US010305041B2

(12) United States Patent
Kim et al.

(10) Patent No.: US 10,305,041 B2
(45) **Date of Patent: *May 28, 2019**

(54) ORGANIC LIGHT-EMITTING DEVICE

(71) Applicant: SAMSUNG DISPLAY CO., LTD., Yongin, Gyeonggi-Do (KR)

(72) Inventors: Seulong Kim, Yongin (KR); Younsun Kim, Yongin (KR); Dongwoo Shin, Yongin (KR); Jungsub Lee, Yongin (KR); Naoyuki Ito, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 255 days.

This patent is subject to a terminal disclaimer.

(21) Appl. No.: 14/698,786

(22) Filed: Apr. 28, 2015

(65) Prior Publication Data

US 2016/0133844 A1 May 12, 2016

(30) Foreign Application Priority Data

Nov. 10, 2014 (KR) ........................ 10-2014-0155518

(51) Int. Cl.
*H01L 51/00* (2006.01)
*C09K 11/06* (2006.01)
*H01L 51/50* (2006.01)

(52) U.S. Cl.
CPC .......... *H01L 51/0054* (2013.01); *C09K 11/06* (2013.01); *H01L 51/0056* (2013.01);
(Continued)

(58) Field of Classification Search
CPC .................... H01L 51/0054; C09K 2211/1088
(Continued)

(56) References Cited

U.S. PATENT DOCUMENTS 8,574,725 B2 11/2013 Nishimura et al.
9,172,046 B1 * 10/2015 Kim .................... H01L 51/0056
(Continued)

FOREIGN PATENT DOCUMENTS

CN 103026521 A 4/2013
JP 2012-156499 A 8/2012
(Continued)

OTHER PUBLICATIONS

Machine Translation of KR 10-2013-0007951.*
(Continued)

*Primary Examiner* — Michael M Dollinger
(74) *Attorney, Agent, or Firm* — Lewis Roca Rothgerber Christie LLP

(57) ABSTRACT

An organic light-emitting device including a first electrode; a second electrode; and an organic layer between the first electrode and the second electrode and including an emission layer. The organic layer includes a first material represented by Formula 1 and a second material represented by Formula 2:

Formula 1

$$Ar_{11}-[(L_{11})_{a11}-(R_{11})_{b11}]_{c11}$$

Formula 2

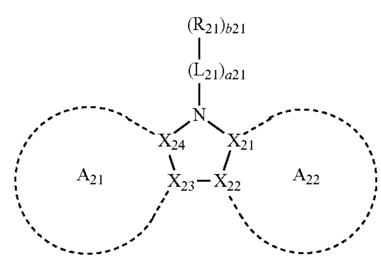

The resulting organic light-emitting device may have high efficiency and a long lifespan.

18 Claims, 1 Drawing Sheet

(52) U.S. Cl.
CPC ...... *H01L 51/0067* (2013.01); *H01L 51/0072* (2013.01); *H01L 51/0085* (2013.01); *H01L 51/5012* (2013.01); *C09K 2211/1007* (2013.01); *C09K 2211/1011* (2013.01); *C09K 2211/1029* (2013.01); *C09K 2211/1033* (2013.01); *C09K 2211/1037* (2013.01); *C09K 2211/1044* (2013.01); *C09K 2211/1059* (2013.01); *C09K 2211/1088* (2013.01)

(58) Field of Classification Search
USPC .......................................................... 428/690
See application file for complete search history.

(56) References Cited

U.S. PATENT DOCUMENTS

2001/0043044 A1 11/2001 Wakimoto et al.
2002/0101154 A1 8/2002 Seo et al.
2006/0063027 A1 3/2006 Vestweber et al.
2006/0103298 A1* 5/2006 Lee .................... H01L 51/5016 313/504
2008/0191618 A1* 8/2008 Mishima ............ H01L 51/5012 313/504
2009/0167161 A1 7/2009 Yabunouchi et al.
2009/0197497 A1 8/2009 Lee
2010/0277060 A1 11/2010 Schaefer et al.
2010/0295445 A1 11/2010 Kuma et al.
2011/0001130 A1 1/2011 Nishimura et al.
2011/0068328 A1 3/2011 Koenemann et al.
2011/0260138 A1 10/2011 Xia et al.
2011/0266526 A1 11/2011 Ma et al.
2011/0278552 A1 11/2011 Numata et al.
2012/0126205 A1 5/2012 Kawamura et al.
2012/0138915 A1 6/2012 Nishimura et al.
2012/0181518 A1 7/2012 Ogiwara et al.
2012/0202997 A1 8/2012 Parham et al.
2012/0214083 A1 8/2012 Norskov et al.
2013/0001523 A1 1/2013 Chun et al.
2013/0056720 A1 3/2013 Kim et al.
2013/0087776 A1* 4/2013 Lee ..................... C07D 209/86 257/40
2013/0112952 A1 5/2013 Adamovich et al.
2013/0207046 A1 8/2013 Pflumm et al.
2013/0207092 A1* 8/2013 Huh ...................... C09K 11/06 257/40
2014/0014940 A1 1/2014 Pflumm et al.
2014/0034940 A1 2/2014 Yu et al.
2014/0048784 A1 2/2014 Inoue et al.
2014/0299865 A1 10/2014 Nishimura et al.
2014/0367657 A1* 12/2014 Kim ................... H01L 51/0067 257/40
2014/0374706 A1 12/2014 Hong et al.
2015/0053937 A1 2/2015 Kim et al.
2015/0102301 A1 4/2015 Cho et al.
2015/0349269 A1 12/2015 Lee et al.
2015/0364694 A1 12/2015 Lee et al.
2016/0028017 A1* 1/2016 Kim ................... H01L 51/0054 257/40
2016/0049593 A1* 2/2016 Kim ................... H01L 51/0072 257/40
2016/0181524 A1* 6/2016 Lee ...................... H01L 51/006 257/40
2016/0260905 A1* 9/2016 Lee .................... H01L 51/0072
2017/0077412 A1* 3/2017 Lim ................... H01L 51/0061

FOREIGN PATENT DOCUMENTS

JP 5208271 B2 3/2013
JP 5632471 82 10/2014
KR 2002/0064217 A 8/2002
KR 10-2006-0055061 A 5/2006
KR 10-0721565 B1 5/2007
KR 10-0857729 B1 9/2008
KR 10-2010-0093085 A 8/2010
KR 10-2012-0057611 A 6/2012
KR 10-2012-0072784 A 7/2012
KR 10-2012-0092550 A 8/2012
KR 10-2012-0140140 A 12/2012
KR 10-2013-0007951 A 1/2013
KR 10-2013-0009614 A 1/2013
KR 10-2013-0010056 A 1/2013
KR 10-2013-0067274 A 6/2013
KR 10-2013-0073023 A 7/2013
KR 10-2013-0099098 A 9/2013
KR 10-2013-0100236 A 9/2013
KR 10-2014-0027218 A 3/2014
WO WO 2011/006511 A1 1/2011
WO WO 2012/108388 A1 8/2012
WO WO 2013/058343 A1 4/2013
WO WO 2013/062075 A1 5/2013
WO WO 2013/084885 A1 6/2013
WO WO 2013/120577 A1 8/2013
WO WO 2014/185589 A1 11/2014
WO WO 2014/185598 A1 11/2014

OTHER PUBLICATIONS

Liao et al., “Hole Mobilities of 2,7- and 2,2'-Disubstituted 9,9'-Spirobifluorene-Based Triaryldiamines and Their Application as Hole Transport MAterials in OLEDs,” Chem. Mater., 2007, vol. 19, No. 25, pp. 6350-6357. Date of web publication: Nov. 8, 2007.
Shin et al., “A new N-fluorenyl carbazole host material: Synthesis, physical properties and applications for highly efficient phosphorescent organic light emitting diodes,” Organic Electronics, 2011, vol. 12, pp. 785-793. Date of web publication: Feb. 26, 2011.
U.S. Notice of Allowance dated Jun. 5, 2015, issued in U.S. Appl. No. 14/537,862 (10 pages).
U.S. Office Action dated Aug. 10, 2017, issued in U.S. Appl. No. 14/801,804 (24 pages).
U.S. Final Office Action dated Jan. 5, 2018, issued in U.S. Appl. No. 14/801,804 (23 pages).
U.S. Office Action dated May 3, 2018, issued in U.S. Appl. No. 14/801,804 (21 pages).
U.S. Final Office Action dated Sep. 21, 2018, issued in U.S. Appl. No. 14/801,804 (22 pages).

* cited by examiner

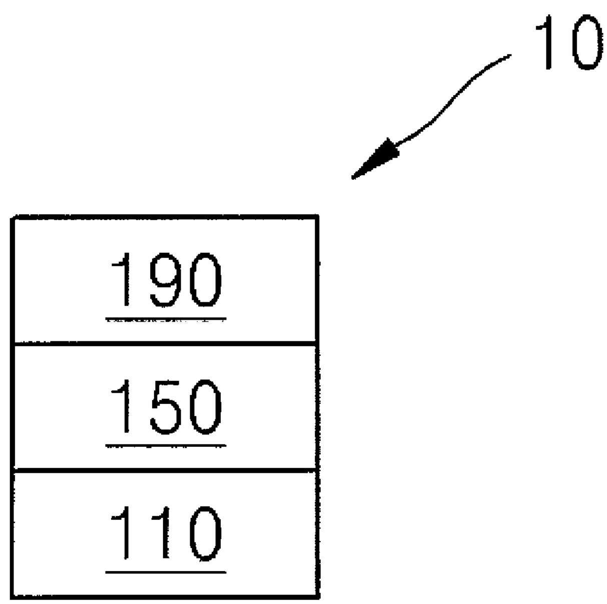
10
190
150
110

ORGANIC LIGHT-EMITTING DEVICE

CROSS-REFERENCE TO RELATED APPLICATION

This application claims priority to and the benefit of Korean Patent Application No. 10-2014-0155518, filed on Nov. 10, 2014, in the Korean Intellectual Property Office, the disclosure of which is incorporated herein in its entirety by reference.

BACKGROUND

1. Field

One or more aspects of embodiments of the present invention are directed to an organic light-emitting device.

2. Description of the Related Art

Organic light emitting devices are self-emission devices that have wide viewing angles, high contrast ratios, short response times, excellent brightness, low driving voltage, and good response speed characteristics, and can produce full-color images.

An organic light-emitting device typically may include a first electrode positioned on a substrate, and a hole transport region, an emission layer, an electron transport region, and a second electrode, which are sequentially positioned on the first electrode. Holes provided from the first electrode may move toward the emission layer through the hole transport region, and electrons provided from the second electrode may move toward the emission layer through the electron transport region. Carriers (e.g., holes and electrons) are then recombined in the emission layer to produce excitons. When these excitons change from an excited state to a ground state, light is emitted.

SUMMARY

One or more aspects of embodiments of the present invention are directed to an organic light-emitting device.

Additional aspects will be set forth in part in the description which follows and, in part, will be apparent from the description, or may be learned by practice of the presented embodiments.

One or more embodiments of the present invention provide an organic light-emitting device including a first electrode, a second electrode, and an organic layer between the first electrode and the second electrode and including an emission layer.

The organic layer includes a first material represented by Formula 1 and a second material represented by Formula 2:

Formula 1

$$Ar_{11}-[(L_{11})_{a11}-(R_{11})_{b11}]_{c11}$$

Formula 2

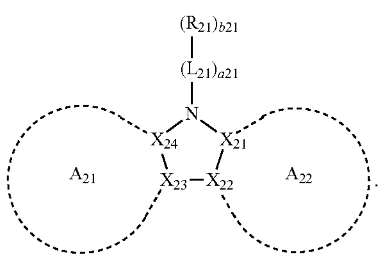

In Formulae 1 and 2, $Ar_{11}$ may be selected from Formulae 8-1 to 8-7;

8-1

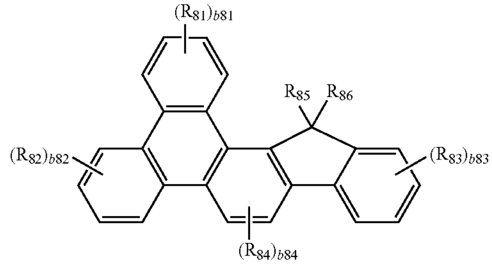

8-2

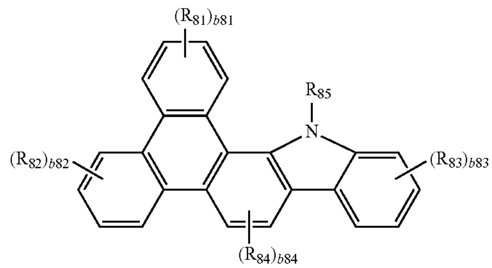

8-3

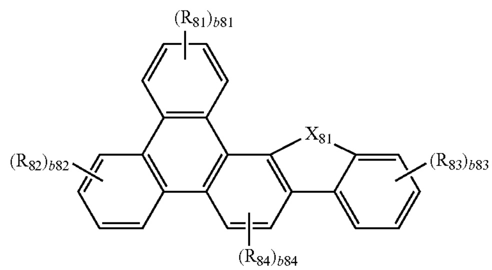

8-4

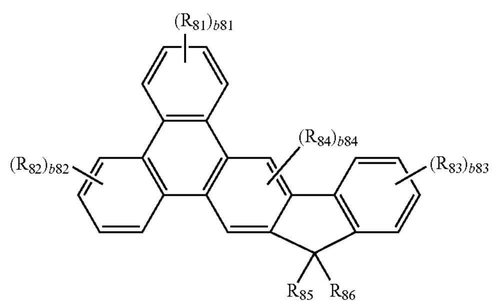

8-5

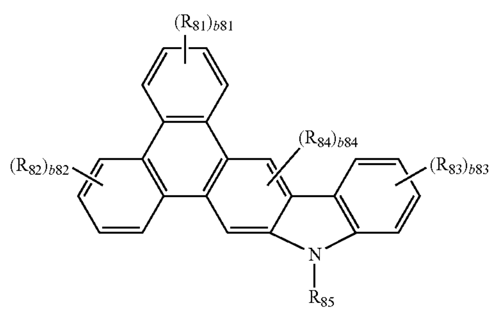

8-6
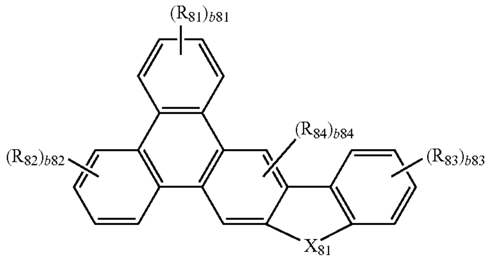
8-7
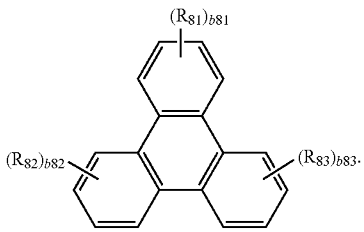
$A_{21}$ and $A_{22}$ may be each independently selected from Formulae 9-1 to 9-12, and any two adjacent groups selected from $X_{21}$ to $X_{24}$ may be each independently carbon atoms corresponding to * in Formulae 9-1 to 9-12;
9-1
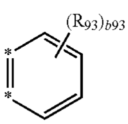
9-2
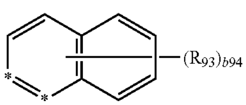
9-3
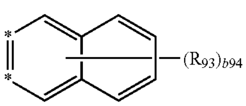
9-4
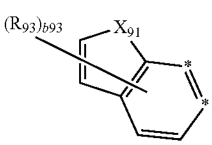
9-5
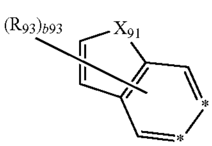
9-6
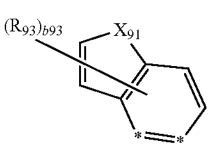
9-7
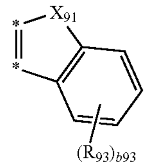
9-8
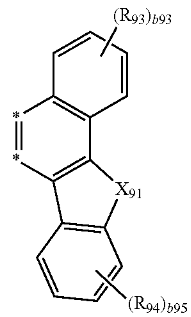
9-9
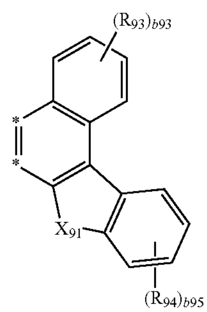
9-10
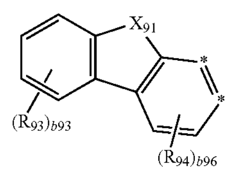
9-11
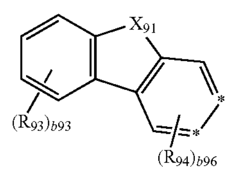
9-12
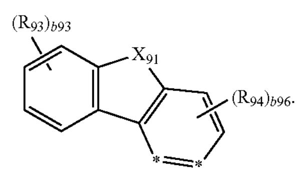
In the formulae above,
$X_{81}$ may be selected from *—O—* and *—S—*;
$X_{91}$ may be selected from
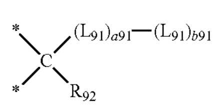
,
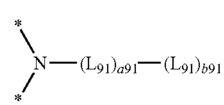
,
*—O—*, and *—S—*;

$L_{11}$, $L_{21}$, and $L_{91}$ may be each independently selected from a bond, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11, a21, and a91 may be each independently selected from 0, 1, 2, and 3;

$R_{11}$ may be an electron transport group;

b11 may be selected from 1, 2, 3, and 4;

c11 may be selected from 1, 2, and 3, and when c11 is two or more, a plurality of *-$[(L_{11})_{a11}$-$(R_{11})_{b11}]$ may be identical to or different from each other;

$R_{81}$ to $R_{86}$ may be each independently selected from *-$[(L_{11})_{a11}$-$(R_{11})_{b11}]$, a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group;

b81 to b83 may be each independently selected from 1, 2, 3, and 4;

b84 may be selected from 1 and 2;

$R_{21}$, and $R_{91}$ to $R_{94}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b21, b91, b93, and b95 may be each independently selected from 0, 1, 2, 3, and 4;

b94 may be selected from 1, 2, 3, 4, 5, and 6;

b96 may be selected from 1 and 2; and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$, where $Q_{11}$ to $Q_{17}$, $Q_{21}$ to $Q_{27}$, and $Q_{31}$ to $Q_{37}$ may be each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

BRIEF DESCRIPTION OF THE DRAWINGS

These and/or other aspects will become apparent and more readily appreciated from the following description of the embodiments, taken in conjunction with the drawing, which is a schematic cross-sectional view of an organic light-emitting device according to one or more embodiments of the present invention.

DETAILED DESCRIPTION

Reference will now be made in more detail to embodiments, examples of which are illustrated in the accompanying drawing, wherein like reference numerals refer to the like elements throughout. In this regard, the present embodiments may have different forms and should not be construed as being limited to the descriptions set forth herein. Accordingly, the embodiments are merely described below, by referring to the drawing, to explain aspects of the present description. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." In addition, as used herein, the terms "use," "using," and "used" may be considered synonymous with the terms "utilize," "utilizing," and "utilized," respectively. Also, the term "exemplary" is intended to refer to an example or illustration.

As used herein, the term "substantially," "about," and similar terms are used as terms of approximation and not as terms of degree, and are intended to account for the inherent deviations in measured or calculated values that would be recognized by those of ordinary skill in the art.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. That is, for example, intervening layers, regions, or components may be present.

Sizes of components in the drawing may be exaggerated for convenience of explanation. In other words, since sizes and thicknesses of components in the drawing are arbitrarily illustrated for convenience of explanation, the following embodiments are not limited thereto.

The expression "X includes a first material represented by Formula 1" as used herein may be interpreted as "X includes one or more of the same first material represented by Formula 1 or two or more different first materials represented by Formula 1."

The term "organic layer" used herein refers to a single layer and/or a plurality of layers between the first electrode and the second electrode of the organic light-emitting device. A material included in the "organic layer" is not limited to an organic material.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 1 12, first paragraph, and 35 U.S.C. § 132(a).

The drawing is a schematic cross-sectional view of an organic light-emitting device according to an embodiment.

Referring to the drawing, the organic light-emitting device according to the present embodiments includes a first electrode 110, an organic layer 150, and a second electrode 190.

In the drawing, a substrate may be additionally positioned under the first electrode 110 or above the second electrode 190. The substrate may be a glass substrate or a transparent plastic substrate, each with good mechanical strength, thermal stability, transparency, surface smoothness, ease of handling, and water-proofness.

The first electrode 110 may be formed by depositing and/or sputtering a material for forming the first electrode 110 on the substrate. When the first electrode 110 is an anode, the material for the first electrode 110 may be selected from materials with a high work function and capable of facilitating hole injection. The first electrode 110 may be a reflective electrode or a transmissive electrode. The material for the first electrode 110 may be a transparent and highly conductive material, and non-limiting examples of such material include indium tin oxide (ITO), indium zinc oxide (IZO), tin oxide ($SnO_2$), and zinc oxide (ZnO). When the first electrode 110 is a semi-transmissive electrode or a reflective electrode, as a material for forming the first electrode, at least one of magnesium (Mg), aluminum (Al), aluminum-lithium (Al—Li), calcium (Ca), magnesium-indium (Mg—In), magnesium-silver (Mg—Ag) may be used (or utilized).

The first electrode 110 may have a single-layer structure, or a multi-layer structure including two or more layers. For example, the first electrode 110 may have a three-layered structure of ITO/Ag/ITO, but the structure of the first electrode 110 is not limited thereto.

The organic layer 150 may be positioned on the first electrode 110 may include an emission layer. The organic layer 150 may further include a hole transport region between the first electrode 110 and the emission layer and an electron transport region between the emission layer and the second electrode 190.

In some embodiments, the organic layer 150 includes a first material represented by Formula 1 and a second material represented by Formula 2:

Formula 1

$$Ar_{11}-\left[(L_{11})_{a11}-(R_{11})_{b11}\right]_{c11}$$

Formula 2

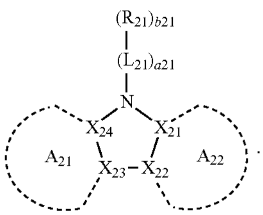

$Ar_{11}$ in Formula 1 may be selected from Formulae 8-1 to 8-7, and detailed descriptions of substituents in Formulae 8-1 to 8-7 will be presented later:

8-1

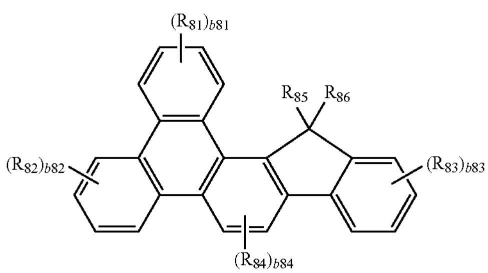

8-2

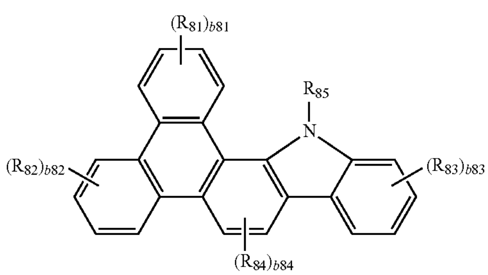

8-3

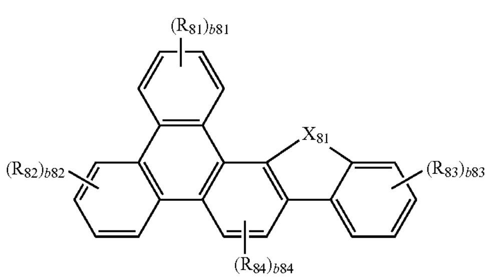

-continued 8-4

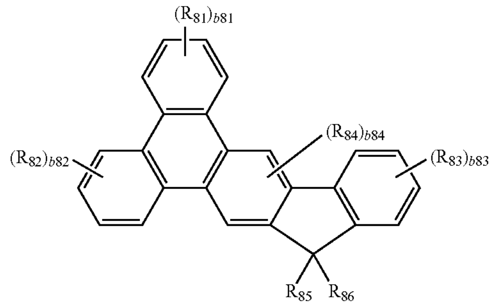

8-5

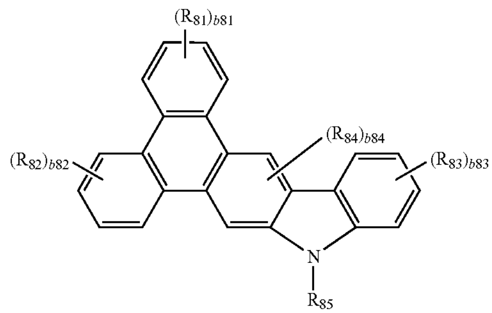

8-6

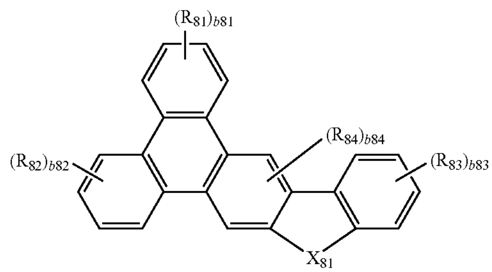

8-7

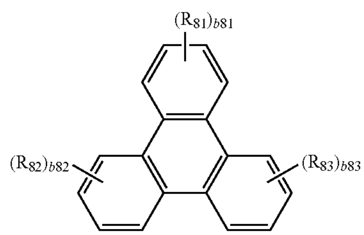

$A_{21}$ and $A_{22}$ in Formula 2 may be each independently selected from Formulae 9-1 to 9-12, and any two adjacent groups selected from $X_{21}$ to $X_{24}$ may be each independently carbon atoms corresponding to * in Formulae 9-1 to 9-12. Detailed descriptions of substituents of Formulae 9-1 to 9-12 will be presented later:

9-1

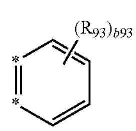

9-2

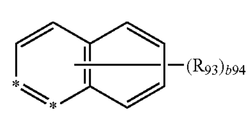

-continued 9-3

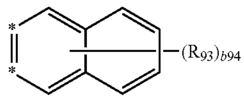

9-4

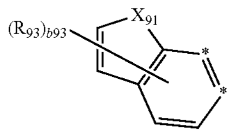

9-5

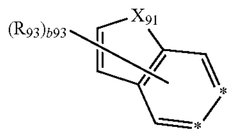

9-6

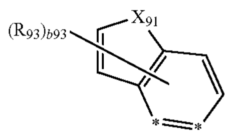

9-7

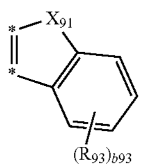

9-8

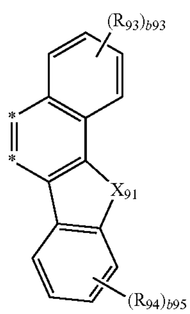

9-9

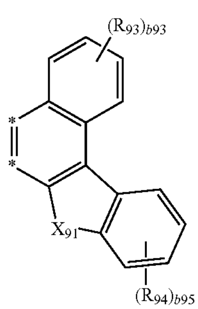

9-10

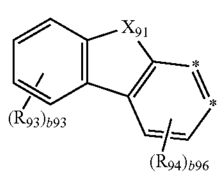

-continued 9-11

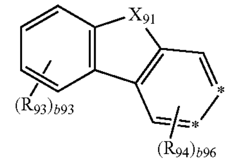

9-12

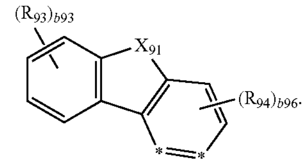

$X_{81}$ in the formulae above may be selected from *—O—* and *—S—*:

$X_{91}$ may be selected from

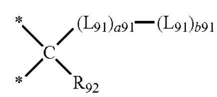

,

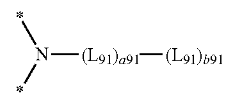

*—O—*, and *—S—*;

$L_{11}$, $L_{21}$, and $L_{91}$ may be each independently selected from a bond, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11, a21, and a91 may be each independently selected from 0, 1, 2, and 3;

$R_{11}$ may be an electron transport group;

b11 may be selected from 1, 2, 3, and 4;

c11 may be selected from 1, 2, and 3, and when c11 is two or more, a plurality of *-$[(L_{11})_{a11}$-$(R_{11})_{b11}]$ may be identical to or different from each other;

$R_{81}$ to $R_{86}$ may be each independently selected from *-$[(L_{11})_{a11}$-$(R_{11})$, a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group;

b81 to b83 may be each independently selected from 1, 2, 3, and 4;

b84 may be selected from 1 and 2;

$R_{21}$, and $R_{91}$ to $R_{94}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b21, b91, b93, and b95 may be each independently selected from 0, 1, 2, 3, and 4;

b94 may be selected from 1, 2, 3, 4, 5, and 6;

b96 may be selected from 1 and 2; and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_1$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_1$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), where $Q_{11}$ to $Q_{17}$, $Q_{21}$ to $Q_{27}$, and $Q_{31}$ to $Q_{37}$ may be each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, $L_{11}$, $L_{21}$, and $L_{91}$ in the formulae above may be each independently selected from a phenylene group, a pentalenylene group, an indenylene group, a naphthylene group, an azulenylene group, a heptalenylene group, an indacenylene group, an acenaphthylene group, a fluorenylene group, an spiro-fluorenylene group, an benzofluorenylene group, an dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, an apentacenylene group, a rubicenylene group, coronenylene group, ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, tetrazolylene group, an oxadiazolylene group, a triazinylene group, a dibenzofuranylene group, a dibenzothiophenylene group, a benzocarbazolylene group, and a dibenzocarbazolylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group, but embodiments of the present invention are not limited thereto.

In some embodiments, $L_{11}$, $L_{21}$, and $L_{91}$ in the formulae above may be each independently selected from a phenylene group, a naphthylene group, a fluorenylene group, a pyridinylene group, a pyrimidinylene group, a quinolinylene group, an isoquinolinylene group, a quinazolinylene group, a carbazolylene group, and a triazinylene group; and a phenylene group, a naphthylene group, a fluorenylene group, a pyridinylene group, a pyrimidinylene group, a quinolinylene group, an isoquinolinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a naphthyl group, a pyridinyl group, and a pyrimidinyl group, but embodiments of the present invention are not limited thereto.

In some embodiments, $L_{11}$, $L_{21}$, and $L_{91}$ in the formulae above may be each independently a group selected from groups represented by Formulae 3-1 to 3-35, but embodiments of the present invention are not limited thereto:

3-1

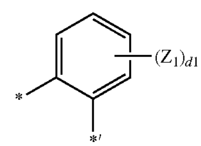

3-2

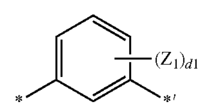

3-3

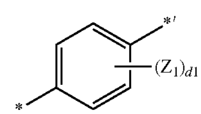

3-4

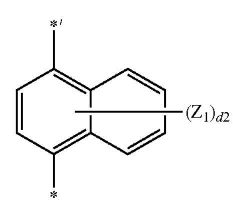

3-5

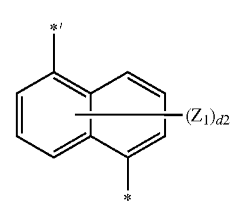

3-6

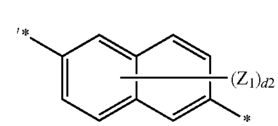

-continued
3-7
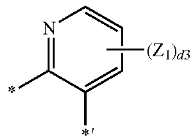
3-8
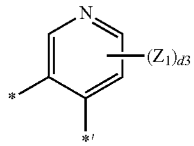
3-9
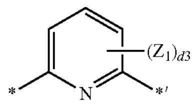
3-10
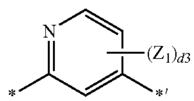
3-11
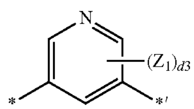
3-12
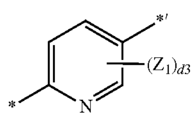
3-13
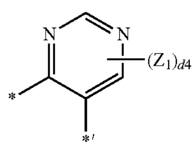
3-14
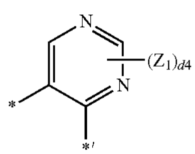
3-15
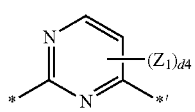
3-16
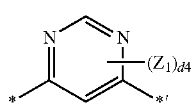
3-17
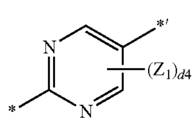
3-18
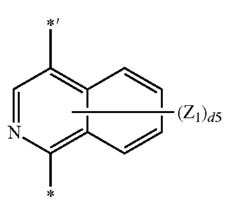
-continued
3-19
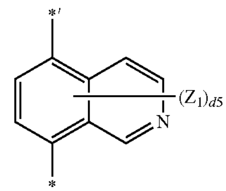
3-20
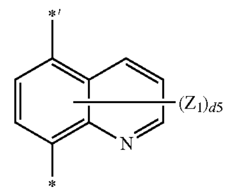
3-21
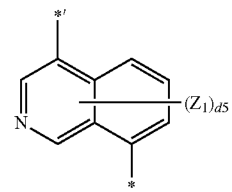
3-22
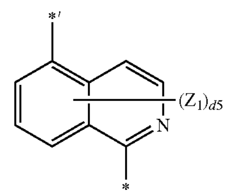
3-23
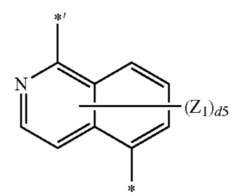
3-24
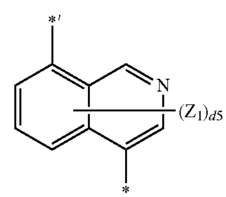
3-25
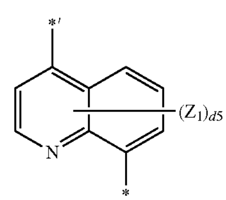
3-26
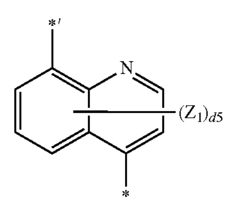

-continued 3-27

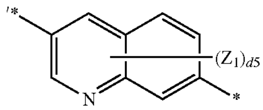

3-28

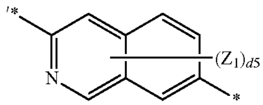

3-29

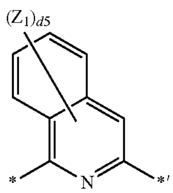

3-30

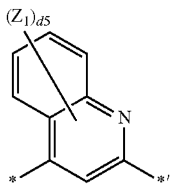

3-31

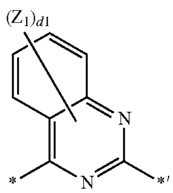

3-32

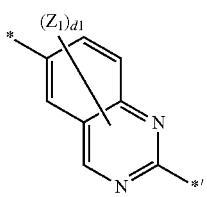

3-33

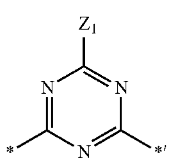

3-34

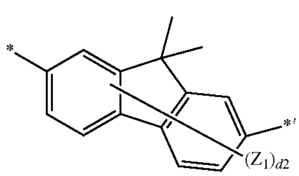

3-35

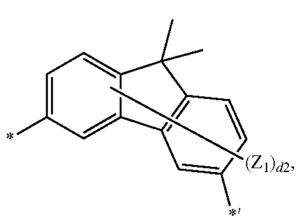

In Formulae 3-1 to 3-35, $Z_1$ may be a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a naphthyl group, a pyridinyl group, and a pyrimidinyl group;

d1 may be selected from 1, 2, 3, and 4;

d2 may be selected from 1, 2, 3, 4, 5, and 6;

d3 is selected from 1, 2, and 3;

d4 is selected from 1 and 2;

d5 may be selected from 1, 2, 3, 4, and 5; and

* and *' may each indicate a binding site to a neighboring atom.

In some embodiments, $L_{11}$, $L_{21}$, and $L_{91}$ in the formulae above may be each independently a group represented by any one of Formulae 3-1 to 3-35; where i) $Z_1$ may be a hydrogen, d1 may be 4, d2 may be 6, d3 may be 3, d4 may be 3, d5 may be 5; or ii) $Z_1$ may be a phenyl group or a pyridinyl group, and d1 to d5 may each be 1, but embodiments of the present invention are not limited thereto.

For example, a11, a21, and a91 in the formulae above may be each independently 0 or 1, but are not limited thereto.

For example, $R_{11}$ in the formulae above may be a substituted or unsubstituted $C_1$-$C_{60}$ heteroaryl group including at least one nitrogen atom (N), but embodiments of the present invention are not limited thereto.

In some embodiments, $R_{11}$ in the formulae above may be selected from a pyrrolyl group, an indolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a benzoa quinoxalinyl group (e.g., benzoquinoxalinyl group), a quinazolinyl group, a benzoa quinazolinyl group (e.g., benzoquinazolinyl group), a phenanthrolinyl group, a benzimidazolyl group, an isobenzothiazolyl group, a benzoxazolyl group, an isobenzoxazolyl group, a triazolyl group, an oxadiazolyl group, a triazinyl group, a thiadiazolyl group, an imidazopyridinyl group, and an imidazopyrimidinyl group; and a pyrrolyl group, an indolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a benzoa quinoxalinyl group, a quinazolinyl group, a benzoa quinazolinyl group, a phenanthrolinyl group, a benzimidazolyl group, an isobenzothiazolyl group, a benzoxazolyl group, an isobenzoxazolyl group, a triazolyl group, an oxadiazolyl group, a triazinyl group, a thiadiazolyl group, an imidazopyridinyl group, and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, phenanthridinyl, acridinyl, phenanthrolinyl, phenazinyl, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, but embodiments of the present invention are not limited thereto.

In some embodiments, $R_{11}$ in the formulae above may be selected from a pyridinyl group, a pyrimidinyl group, a pyridazinyl group, a triazinyl group, a quinolinyl group, an isoquinolinyl group, a quinazolinyl group, a quinoxalinyl group, a phenanthrolinyl group, a benzimidazolyl group, and a triazolyl group; and a pyridinyl group, a pyrimidinyl group, a pyridazinyl group, a triazinyl group, a quinolinyl group, an isoquinolinyl group, a quinazolinyl group, a quinoxalinyl group, a phenanthrolinyl group, a benzimidazolyl group, and a triazolyl group, each substituted with at least one selected from a deuterium, —F, —Cl, —Br, —I, a $C_1$-$C_{20}$ alkyl group, a phosphoric acid group or a salt thereof, a phenyl group, a biphenyl group, a naphthyl group, a pyridinyl group, a pyrimidinyl group, and a triazinyl group, but embodiments of the present invention are not limited thereto.

In some embodiments, $R_{11}$ in the formulae above may be selected from Formulae 4-1 to 4-47 below, but embodiments of the present invention are not limited thereto:

4-1

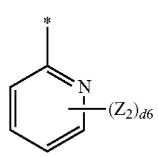

4-2

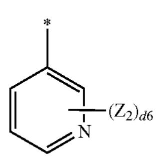

4-3

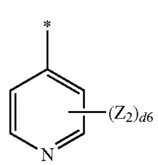

-continued 4-4

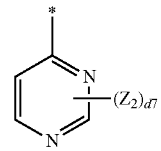

4-5

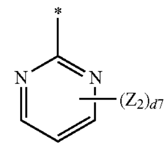

4-6

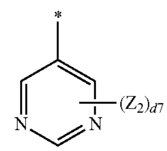

4-7

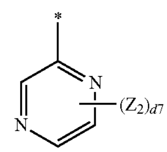

4-8

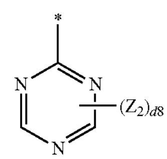

4-9

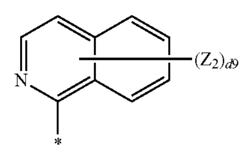

4-10

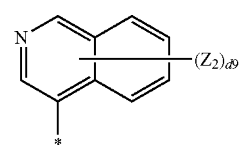

4-11

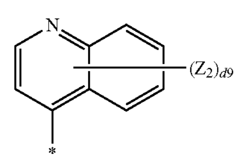

4-12

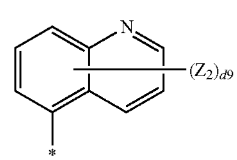

4-13

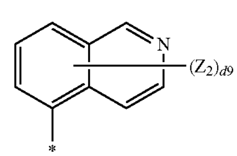

-continued
4-14
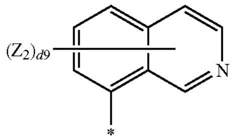
4-15
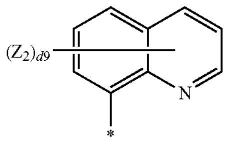
4-16
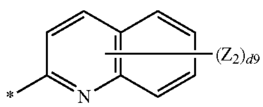
4-17
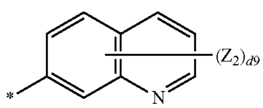
4-18
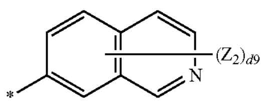
4-19
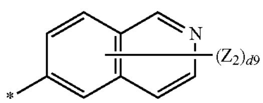
4-20
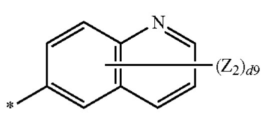
4-21
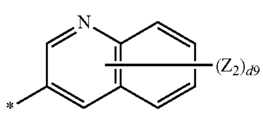
4-22
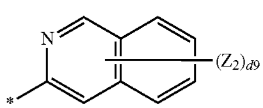
4-23
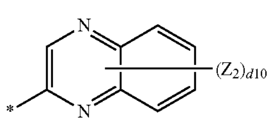
4-24
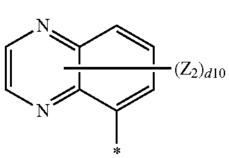
4-25
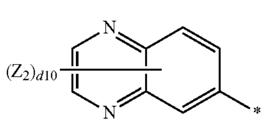
4-26
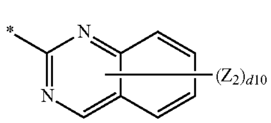
-continued
4-27
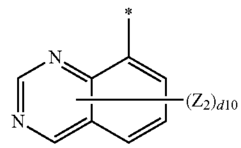
4-28
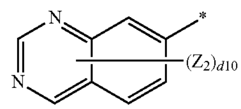
4-29
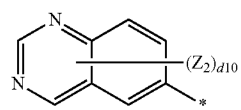
4-30
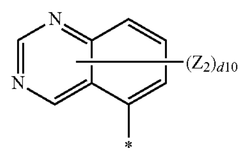
4-31
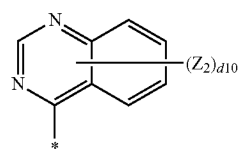
4-32
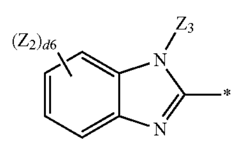
4-33
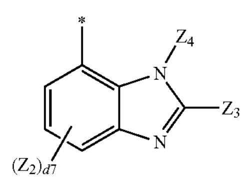
4-34
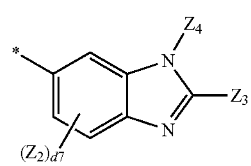
4-35
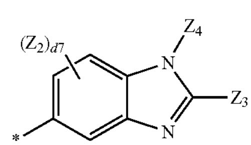
4-36
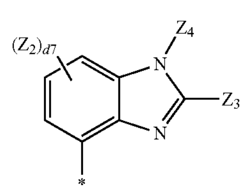

-continued 4-37

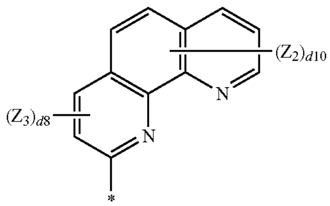

4-38

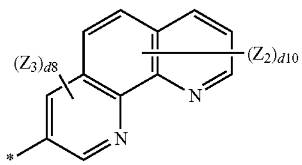

4-39

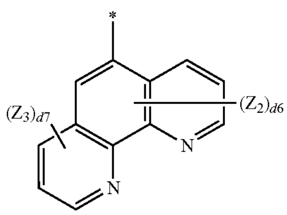

4-40

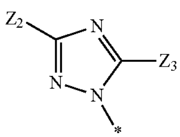

4-41

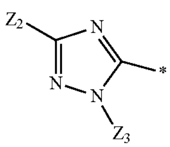

4-42

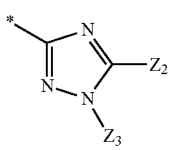

4-43

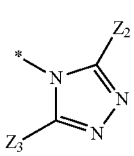

4-44

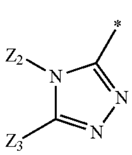

4-45

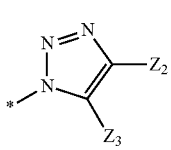

-continued 4-46

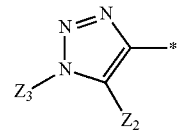

4-47

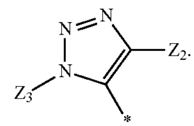

In Formulae 4-1 to 4-47, $Z_2$ to $Z_4$ may be each independently selected from a hydrogen, a deuterium, a phenyl group, a biphenyl group, a naphthyl group, a pyridinyl group, a pyrimidinyl group, and a triazinyl group;

d6 may be selected from 1, 2, 3, and 4; and d7 may be selected from 1, 2, and 3;

d8 may be selected from 1 and 2;

d9 may be selected from 1, 2, 3, 4, 5, and 6;

d10 may be selected from 1, 2, 3, 4, and 5; and

* indicates a binding site to a neighboring atom.

In some embodiments, $R_{11}$ in the formulae above may be selected from Formulae 4-1 to 4-47, where $Z_2$ to $Z_4$ in Formulae 4-1 to 4-47 may be each independently selected from a hydrogen, a phenyl group, a biphenyl group, and a naphthyl group; d6 may be selected from 1, 2, 3, and 4; d7 may be selected from 1, 2, and 3; d8 may be selected from 1 and 2; d9 may be selected from 1, 2, 3, 4, 5, and 6; d10 may be selected from 1, 2, 3, 4, and 5; and * may be a binding site to a neighboring atom, but embodiments of the present invention are not limited thereto.

In some embodiments, $R_{11}$ in the formulae above may be selected from Formulae 5-1 to 5-143 below, but embodiments of the present invention are not limited thereto:

5-1

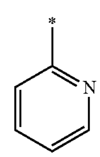

5-2

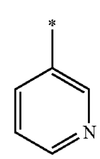

5-3

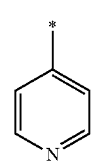

5-4

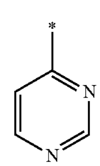

-continued
5-5
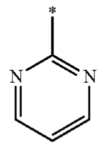
5-6
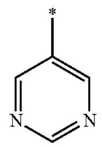
5-7
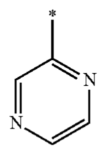
5-8
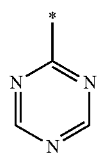
5-9
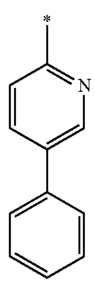
5-10
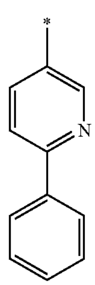
5-11
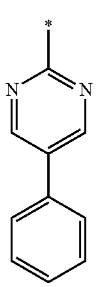
-continued
5-12
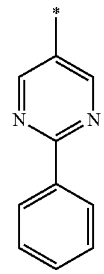
5-13
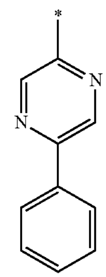
5-14
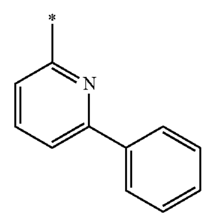
5-15
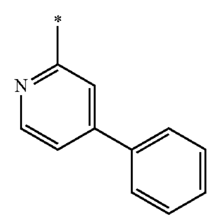
5-16
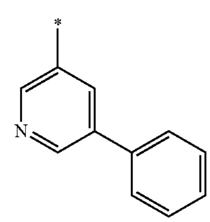
5-17
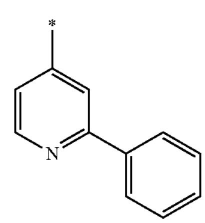

5-18
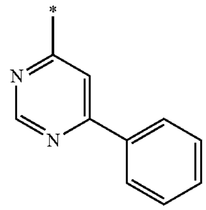
5-19
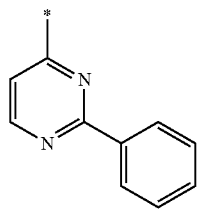
5-20
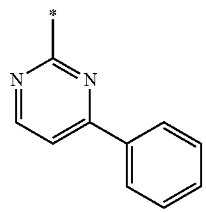
5-21
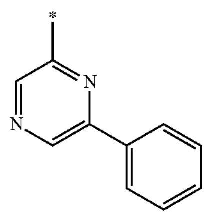
5-22
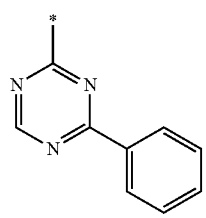
5-23
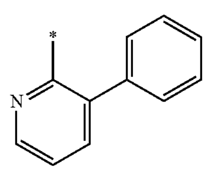
5-24
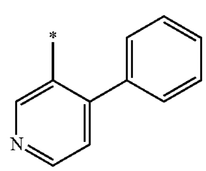
5-25
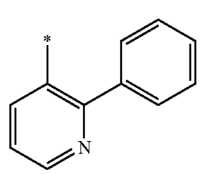
5-26
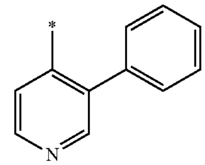
5-27
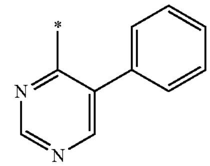
5-28
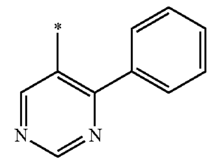
5-29
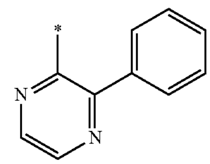
5-30
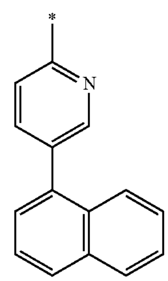
5-31
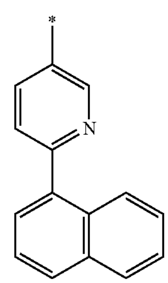
5-32
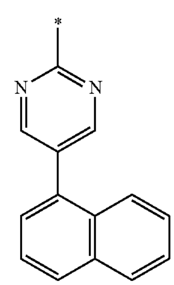

-continued
5-33
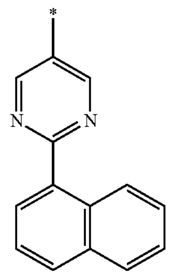
5-34
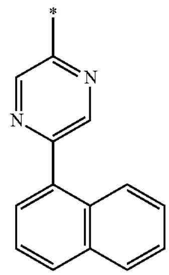
5-35
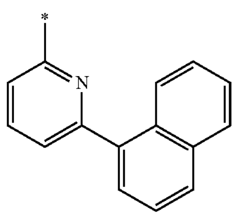
5-36
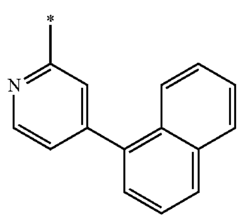
5-37
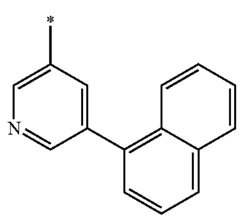
5-38
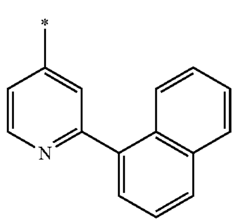
5-39
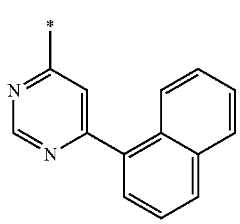
-continued
5-40
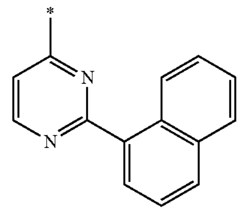
5-41
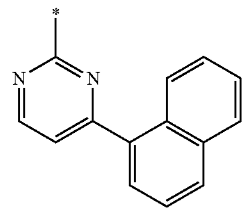
5-42
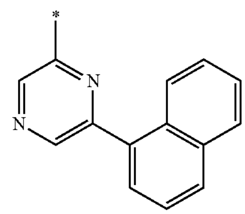
5-43
5-44
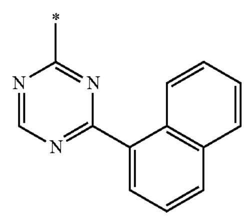
5-45
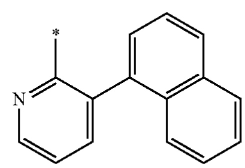
5-46
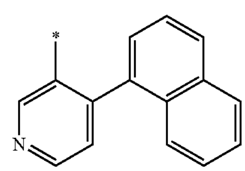
5-47
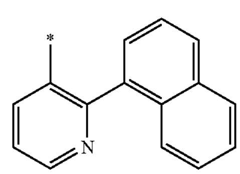
5-48
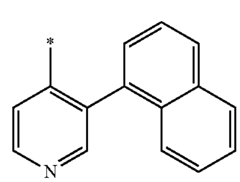

5-49
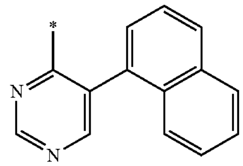
5-50
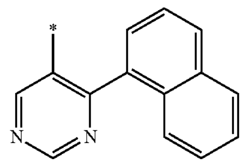
5-51
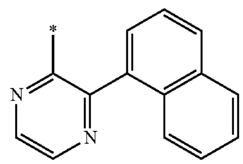
5-52
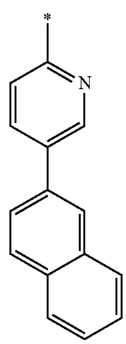
5-53
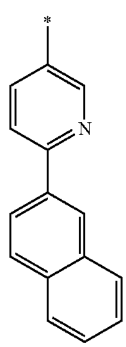
5-54
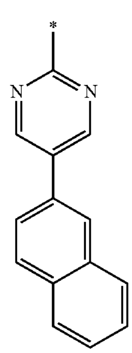
5-55
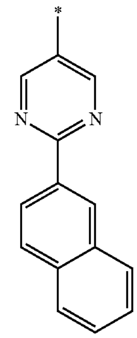
5-56
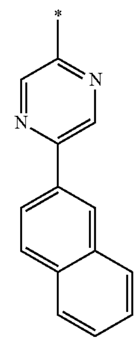
5-57
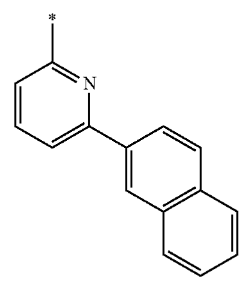
5-58
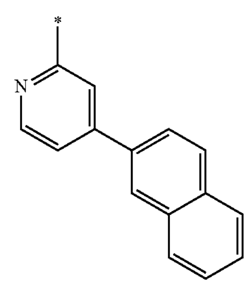
5-59
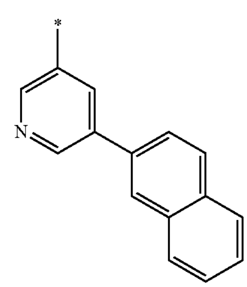

-continued
5-60
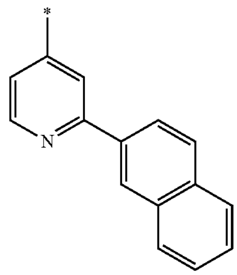
5-61
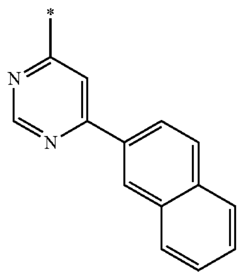
5-62
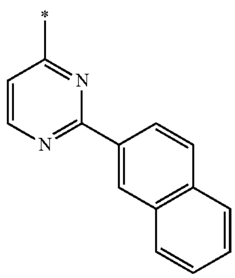
5-63
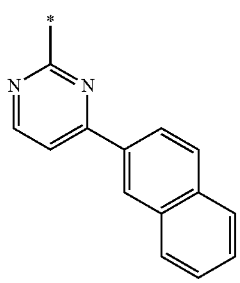
5-64
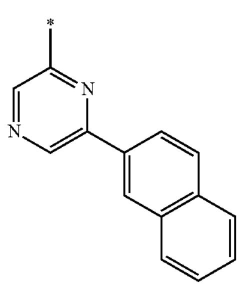
-continued
5-65
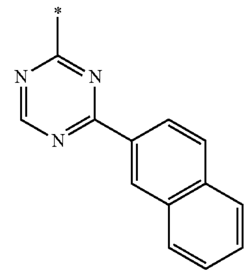
5-66
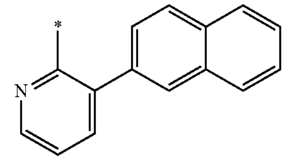
5-67
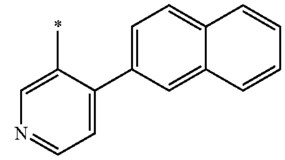
5-68
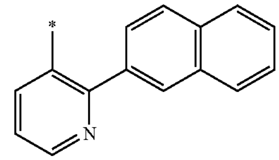
5-69
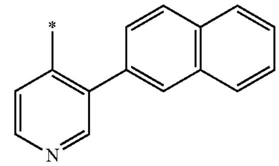
5-70
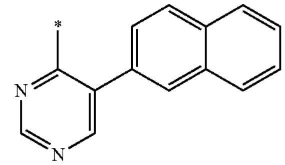
5-71
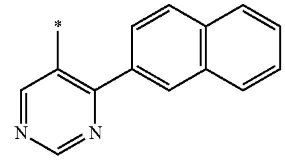
5-72
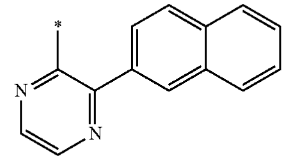

-continued
5-73
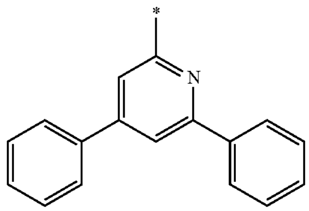
5-74
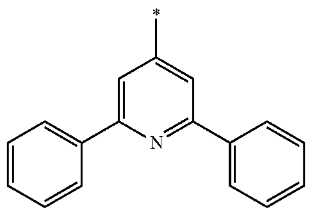
5-75
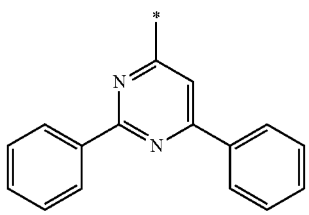
5-76
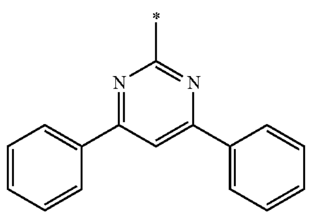
5-77
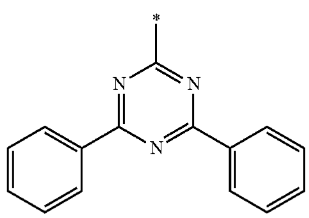
5-78
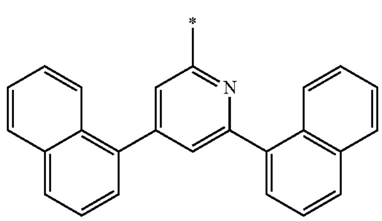
5-79
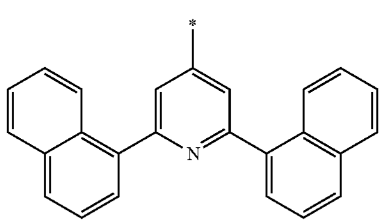
-continued
5-80
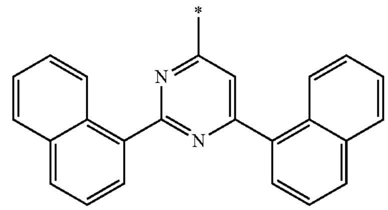
5-81
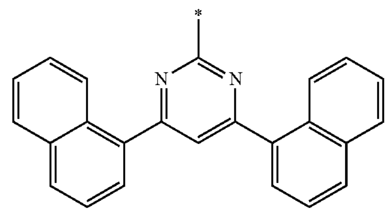
5-82
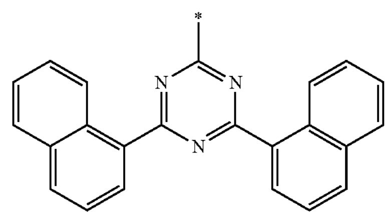
5-83
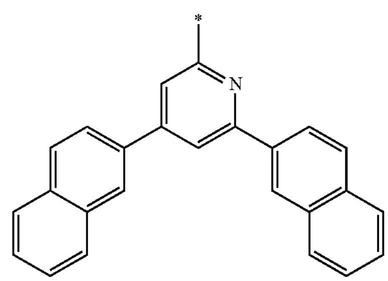
5-84
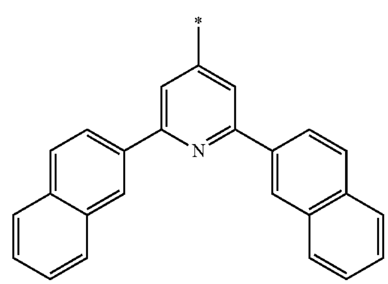
5-85
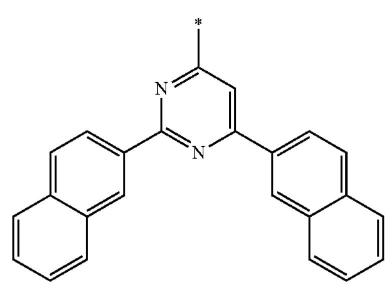

-continued
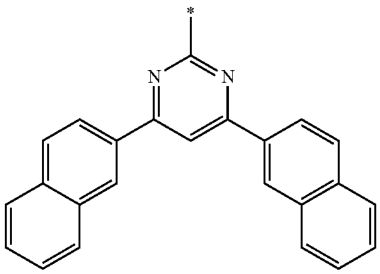
5-86
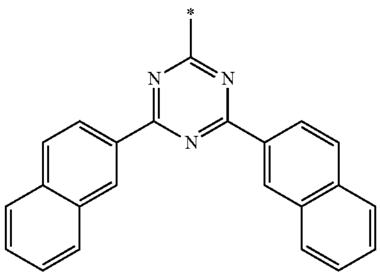
5-87
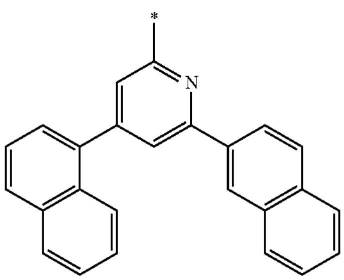
5-88
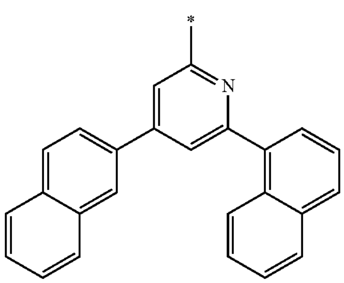
5-89
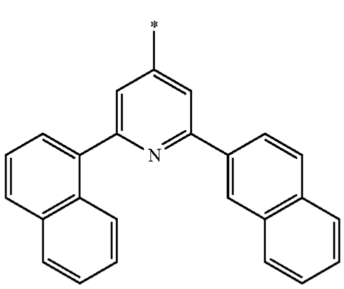
5-90
-continued
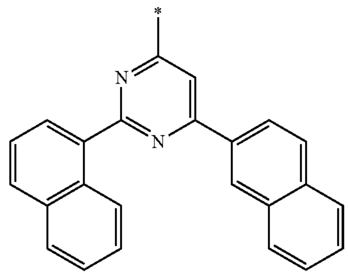
5-91
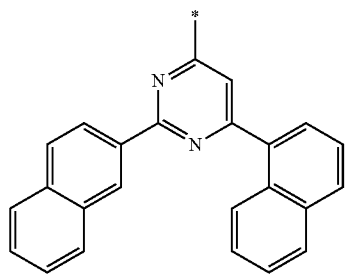
5-92
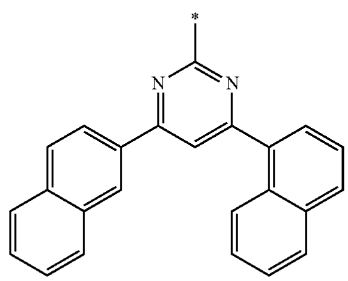
5-93
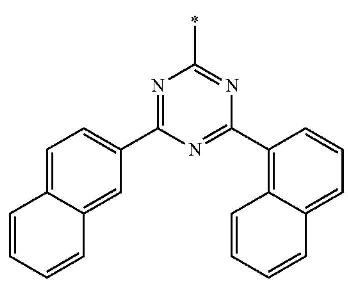
5-94
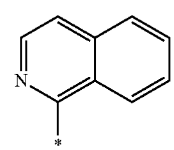
5-95
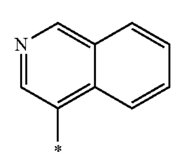
5-96
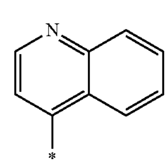
5-97

-continued
5-98
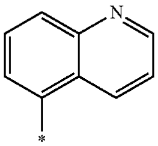
5-99
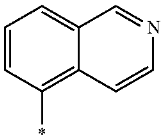
5-100
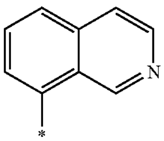
5-101
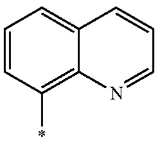
5-102
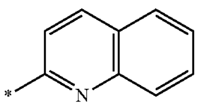
5-103
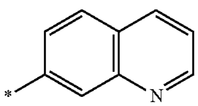
5-102
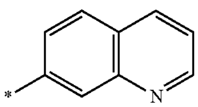
5-104
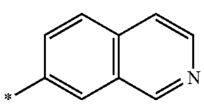
5-105
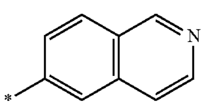
5-106
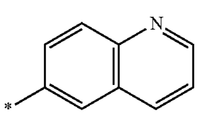
5-107
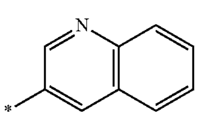
5-108
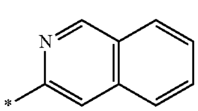
-continued
5-109
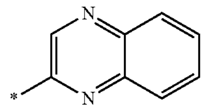
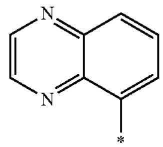
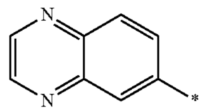
5-112
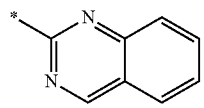
5-113
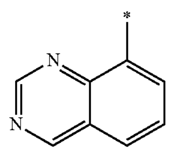
5-114
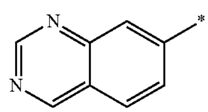
5-115
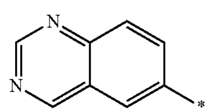
5-116
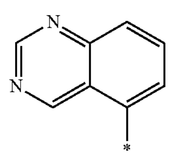
5-117
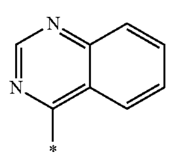
5-118
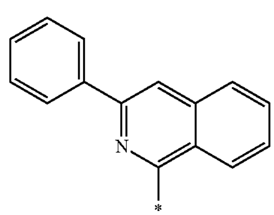

-continued
5-119
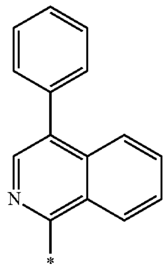
5-120
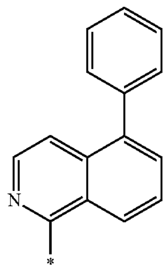
5-121
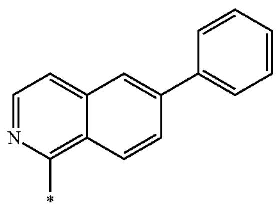
5-122
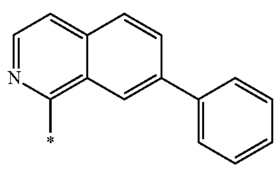
5-123
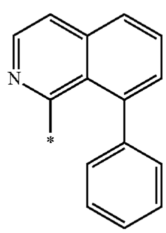
5-124
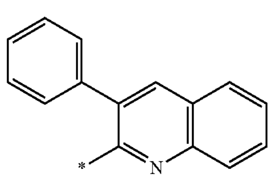
5-125
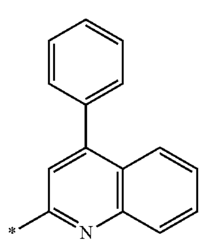
-continued
5-126
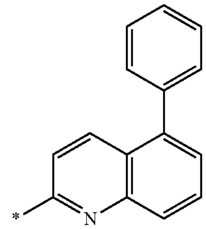
5-127
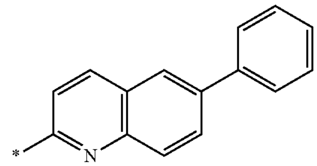
5-128
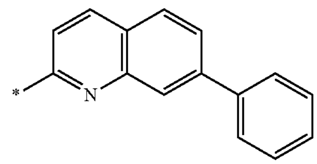
5-129
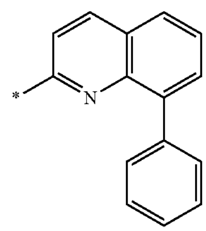
5-130
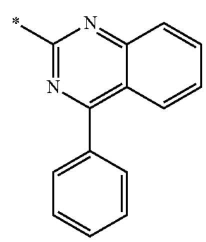
5-131
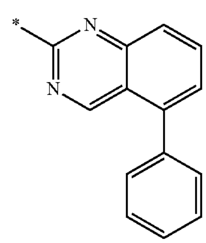
5-132
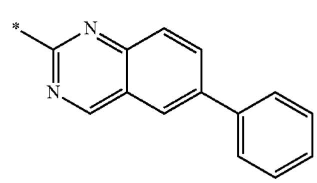
5-133
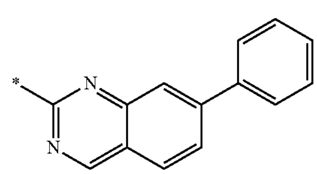

-continued 5-134

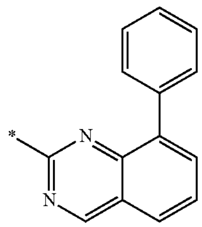

5-135

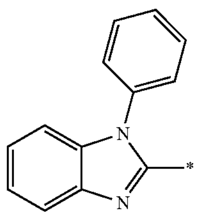

5-136

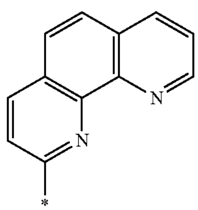

5-137

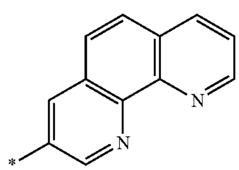

5-138

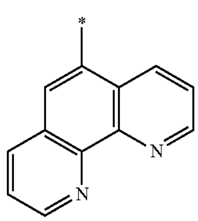

5-139

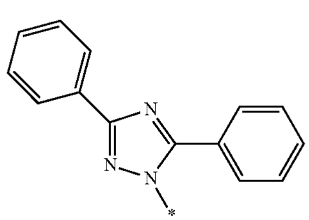

5-140

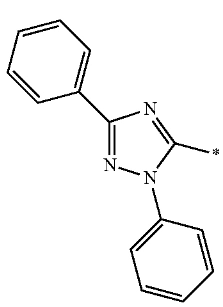

-continued 5-141

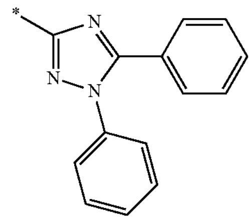

5-142

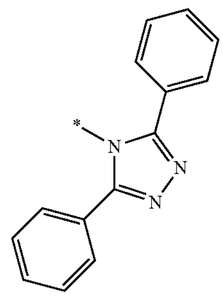

5-143

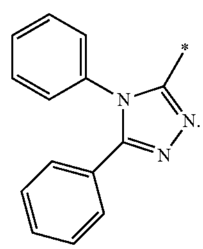

In Formulae 5-1 to 5-143,

* indicates a binding site to a neighboring atom.

For example, b11 in the formulae above may be 1, but is not limited thereto.

For example, c11 in the formulae above may be selected from 1 and 2, but is not limited thereto.

In some embodiments, c11 in the formulae above may be 1, but is not limited thereto.

For example, $R_{81}$ to $R_{86}$ in the formulae above may be each independently selected from *-$[(L_{11})_{a11}$-$(R_{11})_{b11}]$, a hydrogen, a deuterium, —F, —Cl, —Br, —I, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, a phenyl group, a naphthyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, a pyridinyl group, a pyrazinyl group, a pyrimidinyl group, a pyridazinyl group, an indolyl group, a quinolinyl group, an isoquinolinyl group, a benzoquinolinyl group, a quinoxalinyl group, a quinazolinyl group, a cinnolinyl group, a phenanthridinyl group, an acridinyl group, a phenanthrolinyl group, a phenazinyl group, a benzimidazolyl group, a triazolyl group, and a triazinyl group; and a phenyl group, a naphthyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, a pyridinyl group, a pyrazinyl group, a pyrimidinyl group, a pyridazinyl group, an indolyl group, a quinolinyl group, an isoquinolinyl group, a benzoquinolinyl group, a quinoxalinyl group, a quinazolinyl group, a cinnolinyl group, a phenanthridinyl group, an acridinyl group, a phenanthrolinyl group, a phenazinyl group, a benzimidazolyl group, a triazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, but embodiments of the present invention are not limited thereto.

In some embodiments, $R_{81}$ to $R_{86}$ in the formulae above may be each independently selected from *-[$(L_{11})_{a11}$-$(R_{11})_{b11}$], a hydrogen, a deuterium, —F, —Cl, —Br, —I, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, a phenyl group, a naphthyl group, a pyridinyl group, a pyrimidinyl group, a pyridazinyl group, and a triazinyl group; and a phenyl group, a naphthyl group, a pyridinyl group, a pyrimidinyl group, a pyridazinyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group and a naphthyl group, but embodiments of the present invention are not limited thereto.

In some embodiments, $R_{81}$ to $R_{86}$ in the formulae above may be each independently selected from *-[$(L_{11})_{a11}$-$(R_{11})_{b11}$] and a hydrogen, but embodiments of the present invention are not limited thereto.

For example, $R_{21}$ and $R_{91}$ to $R_{94}$ in the formulae above may be each independently selected from a hydrogen, a deuterium, —F, —Cl, —Br, —I, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoa quinoxalinyl group, a quinazolinyl group, a benzoa quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazoly group, an imidazopyridinyl group, and an imidazopyrimidinyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoa quinoxalinyl group, a quinazolinyl group, a benzoa quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosiloyl group, a benzocarbazolyl group, a dibenzocarbazolyl group, a thiadiazolyl group, an imidazopyridinyl group and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoa quinoxalinyl group, a quinazolinyl group, a benzoa quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, but embodiments of the present invention are not limited thereto.

In some embodiments, $R_{21}$ and $R_{91}$ to $R_{94}$ in the formulae above may be each independently selected from a hydrogen, a deuterium, —F, —Cl, —Br, —I, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, a phenyl group, a naphthyl group, a fluorenyl group, a benzofluorenyl group, an anthracenyl group, a triphenylenyl group, a pyrrolyl group, a thiophenyl group, a furanyl group, an imidazolyl group, a pyridinyl group, a pyrimidinyl group, a pyridazinyl group, an indolyl group, a quinolinyl group, an isoquinolinyl group, a carbazolyl group, a benzoquinolinyl group, a quinoxalinyl group, a benzoa quinoxalinyl group, a quinazolinyl group, a benzoa quinazolinyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, an oxadiazolyl group, a triazinyl group, a dibenzofuranyl group, a dibenzothiophenyl group, a thiadiazolyl group, an imidazopyridinyl group, and an imidazopyrimidinyl group; and a phenyl group, a naphthyl group, a fluorenyl group, a benzofluorenyl group, an anthracenyl group, a triphenylenyl group, a pyrrolyl group, a thiophenyl group, a furanyl group, an imidazolyl group, a pyridinyl group, a pyrimidinyl group, a pyridazinyl group, an indolyl group, a quinolinyl group, an isoquinolinyl group, a carbazolyl group, a benzoquinolinyl group, a quinoxalinyl group, a benzoa quinoxalinyl group, a quinazolinyl group, a benzoa quinazolinyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, an oxadiazolyl group, a triazinyl group, a dibenzofuranyl group, a dibenzothiophenyl group, a thiadiazolyl group, an imidazopyridinyl group and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, phenanthridinyl, acridinyl, phenanthrolinyl, phenazinyl, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group and an imidazopyrimidinyl group, but embodiments of the present invention are not limited thereto.

In some embodiments, $R_{21}$ and $R_{91}$ to $R_{94}$ in the formulae above may be each independently selected from a hydrogen, a deuterium, —F, —Cl, —Br, —I, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, a phenyl group, a naphthyl group, a fluorenyl group, a benzofluorenyl group, a phenanthrenyl group, an anthracenyl group, a triphenylenyl group, a pyridinyl group, a pyrimidinyl group, a pyridazinyl group, a triazinyl group, a dibenzofuranyl group, a dibenzothiophenyl group, a quinolinyl group, an isoquinolinyl group, a carbazolyl group, a quinazolinyl group, a quinoxalinyl group, a phenanthrolinyl group, a benzimidazolyl group, and a triazolyl group; and a phenyl group, a naphthyl group, a fluorenyl group, a benzofluorenyl group, a phenanthrenyl group, an anthracenyl group, a triphenylenyl group, a pyridinyl group, a pyrimidinyl group, a pyridazinyl group, a triazinyl group, a dibenzofuranyl group, a dibenzothiophenyl group, a quinolinyl group, an isoquinolinyl group, a carbazolyl group, a quinazolinyl group, a quinoxalinyl group, a phenanthrolinyl group, a benzimidazolyl group, and a triazolyl group, each substituted with at least one selected from a deuterium, —F, —Cl, —Br, —I, a $C_1$-$C_{20}$ alkyl group, a phosphoric acid group or a salt thereof, a phenyl group, a biphenyl group, a naphthyl group, a pyridinyl group, a pyrimidinyl group, and a triazinyl group, but embodiments of the present invention are not limited thereto.

In some embodiments, $R_{21}$ and $R_{91}$ to $R_{94}$ in the formulae above may be each independently selected from Formulae 4-1 to 4-47 below and Formulae 6-1 to 6-15 below, but embodiments of the present invention are not limited thereto:
4-1
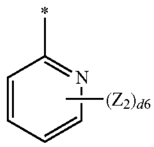
4-2
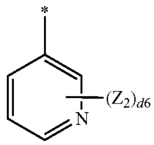
4-3
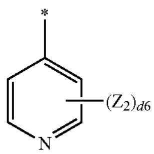
4-4
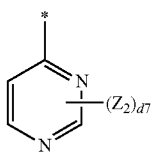
4-5
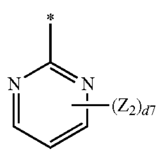
4-6
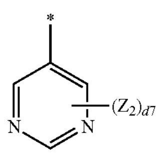
4-7
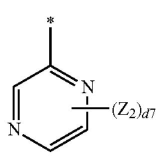
4-8
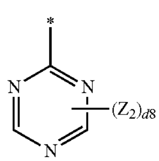
4-9
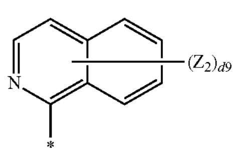
-continued
4-10
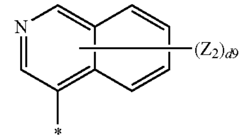
4-11
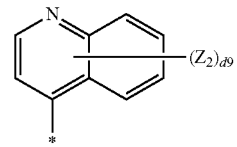
4-12
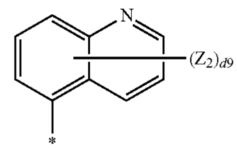
4-13
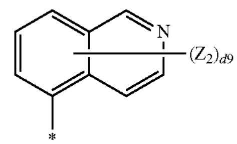
4-14
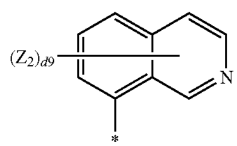
4-15
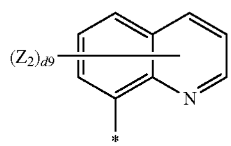
4-16
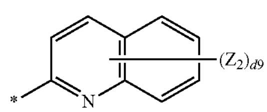
4-17
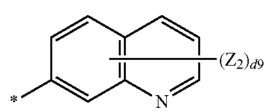
4-18
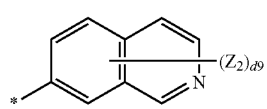
4-19
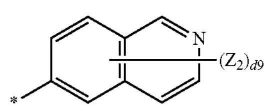
4-20
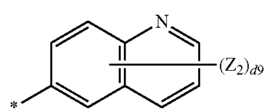
4-21
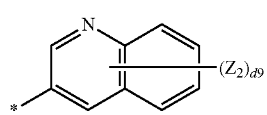

-continued
4-22
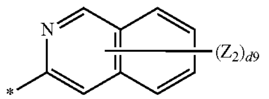
4-23
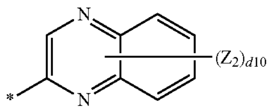
4-24
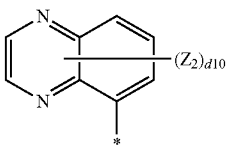
4-25
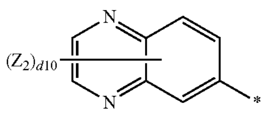
4-26
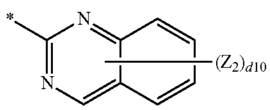
4-27
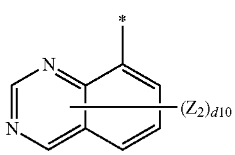
4-28
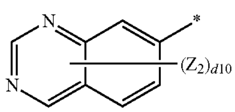
4-29
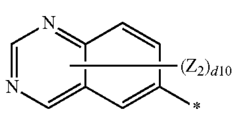
4-30
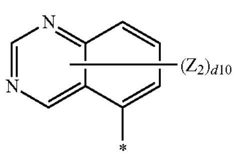
4-31
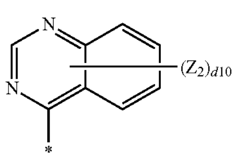
4-32
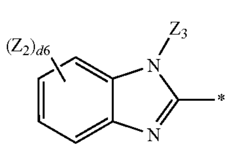
-continued
4-33
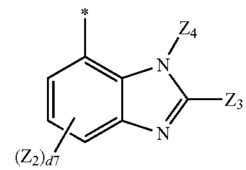
4-34
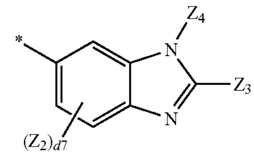
4-35
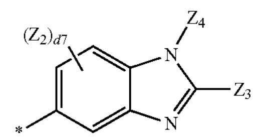
4-36
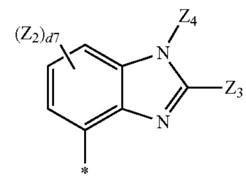
4-37
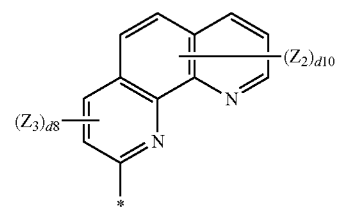
4-38
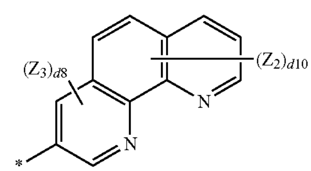
4-39
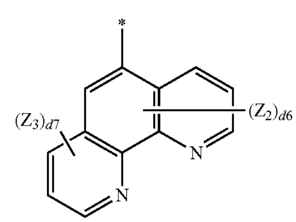
4-40
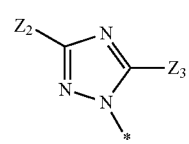
4-41
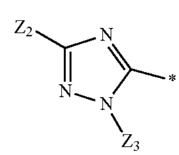

-continued
4-42
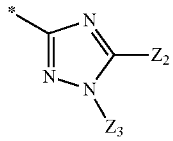
4-43
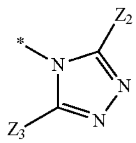
4-44
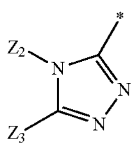
4-45
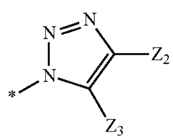
4-46
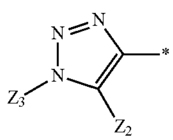
4-47
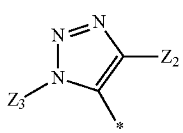
6-1
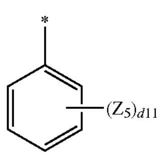
6-2
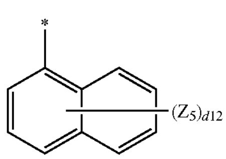
6-3
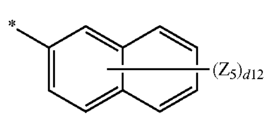
6-4
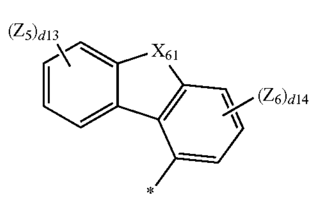
-continued
6-5
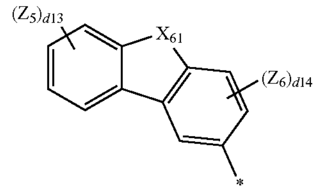
6-6
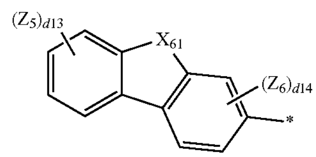
6-7
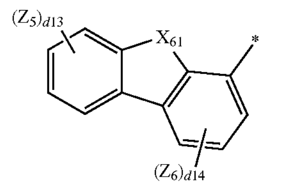
6-8
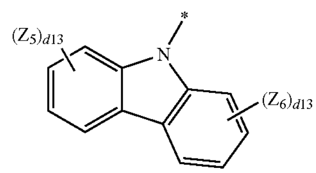
6-9
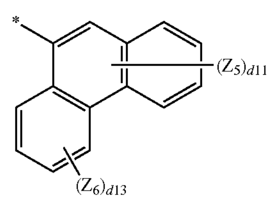
6-10
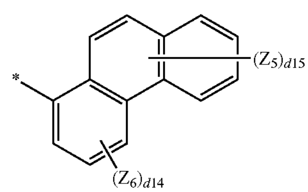
6-11
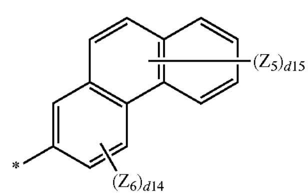
6-12
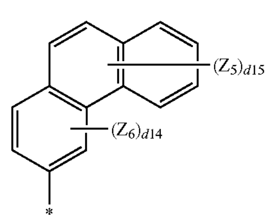

-continued 6-13

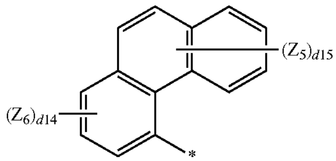

6-14

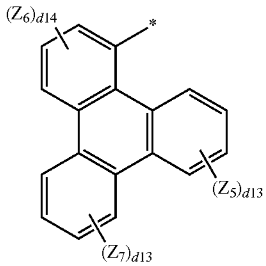

6-15

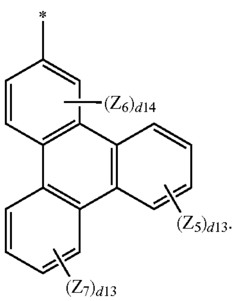

In Formulae 4-1 to 4-47 and Formulae 6-1 to 6-15, $X_{61}$ may be selected from $C(Q_1)(Q_2)$, $N(Q_1)$, an oxygen atom (O), and a sulfur atom (S);

$Q_1$ and $Q_2$ may be each independently selected from a hydrogen, a methyl group, and a phenyl group;

$Z_2$ to $Z_7$ may be each independently selected from a hydrogen, a deuterium, a phenyl group, a biphenyl group, a naphthyl group, a pyridinyl group, a pyrimidinyl group, and a triazinyl group;

d6 and d13 may be each independently selected from 1, 2, 3, and 4;

d7 and d14 may be each independently selected from 1, 2, and 3;

d8 may be selected from 1 and 2;

d9 and d15 may be each independently selected from 1, 2, 3, 4, 5 and 6;

d10 and d11 may be each independently selected from 1, 2, 3, 4, and 5;

d12 may be selected from 1, 2, 3, 4, 5, 6, and 7; and

* indicates a binding site to a neighboring atom.

In some embodiments, $R_{21}$ and $R_{91}$ to $R_{94}$ in the formulae above may be each independently selected from Formulae 4-1 to 4-47 and Formulae 6-1 to 6-15:

4-1

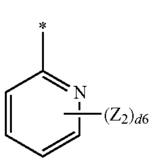

-continued 4-2

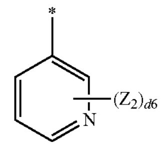

4-3

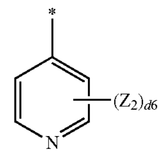

4-4

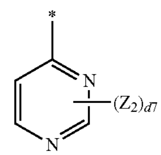

4-5

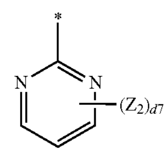

4-6

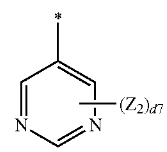

4-7

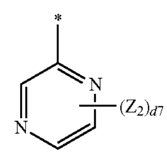

4-8

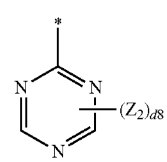

4-9

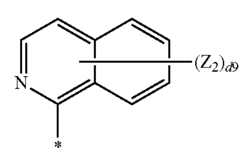

4-10

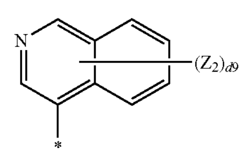

4-11

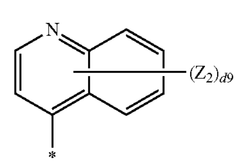

-continued
4-12
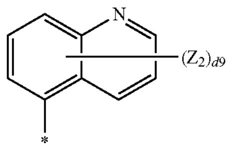
4-13
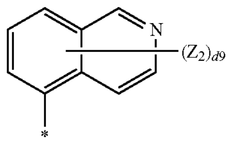
4-14
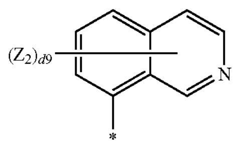
4-15
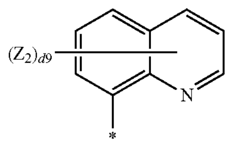
4-16
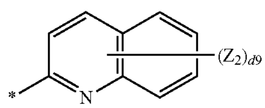
4-17
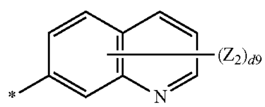
4-18
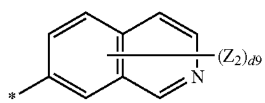
4-19
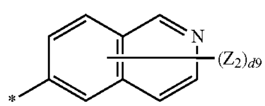
4-20
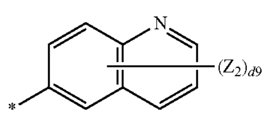
4-21
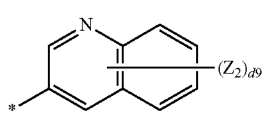
4-22
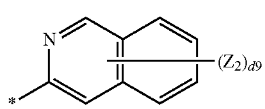
4-23
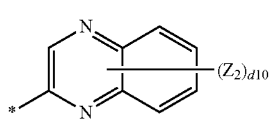
-continued
4-24
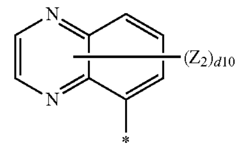
4-25
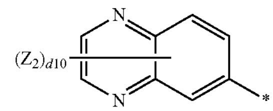
4-26
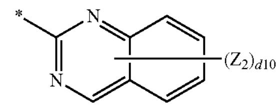
4-27
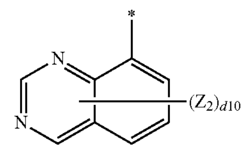
4-28
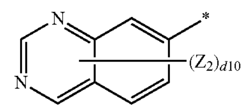
4-29
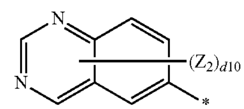
4-30
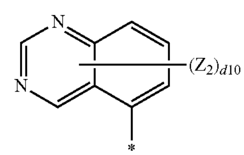
4-31
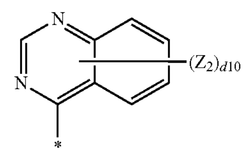
4-32
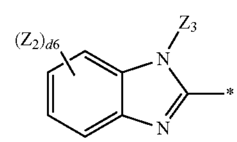
4-33
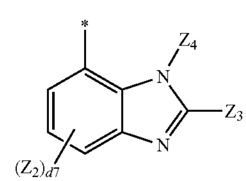
4-34
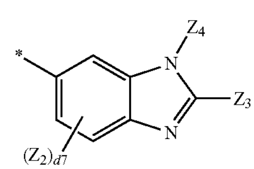

-continued
4-35
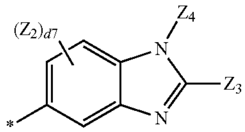
4-36
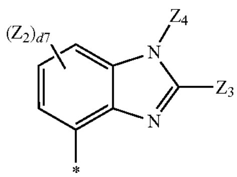
4-37
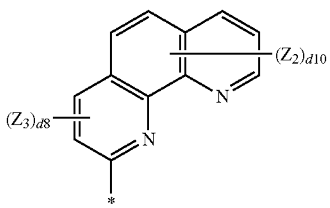
4-38
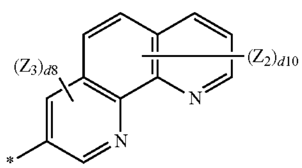
4-39
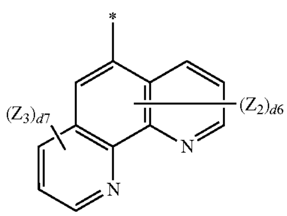
4-40
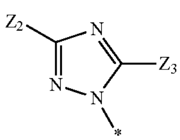
4-41
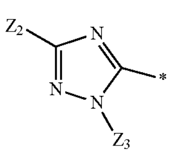
4-42
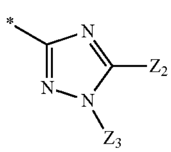
4-43
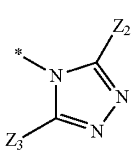
-continued
4-44
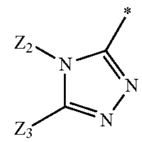
4-45
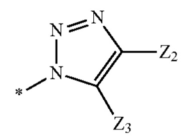
4-46
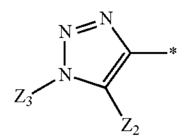
4-47
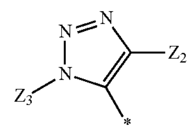
6-1
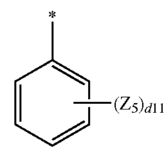
6-2
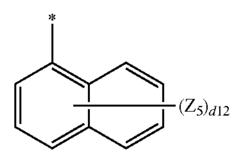
6-3
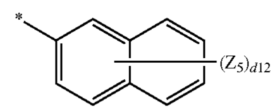
6-4
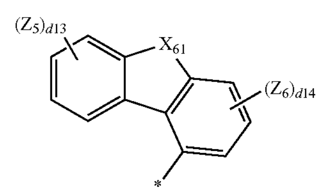
6-5
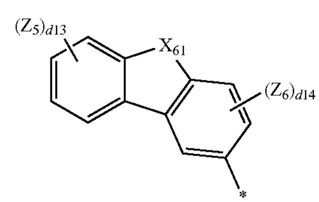
6-6
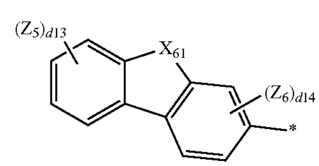

-continued 6-7

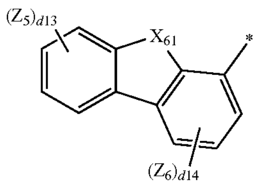

6-8

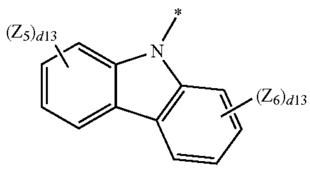

6-9

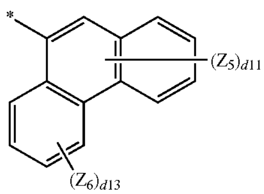

6-10

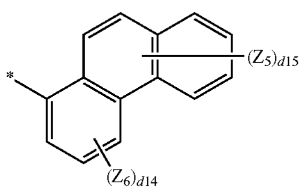

6-11

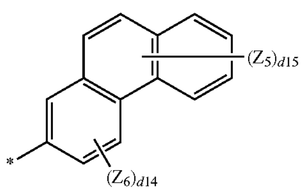

6-12

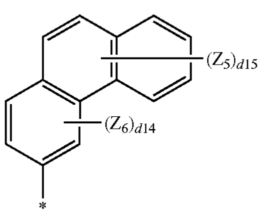

6-13

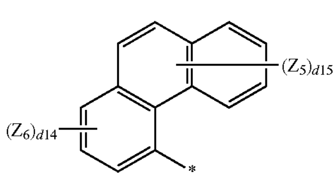

6-14

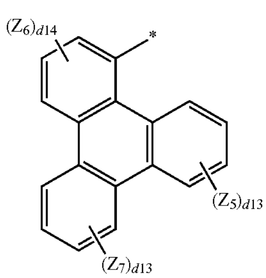

-continued 6-15

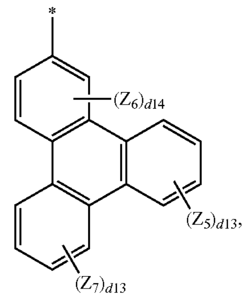

where, in Formulae 4-1 to 4-47 and 6-1 to 6-15, $X_{61}$ may be selected from $C(Q_1)(Q_2)$, $N(Q_1)$, an oxygen atom (O), and a sulfur atom (S);

$Q_1$ and $Q_2$ may be each independently selected from a methyl group and a phenyl group;

$Z_2$ to $Z_7$ may be each independently selected from a hydrogen, a phenyl group, a biphenyl group, and a naphthyl group;

d6 and d13 may be each independently selected from 1, 2, 3, and 4;

d7 and d14 may be each independently selected from 1, 2, and 3;

d8 may be selected from 1 and 2;

d9 and d15 may be each independently selected from 1, 2, 3, 4, 5 and 6;

d10 and d11 may be each independently selected from 1, 2, 3, 4, and 5;

d12 may be selected from 1, 2, 3, 4, 5, 6, and 7; and

* indicates a binding site to a neighboring atom.

In some embodiments, $R_{21}$ and $R_{91}$ to $R_{94}$ in the formulae above may be each independently selected from Formulae 5-1 to 5-143 below and Formulae 7-1 to 7-35 below, but embodiments of the present invention are not limited thereto:

5-1

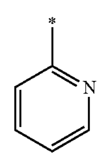

5-2

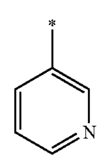

5-3

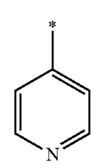

5-4

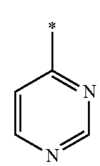

5-5
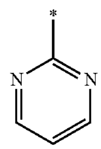
5-6
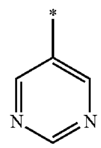
5-7
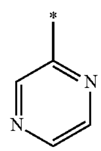
5-8
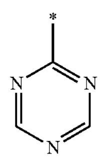
5-9
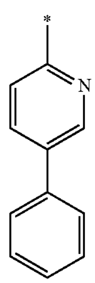
5-10
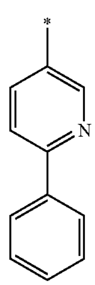
5-11
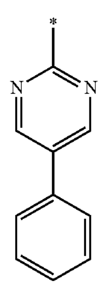
5-12
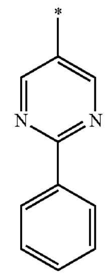
5-13
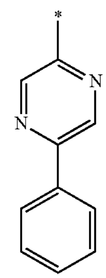
5-14
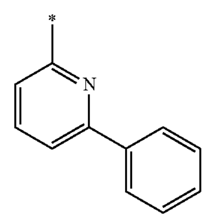
5-15
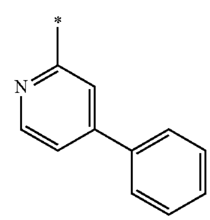
5-16
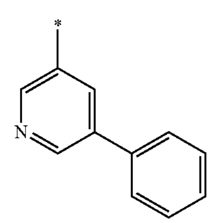
5-17
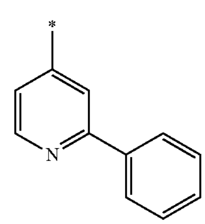

-continued
5-18
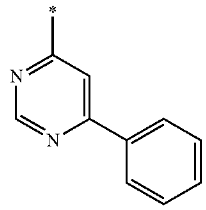
5-19
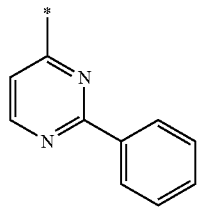
5-20
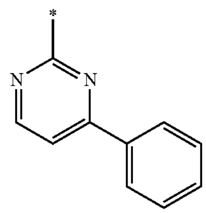
5-21
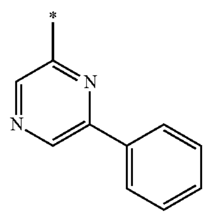
5-22
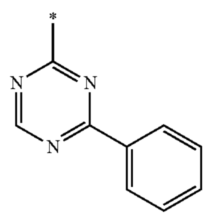
5-23
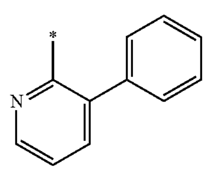
5-24
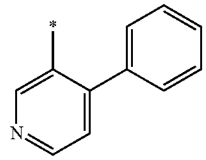
5-25
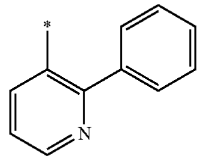
-continued
5-26
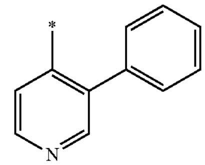
5-27
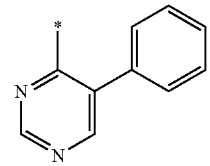
5-28
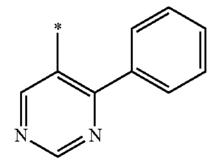
5-29
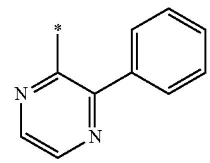
5-30
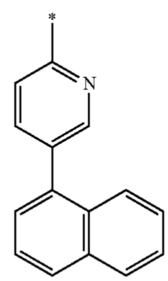
5-31
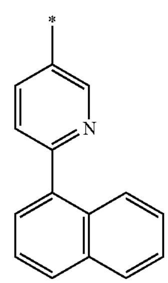
5-32
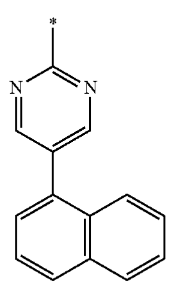

-continued
5-33
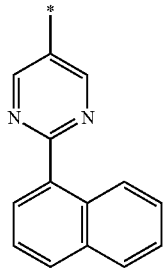
5-34
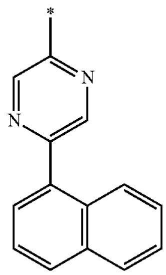
5-35
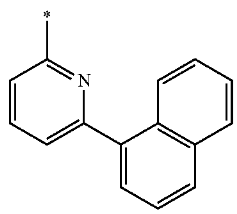
5-36
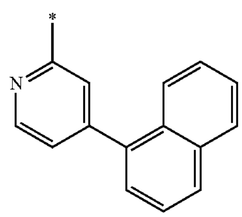
5-37
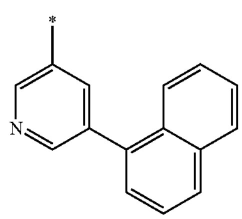
5-38
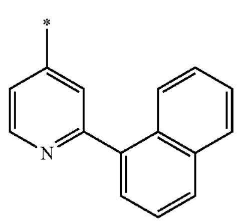
5-39
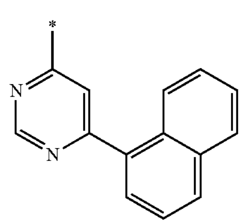
-continued
5-40
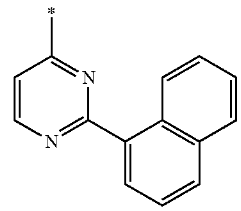
5-41
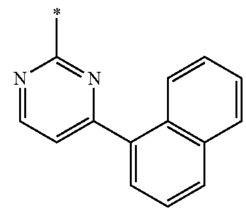
5-42
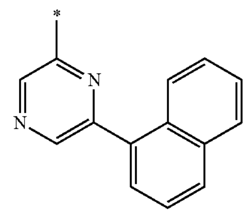
5-43
5-44
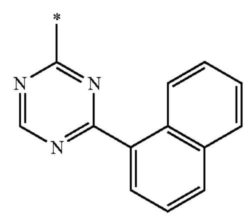
5-45
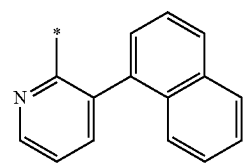
5-46
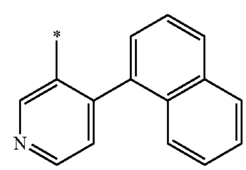
5-47
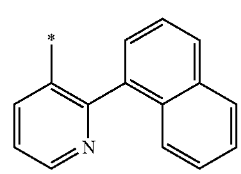
5-48
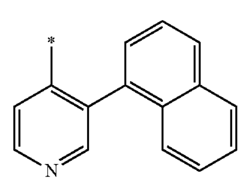

5-49
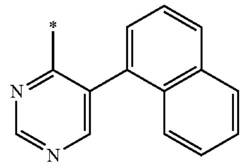
5-50
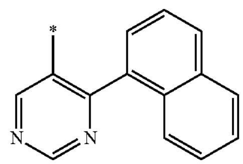
5-51
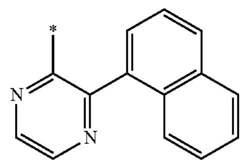
5-52
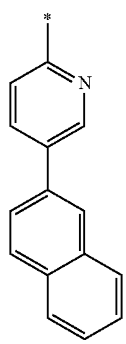
5-53
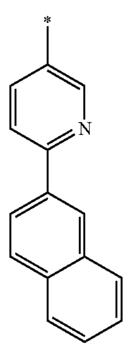
5-54
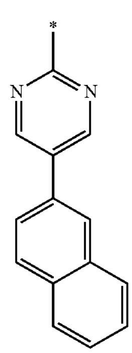
5-55
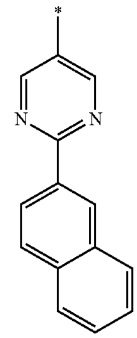
5-56
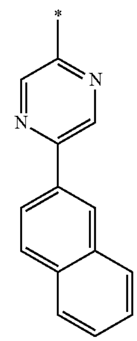
5-57
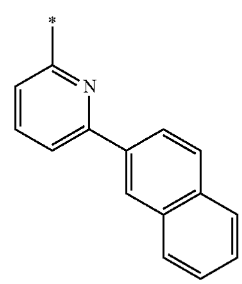
5-58
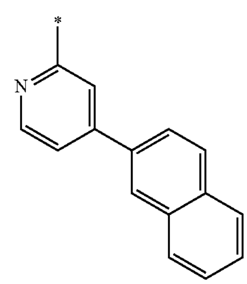
5-59
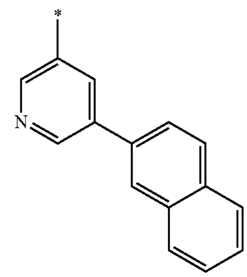

-continued
5-60
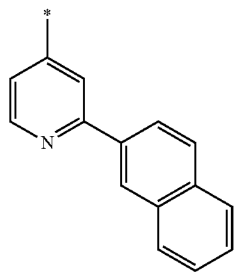
5-61
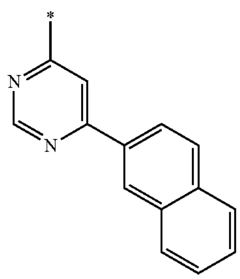
5-62
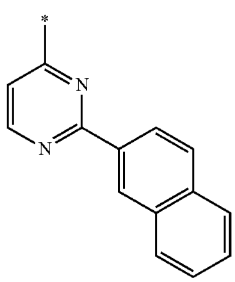
5-63
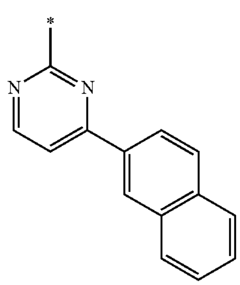
5-64
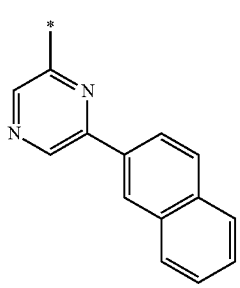
-continued
5-65
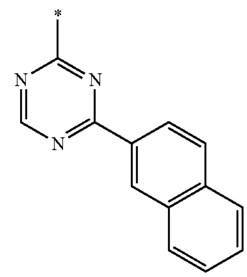
5-66
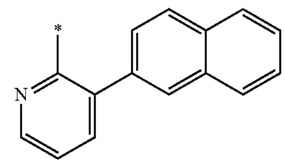
5-67
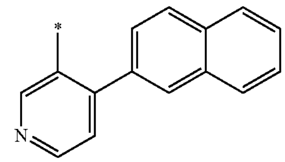
5-68
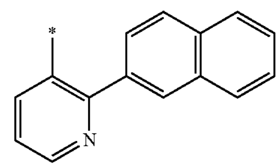
5-69
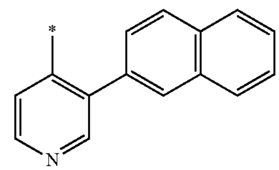
5-70
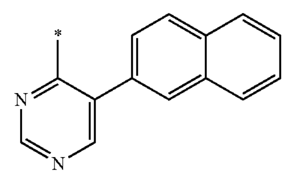
5-71
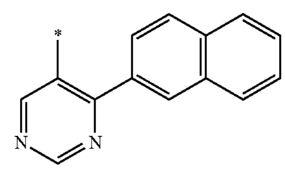
5-72
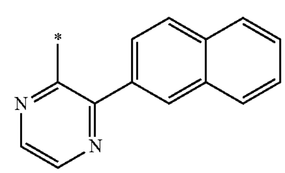

-continued
5-73
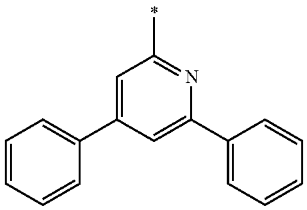
5-74
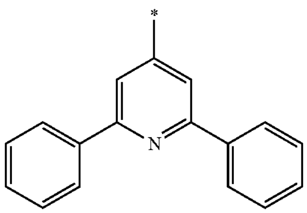
5-75
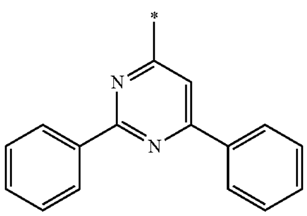
5-76
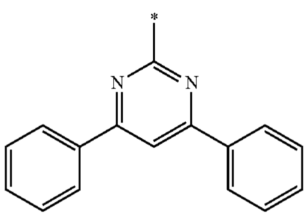
5-77
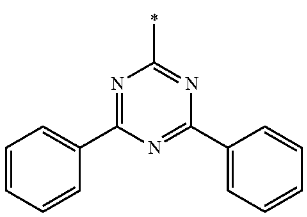
5-78
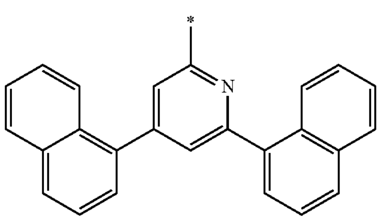
5-79
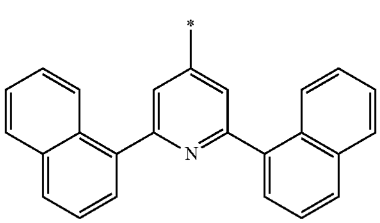
-continued
5-80
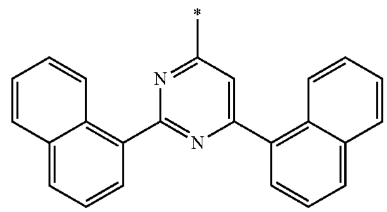
5-81
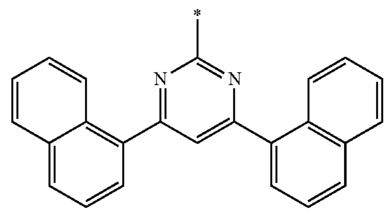
5-82
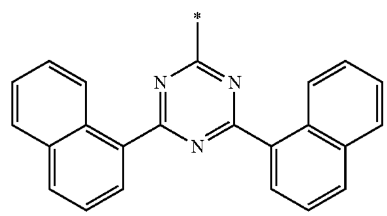
5-83
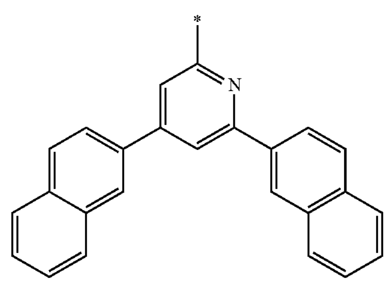
5-84
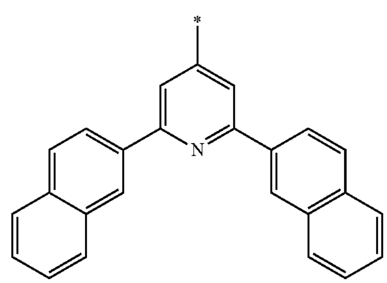
5-85
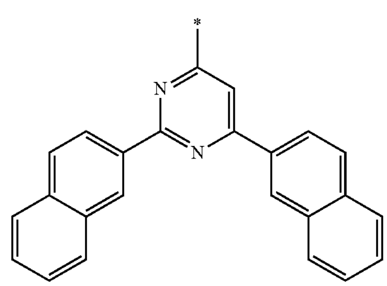

-continued
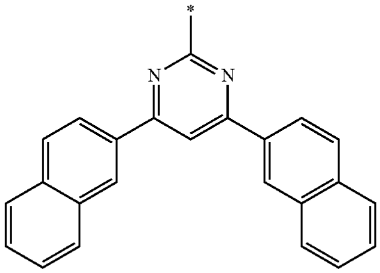
5-86
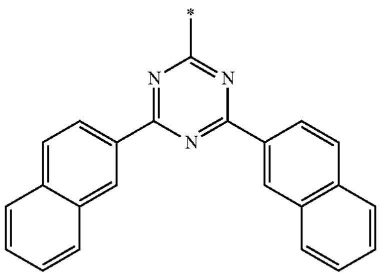
5-87
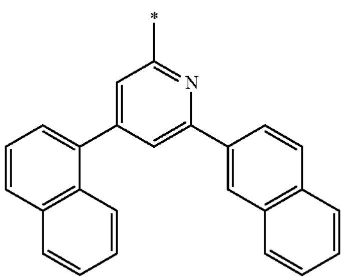
5-88
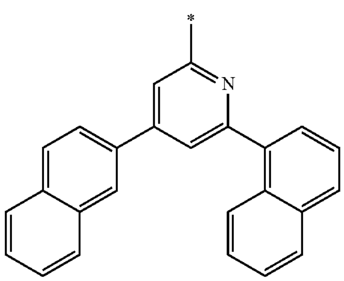
5-89
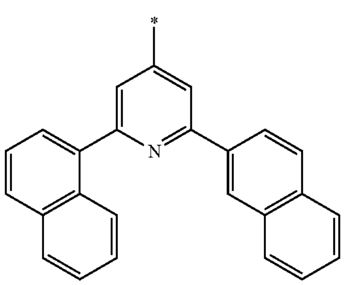
5-90
-continued
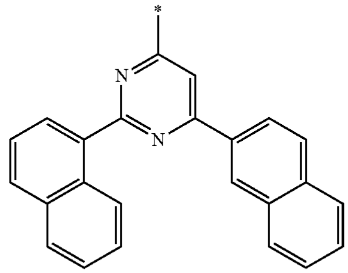
5-91
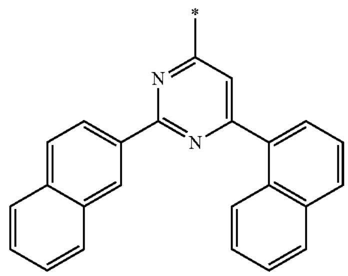
5-92
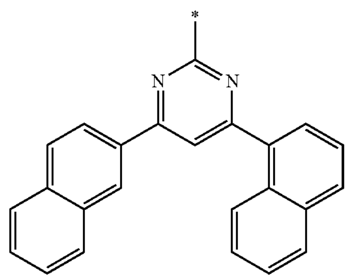
5-93
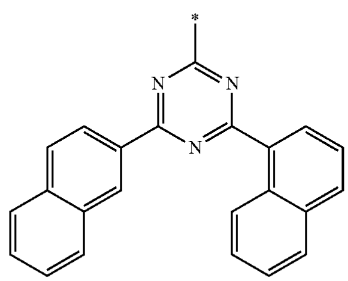
5-94
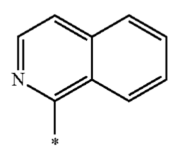
5-95
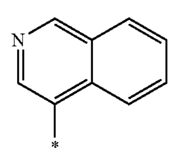
5-96
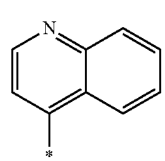
5-97

-continued
5-98
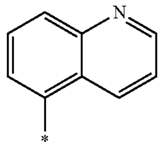
5-99
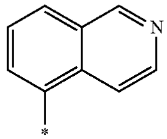
5-100
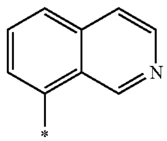
5-101
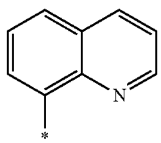
5-102
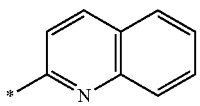
5-103
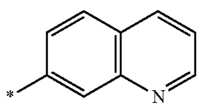
5-104
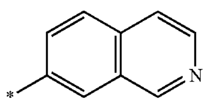
5-105
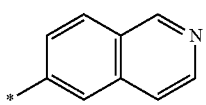
5-106
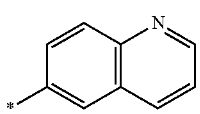
5-107
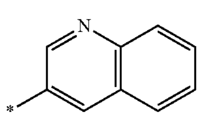
5-108
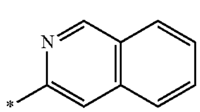
5-109
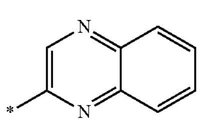
-continued
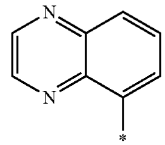
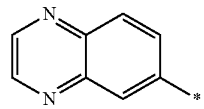
5-112
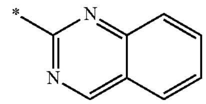
5-113
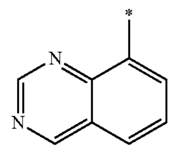
5-114
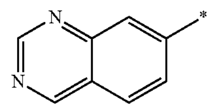
5-115
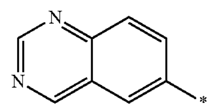
5-116
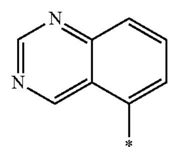
5-117
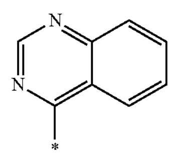
5-118
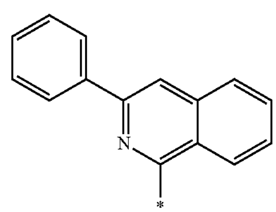
5-119
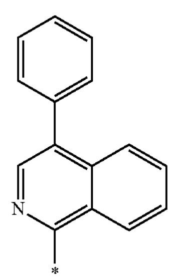

-continued
5-120
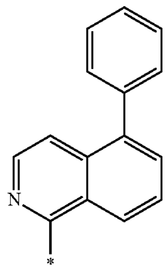
5-121
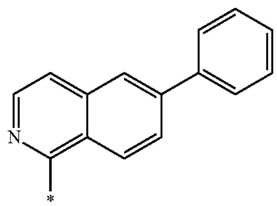
5-122
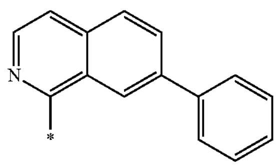
5-123
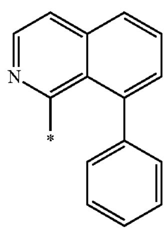
5-124
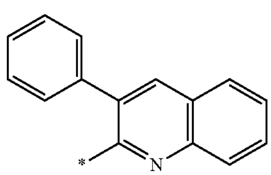
5-125
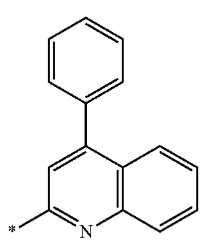
5-126
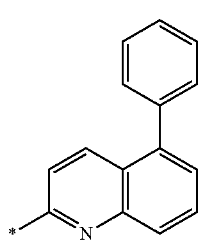
-continued
5-127
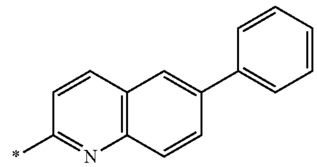
5-128
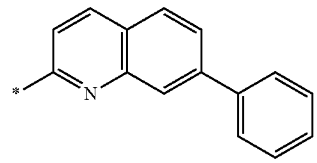
5-129
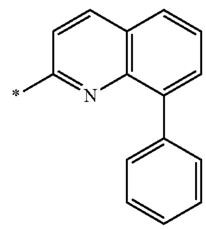
5-130
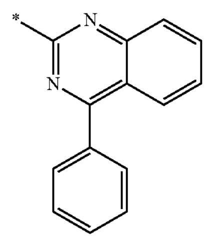
5-131
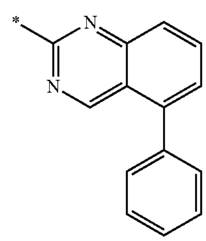
5-132
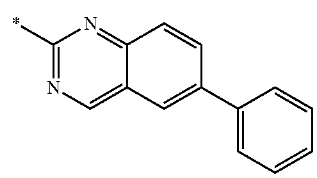
5-133
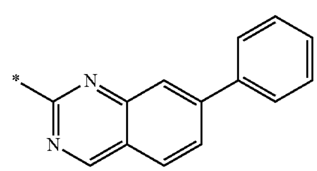
5-134
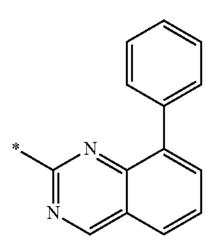

-continued
5-135
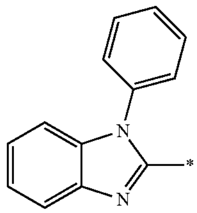
5-136
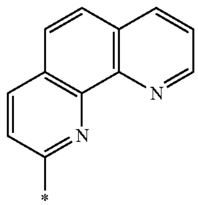
5-137
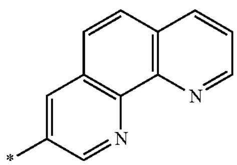
5-138
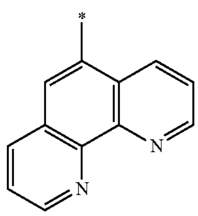
5-139
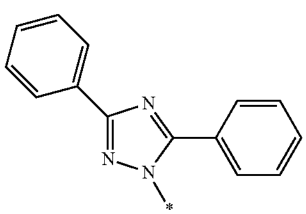
5-140
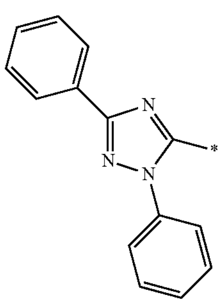
5-141
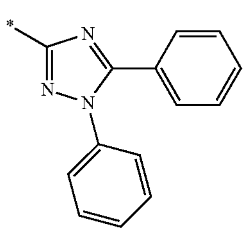
-continued
5-142
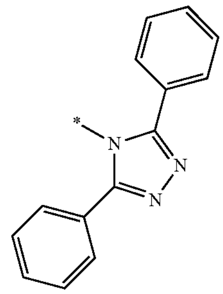
5-143
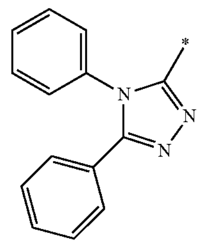
7-1
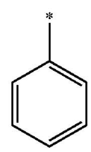
7-2
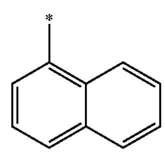
7-3
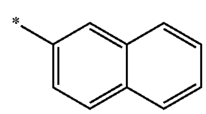
7-4
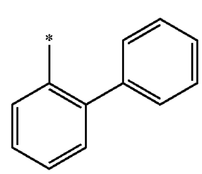
7-5
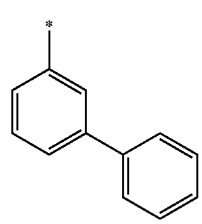

-continued
7-6
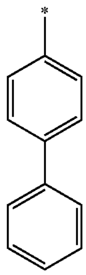
7-7
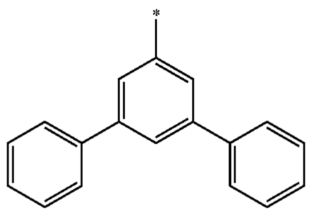
7-8
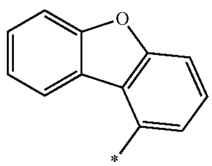
7-9
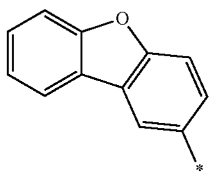
7-10
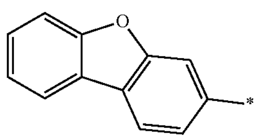
7-11
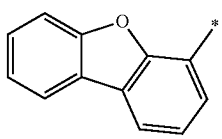
7-12
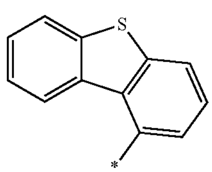
7-13
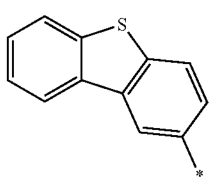
7-14
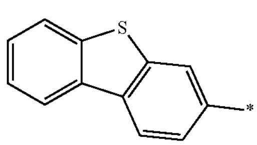
-continued
7-15
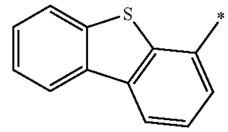
7-16
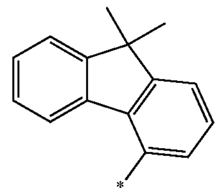
7-17
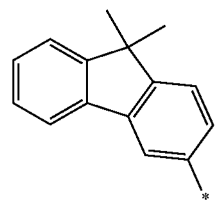
7-18
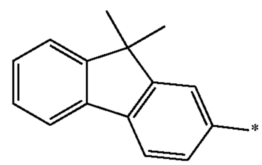
7-19
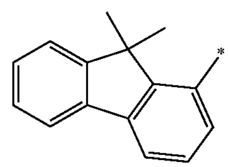
7-20
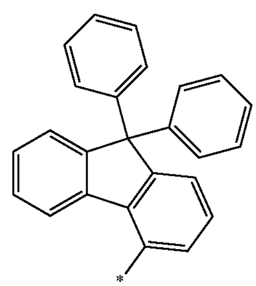
7-21
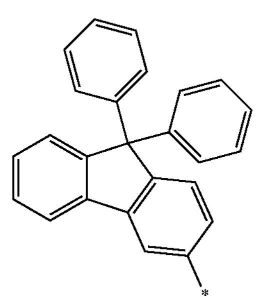

-continued
7-22
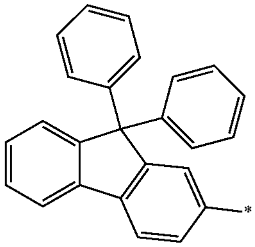
7-23
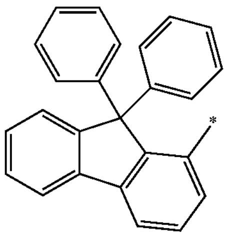
7-24
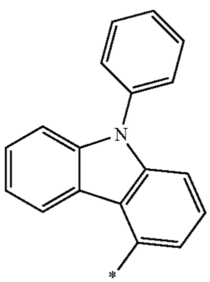
7-25
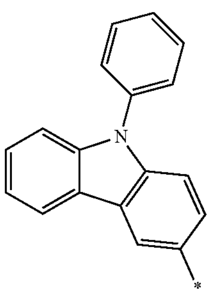
7-26
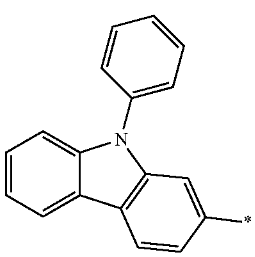
7-27
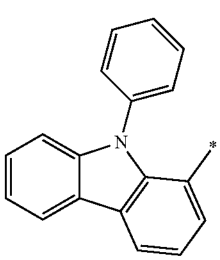
-continued
7-28
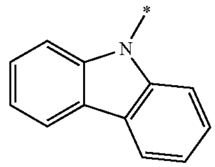
7-29
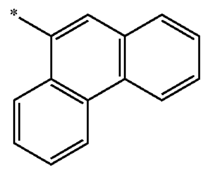
7-30
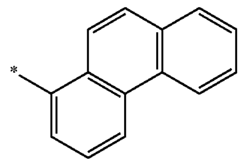
7-31
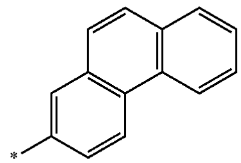
7-32
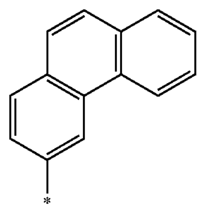
7-33
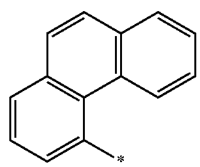
7-34
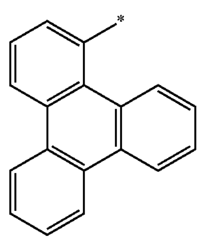
7-35
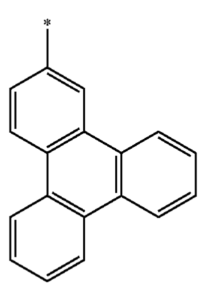

In Formulae 5-1 to 5-143 and 7-1 to 7-35,

* indicates a binding site to a neighboring atom.

In some embodiments, the organic layer includes a first material and a second material, and the first material may be represented by any one of Formulae 1-1 to 1-12; and the second material may be represented by any one of Formulae 2-1 to 2-18. However, embodiments of the present invention are not limited thereto:

1-1

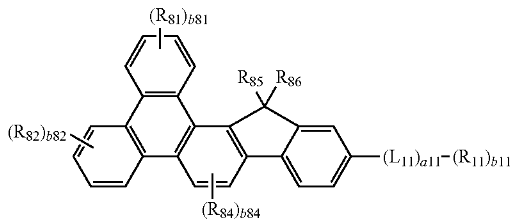

1-2

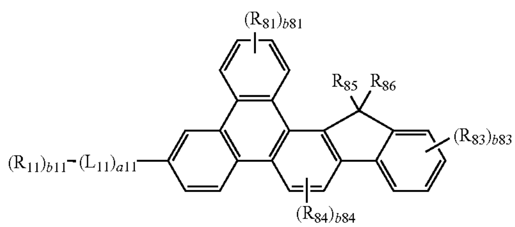

1-3

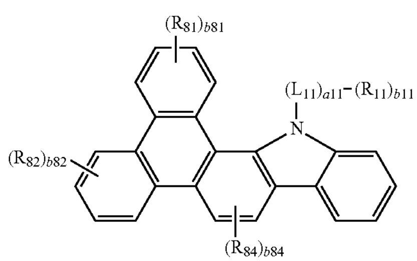

1-4

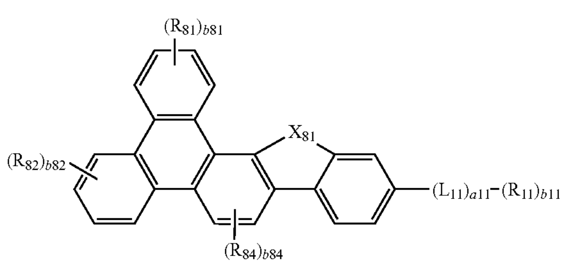

1-5

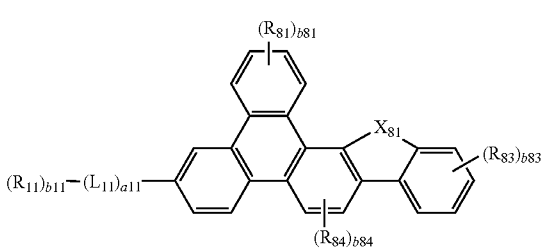

-continued 1-6

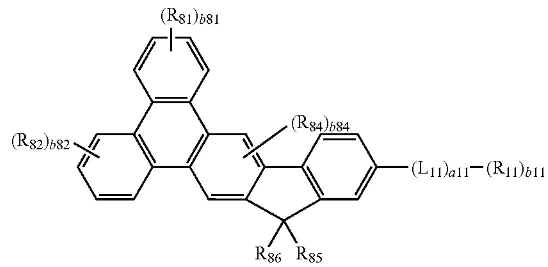

1-7

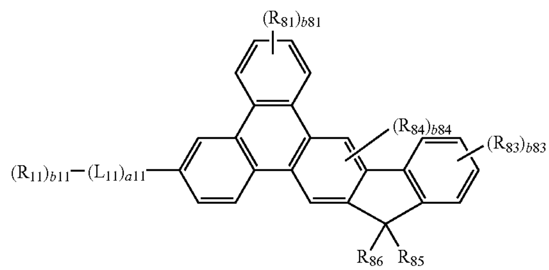

1-8

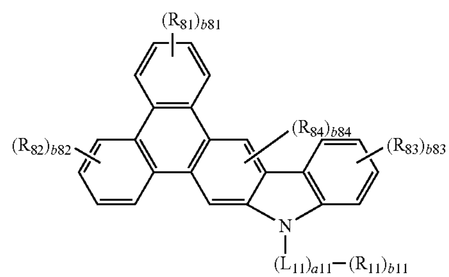

1-9

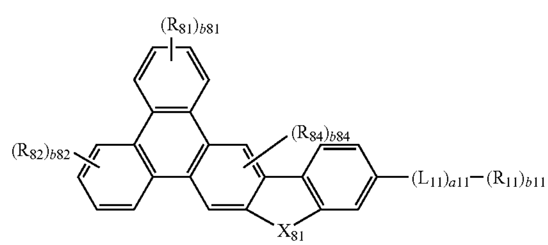

1-10

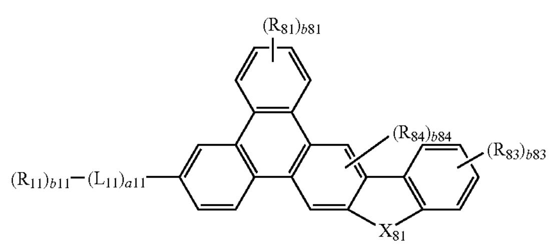

1-11

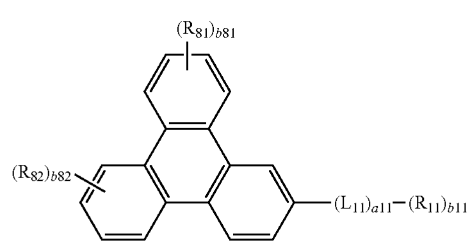

-continued
1-12
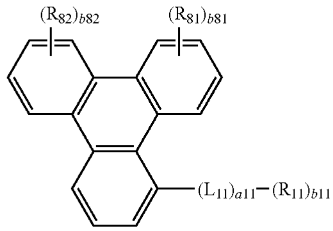
2-1
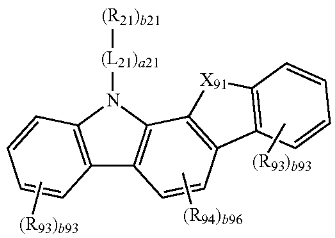
2-2
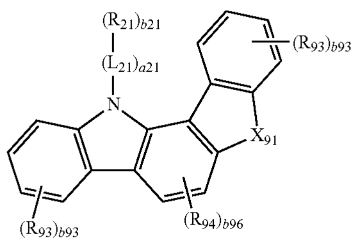
2-3
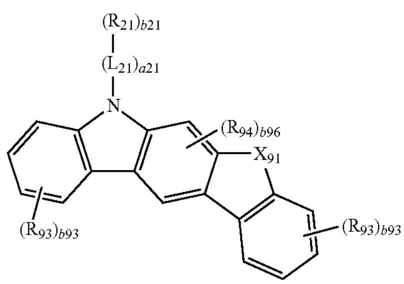
2-4
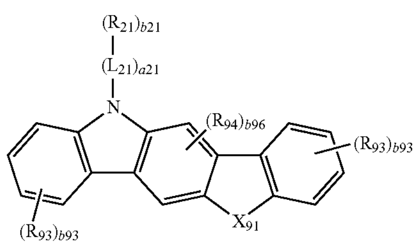
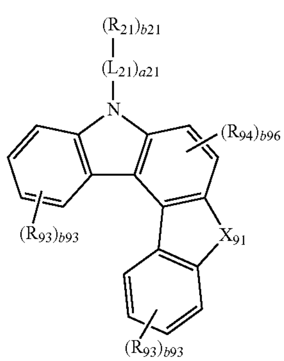
-continued
2-6
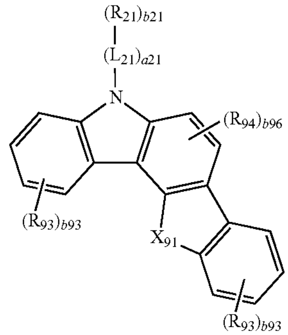
2-7
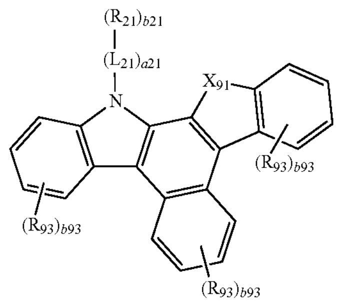
2-8
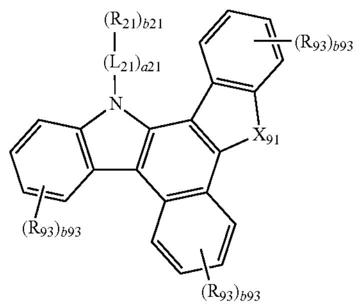
2-9
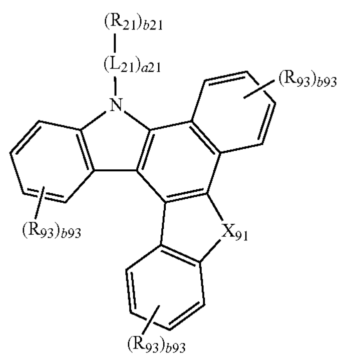
2-10
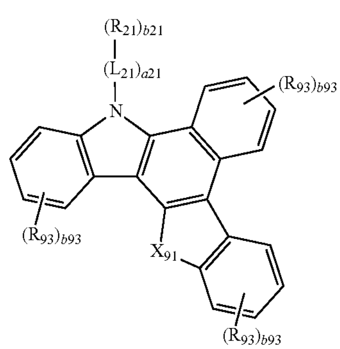

-continued 2-11

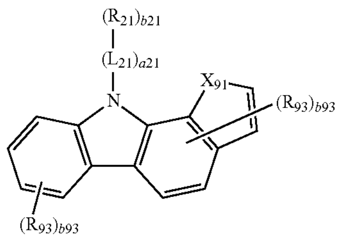

2-12

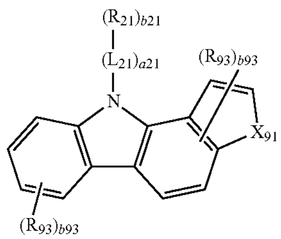

2-13

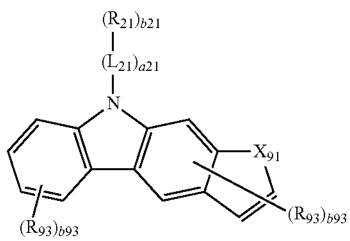

2-14

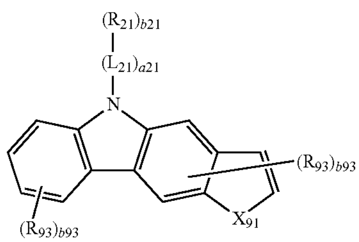

2-15

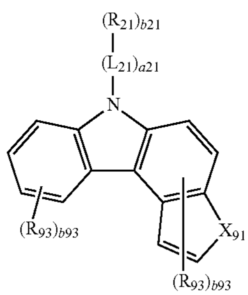

2-16

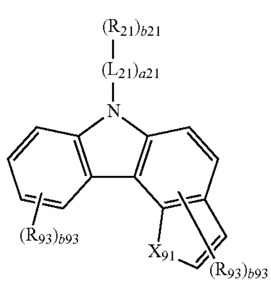

-continued 2-17

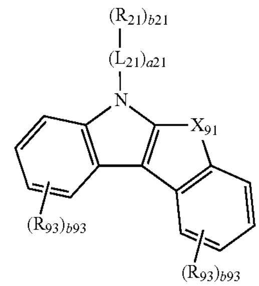

2-18

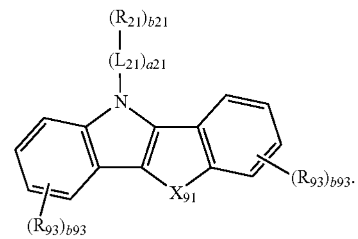

In Formulae 1-1 to 1-12 and 2-1 to 2-18, $X_{81}$, $X_{91}$, $L_{11}$, $L_{21}$, a11, a21, $R_{11}$, b11, $R_{81}$ to $R_{86}$, b81 to b84, $R_{21}$, $R_{91}$ to $R_{94}$, b21, and b91 to b96 are as described above.

In some embodiments, the organic layer includes a first material and a second material, and the first material may be selected from Compounds 1 to 140 below, and the second material may be selected from Compounds 200 to 371, but embodiments of the present invention are not limited thereto:

1

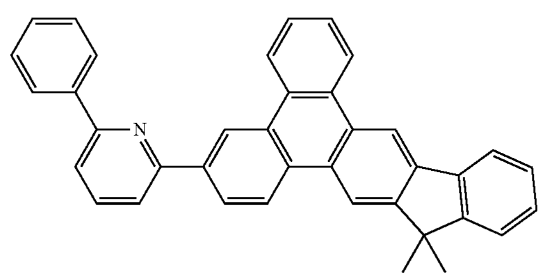

2

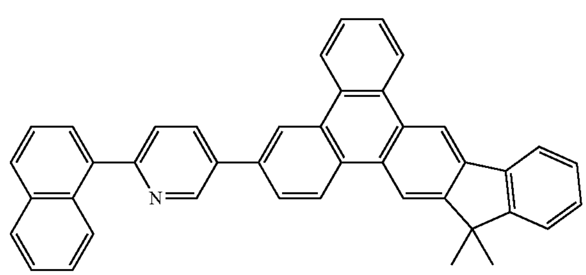

-continued
3
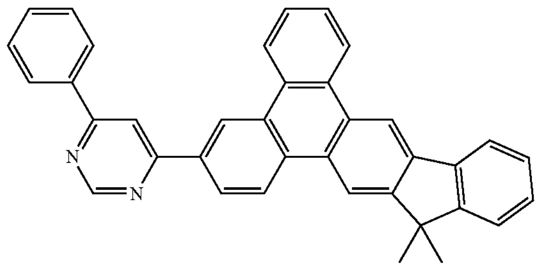
4
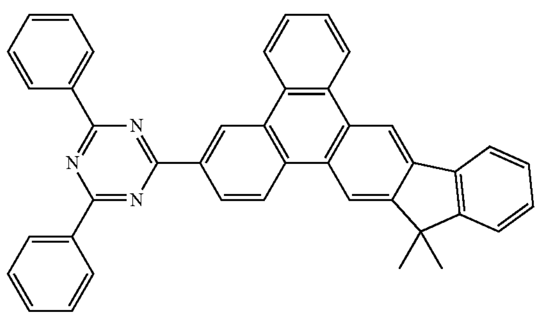
5
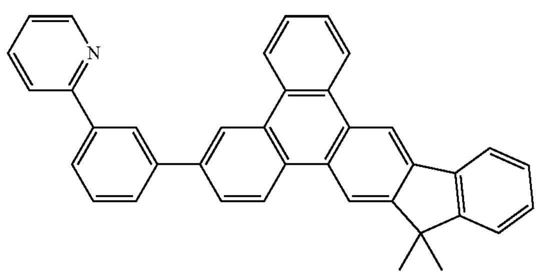
6
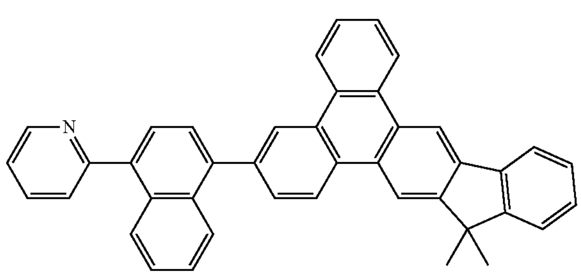
7
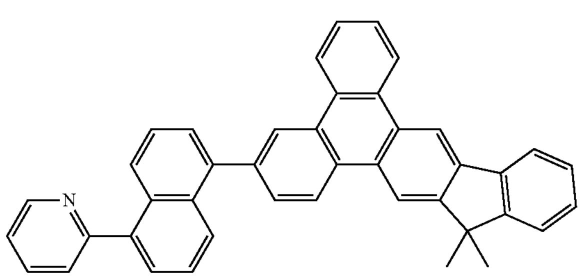
-continued
8
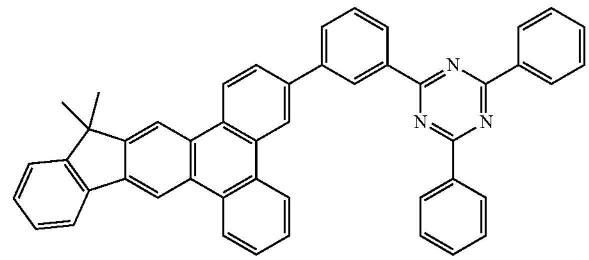
9
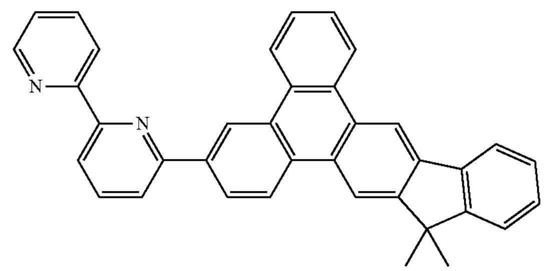
10
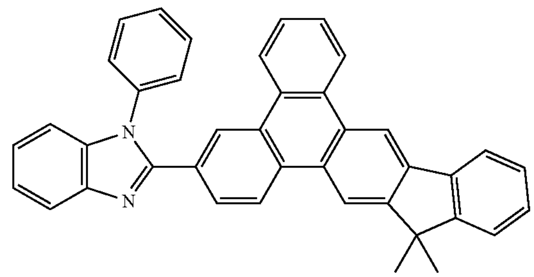
11
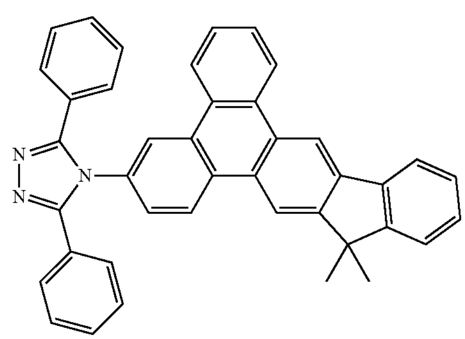
12
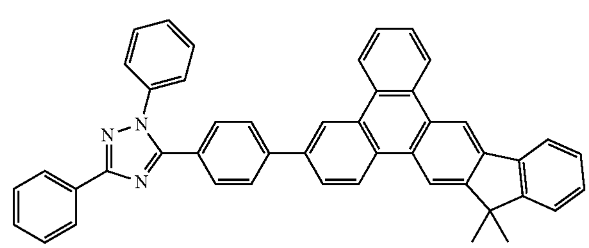

13
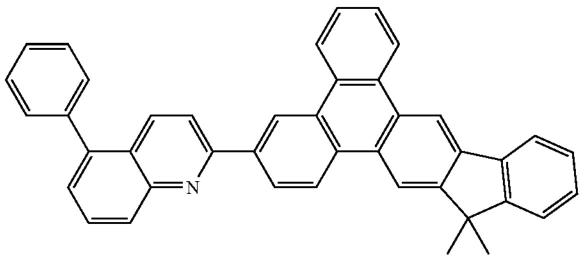
14
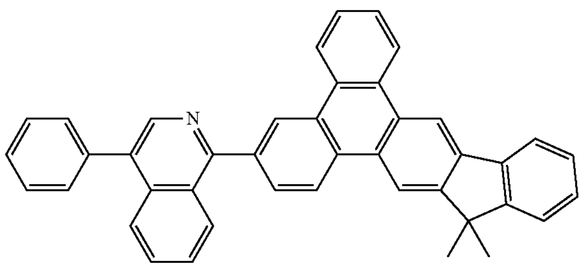
15
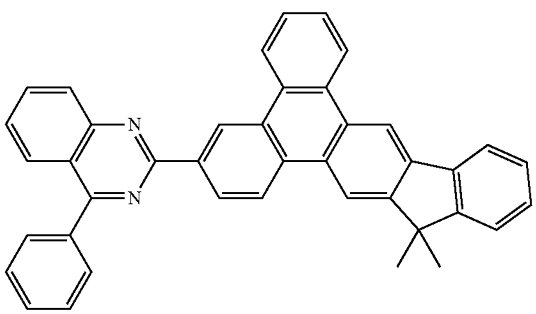
16
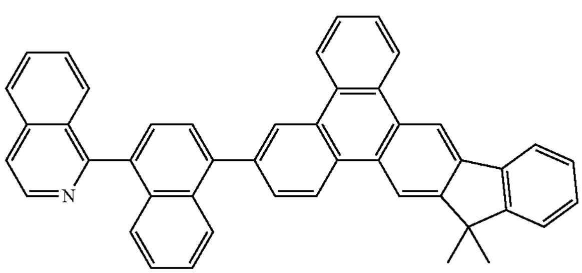
17
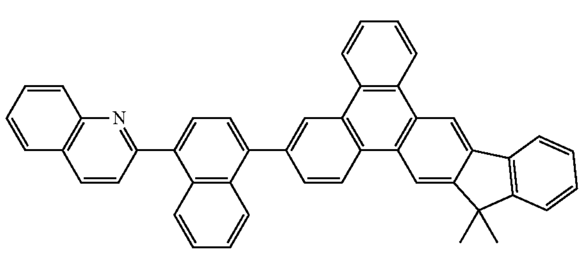
18
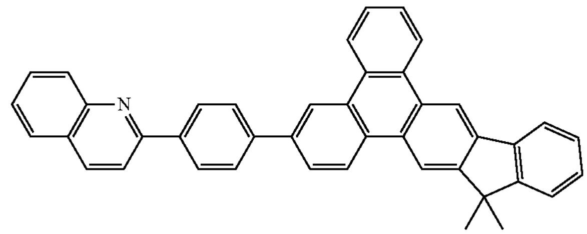
19
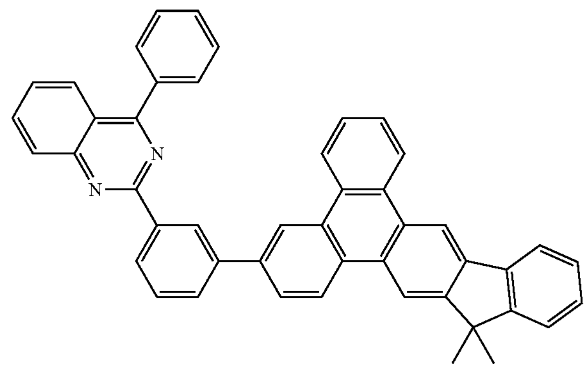
20
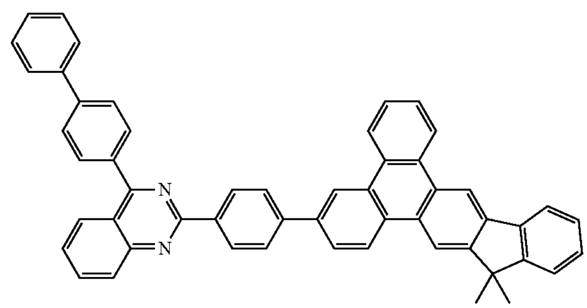
21
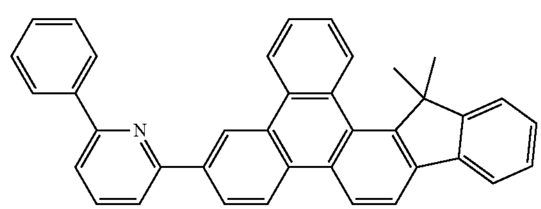
22
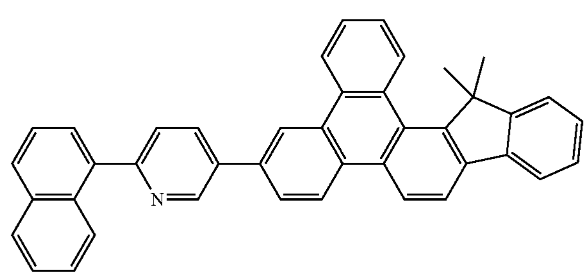

-continued
23
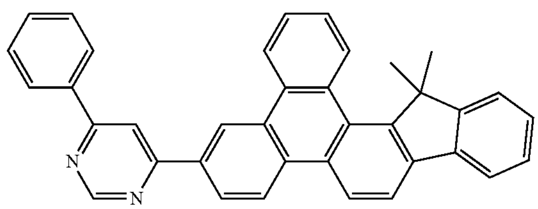
24
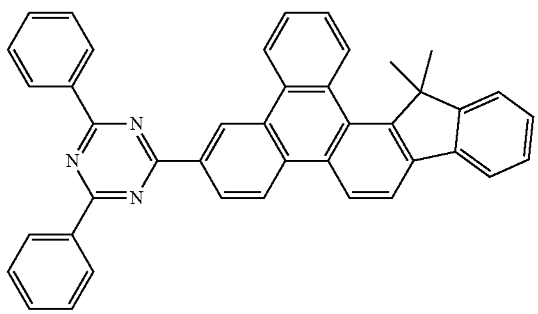
25
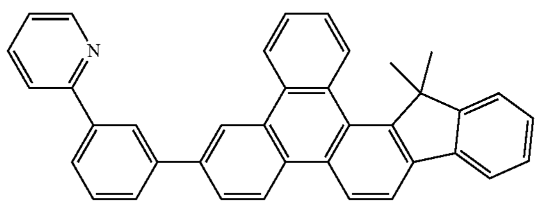
26
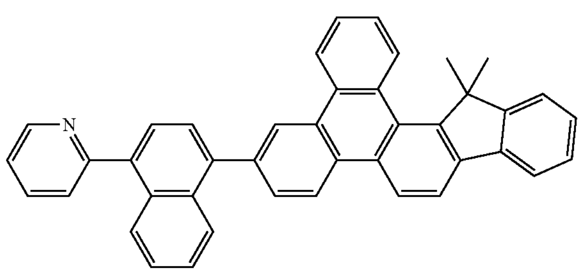
27
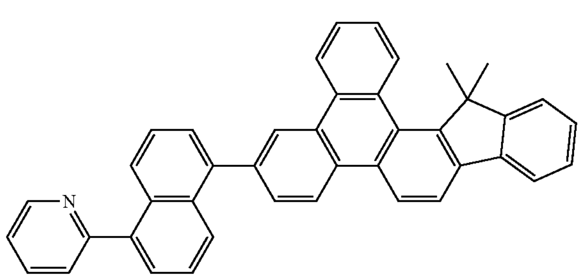
-continued
28
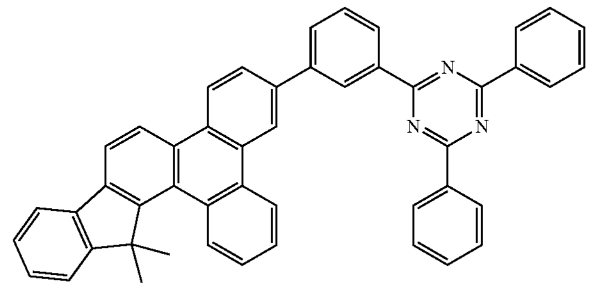
29
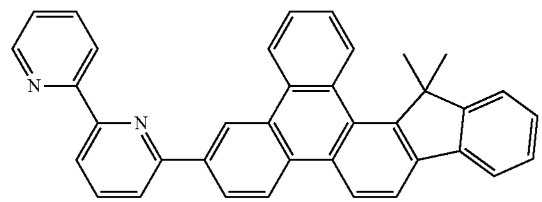
30
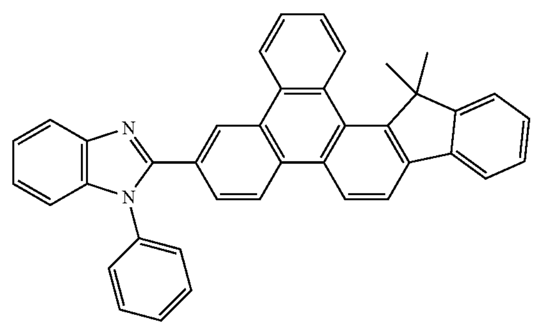
31
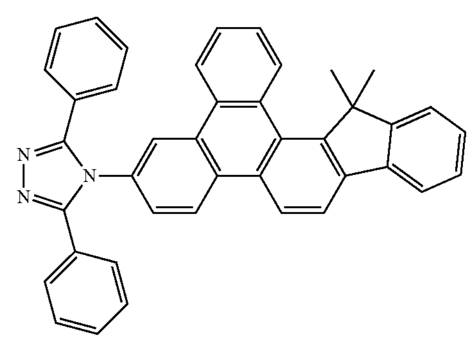
32
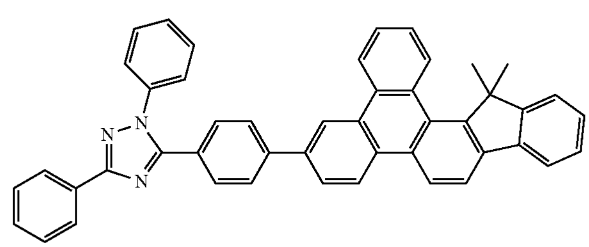

-continued
33
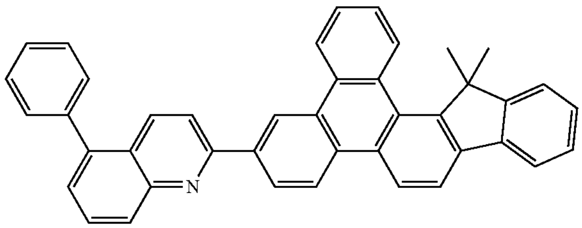
34
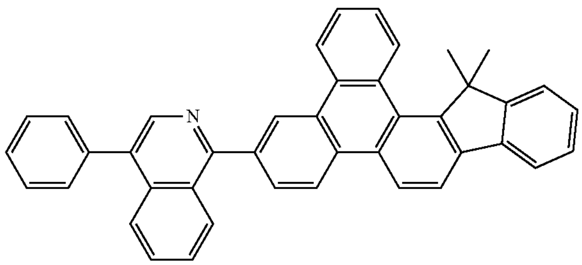
35
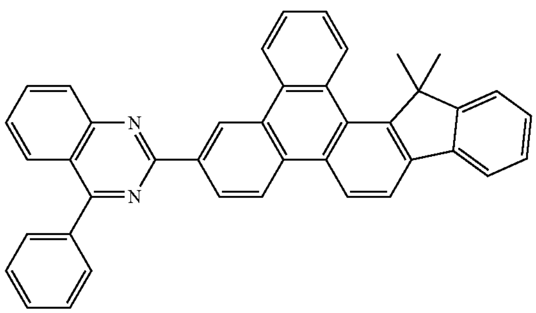
36
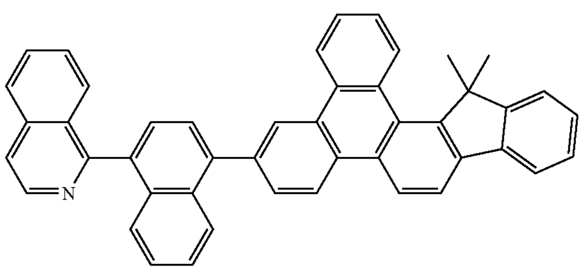
37
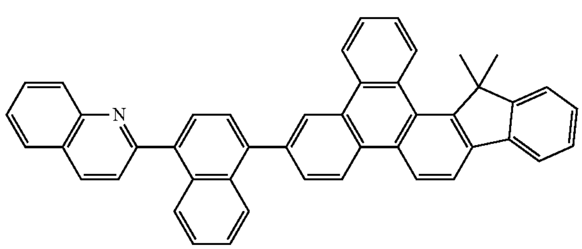
38
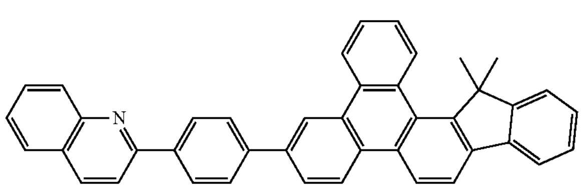
-continued
39
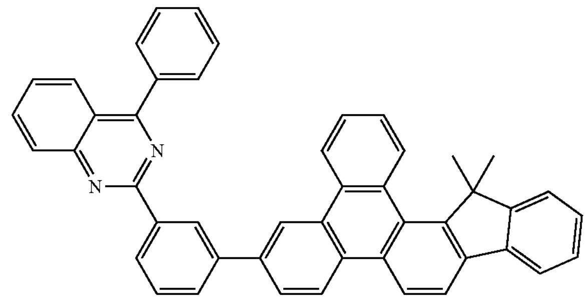
40
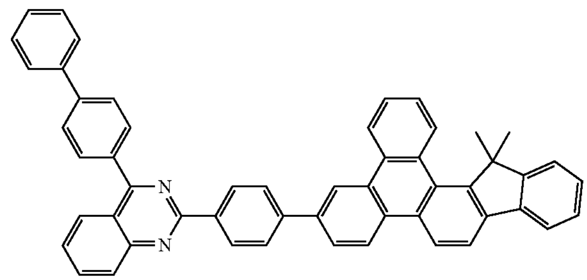
41
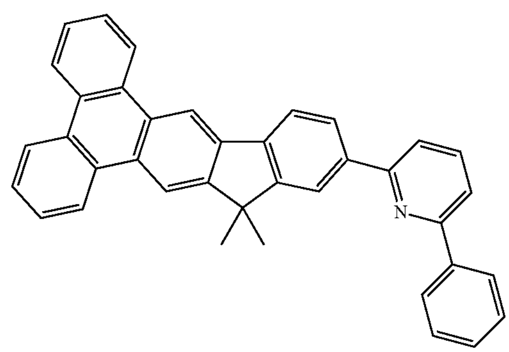
42
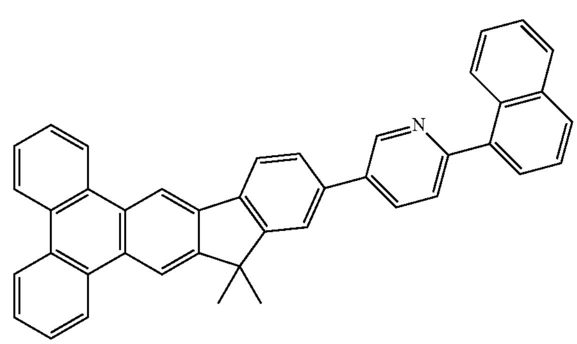

43
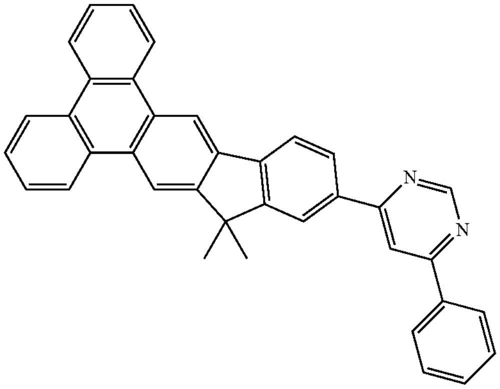
44
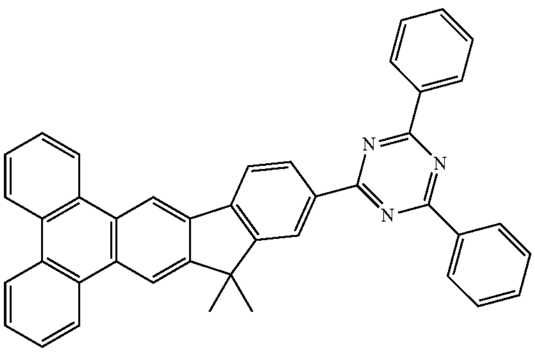
45
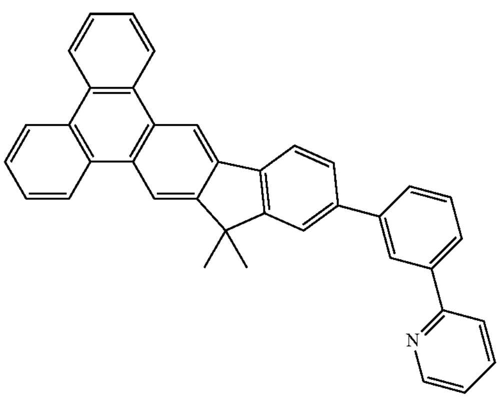
46
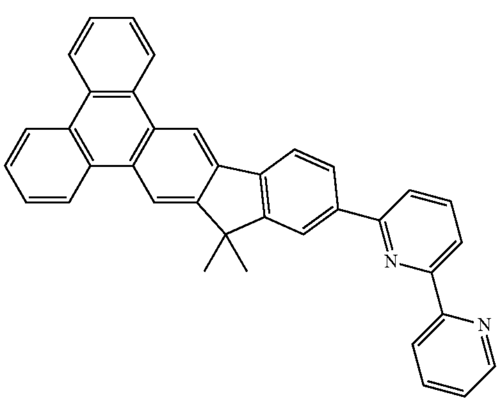
47
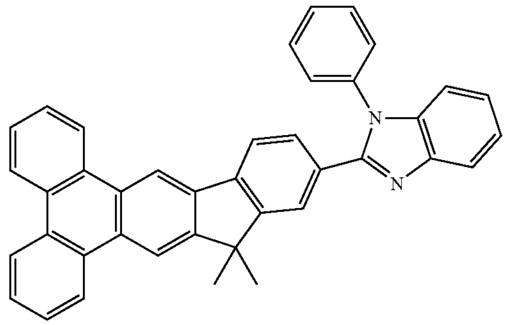
48
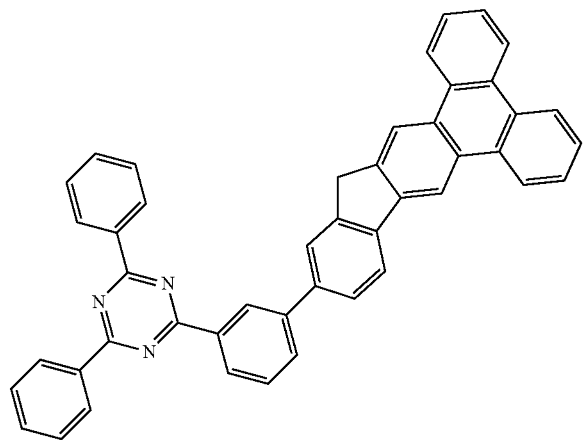
49
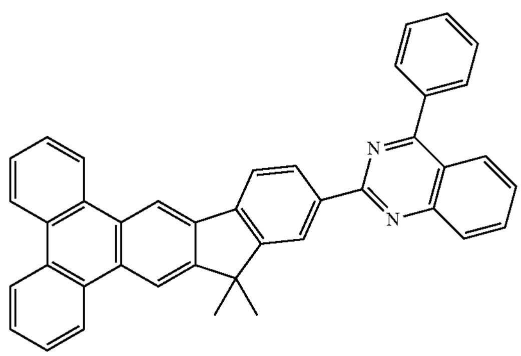
50
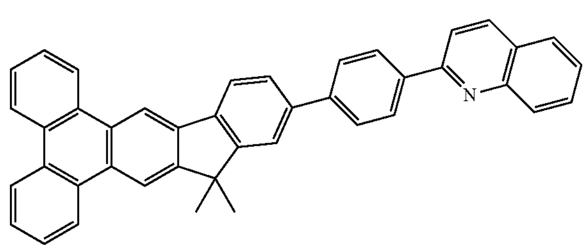

-continued
51
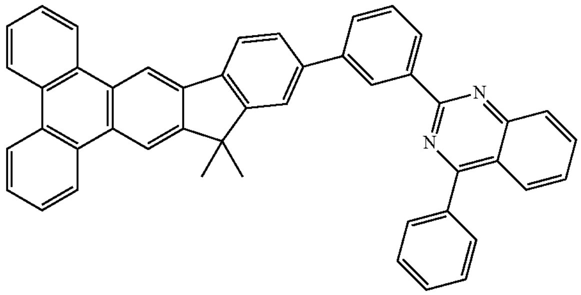
52
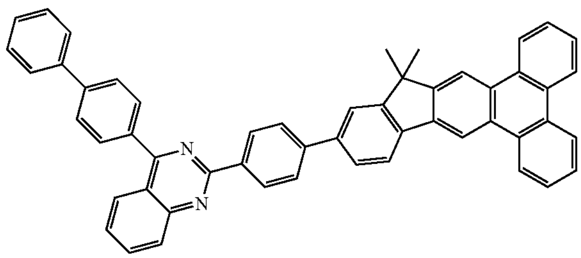
53
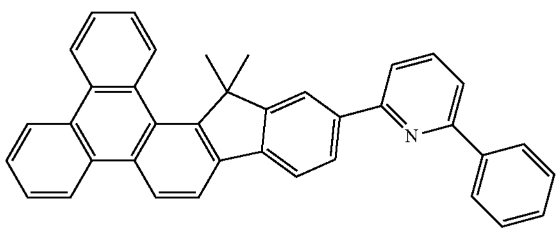
54
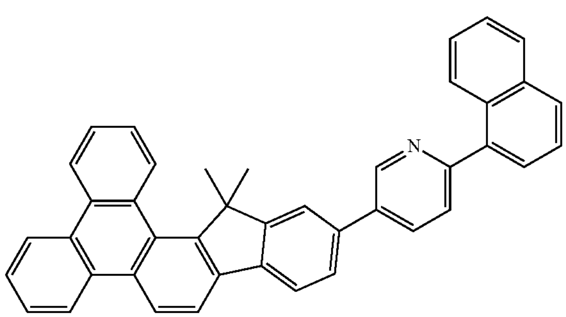
55
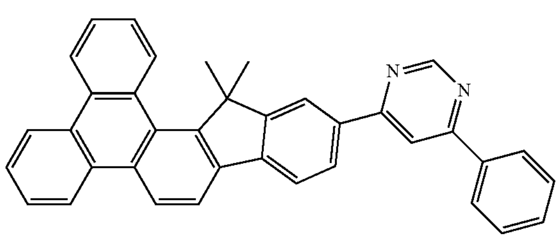
-continued
56
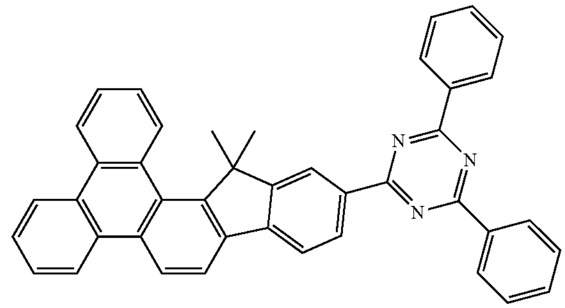
57
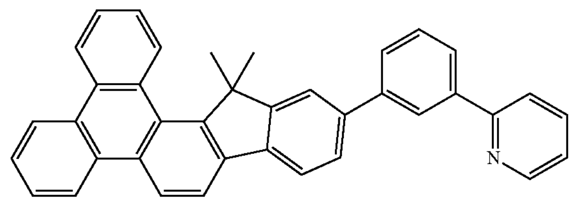
58
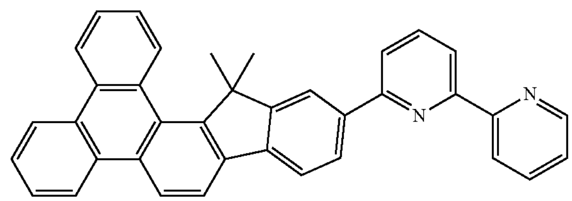
59
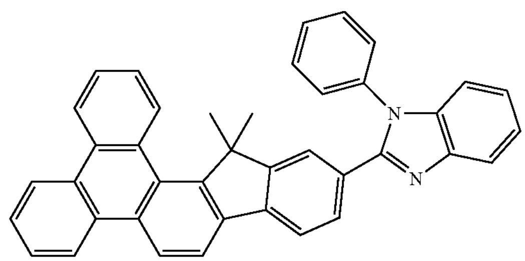
60
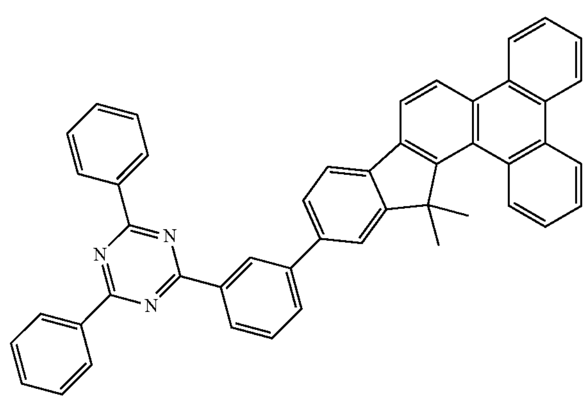

-continued
61
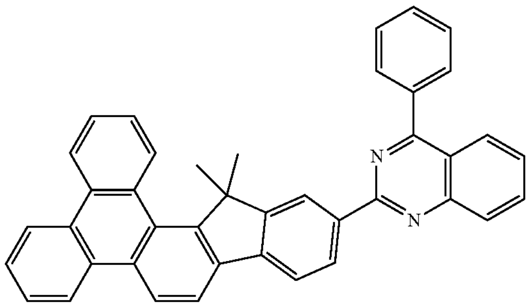
62
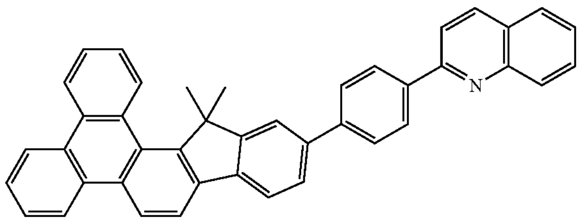
63
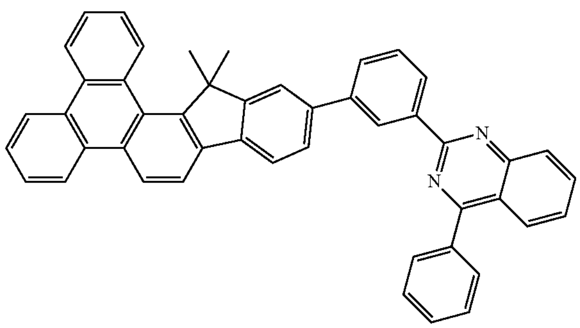
64
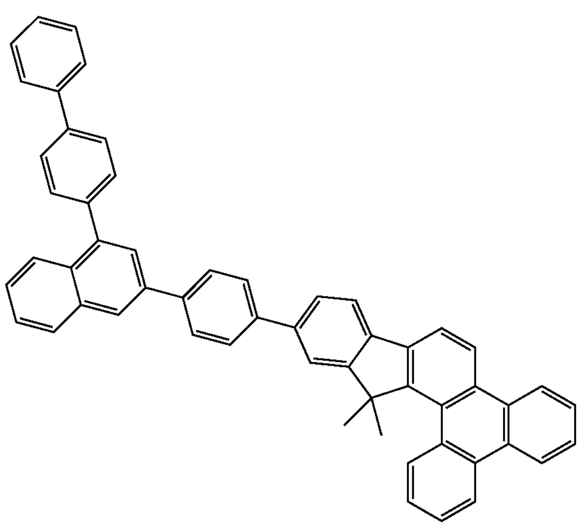
-continued
65
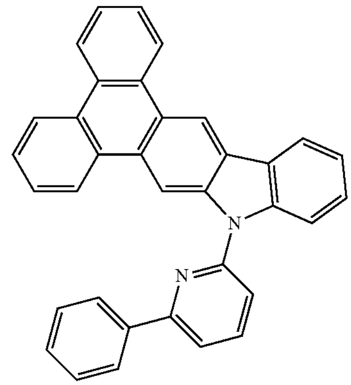
66
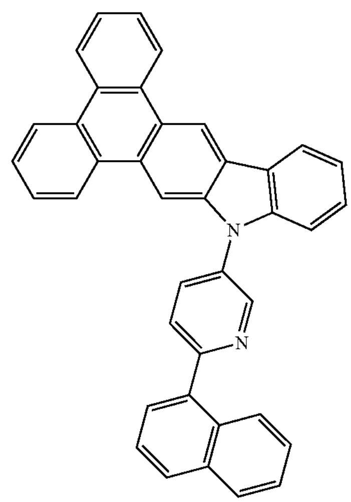
67
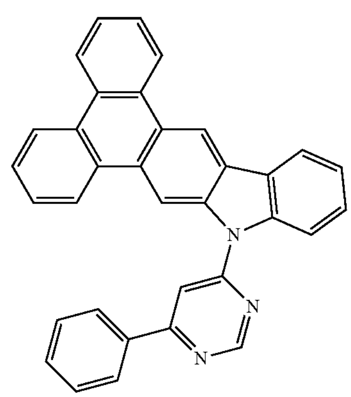

-continued
68
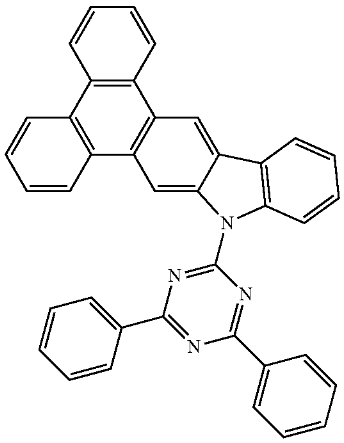
69
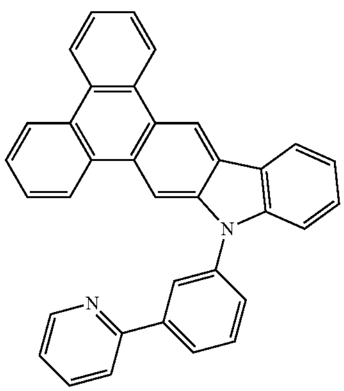
70
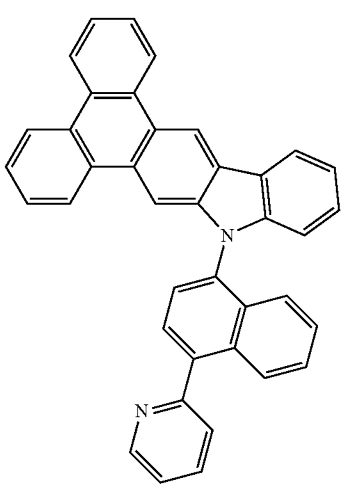
-continued
71
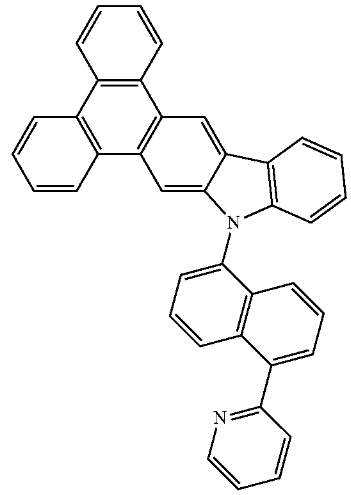
72
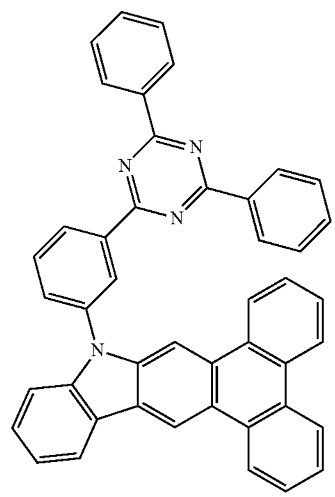
73
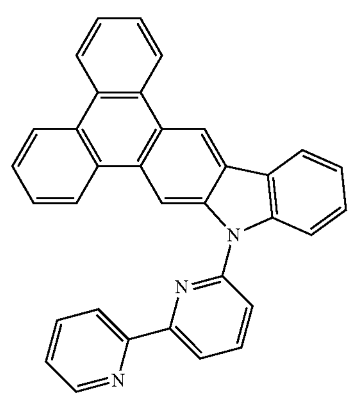

-continued
74
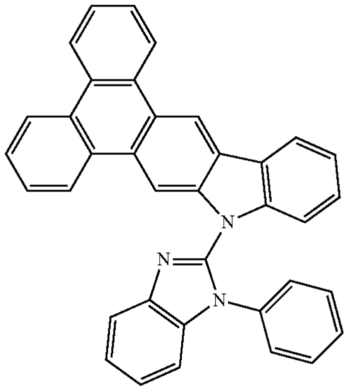
75
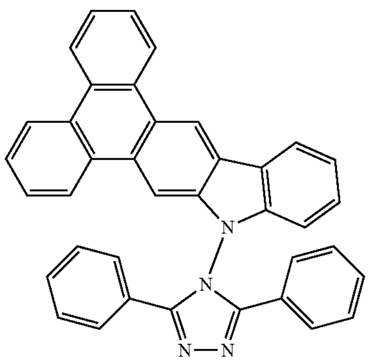
76
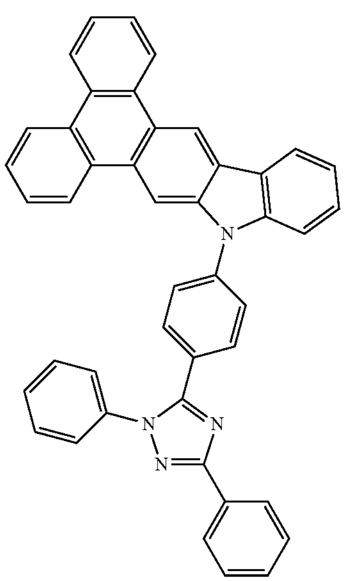
-continued
77
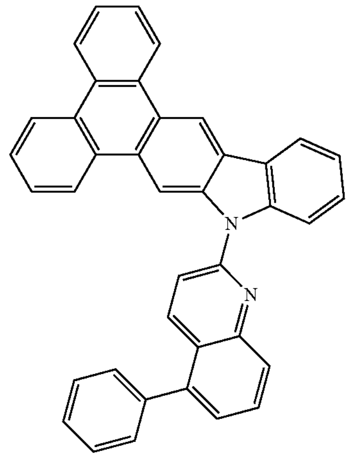
78
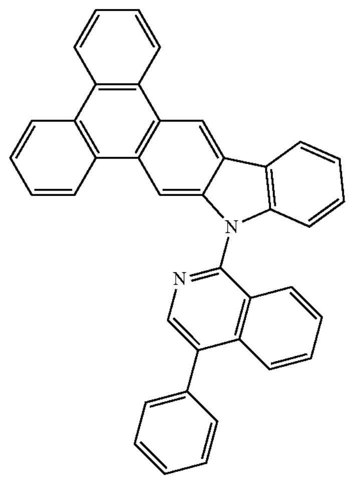
79
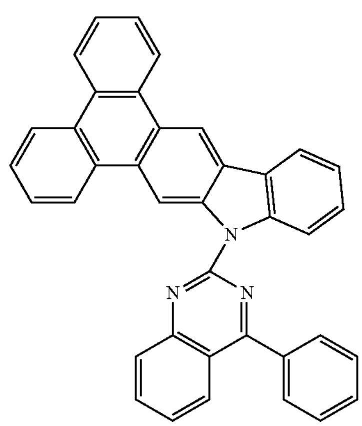

-continued
80
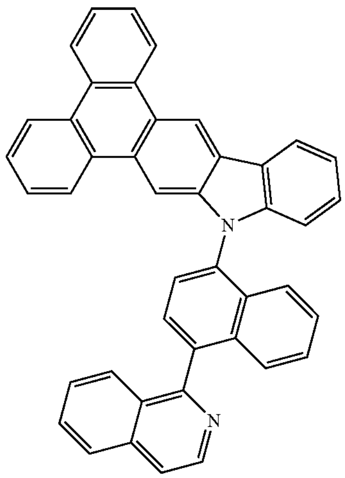
81
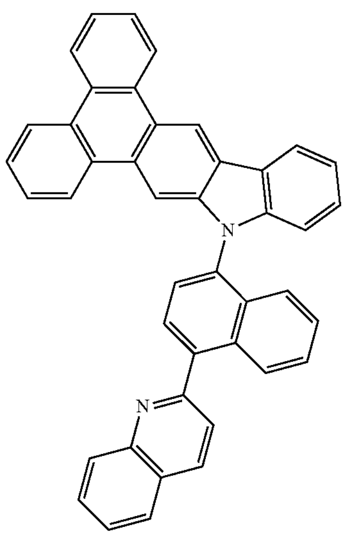
82
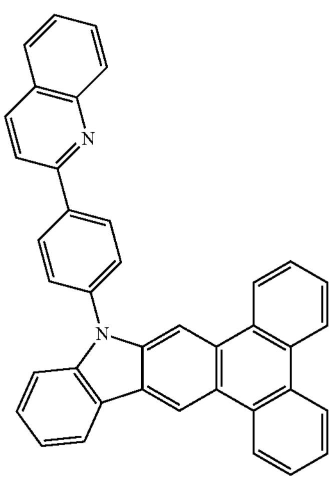
-continued
83
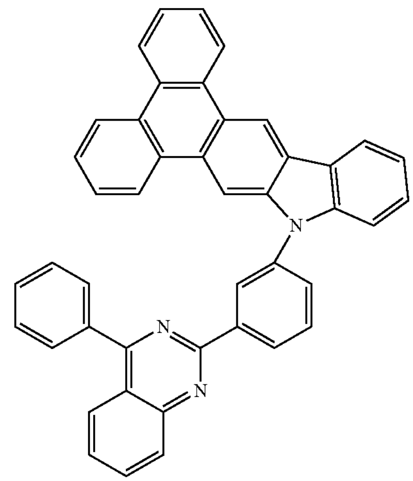
84
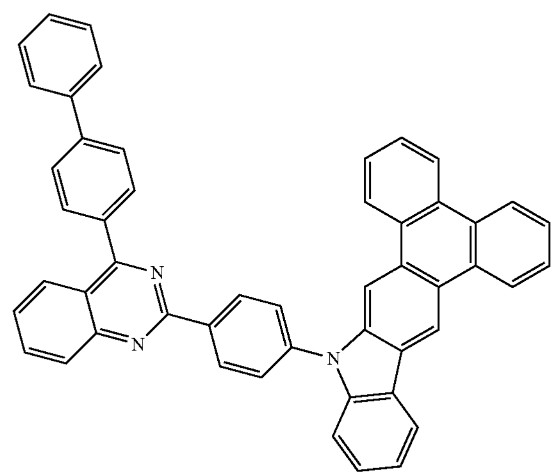
85
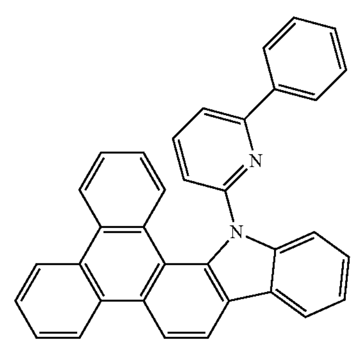

-continued
86
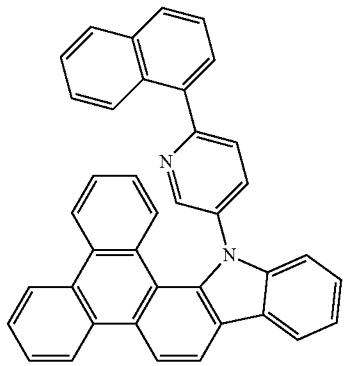
87
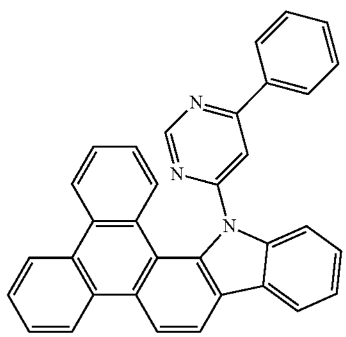
88
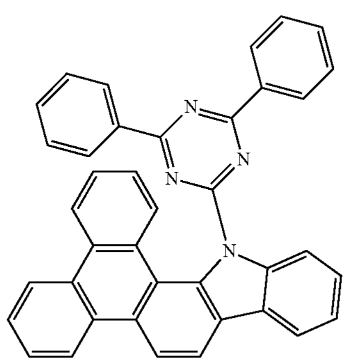
89
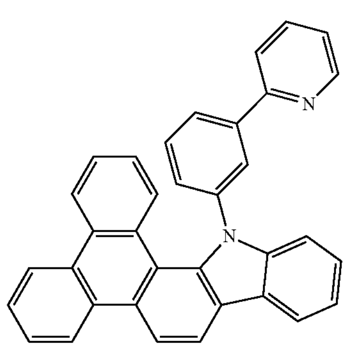
-continued
90
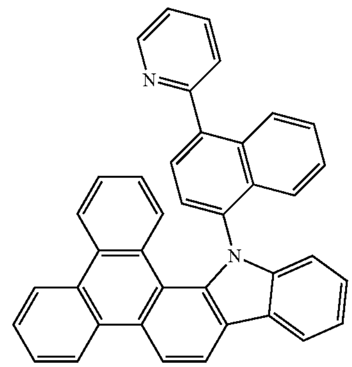
91
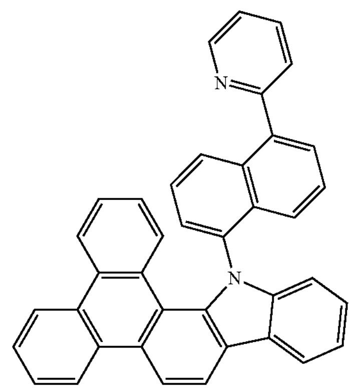
92
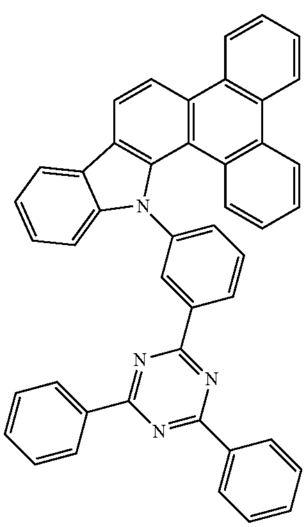
93
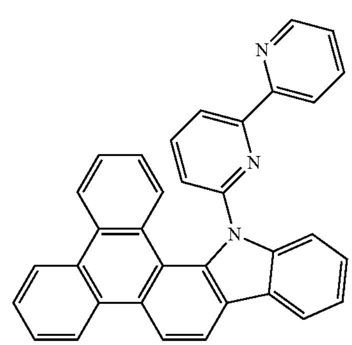

94
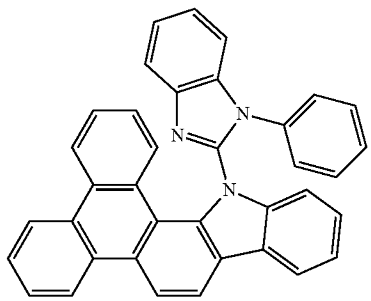
95
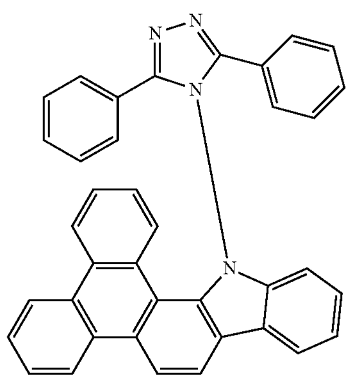
96
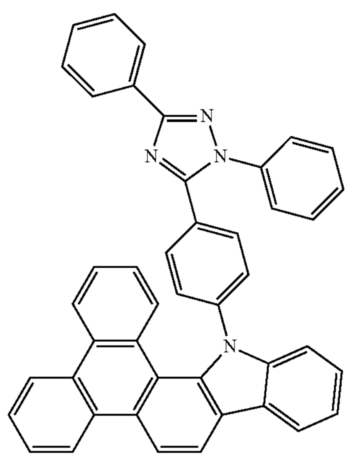
97
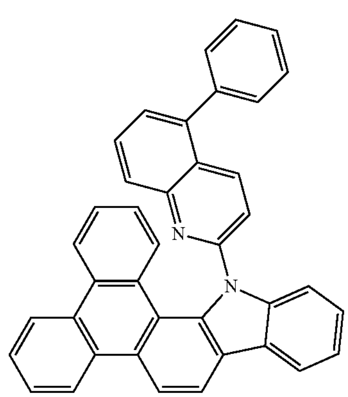
98
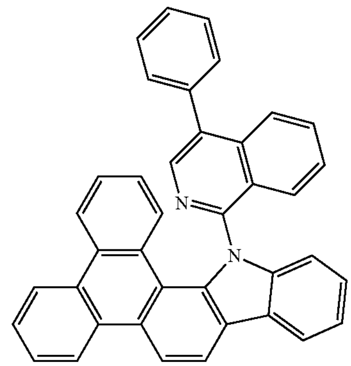
99
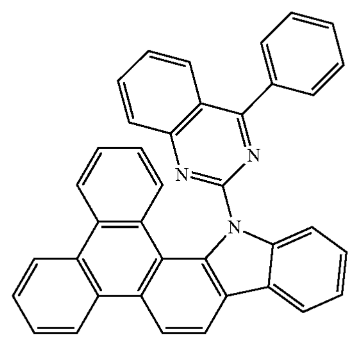
100
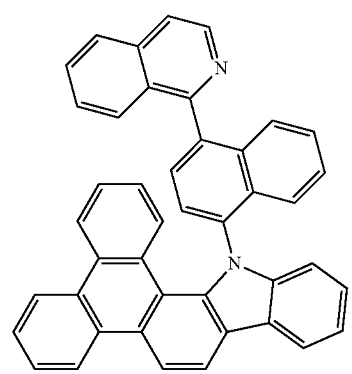
101
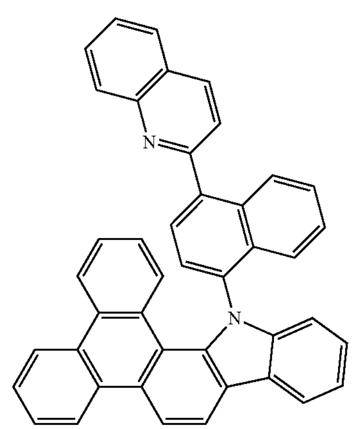

102
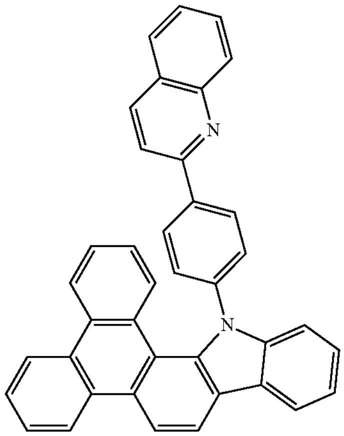
103
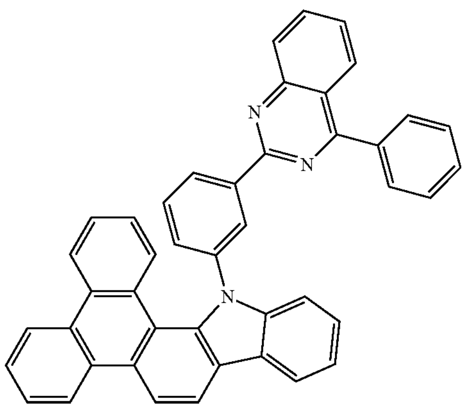
104
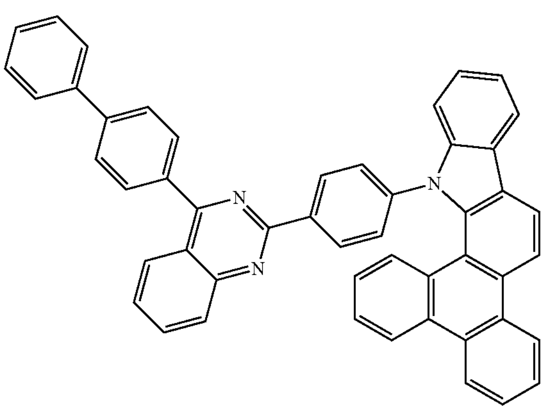
105
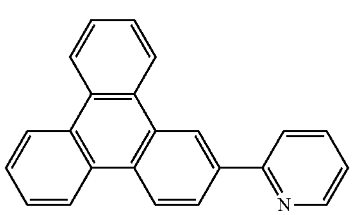
106
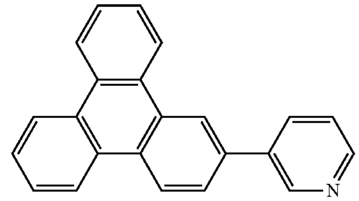
107
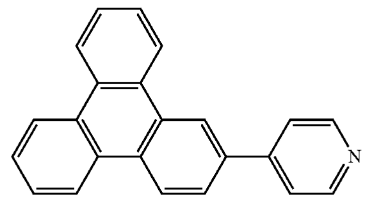
108
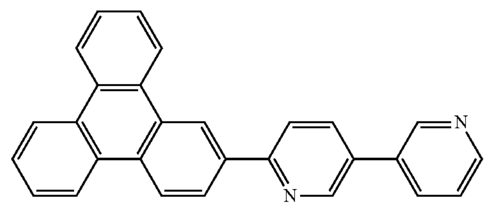
109
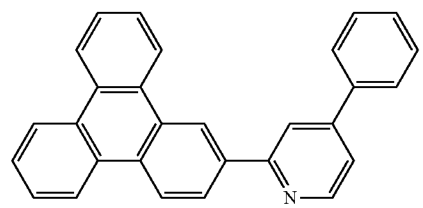
110
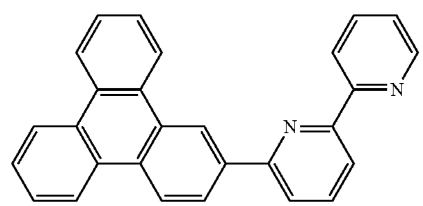
111
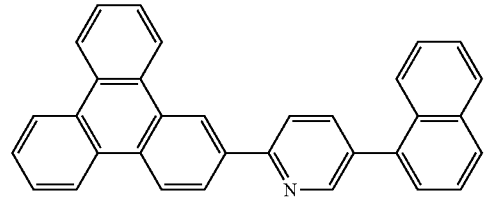
112
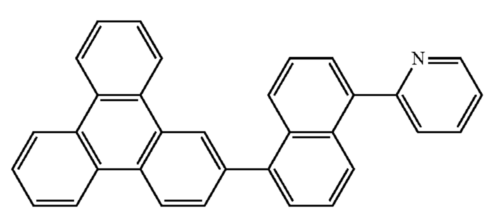

-continued
113
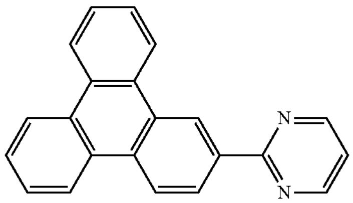
114
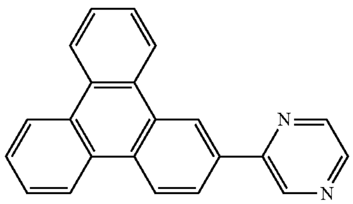
115
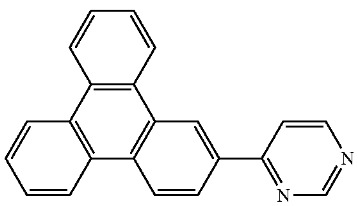
116
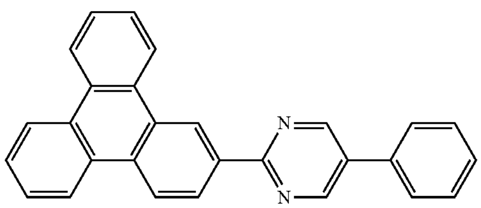
117
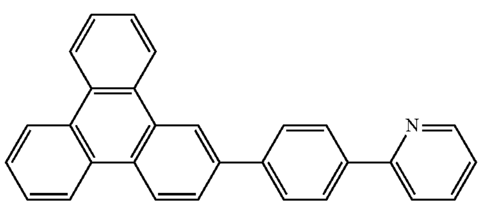
118
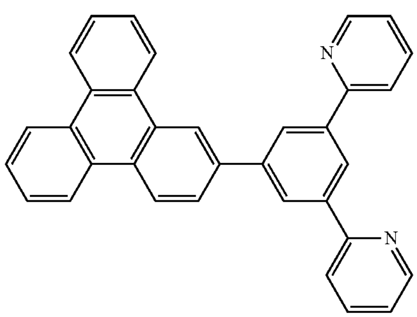
119
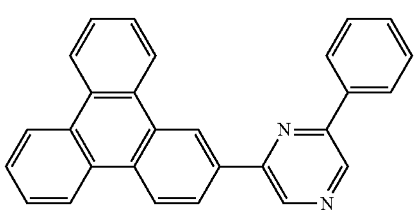
-continued
120
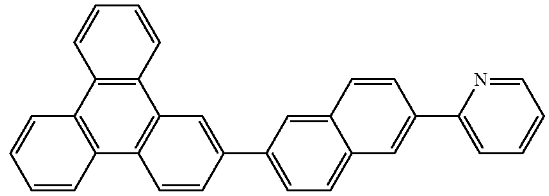
121
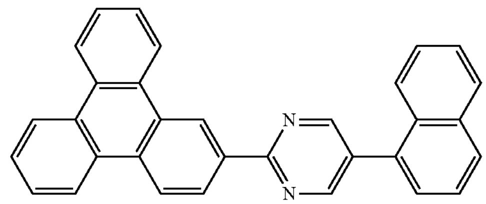
122
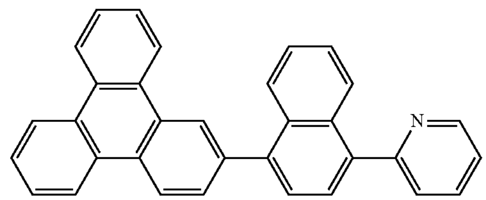
123
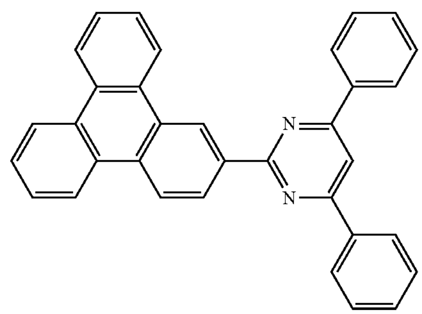
124
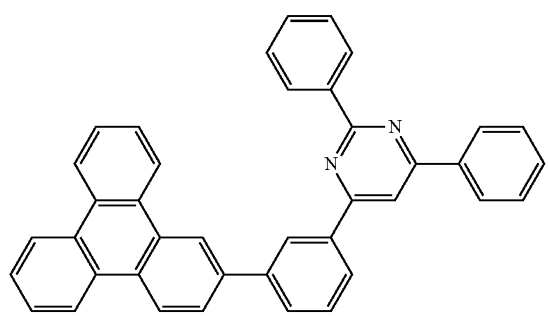
125
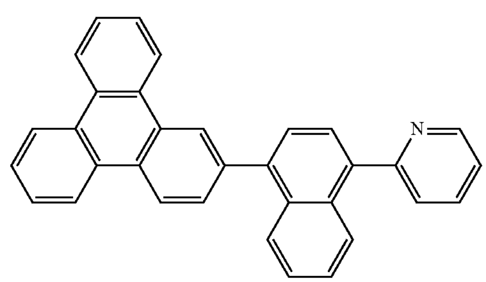

-continued
126
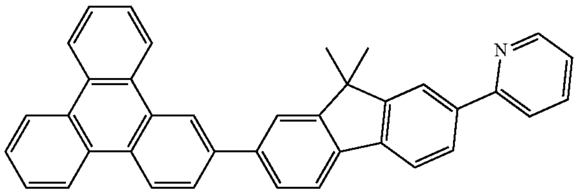
127
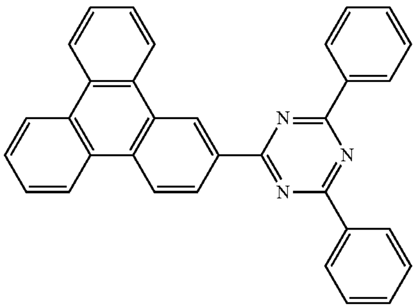
128
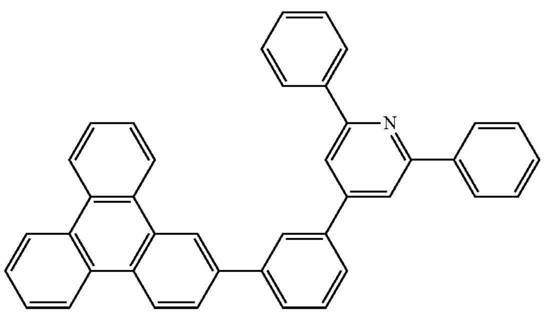
129
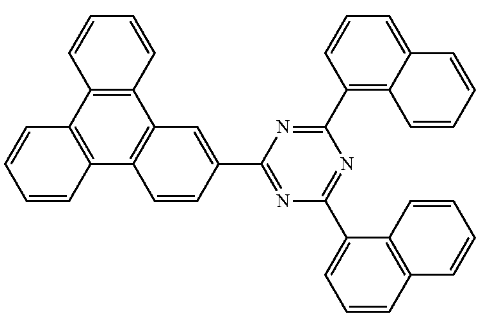
130
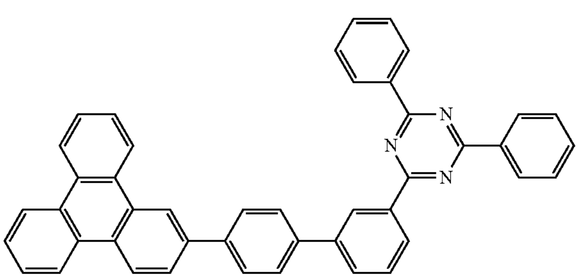
-continued
131
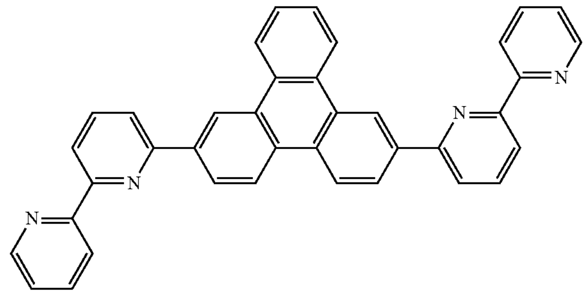
132
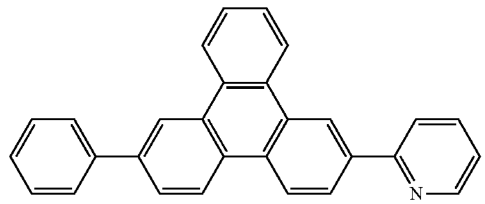
133
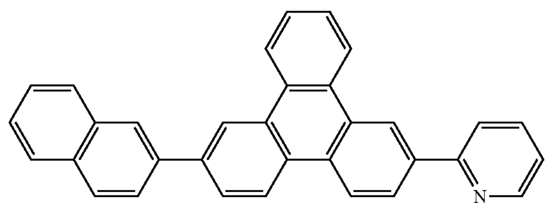
134
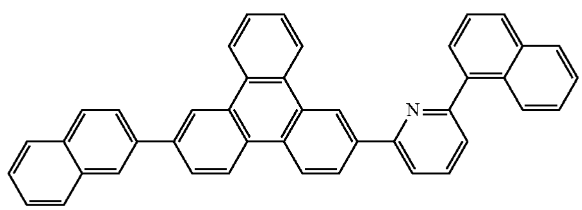
135
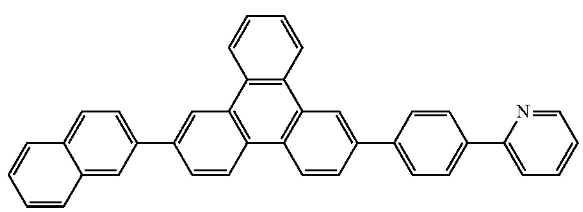
136
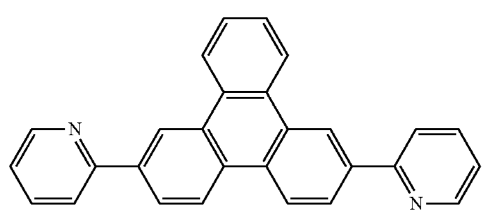

-continued
137
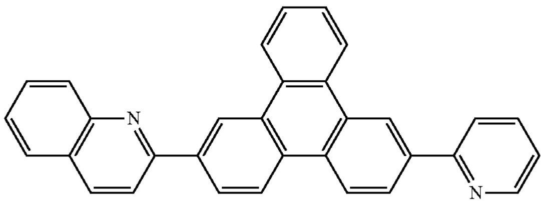
138
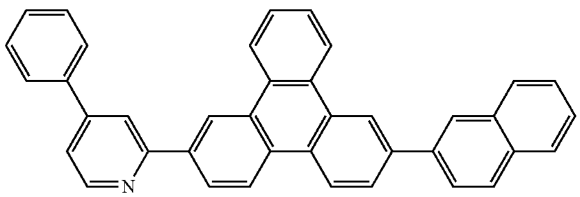
139
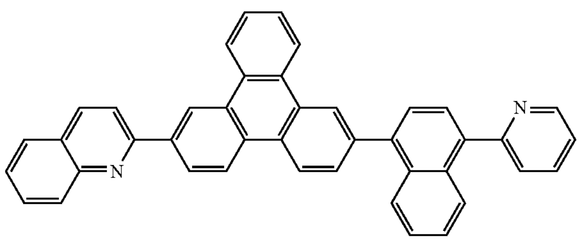
140
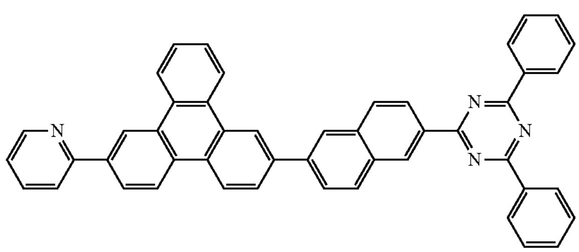
200
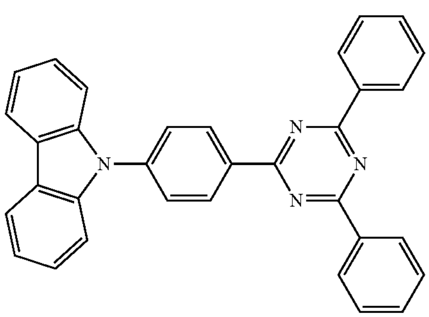
201
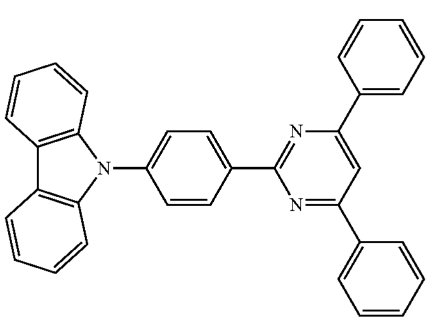
-continued
202
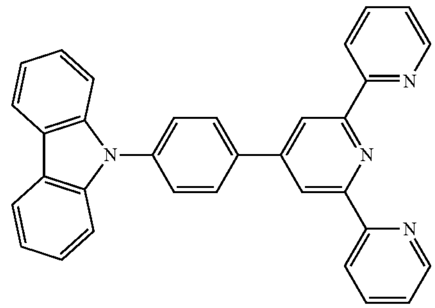
203
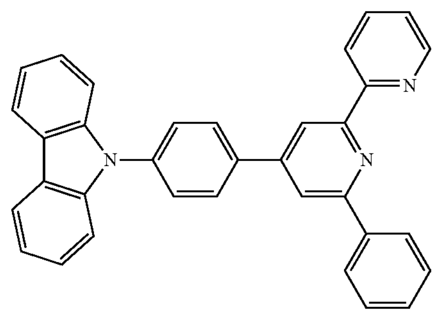
204
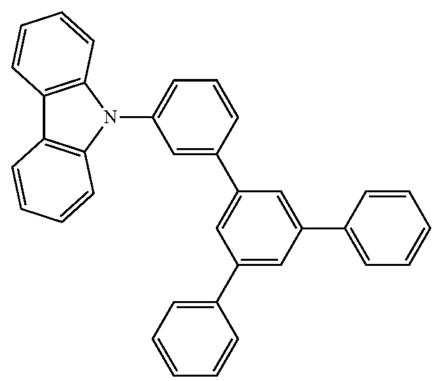
205
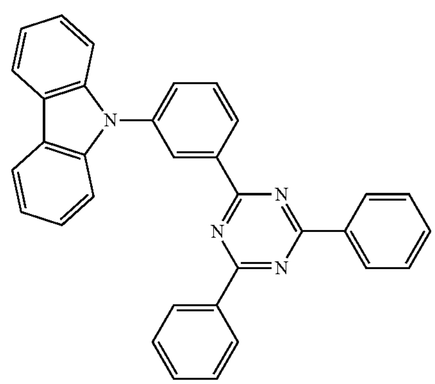

-continued
206
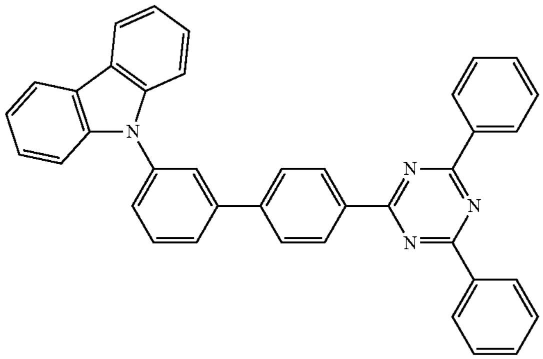
207
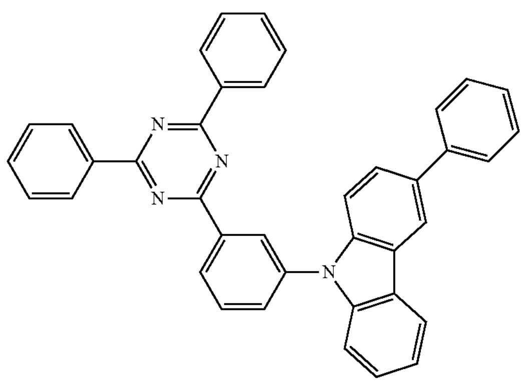
208
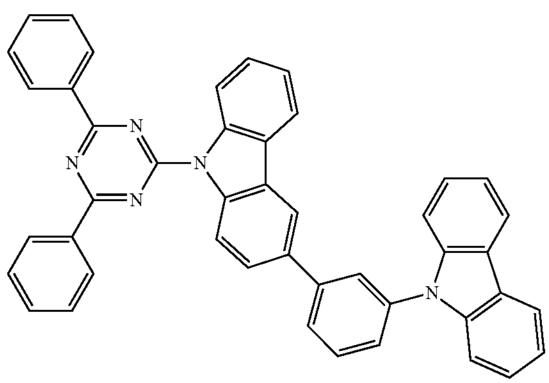
209
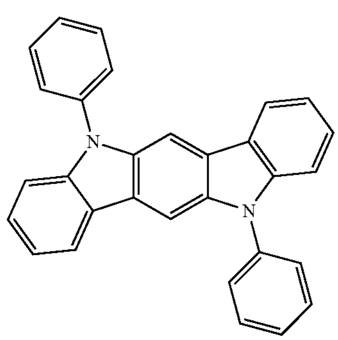
-continued
210
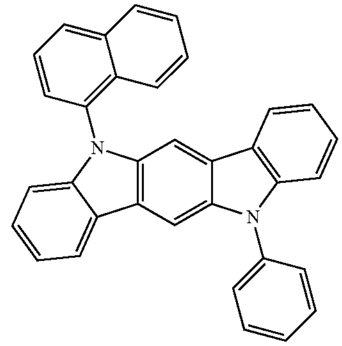
211
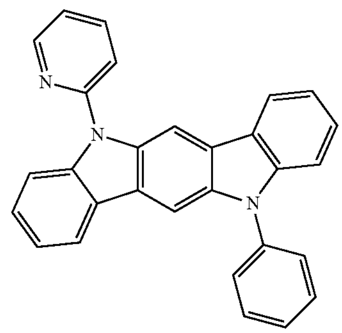
212
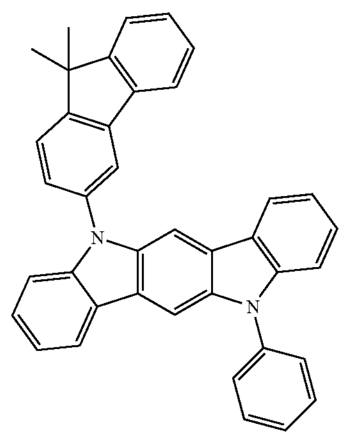
213
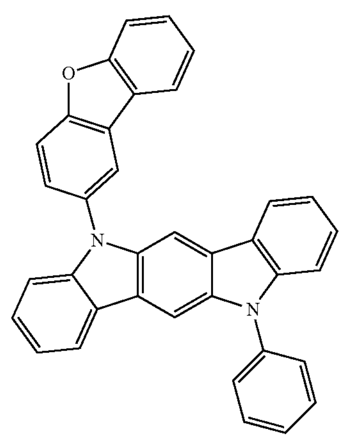

-continued
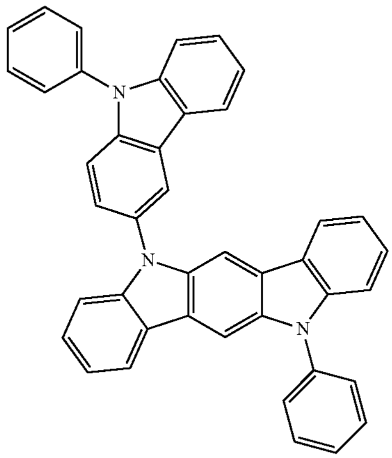
214
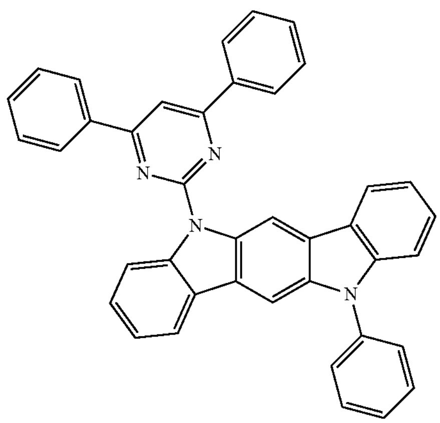
215
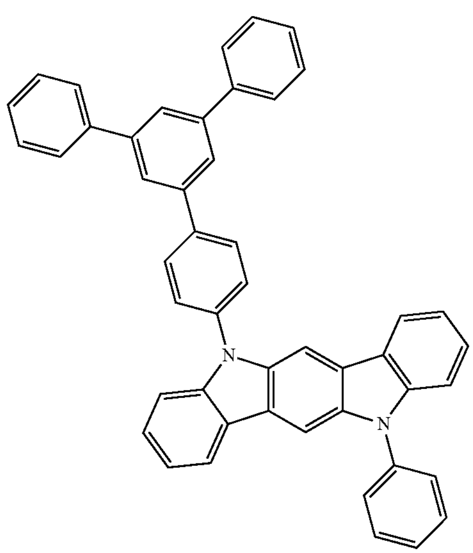
216
-continued
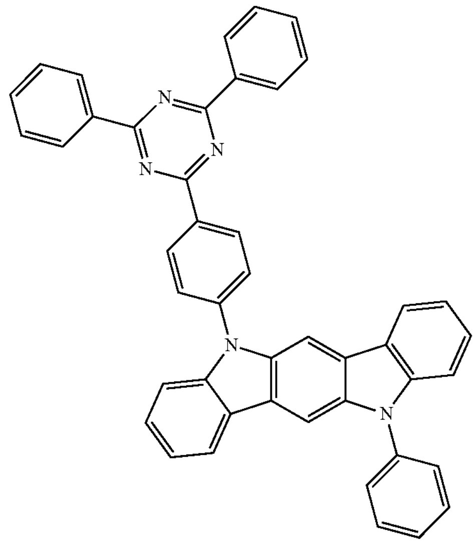
217
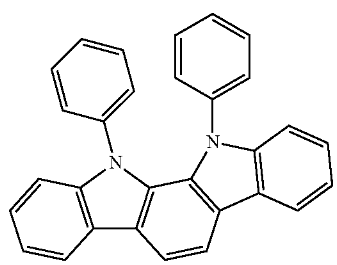
218
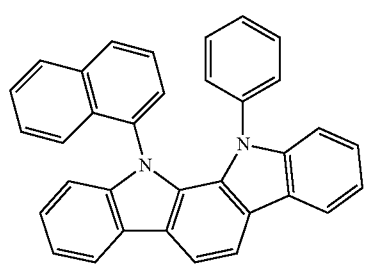
219
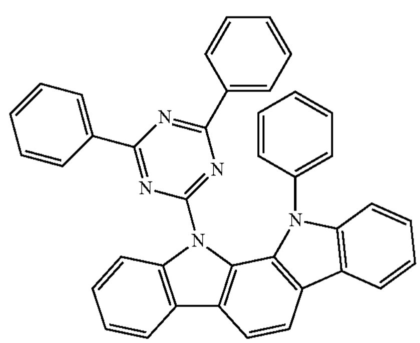
220

-continued
221
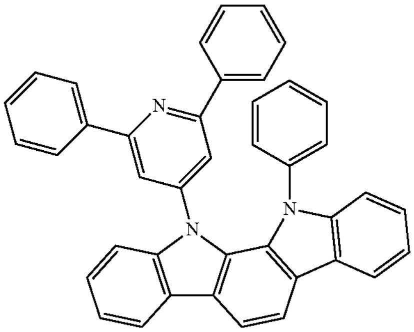
222
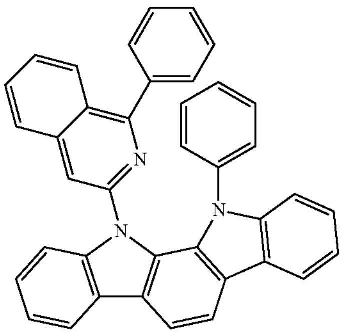
223
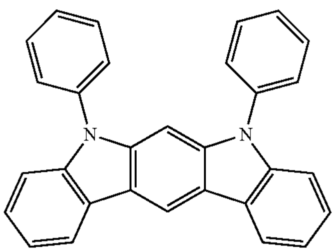
224
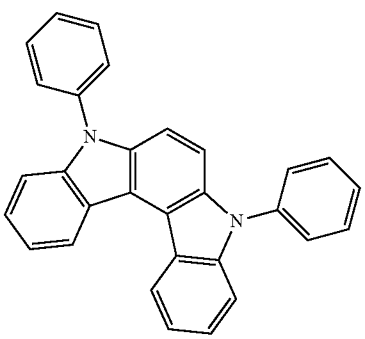
225
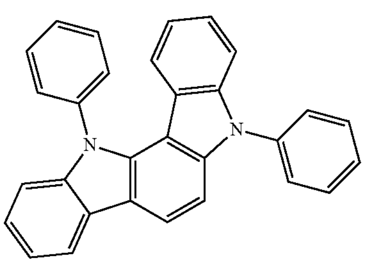
-continued
226
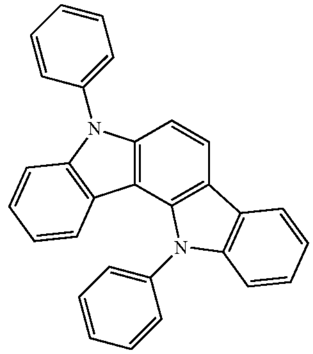
227
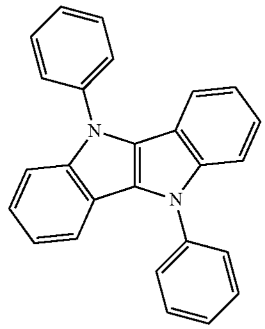
228
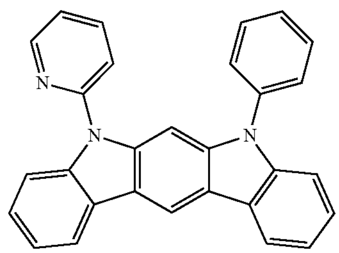
229
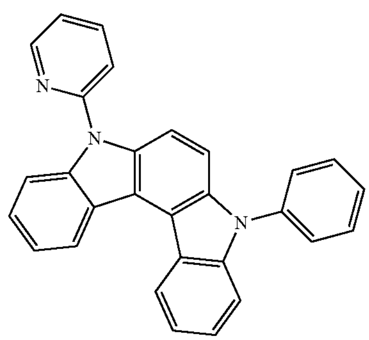
230
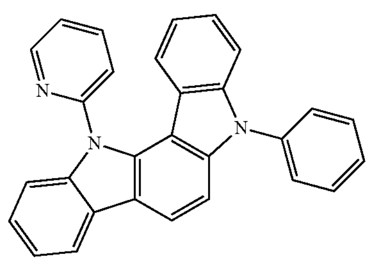

-continued
231
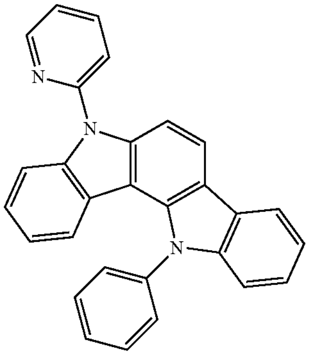
232
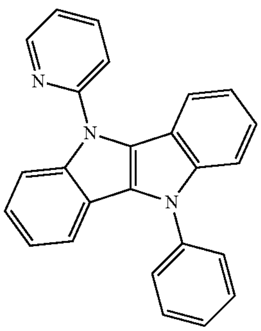
233
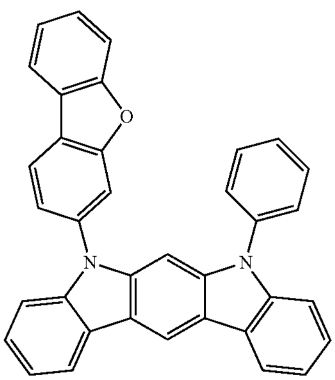
234
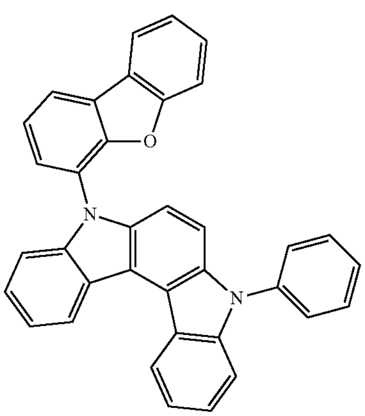
-continued
235
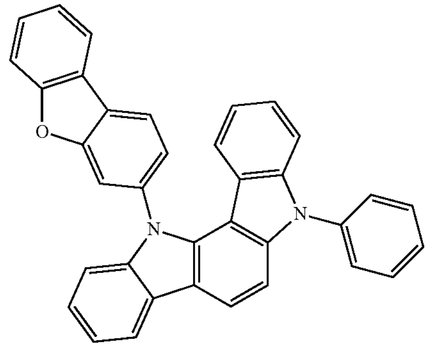
236
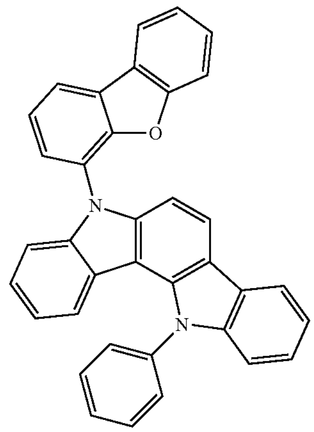
237
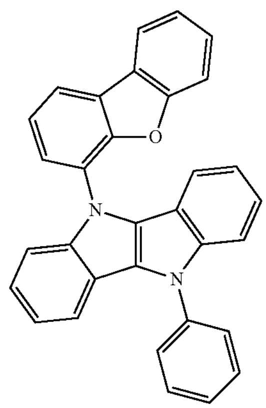
238
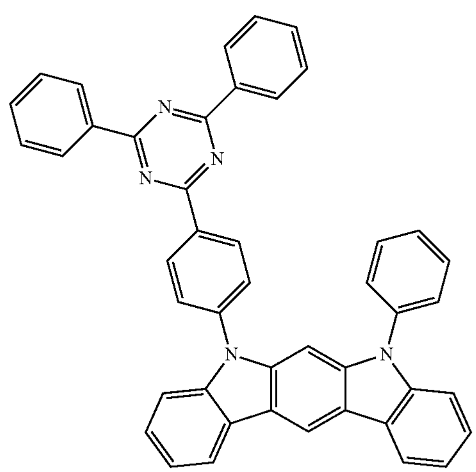

-continued
239
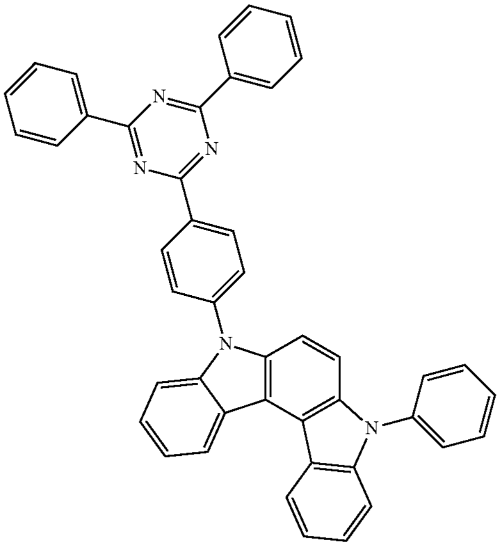
240
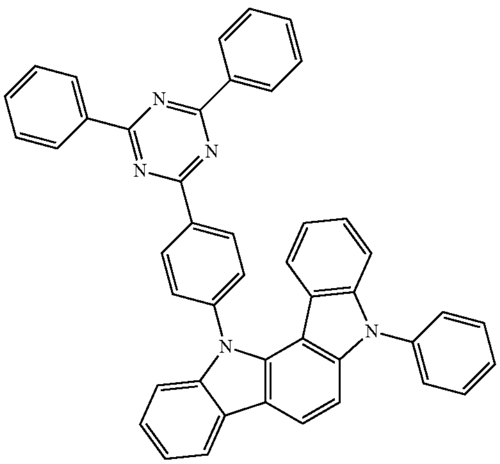
241
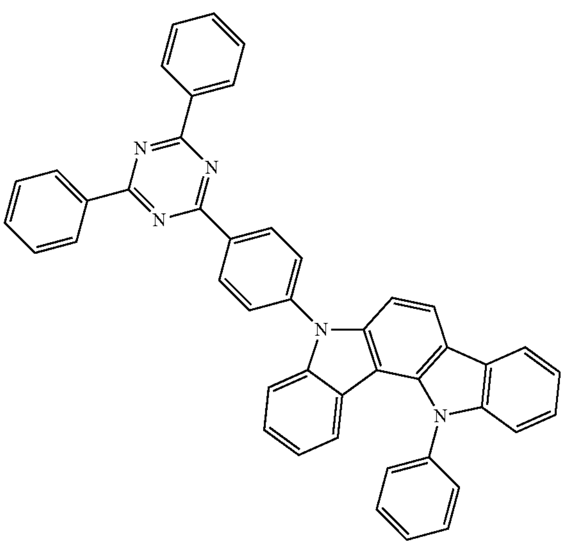
-continued
242
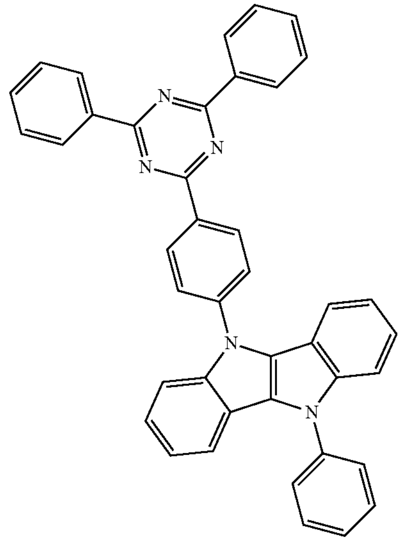
243
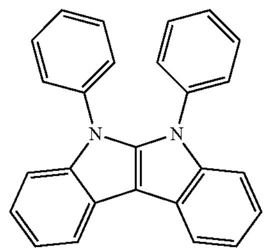
244
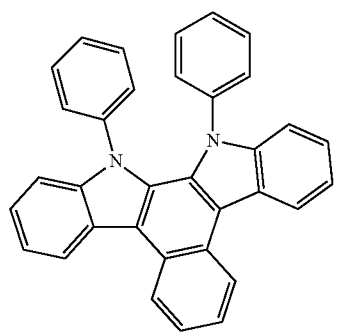
245
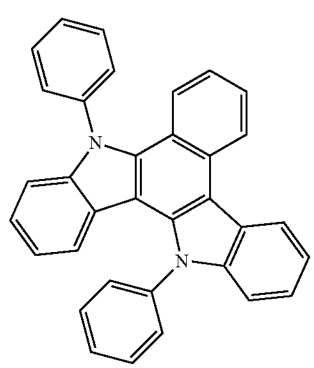

-continued
246
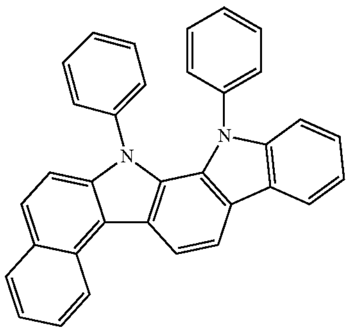
247
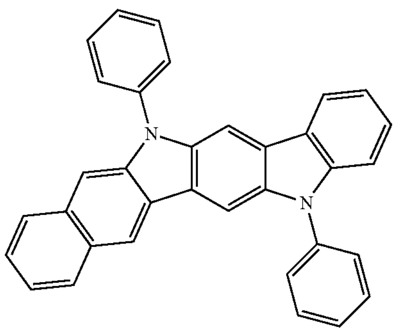
248
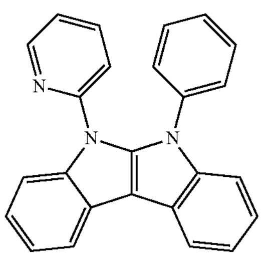
249
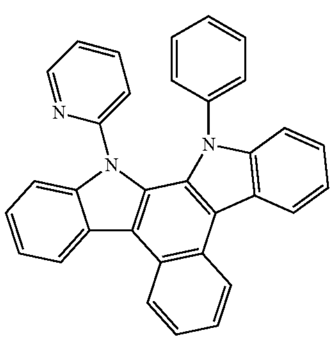
250
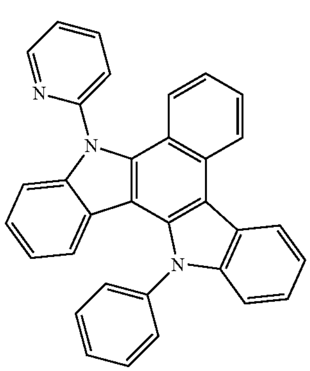
-continued
251
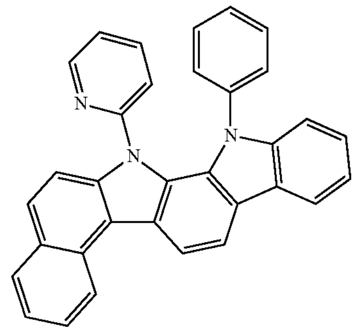
252
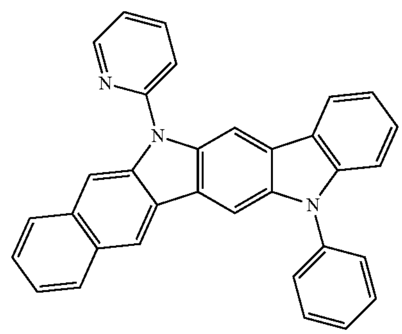
253
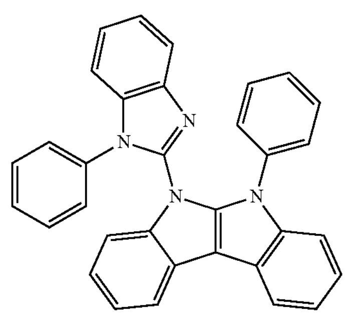
254
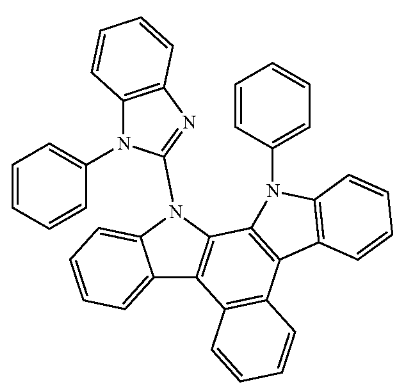

255
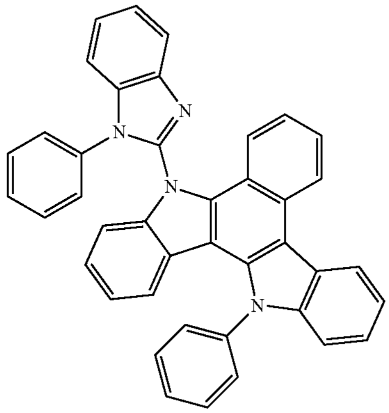
256
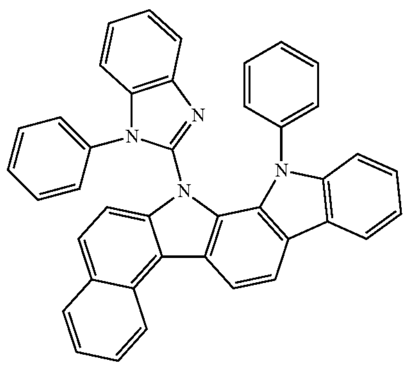
257
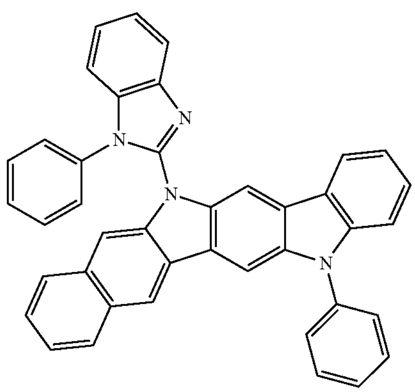
258
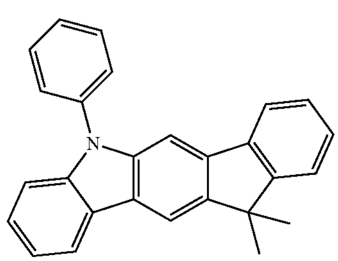
259
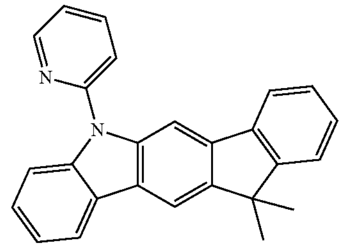
260
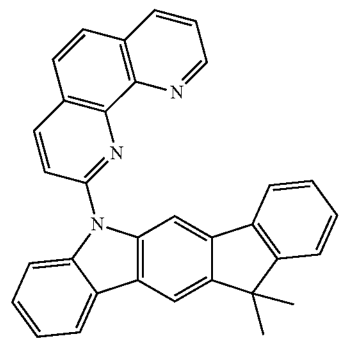
261
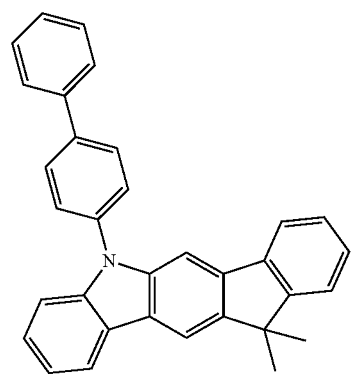
262
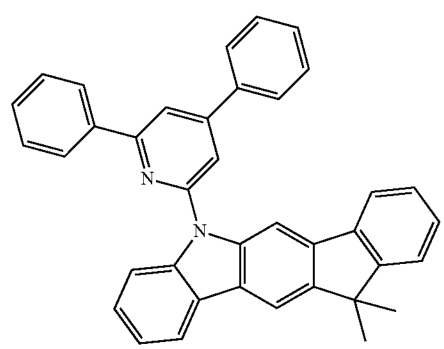
263
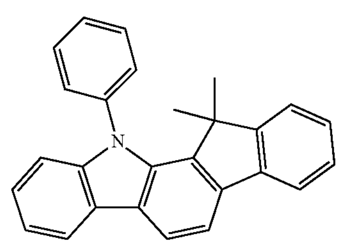

-continued
264
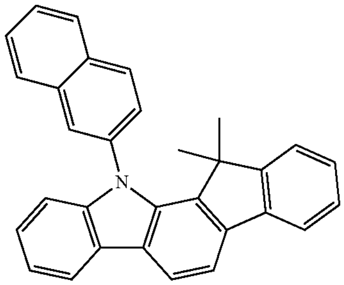
265
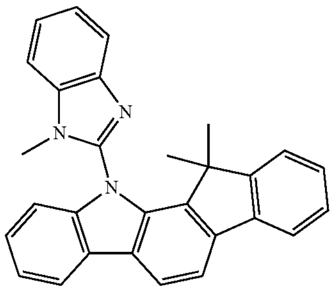
266
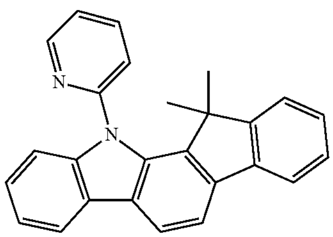
267
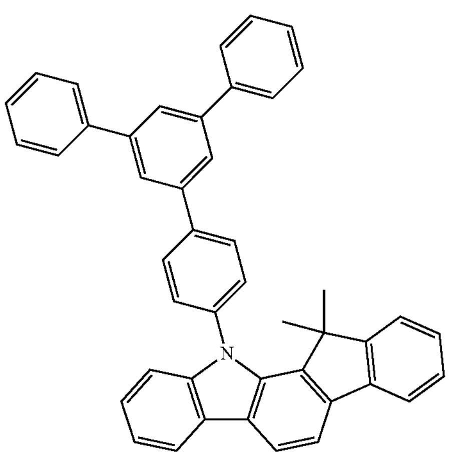
268
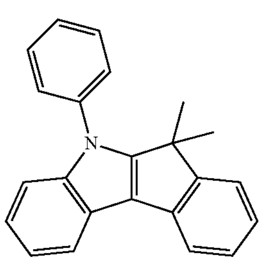
-continued
269
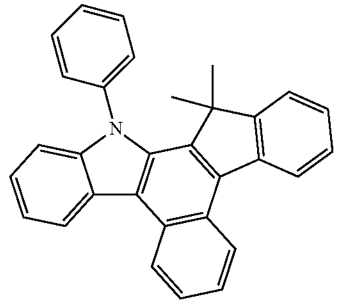
270
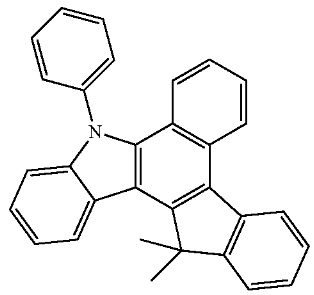
271
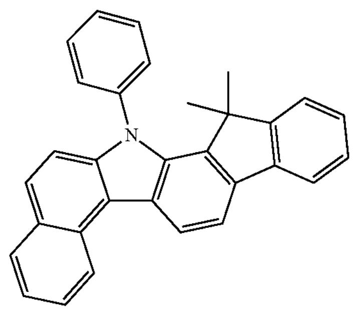
272
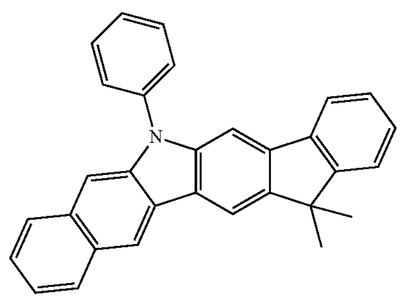
273
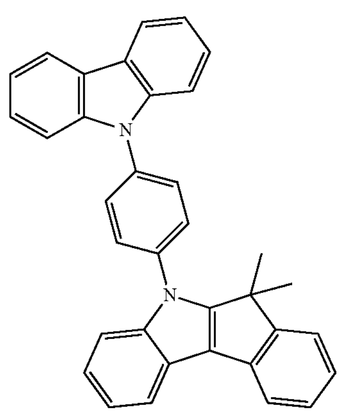

-continued
274
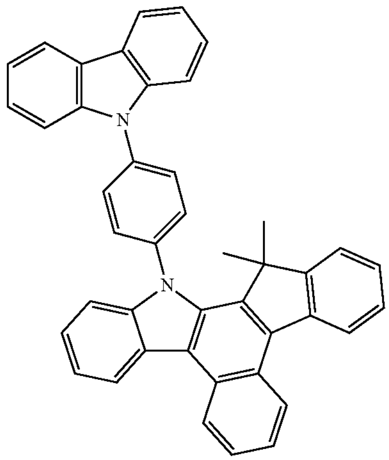
275
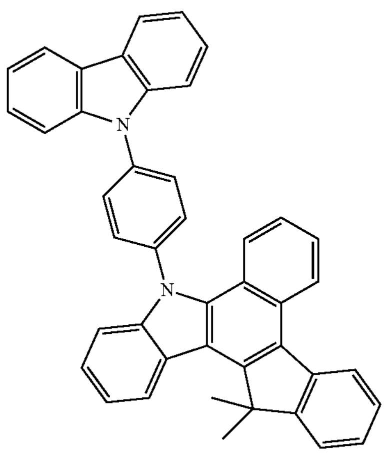
276
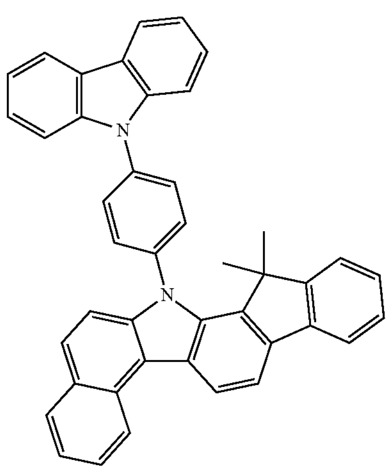
-continued
277
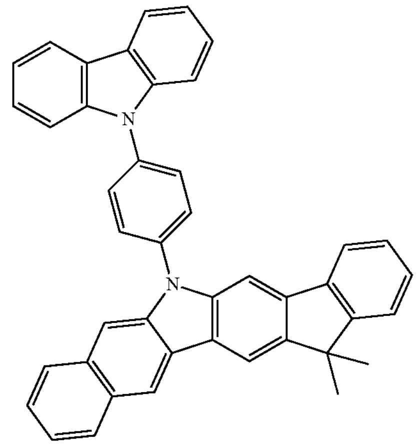
278
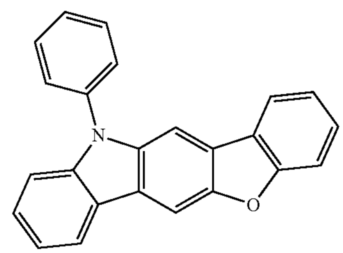
279
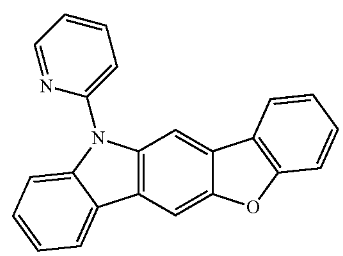
280
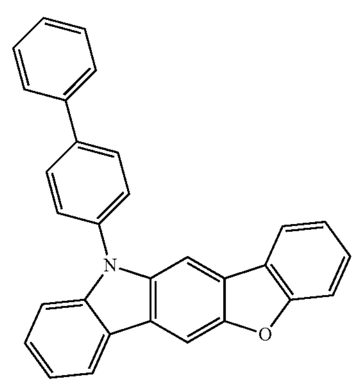

-continued
281
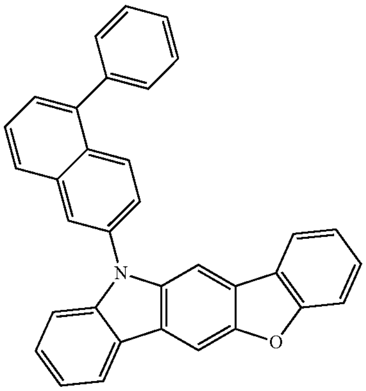
282
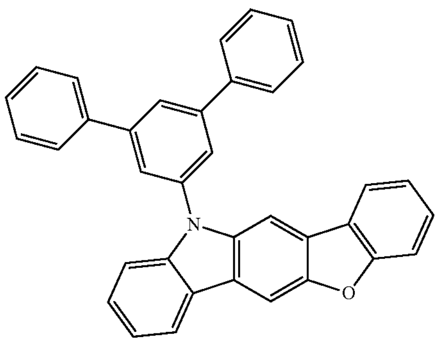
283
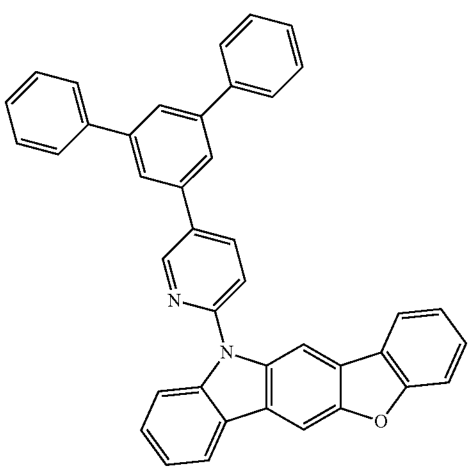
-continued
284
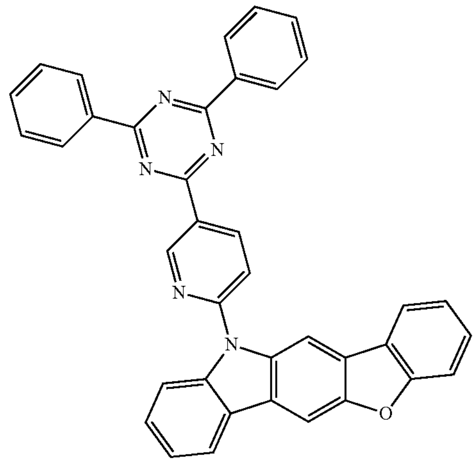
285
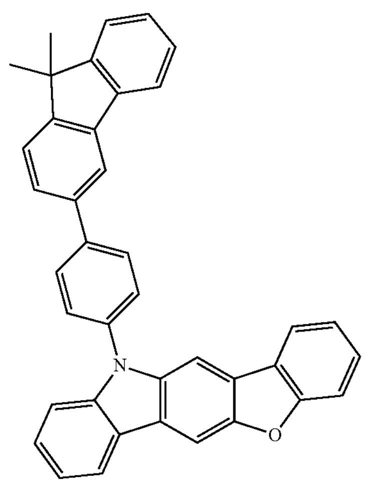
286
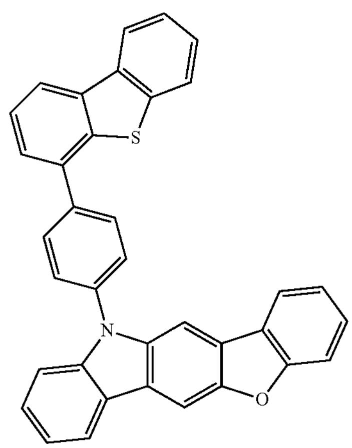

-continued
287
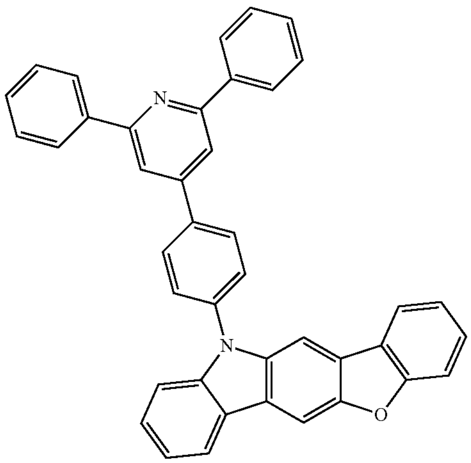
288
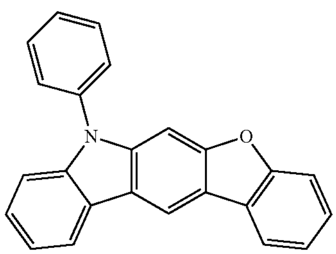
289
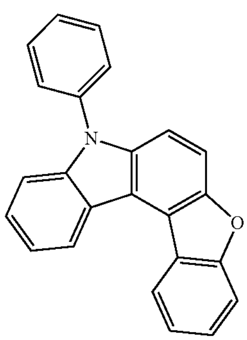
290
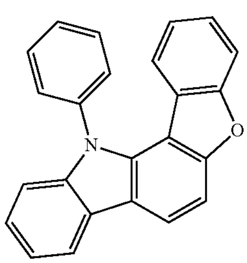
291
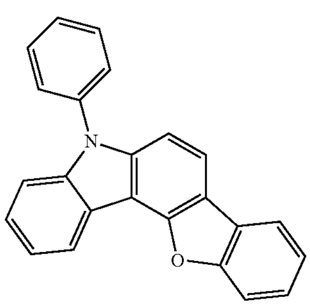
-continued
292
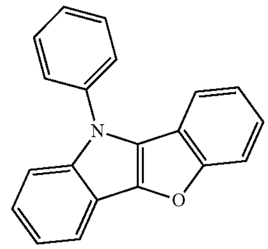
293
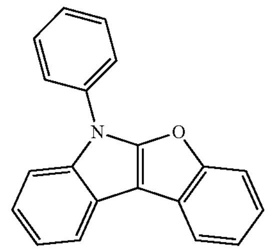
294
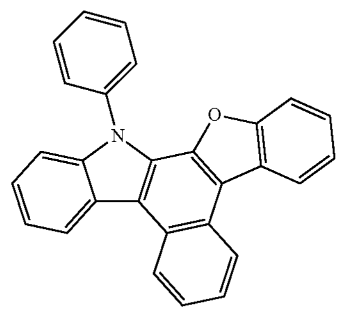
295
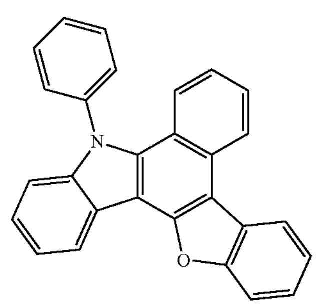
296
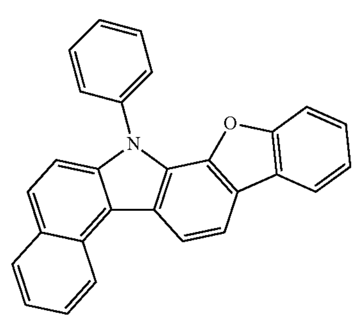

-continued
297
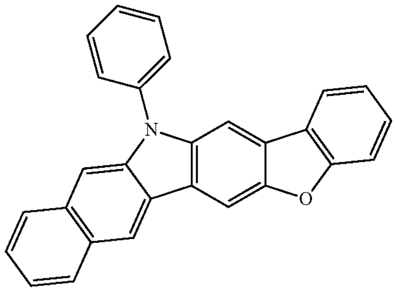
298
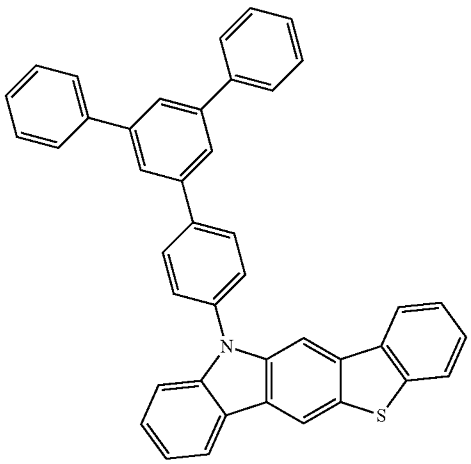
299
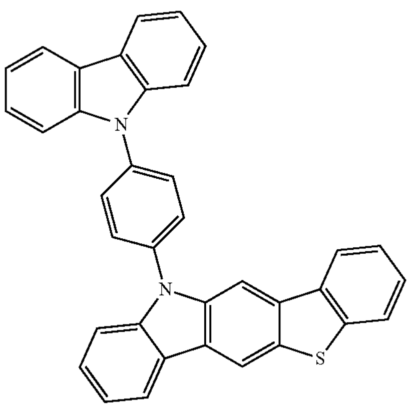
300
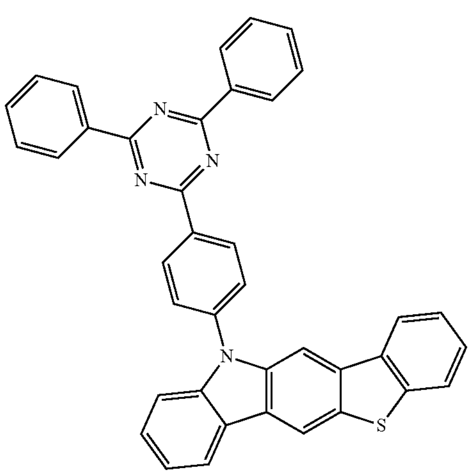
-continued
301
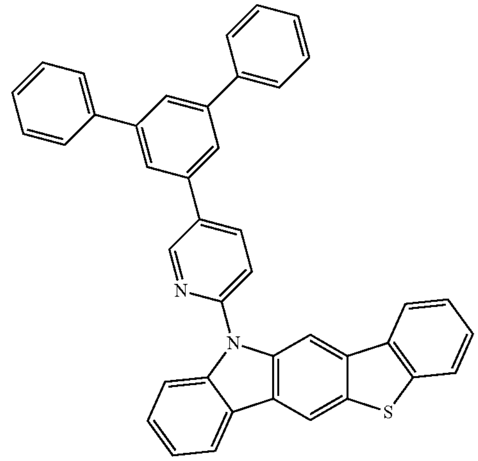
302
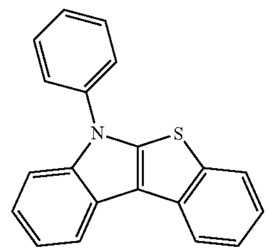
303
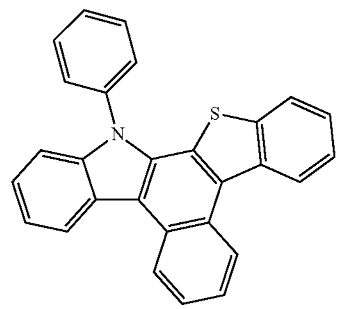
304
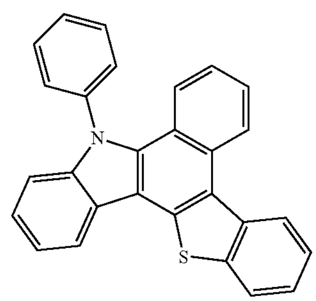
305
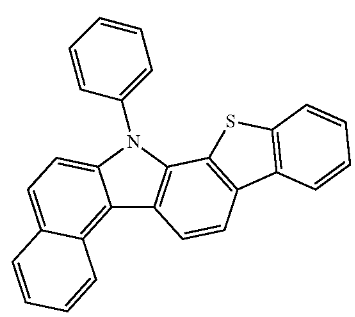

-continued
306
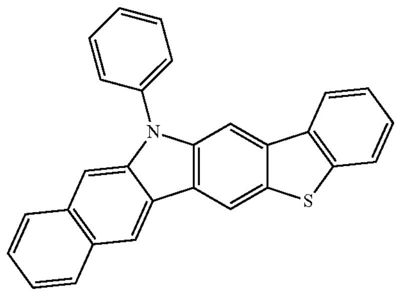
307
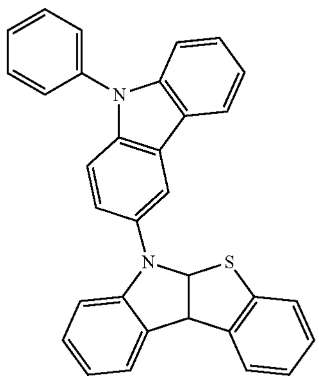
308
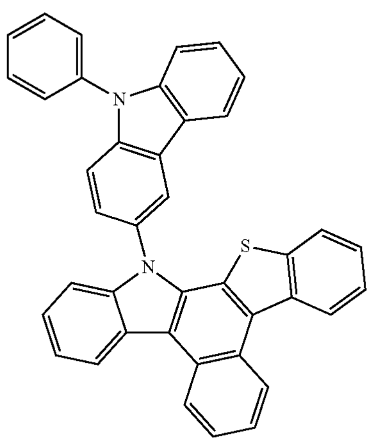
309
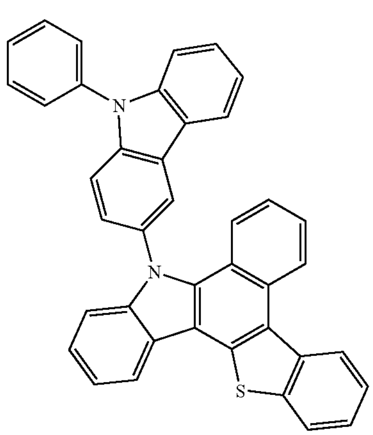
-continued
310
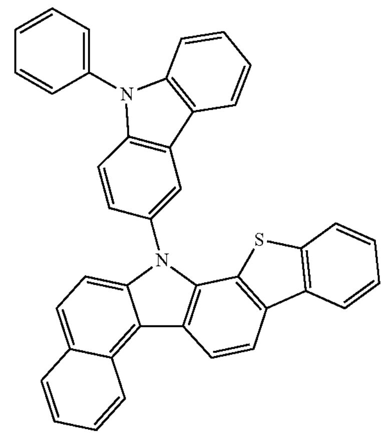
311
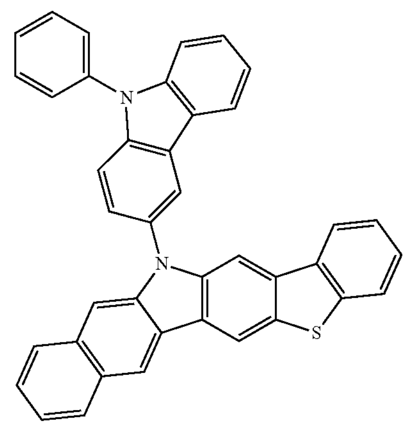
312
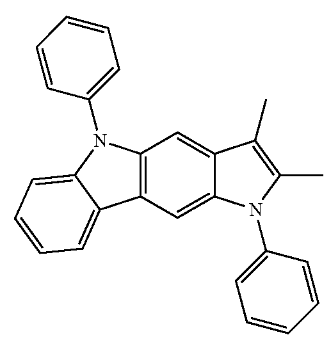
313
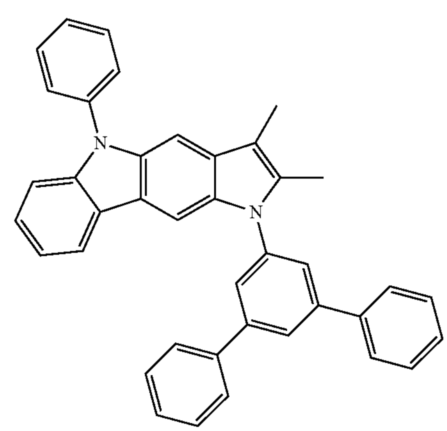

-continued
314
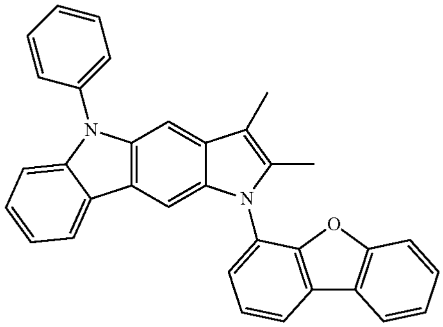
315
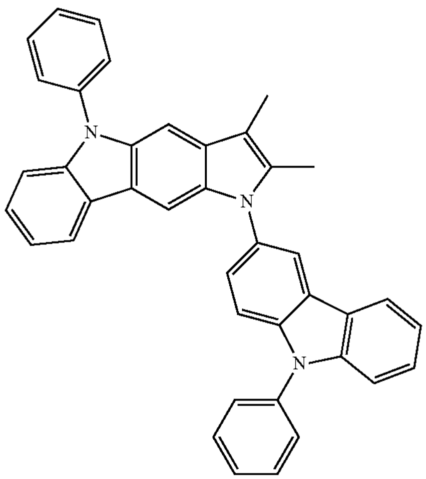
316
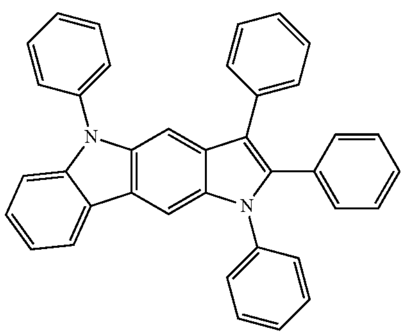
317
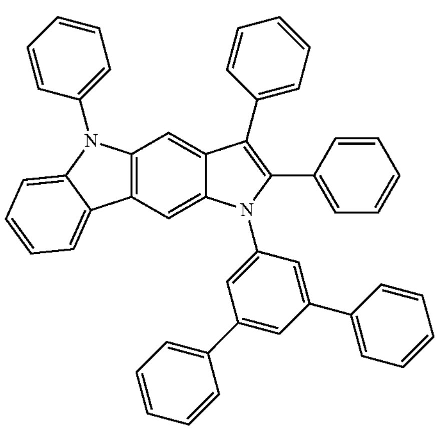
-continued
318
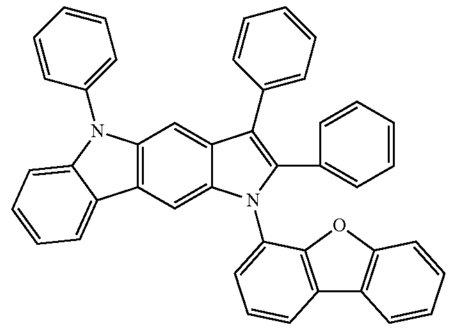
319
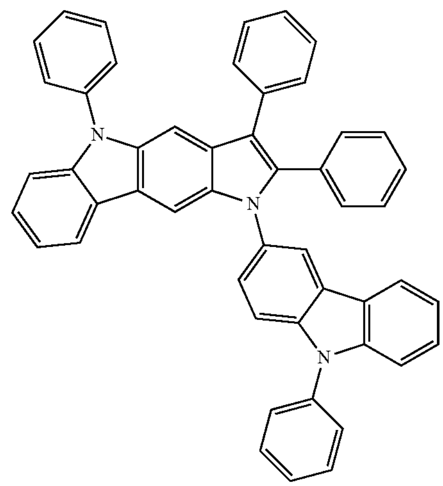
320
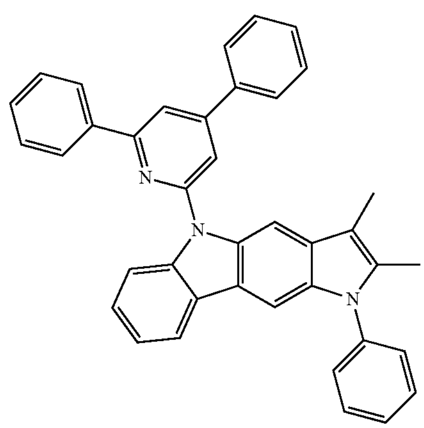

-continued
321
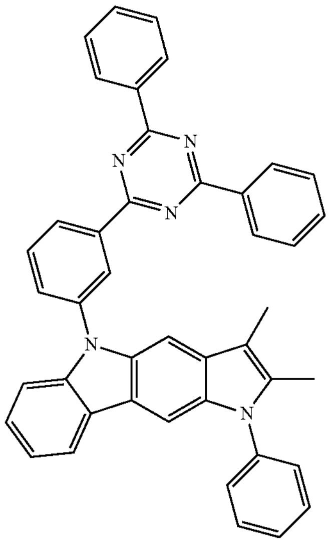
322
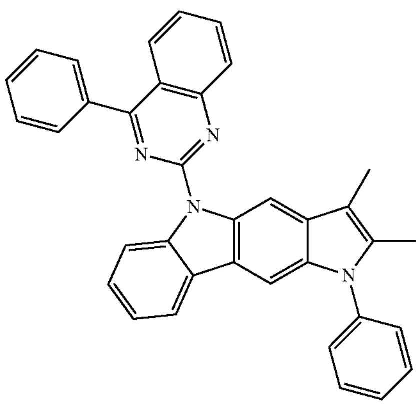
323
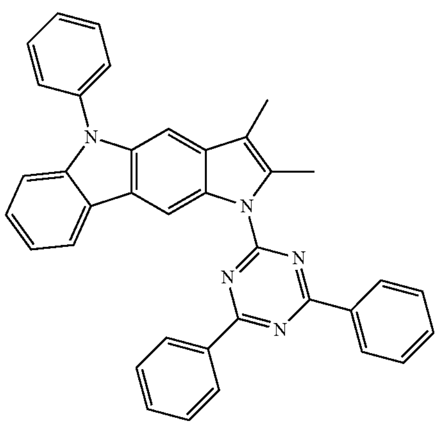
324
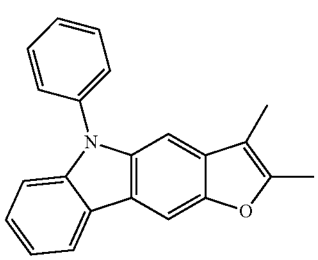
-continued
325
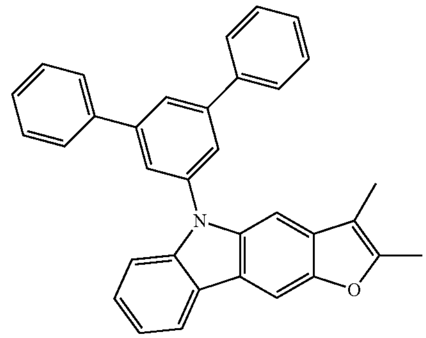
326
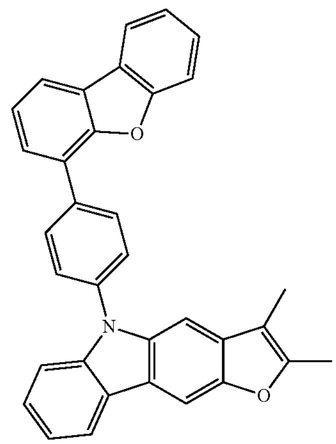
327
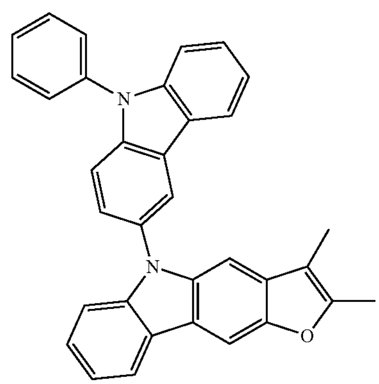
328
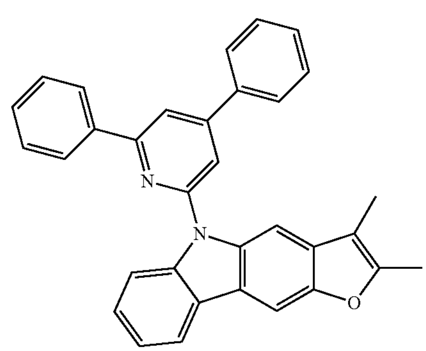

-continued
329
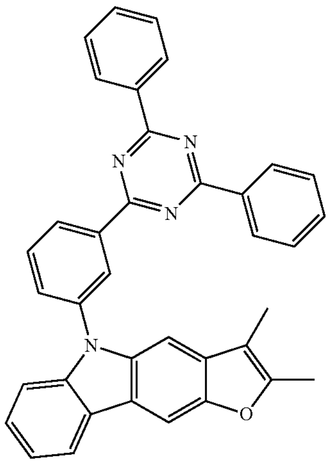
330
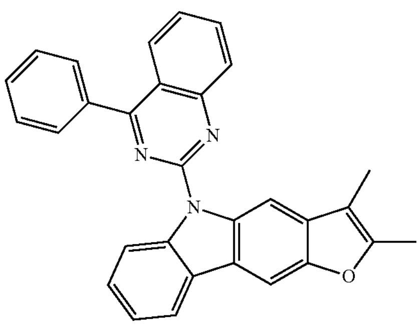
331
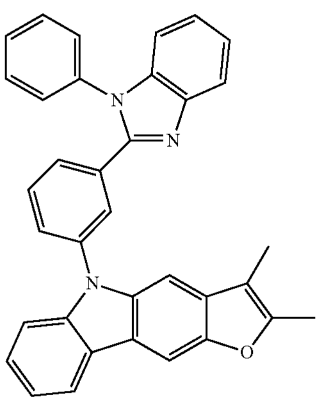
332
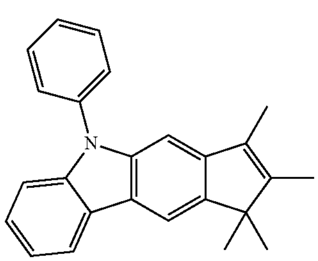
-continued
333
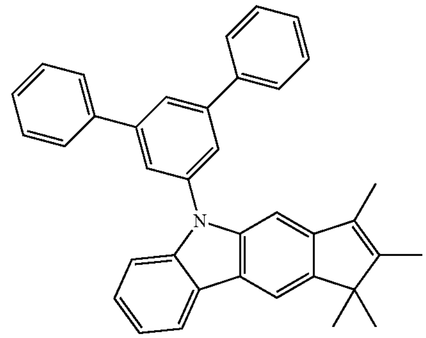
334
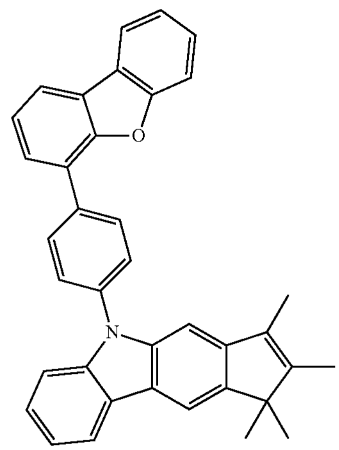
335
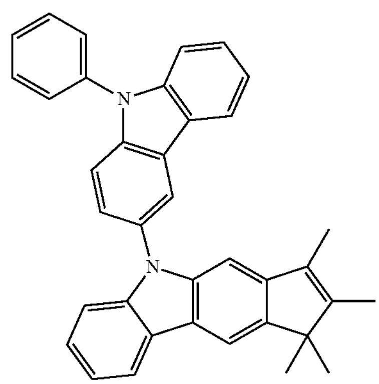
336
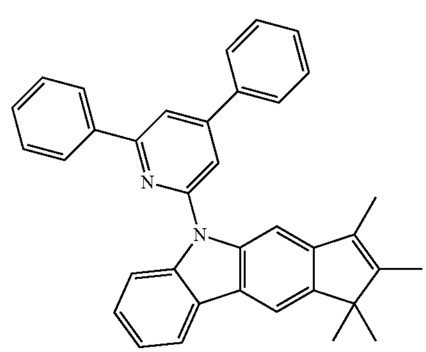

-continued
337
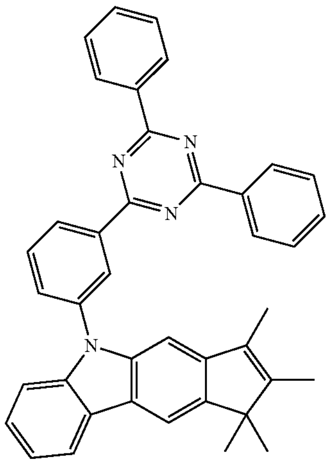
338
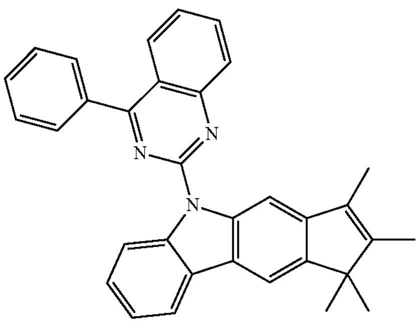
339
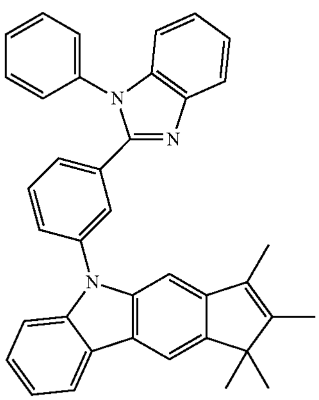
340
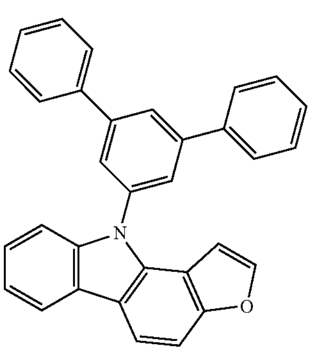
-continued
341
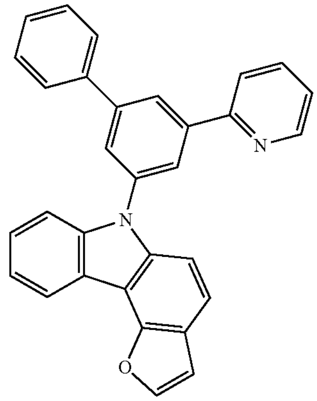
342
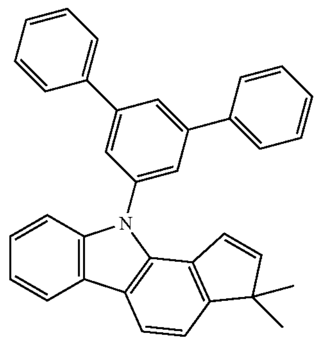
343
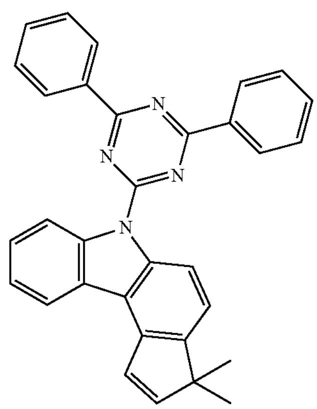
344
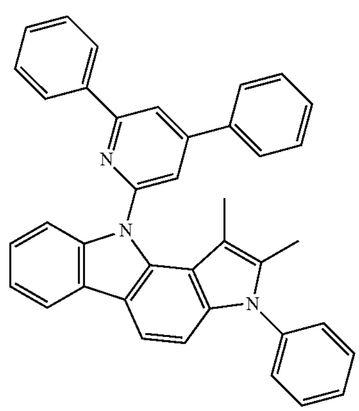

-continued
345
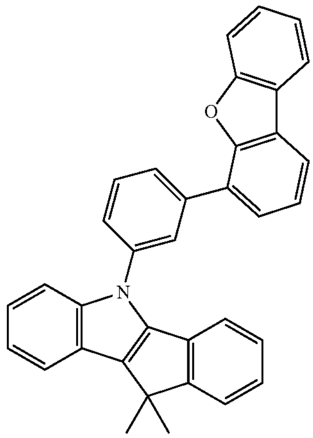
346
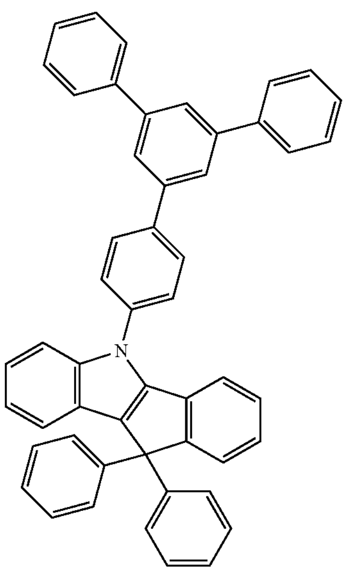
347
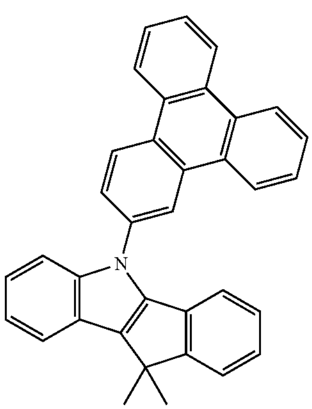
-continued
348
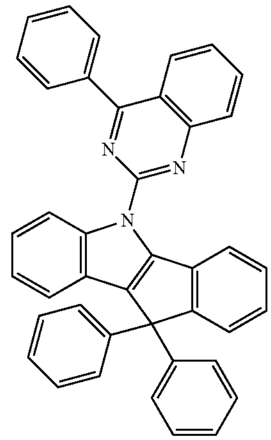
349
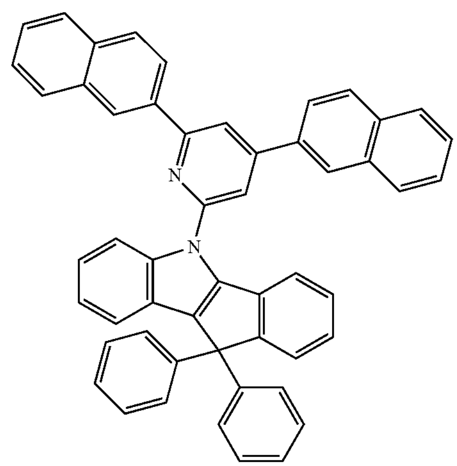
350
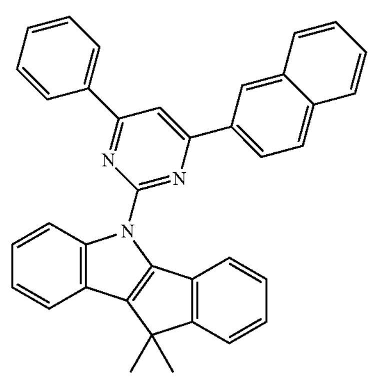

-continued
351
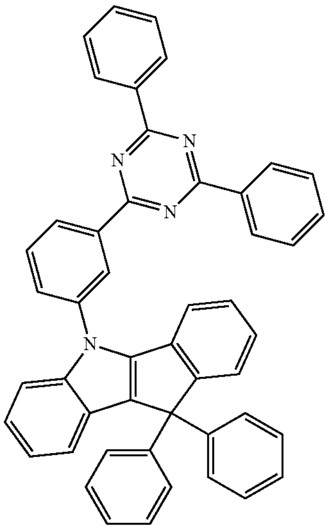
352
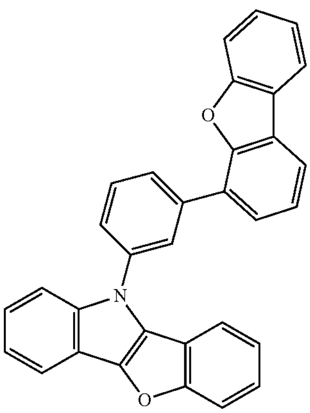
353
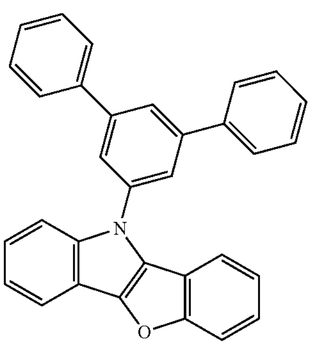
-continued
354
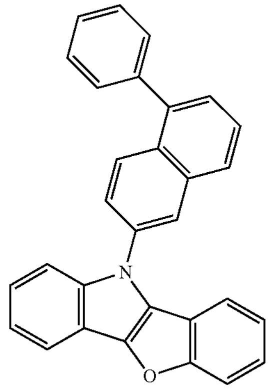
355
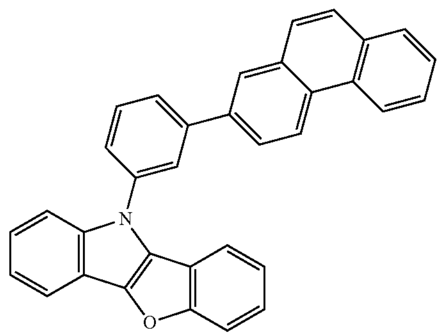
356
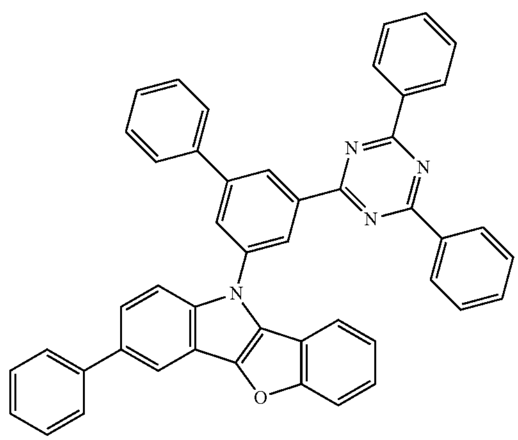
357
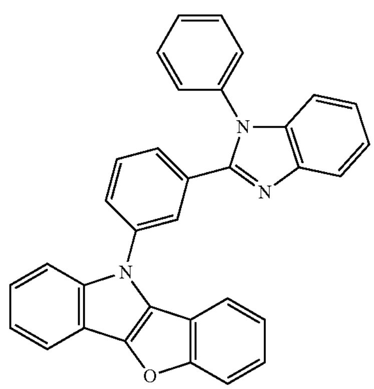

-continued
358
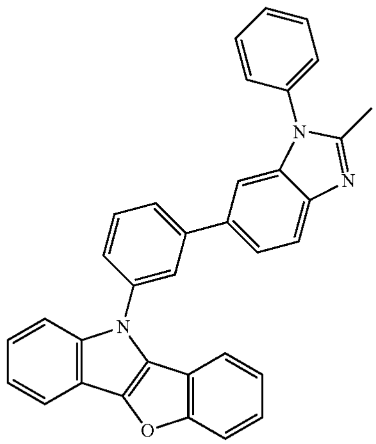
359
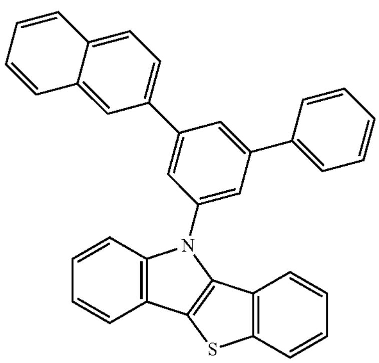
360
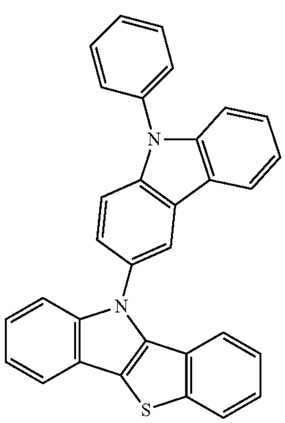
361
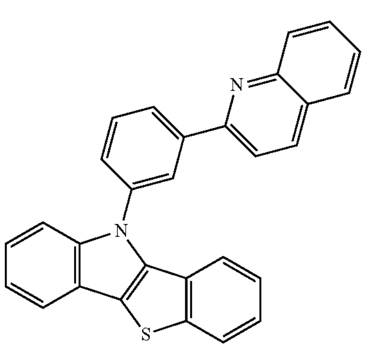
-continued
362
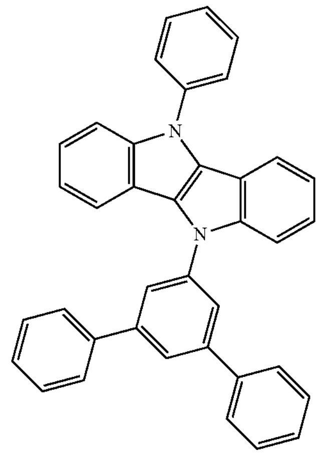
363
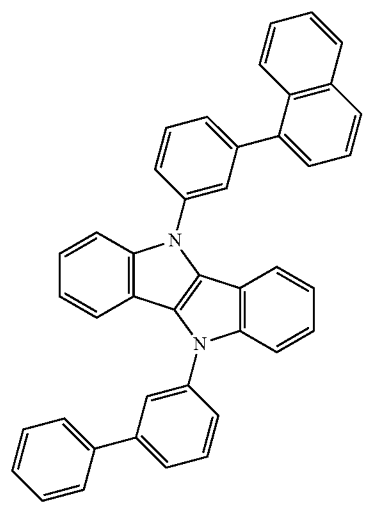
364
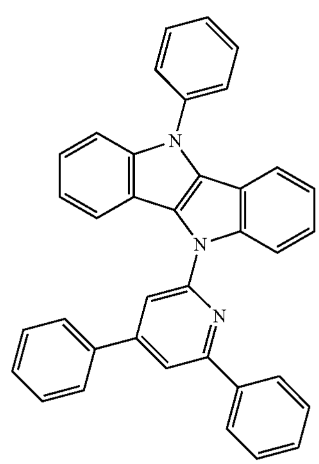

-continued
365
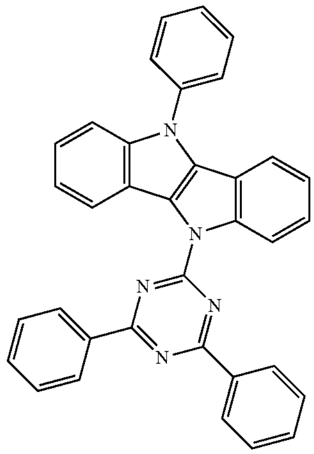
366
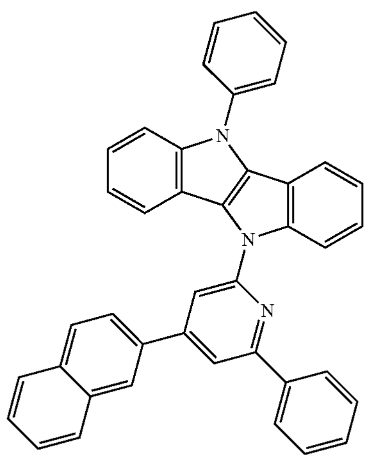
367
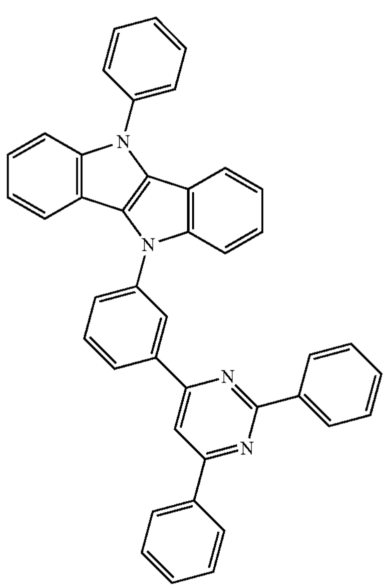
-continued
368
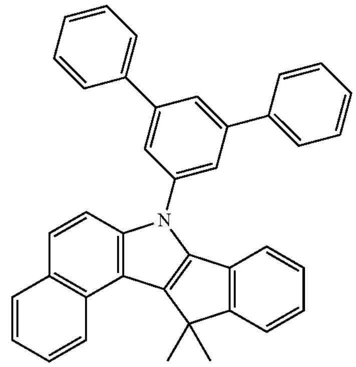
369
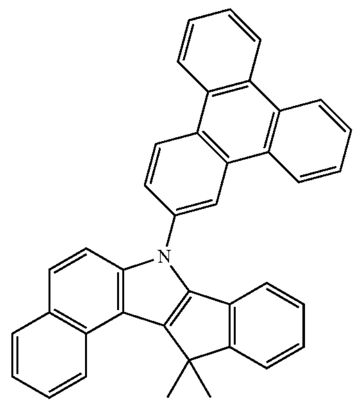
370
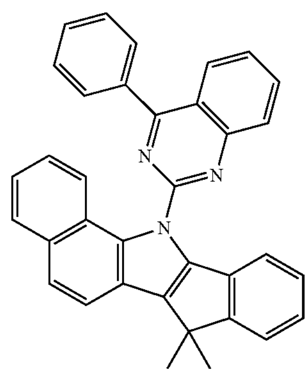
371
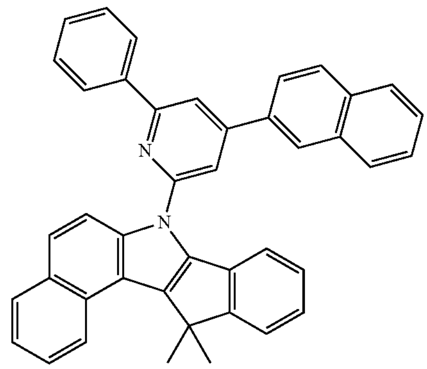
A weight ratio of the first material to the second material may be in a range of about 1:9 to about 9:1, for example, about 4:6 to about 6:4. For example, a weight ratio of the first material to the second material may be about 5:5, but embodiments of the present invention are not limited thereto. When the weight ratio of the first material to the second material is within any of these ranges, hole mobility and electron mobility in the emission layer may be efficiently balanced with respect to each other.

The first material and the second material may be both included in the emission layer in the organic layer 150.

In a comparative organic light-emitting device that includes only one kind of host in the emission layer, it is the difficult for the host to concurrently or simultaneously have an electron transport capability and a hole transport capability. Accordingly, such organic light-emitting device may have poor durability against charges, and may be more likely to deteriorate, thus leading to a decrease in the lifespan of the organic light-emitting device.

However, when the first material and the second material are both included in the emission layer, a region in which holes and electrons are combined may be shifted toward an interface between the emission layer and an electron transport region (the electron transport region being positioned between the emission layer and the second electrode). Accordingly, efficiency and lifespan of the resulting organic light-emitting device may be improved.

In some embodiments, the second material has, in addition to a high hole transporting capability, high robust properties (or high durability). Accordingly, an emission layer formed using the second material may have high thermal stability and high durability against electric stress.

Thus, an organic light-emitting device including an emission layer that includes both the first material and the second material may have high efficiency and a long lifespan.

In some embodiments, the second material may be included in the emission layer of the organic layer 150, and the first material may be included in the electron transport region between the emission layer and the second electrode 190. In some embodiments, the first material and the second material may both be included in the emission layer of the organic layer 150, and the first material may be further included in the electron transport region between the emission layer and the second electrode. In this regard, the first material included in the emission layer and the first material included in the electron transport region may be identical to or different from each other.

In some embodiments, the first material and the second material of the emission layer of the organic layer 150 may act as a host, and the emission layer may further include, in addition to the first material and the second material, a dopant.

An amount of the dopant in the emission layer may be in a range of about 0.01 to about 15 parts by weight based on 100 parts by weight of the host, but is not limited thereto.

A thickness of the emission layer may be in a range of about 100 Å to about 1,000 Å, for example, about 200 Å to about 600 Å. When the thickness of the emission layer is within any of these ranges, excellent light-emission characteristics may be obtained without a substantial increase in driving voltage.

The dopant may be a phosphorescent dopant.

For example, the phosphorescent dopant may include an organometallic compound including one selected from iridium (Ir), platinum (Pt), osmium (Os), titanium (Ti), zirconium (Zr), hafnium (Hf), europium (Eu), terbium (Tb), thulium (Tm), rhodium (Rh), and copper (Cu).

In some embodiments, the phosphorescent dopant may include an organometallic compound represented by Formula 401 below:

Formula 401

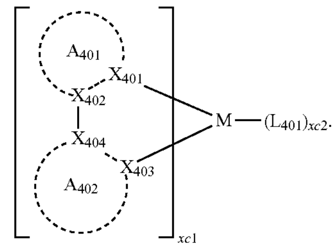

In Formula 401,

M may be selected from iridium (Ir), platinum (Pt), osmium (Os), titanium (Ti), zirconium (Zr), hafnium (Hf), europium (Eu), terbium (Tb), thulium (Tm), rhodium (Rh), and copper (Cu);

$X_{401}$ to $X_{404}$ may be each independently nitrogen or carbon;

$A_{401}$ and $A_{402}$ rings may be each independently selected from a substituted or unsubstituted benzene group, a substituted or unsubstituted naphthalene group, a substituted or unsubstituted fluorene group, a substituted or unsubstituted spiro-fluorene group, a substituted or unsubstituted indene group, a substituted or unsubstituted pyrrole group, a substituted or unsubstituted thiophene group, a substituted or unsubstituted furan group, a substituted or unsubstituted imidazole group, a substituted or unsubstituted pyrazole group, a substituted or unsubstituted thiazole group, a substituted or unsubstituted isothiazole group, a substituted or unsubstituted oxazole group, a substituted or unsubstituted isoxazole group, a substituted or unsubstituted pyridine group, a substituted or unsubstituted pyrazine group, a substituted or unsubstituted pyrimidine group, a substituted or unsubstituted pyridazine group, a substituted or unsubstituted quinoline group, a substituted or unsubstituted isoquinoline group, a substituted or unsubstituted benzoquinoline group, a substituted or unsubstituted quinoxaline group, a substituted or unsubstituted quinazoline group, a substituted or unsubstituted carbazole group, a substituted or unsubstituted benzimidazole group, a substituted or unsubstituted benzofuran group, a substituted or unsubstituted benzothiophene group, a substituted or unsubstituted isobenzothiophene group, a substituted or unsubstituted benzoxazole group, a substituted or unsubstituted isobenzoxazole group, a substituted or unsubstituted triazole group, a substituted or unsubstituted oxadiazole group, a substituted or unsubstituted triazine group, a substituted or unsubstituted dibenzofuran group, and a substituted or unsubstituted dibenzothiophene group; and at least one substituent of the substituted benzene group, substituted naphthalene group, substituted fluorene group, substituted spiro-fluorene group, substituted indene group, substituted pyrrole group, substituted thiophene group, substituted furan group, substituted imidazole group, substituted pyrazole group, substituted thiazole group, substituted isothiazole group, substituted oxazole group, substituted isoxazole group, substituted pyridine group, substituted pyrazine group, substituted pyrimidine group, substituted pyridazine group, substituted quinoline group, substituted isoquinoline group, substituted benzoquinoline group, substituted quinoxaline group, substituted quinazoline group, substituted carbazole group, substituted benzimidazole group, substituted benzofuran group, substituted benzothiophene group, substituted isobenzothiophene group, substituted benzoxazole group, substituted isobenzoxazole group, substituted triazole group, substituted oxadiazole group, substituted triazine group, substituted dibenzofuran group, and substituted dibenzothiophene group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$) and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$), where $Q_{401}$ to $Q_{407}$, $Q_{411}$ to $Q_{417}$, and $Q_{421}$ to $Q_{427}$ may each independently be selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group;

$L_{401}$ is an organic ligand;

xc1 is 1, 2, or 3; and xc2 is 0, 1, 2, or 3.

In some embodiments, $L_{401}$ may be a monovalent, divalent, or trivalent organic ligand. For example, $L_{401}$ may be selected from a halogen ligand (for example, $Cl^-$ or $F^-$), a diketone ligand (for example, acetylacetonate, 1,3-diphenyl-1,3-propanedionate, 2,2,6,6-tetramethyl-3,5-heptanedionate, or hexafluoroacetonate), a carboxylic acid ligand (for example, picolinate, dimethyl-3-pyrazolecarboxylate, or benzoate), a carbon monooxide ligand, an isonitrile ligand, a cyano ligand, and a phosphorous ligand (for example, phosphine, and phosphite), but is not limited thereto.

When $A_{401}$ in Formula 401 has two or more substituents, the substituents of $A_{401}$ may bind to each other to form a saturated or unsaturated ring.

When $A_{401}$ in Formula 402 has two or more substituents, the substituents of $A_{402}$ may bind to each other to form a saturated or unsaturated ring.

When xc1 in Formula 401 is two or more, a plurality of ligands

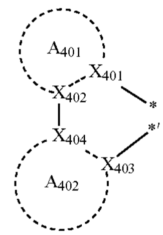

in Formula 401 may be identical to or different from each other. When xc1 in Formula 401 is two or more, $A_{401}$ and/or $A_{402}$ of one ligand may be respectively connected to $A_{401}$ and/or $A_{402}$ of one or more neighboring ligands either directly without a linking group (for example, via a single bond) or with a linking group (for example, a $C_1$-$C_5$ alkylene group, —N(R')— (where R' may be a $C_1$-$C_{10}$ alkyl group or a $C_6$-$C_{20}$ aryl group), or —C(═O)—) therebetween.

The phosphorescent dopant may include at least one selected from Compounds PD1 to PD74 and $Ir(pq)_2acac$, but embodiments of the present invention are not limited thereto (herein, Compound PD1 is $Ir(ppy)_3$, Compound PD2 is FlrPic, and PD17 is $Ir(pq)_2acac$):

PD1

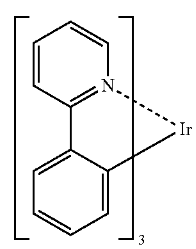

PD2

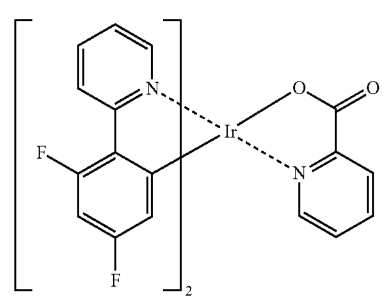

-continued
PD3
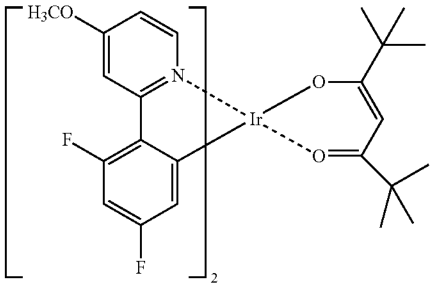
PD4
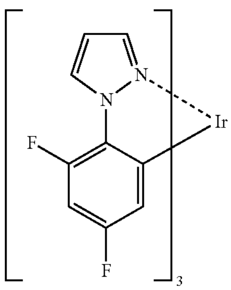
PD5
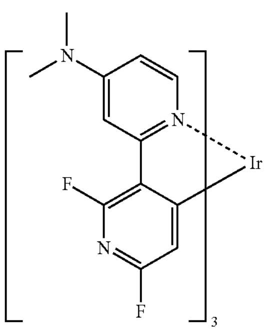
PD6
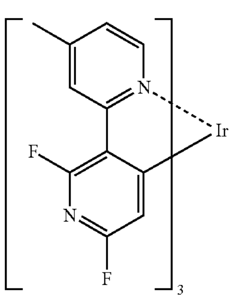
PD7
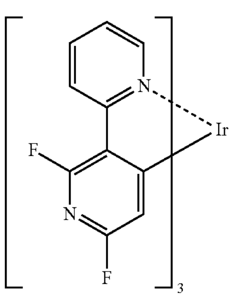
-continued
PD8
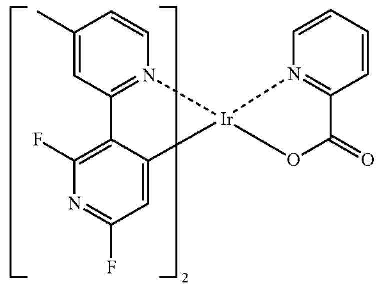
PD9
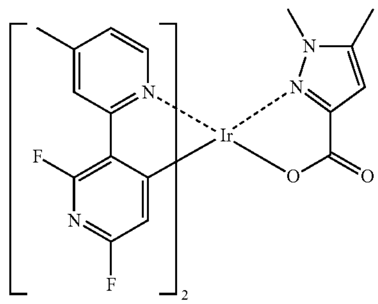
PD10
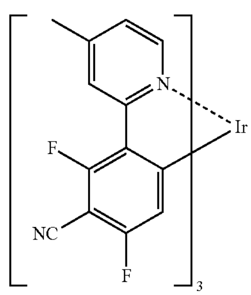
PD11
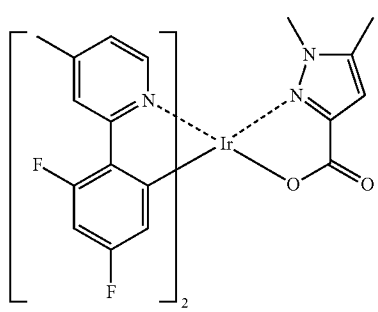
PD12
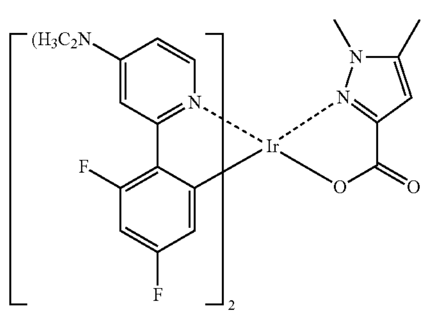

-continued
PD13
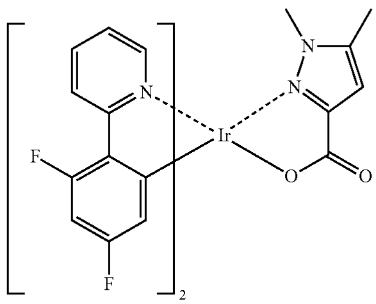
PD14
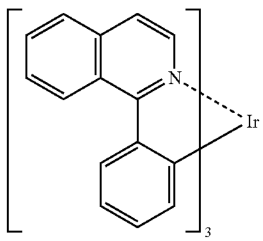
PD15
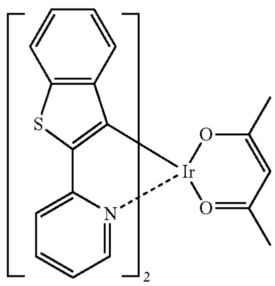
PD16
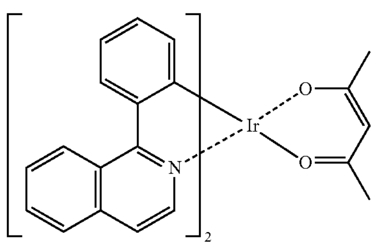
PD17
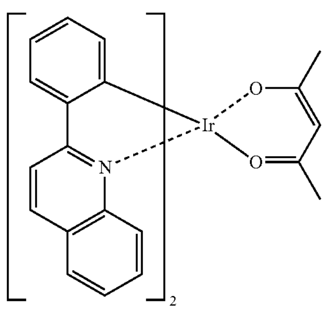
-continued
PD18
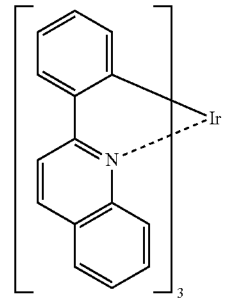
PD19
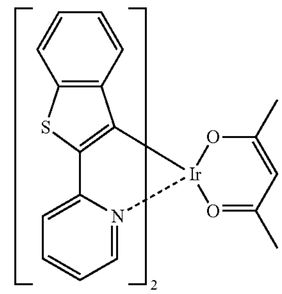
PD20
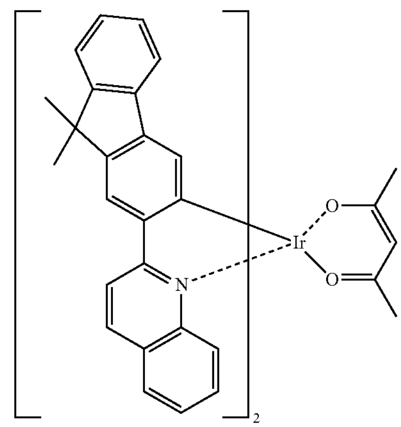
PD21
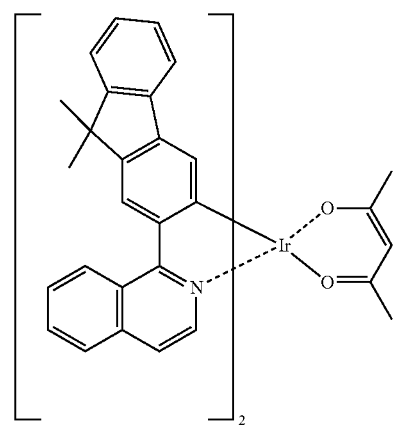
PD22
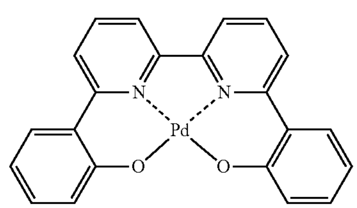

-continued
PD23
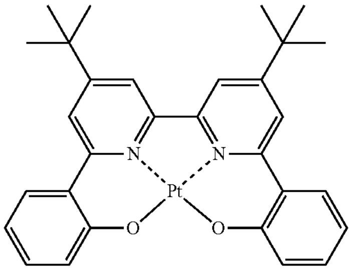
PD24
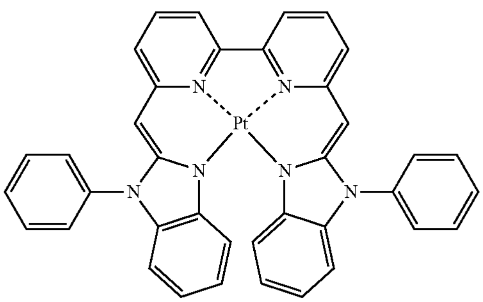
PD25
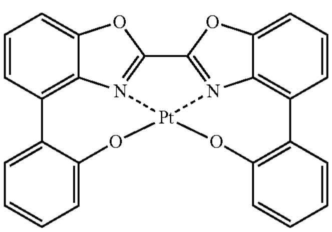
PD26
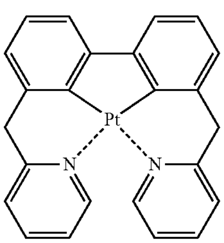
PD27
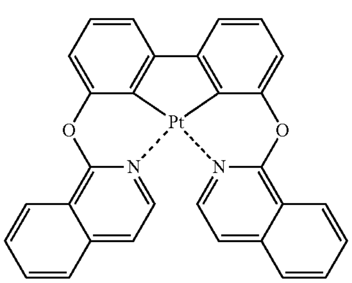
PD28
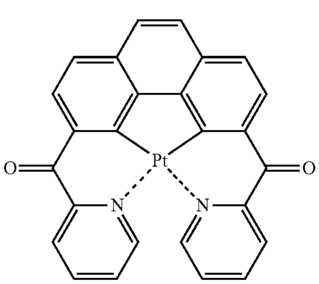
-continued
PD29
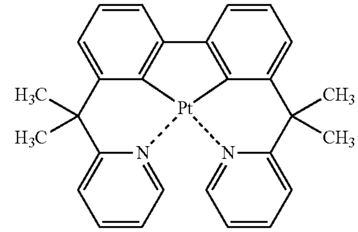
PD30
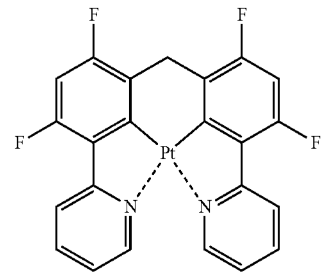
PD31
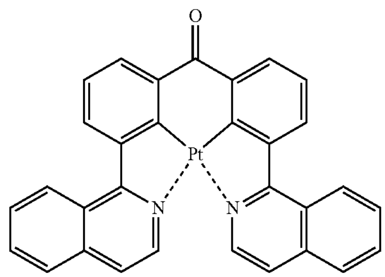
PD32
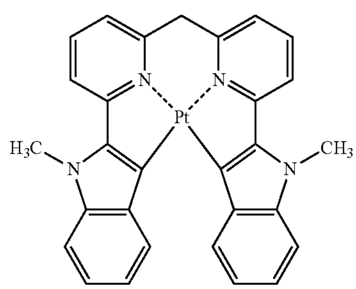
PD33
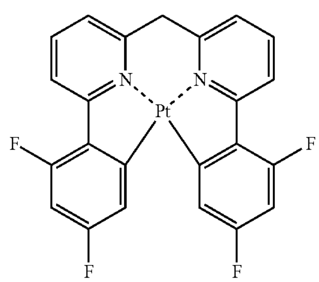
PD34
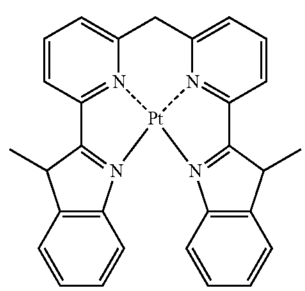

-continued
PD35
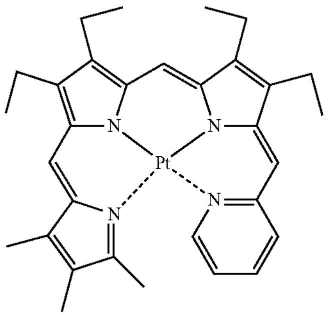
PD36
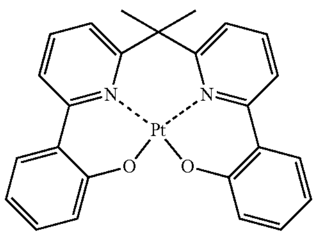
PD37
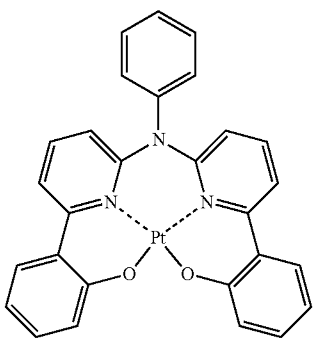
PD38
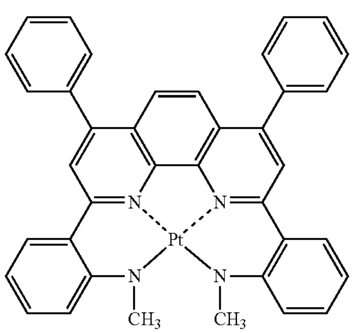
PD39
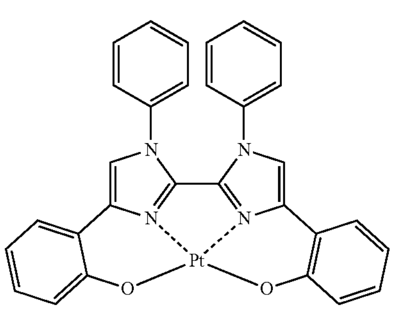
-continued
PD40
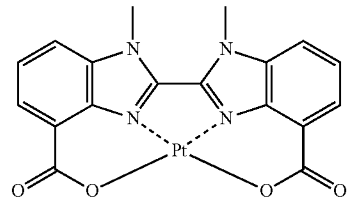
PD41
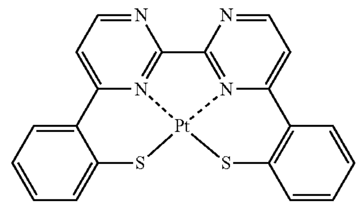
PD42
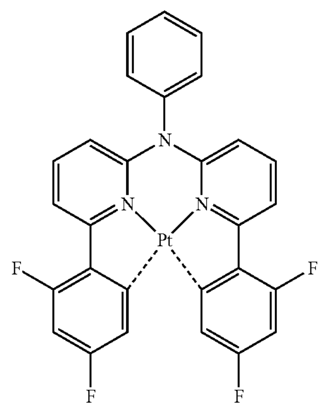
PD43
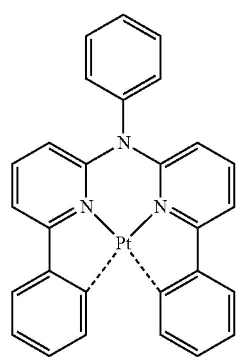
PD44
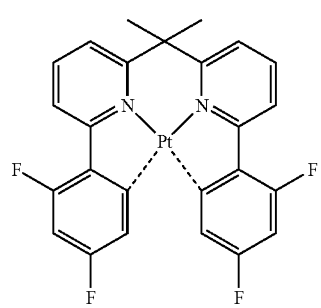

PD45
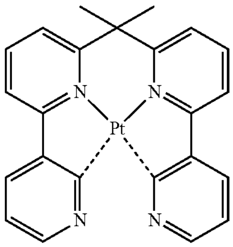
PD46
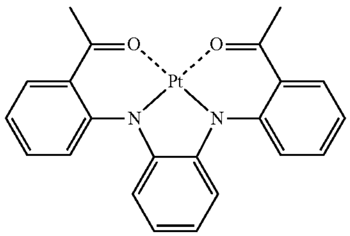
PD47
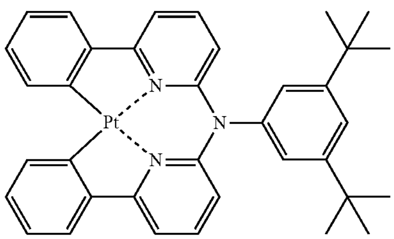
PD48
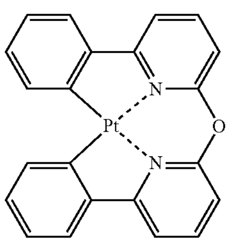
PD49
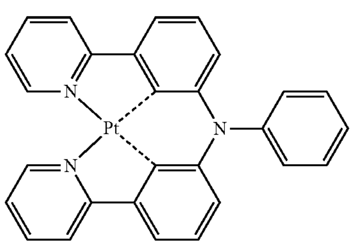
PD50
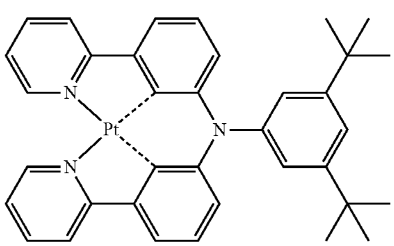
PD51
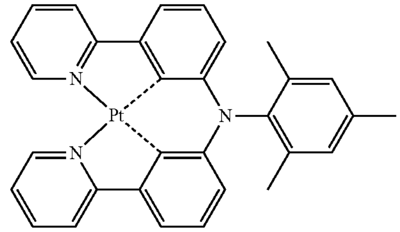
PD52
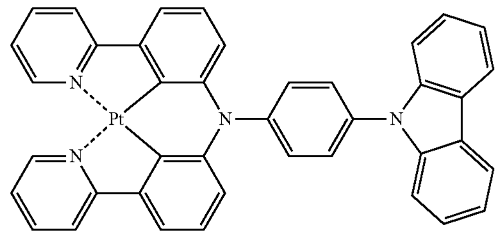
PD53
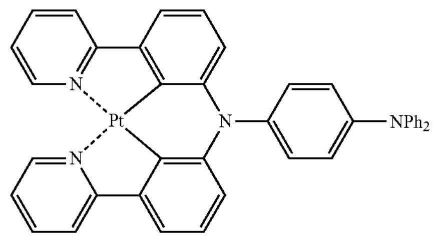
PD54
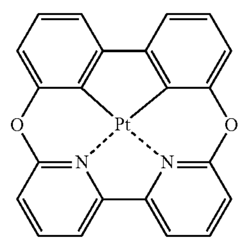
PD55
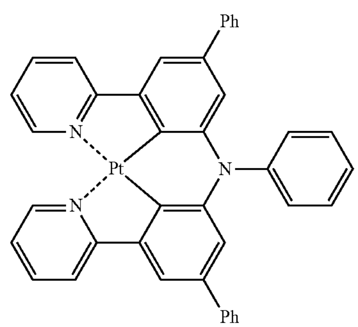
PD56
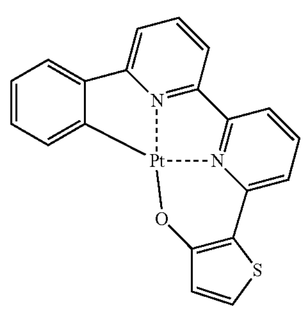

-continued
PD57
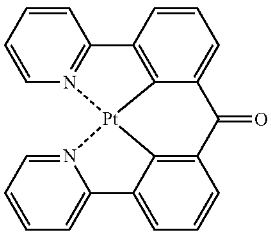
PD58
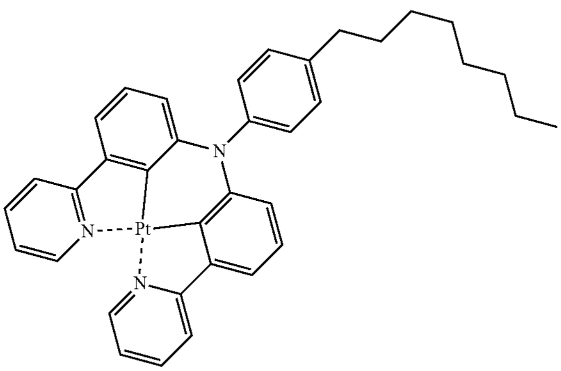
PD59
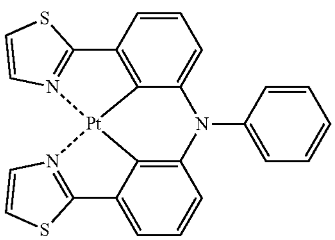
PD60
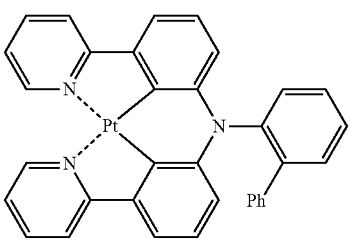
PD61
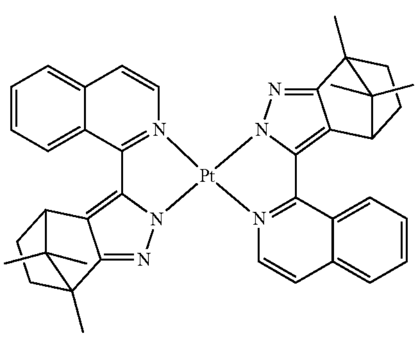
-continued
PD62
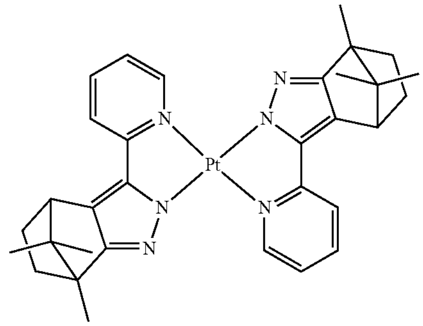
PD63
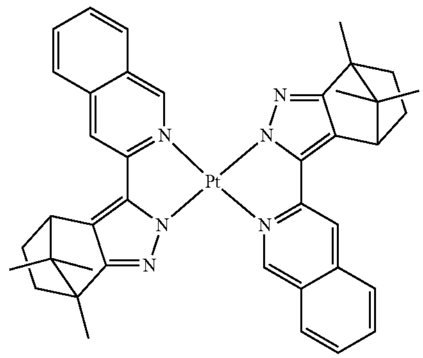
PD64
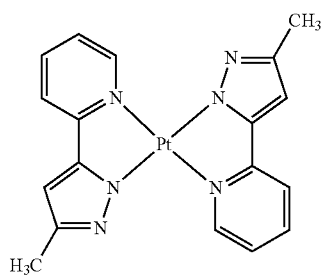
PD65
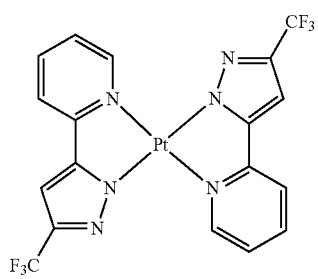
PD66
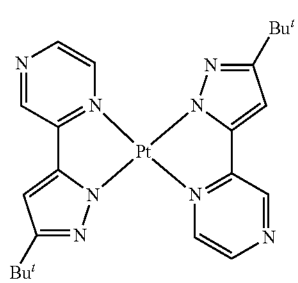

-continued

PD67

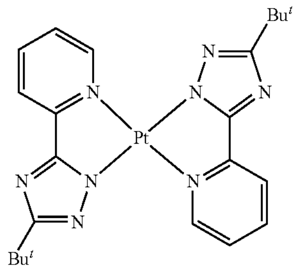

PD68

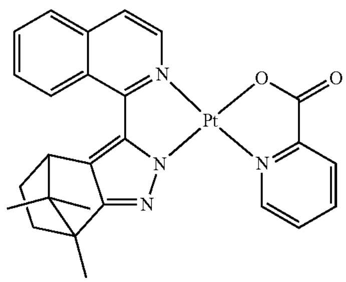

PD69

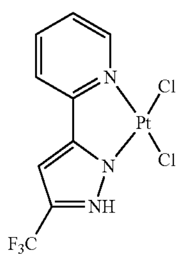

PD70

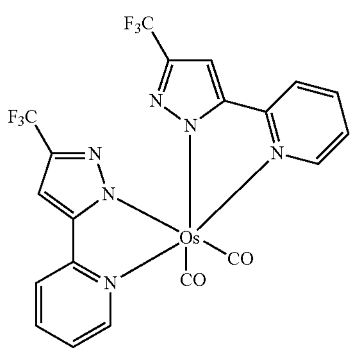

PD71

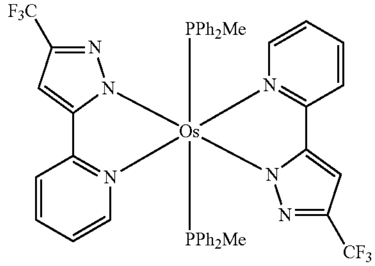

-continued

PD72

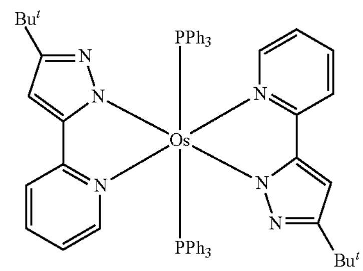

PD73

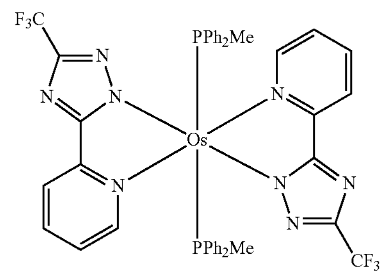

PD74

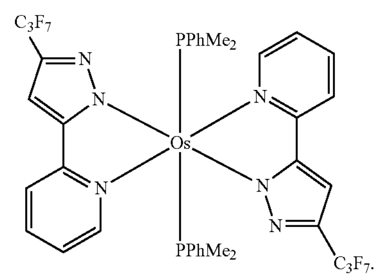

In some embodiments, the phosphorescent dopant may include PtOEP:

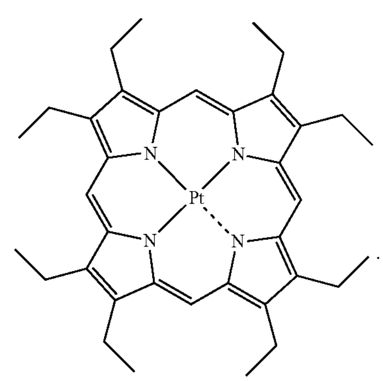

PtOEP

The hole transport region may include at least one selected from a hole injection layer (HIL), a hole transport layer (HTL), a buffer layer, and an electron blocking layer (EBL), and the electron transport region may include at least one selected from a hole blocking layer (HBL), an electron transport layer (ETL), and an electron injection layer (EIL), but they are not limited thereto.

The hole transport region may have a single-layered structure formed of a single material, a single-layered structure formed of a plurality of different materials, or a multi-layered structure having a plurality of layers formed of a plurality of different materials.

For example, the hole transport region may have a single-layered structure formed of a plurality of different materials, or a structure of hole injection layer/hole transport layer, a structure of hole injection layer/hole transport layer/buffer layer, a structure of hole injection layer/buffer layer, a structure of hole transport layer/buffer layer, a structure of hole injection layer/hole transport layer/electron blocking layer, or a structure of a hole transport layer/electron blocking layer wherein layers of each structure are sequentially stacked from the first electrode 110 in this stated order, but embodiments of the present invention are not limited thereto.

When the hole transport region includes a hole injection layer, the hole injection layer may be formed on the first electrode 110 by one or more of various suitable methods, such as vacuum deposition, spin coating casting, a Langmuir-Blodgett (LB) method, ink-jet printing, laser-printing, and/or laser-induced thermal imaging.

When the hole injection layer is formed by vacuum deposition, for example, the vacuum deposition may be performed at a deposition temperature of about 100 to about 500° C., at a vacuum degree of about $10^{-8}$ to about $10^{-3}$ torr, and at a deposition rate of about 0.01 to about 100 Å/sec, depending on the compound for forming the hole injection layer, and the structure of the hole injection layer to be formed.

When the hole injection layer is formed by spin coating, the spin coating may be performed at a coating rate of about 2000 rpm to about 5000 rpm, and at a temperature of about 80° C. to 200° C., depending on the compound for forming the hole injection layer, and the structure of the hole injection layer to be formed.

When the hole transport region includes a hole transport layer, the hole transport layer may be formed on the first electrode 110 or on the hole injection layer by one or more of various suitable methods, such as vacuum deposition, spin coating, casting, a LB method, ink-jet printing, laser-printing, and/or laser-induced thermal imaging. When the hole transport layer is formed by vacuum deposition and/or spin coating, deposition and/or coating conditions for forming the hole transport layer may be the same as (or similar to) the deposition and coating conditions for forming the hole injection layer.

The hole transport region may include at least one selected from m-MTDATA, TDATA, 2-TNATA, NPB, 3-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), (polyaniline)/poly(4-styrenesulfonate) (PANI/PSS), a compound represented by Formula 201 below, and a compound represented by Formula 202 below:

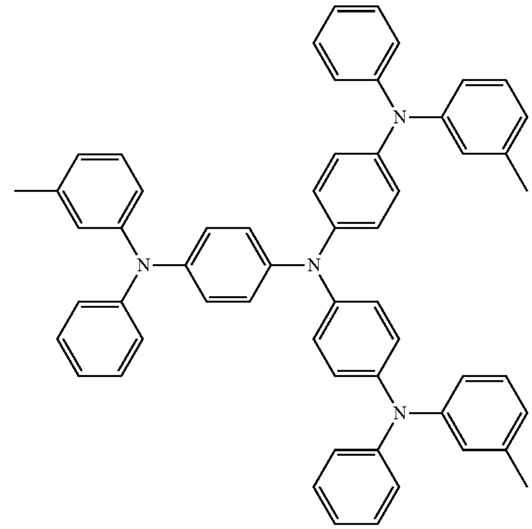

m-MTDATA

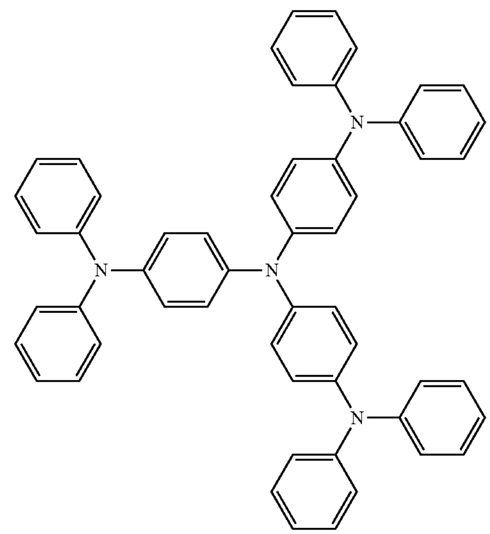

TDATA

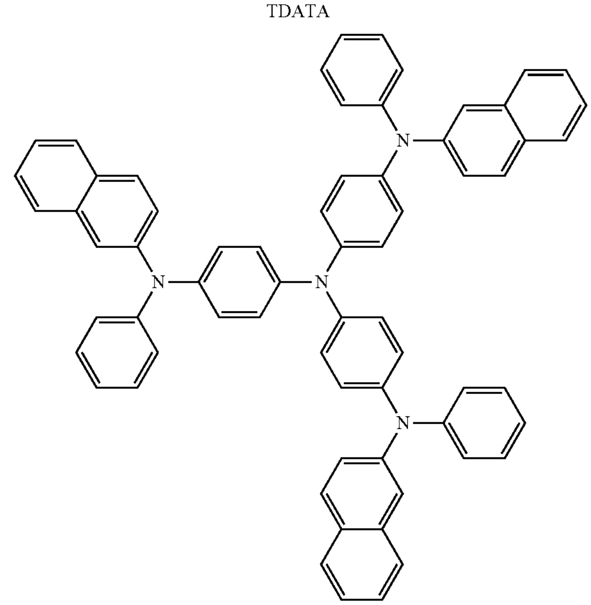

2-TNATA

-continued

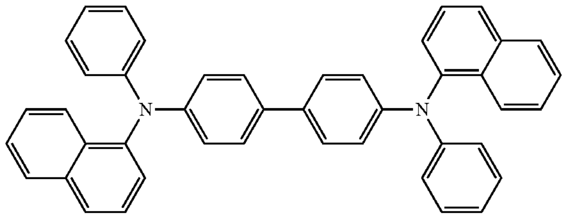

NPB

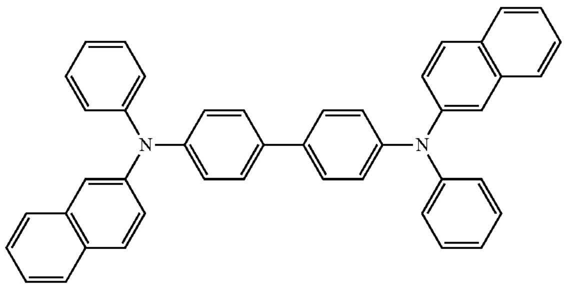

β-NPB

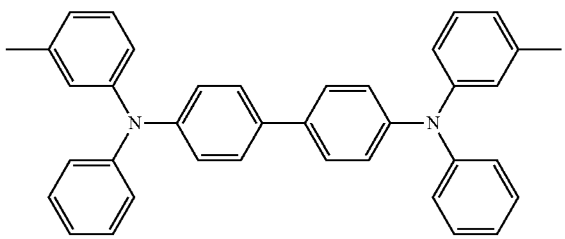

TPD

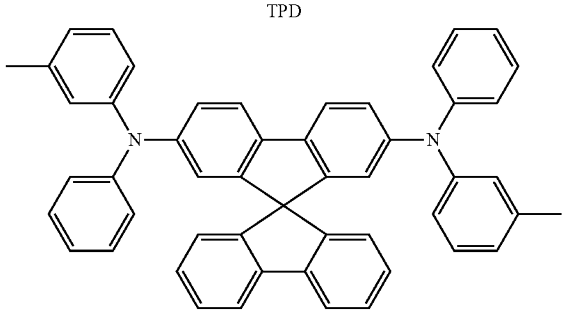

Spiro-TPD

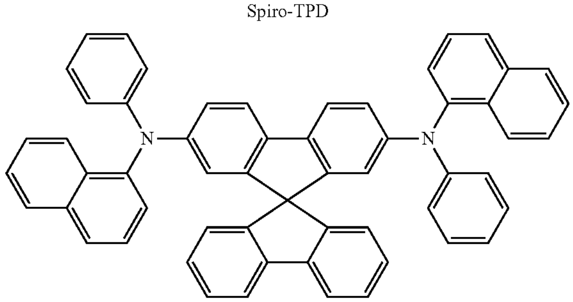

Spiro-TPD

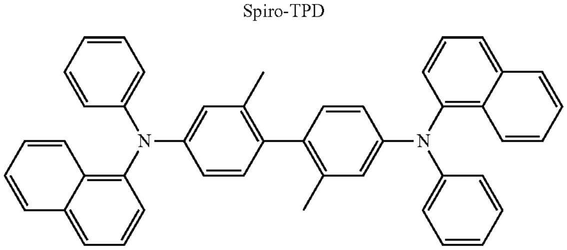

methylated NPB

-continued

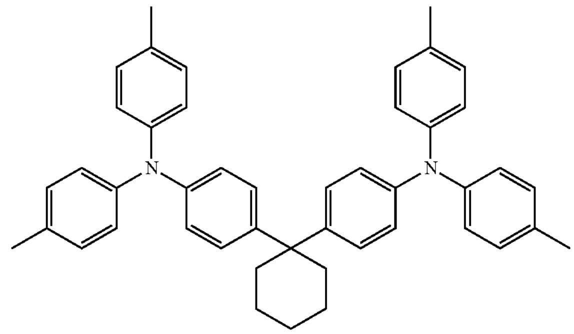

TAPC

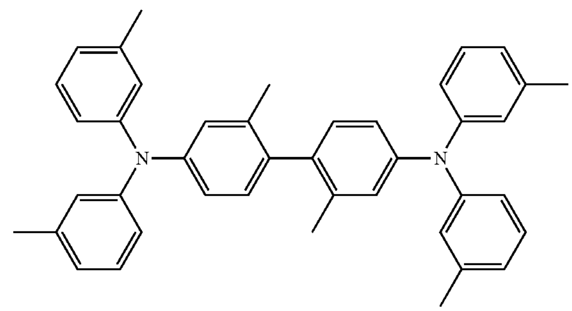

HMTPD

Formula 201

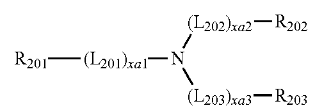

Formula 202

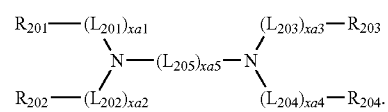

In Formulae 201 and 202, $L_{201}$ to $L_{205}$ may be each independently selected from a bond, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

xa1 to xa4 may be each independently selected from 0, 1, 2, and 3;

xa5 may be selected from 1, 2, 3, 4, and 5; and $R_{201}$ to $R_{204}$ may be each independently understood by referring to the description provided herein in connection with $R_{11}$;

The compound represented by Formula 201 may be represented by Formula 201A:

Formula 201A

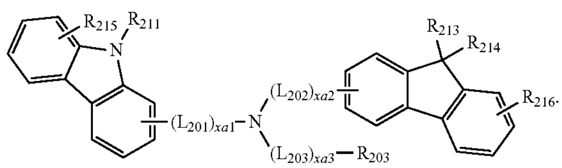

For example, the compound represented by Formula 201 may be represented by Formula 201A-1 below, but is not limited thereto:

Formula 201A-1

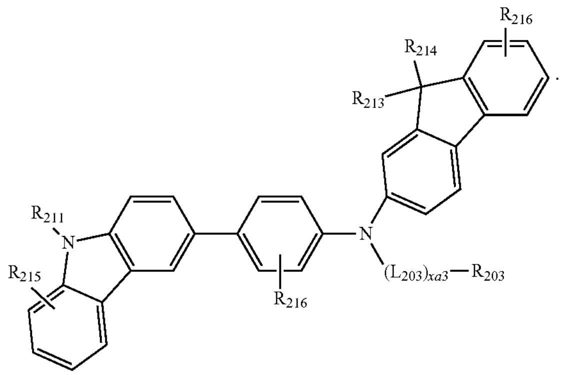

For example, the compound represented by Formula 202 may be represented by Formula 202A below, but is not limited thereto:

Formula 202A

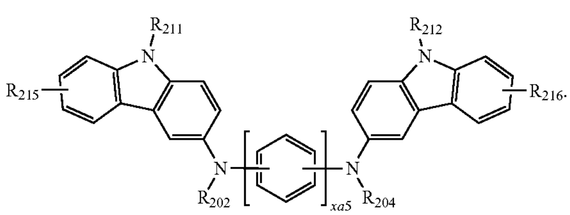

$L_{201}$ to $L_{203}$, xa1 to xa3, xa5, and $R_{202}$ to $R_{204}$ in Formulae 201A, 201A-1 and 202A are as described above; $R_{211}$ and $R_{212}$ may be each independently understood by referring to the description provided herein in connection with $R_{203}$; and $R_{213}$ to $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

For example, in Formulae 201A, 201A-1, and 202A, $L_{201}$ to $L_{203}$ may be each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may be each independently 0 or 1;

$R_{202}$ to $R_{204}$, $R_{211}$, and $R_{212}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may be each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and $R_{215}$ and $R_{216}$ are each independently selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 may be 1 or 2.

$R_{213}$ and $R_{214}$ in Formulae 201A, and 201A-1 may bind to each other to form a saturated or unsaturated ring.

The compound represented by Formula 201, and the compound represented by Formula 202 may each include any of compounds HT1 to HT20 illustrated below, but are not limited thereto.

HT1

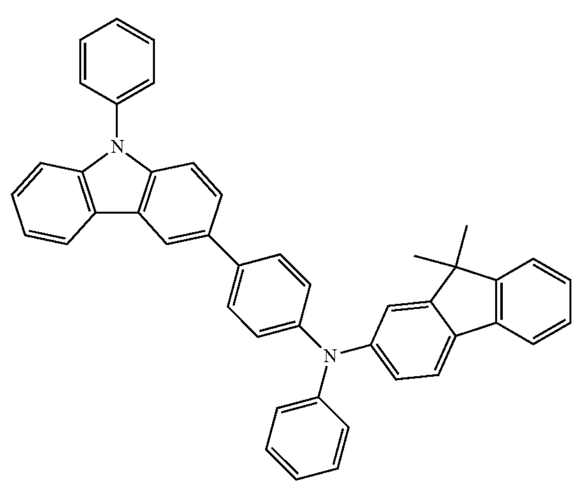

HT2
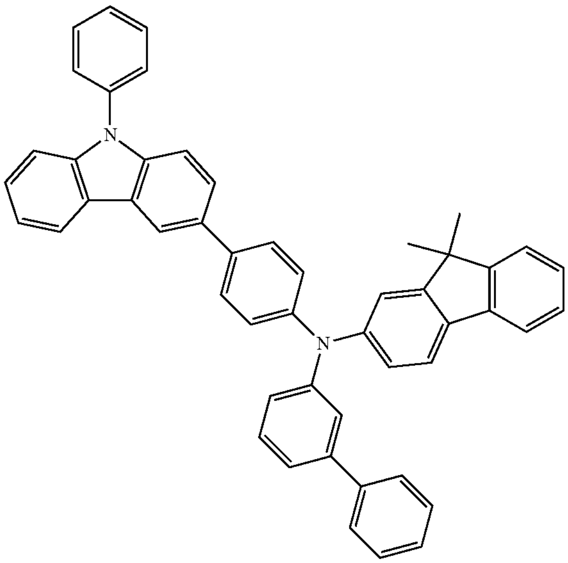
HT3
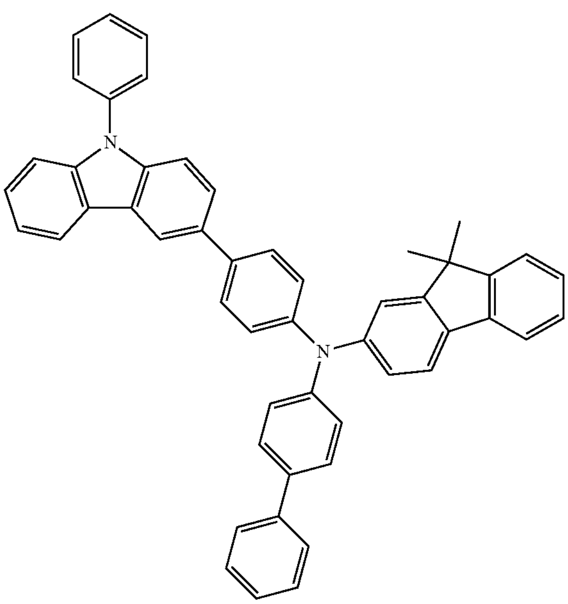
HT4
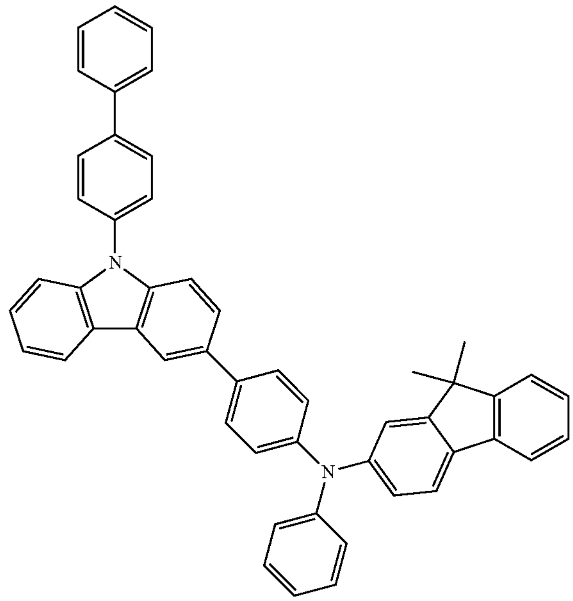
HT5
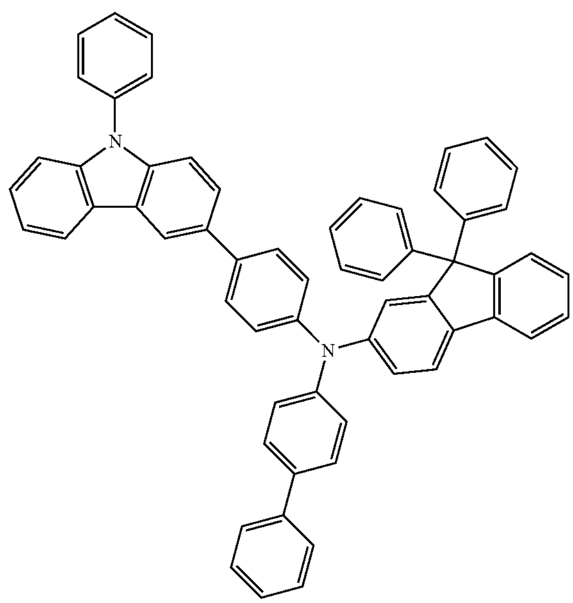

-continued
HT6
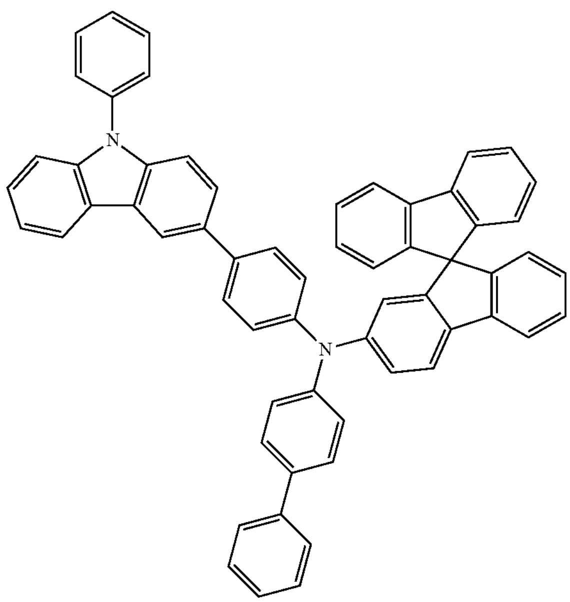
HT7
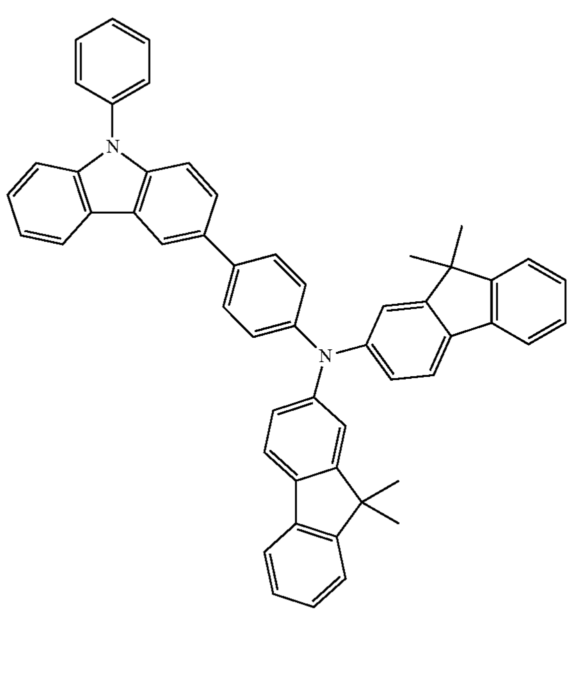
-continued
HT8
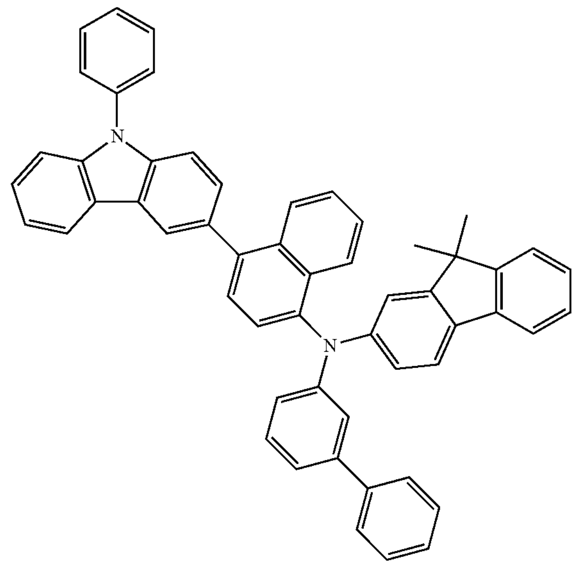
HT9
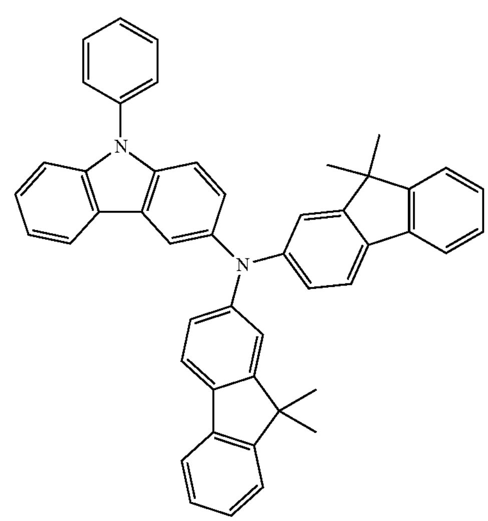

HT10
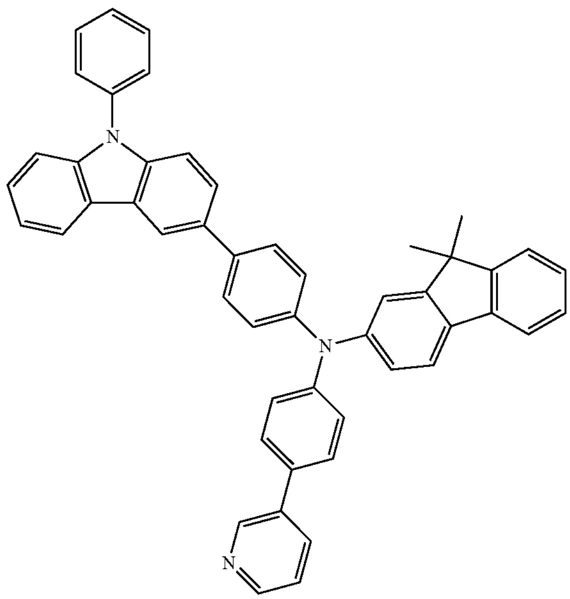
HT11
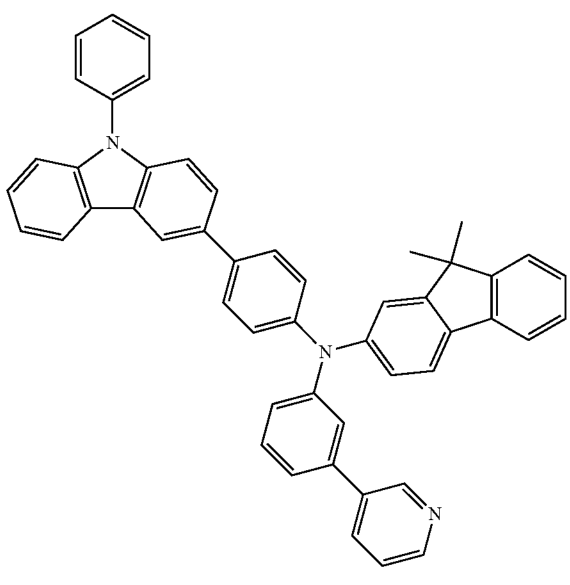
HT12
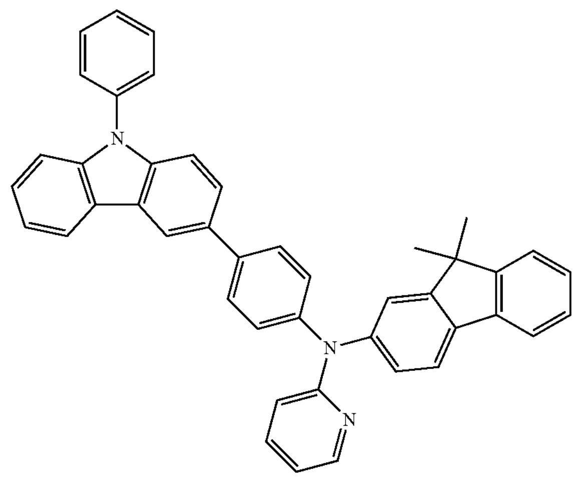
HT13
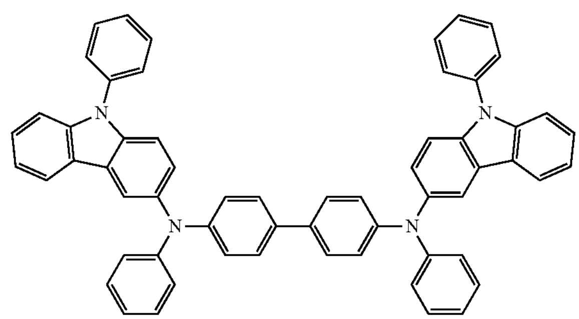
HT14
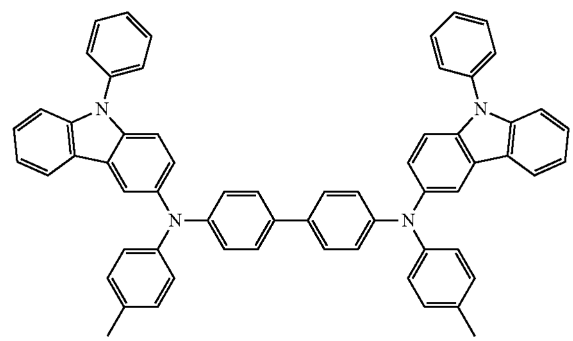
HT15
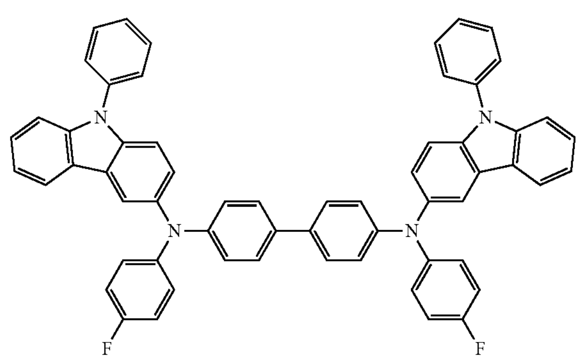

-continued

HT16

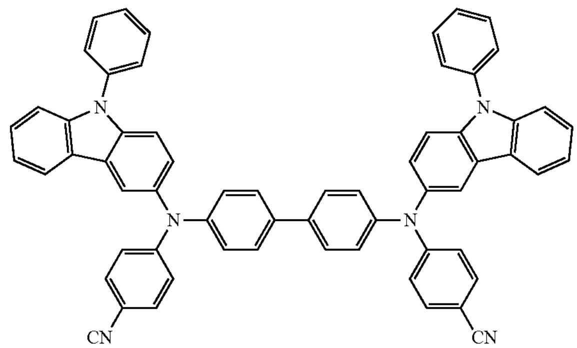

HT17

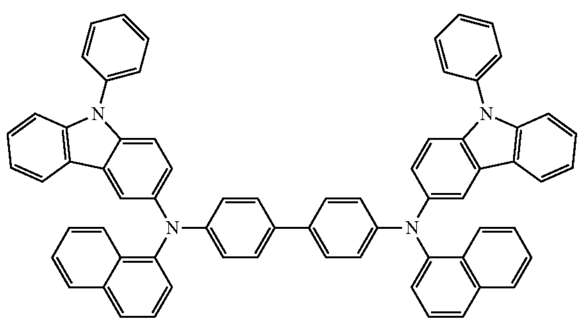

HT18

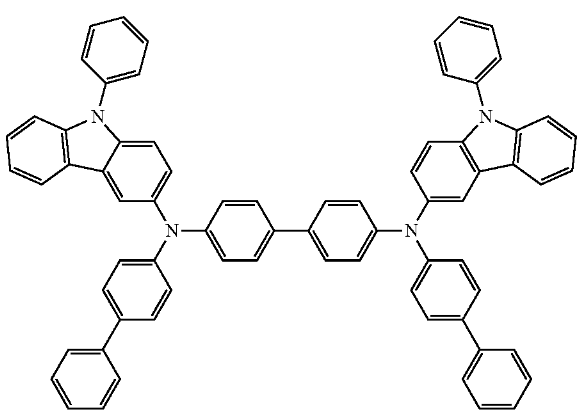

HT19

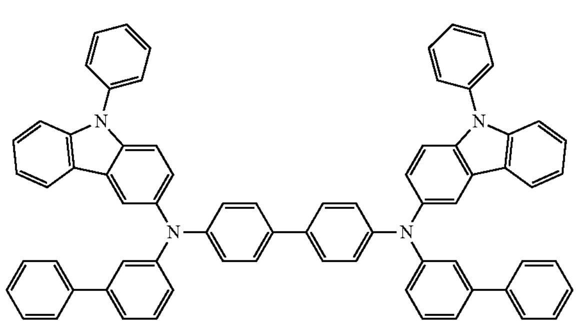

-continued

HT20

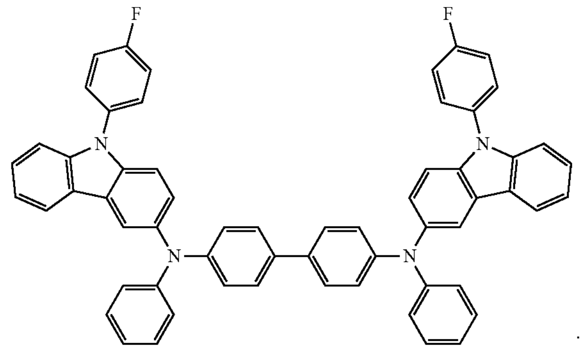

A thickness of the hole transport region may be in a range of about 100 Å to about 10,000 Å, for example, about 100 Å to about 2,000 Å. When the hole transport region includes both a hole injection layer and a hole transport layer, a thickness of the hole injection layer may be in a range of about 100 Å to about 10,000 Å, for example, about 100 Å to about 9,950 Å, or about 100 Å to about 1000 Å, and a thickness of the hole transport layer may be in a range of about 50 Å to about 2000 Å, for example about 100 Å to about 1500 Å. When the thicknesses of the hole transport region, the hole injection layer, and the hole transport layer are within any of these ranges, satisfactory hole transporting characteristics may be obtained without a substantial increase in driving voltage.

The hole transport region may further include, in addition to the above-described materials, a charge-generation material for the improvement of conductive properties. The charge-generation material may be homogeneously or unhomogeneously dispersed in the hole transport region.

The charge-generation material may be, for example, a p-dopant. The p-dopant may be one selected from a quinone derivative, a metal oxide, and a cyano group-containing compound, but is not limited thereto. Non-limiting examples of the p-dopant include quinone derivatives, such as tetracyanoquinonedimethane (TCNQ) and/or 2,3,5,6-tetrafluoro-tetracyano-1,4-benzoquinonedimethane (F4-TCNQ); metal oxides, such as a tungsten oxide and/or a molybdenum oxide, and Compound HT-D1 illustrated below.

Compound HT-D1

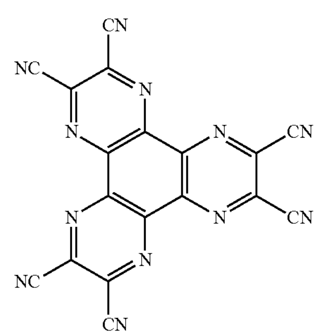

-continued

F4-TCNQ

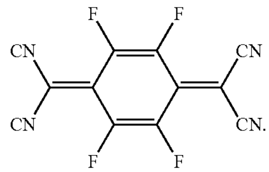

The hole transport region may further include, in addition to the hole injection layer and the hole transport layer, at least one selected from a buffer layer and an electron blocking layer. Since the buffer layer may compensate for an optical resonance distance according to a wavelength of light emitted from the emission layer, light-emission efficiency of the formed organic light-emitting device may be improved. As a material included in the buffer layer, materials that are included in the hole transport region may be used. In some embodiments, the electron blocking layer prevents (or substantially blocks) the injection of electrons from the electron transport region.

For example, a material for the electron blocking layer may be mCP, but embodiments of the present invention are not limited thereto.

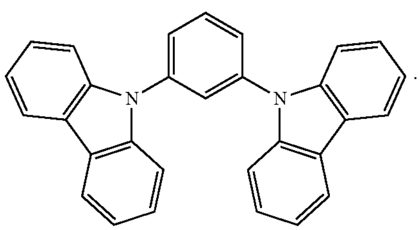

mCP

The electron transport region may include at least one selected from a hole blocking layer, an electron transport layer (ETL), and an electron injection layer, but is not limited thereto.

For example, the electron transport region may have a structure of electron transport layer/electron injection layer or a structure of hole blocking layer/electron transport layer/electron injection layer, wherein the layers of each structure are sequentially stacked from the emission layer in the stated order, but the structure of the electron transport region is not limited thereto.

The electron transport region may include a hole blocking layer. When the emission layer includes a phosphorescent dopant, the hole blocking layer may be formed to prevent or reduce the diffusion of excitons or holes into an electron transport layer.

When the electron transport region includes a hole blocking layer, the hole blocking layer may be formed on the emission layer by one or more of various suitable methods, such as vacuum deposition, spin coating casting, a Langmuir-Blodgett (LB) method, ink-jet printing, laser-printing, and/or laser-induced thermal imaging. When the hole blocking layer is formed by vacuum deposition and/or spin coating, deposition and/or coating conditions for forming the hole blocking layer may be similar to the deposition and coating conditions for forming the hole injection layer.

The hole blocking layer may include, for example, at least one selected from BCP, Bphen, and TmPyPB, but a material included in the hole blocking layer is not limited thereto.

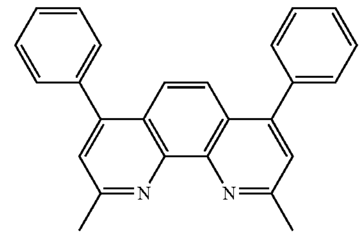

BCP

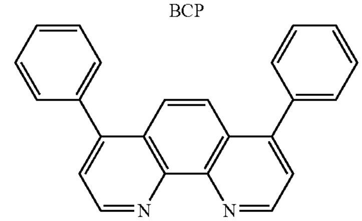

Bphen

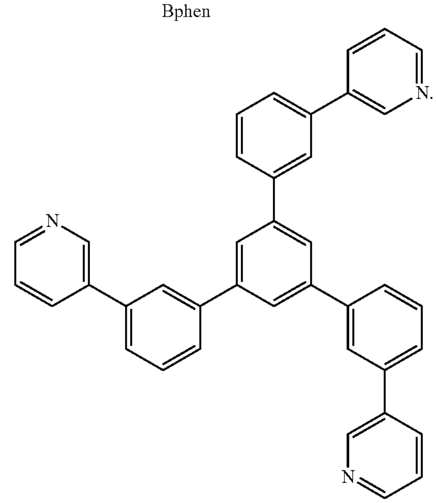

TmPyPB

A thickness of the hole blocking layer may be in a range of about 20 Å to about 1,000 Å, for example, about 30 Å to about 300 Å. When the thickness of the hole blocking layer is within any of these ranges, the hole blocking layer may have excellent hole blocking characteristics without a substantial increase in driving voltage.

The electron transport region may include an electron transport layer. The electron transport layer may be formed on the emission layer or on the hole blocking layer by one or more of various suitable methods, such as vacuum deposition, spin coating casting, a LB method, ink-jet printing, laser-printing, and/or laser-induced thermal imaging. When the electron transport layer is formed by vacuum deposition and/or spin coating, deposition and/or coating conditions for forming the electron transport layer may be the same as (or similar to) the deposition and coating conditions for forming the hole injection layer.

The electron transport layer may include at least one selected from BCP, Bphen, $Alq_3$, Balq, TAZ, and NTAZ.

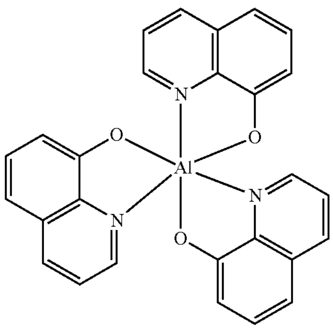

$Alq_3$

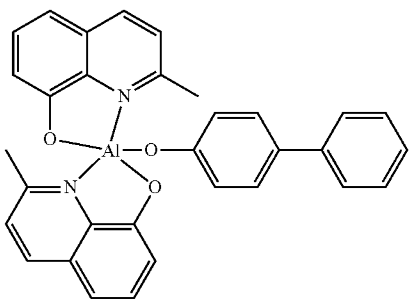

BAlq

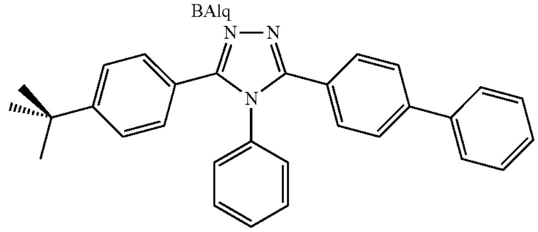

TAZ

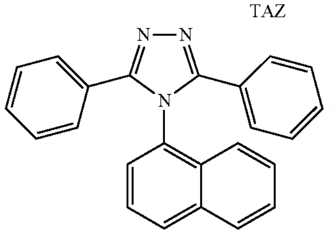

NTAZ

In some embodiments, the electron transport layer may further include at least one of compounds represented by Formula 601 below:

$$Ar_{601}\text{-}[(L_{601})_{xe1}\text{-}E_{601}]_{xe2}. \quad \text{Formula 601}$$

In Formula 601, $Ar_{601}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, monovalent non-aromatic condensed heteropolycyclic group, and —Si($Q_{301}$)($Q_{302}$)($Q_{303}$) (where $Q_{301}$ to $Q_{303}$ may be each independently selected from a hydrogen, a $C_1$-$C_{60}$ alkyl group, a $C_2$-$C_{60}$ alkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group);

a description of $L_{601}$ may be understood by referring to the description provided in connection with $L_{201}$;

$E_{601}$ may be selected from a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, carbazolyl, a phenanthridinyl group, an acridinyl group, a phenanthrolinyl group, a phenazinyl group, benzimidazolyl, a benzofuranyl group, a benzothiophenyl group, isobenzothiazolyl, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group;

xe1 may be selected from 0, 1, 2, and 3; and xe2 may be selected from 1, 2, 3, and 4.

In some embodiments, the electron transport layer may further include at least one of compounds represented by Formula 602 below:

Formula 602

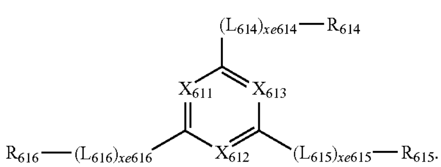

In Formula 602, $X_{611}$ may be N or C-$(L_{611})_{xe611}$-$R_{611}$, $X_{612}$ may be N or C-$(L_{612})_{xe612}$-$R_{612}$, $X_{613}$ may be N or C-$(L_{613})_{xe613}$-$R_{613}$, and at least one selected from $X_{611}$ to $X_{613}$ may be N;

$L_{611}$ to $L_{616}$ may be each independently understood by referring to the description provided herein in connection with $L_{201}$;

$R_{611}$ and $R_{616}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xe611 to xe616 may be each independently selected from 0, 1, 2, and 3.

The compound represented by Formula 601 and the compound represented by Formula 602 may each independently include at least one of Compounds ET1 to ET15 illustrated below.

ET1

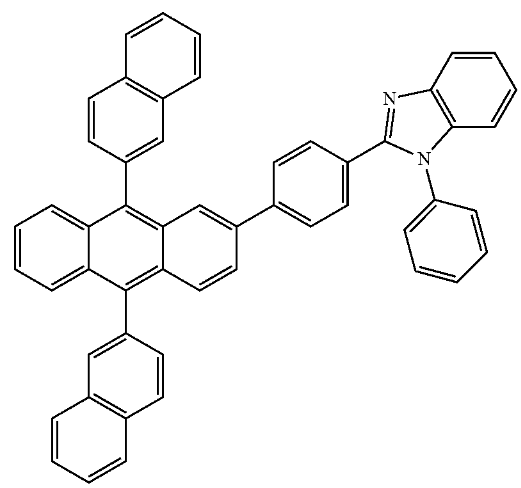

ET2

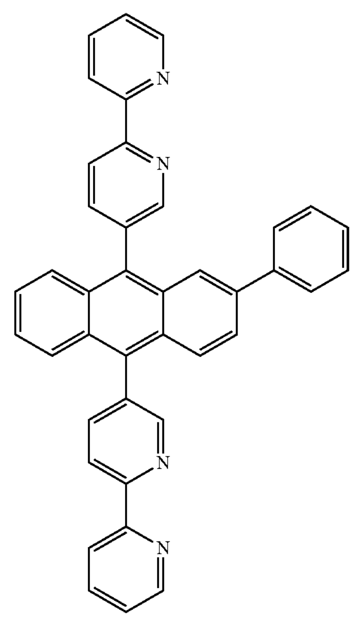

ET3
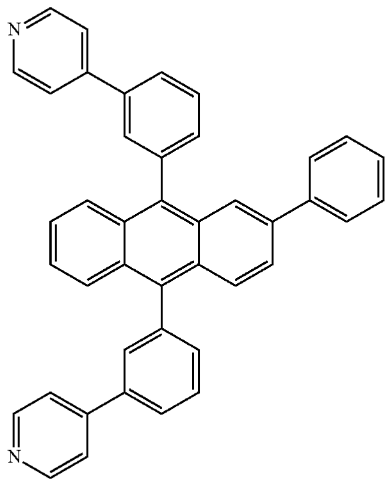
ET4
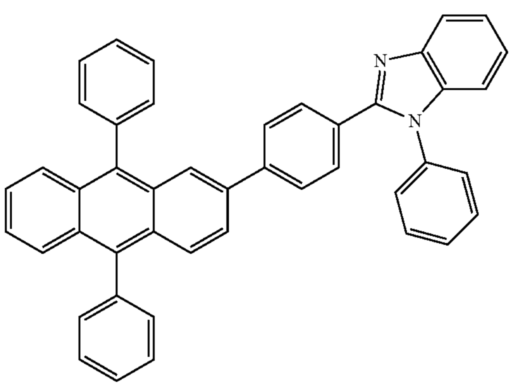
ET5
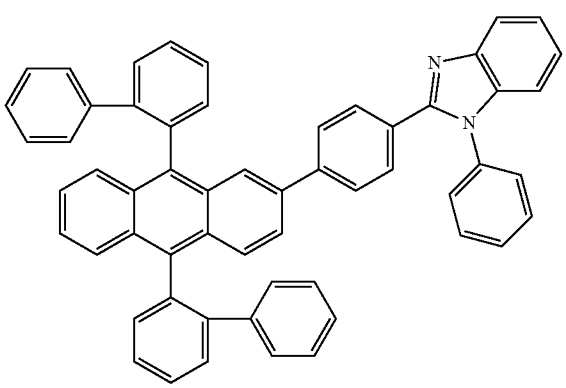
ET6
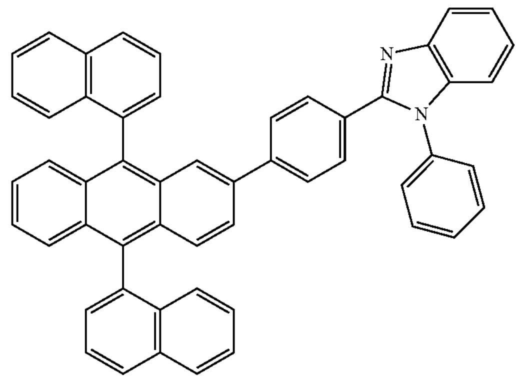
ET7
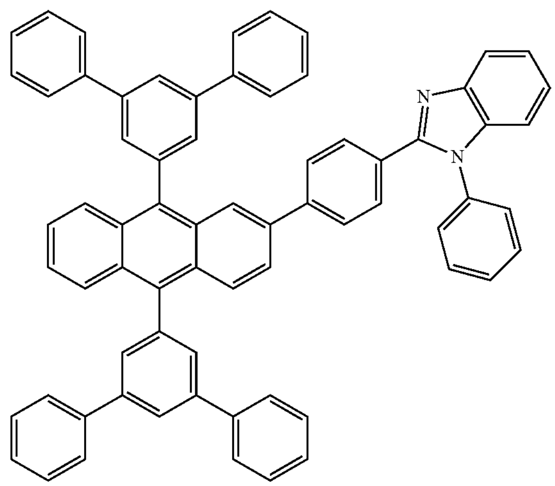
ET8
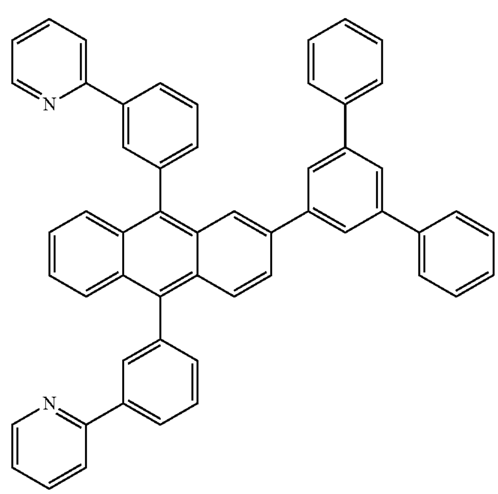

ET9
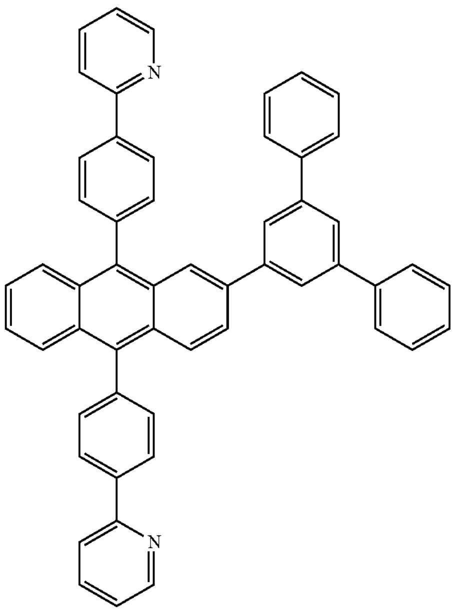
ET10
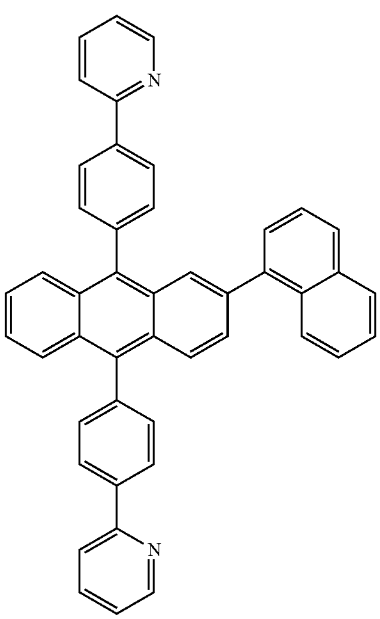
ET11
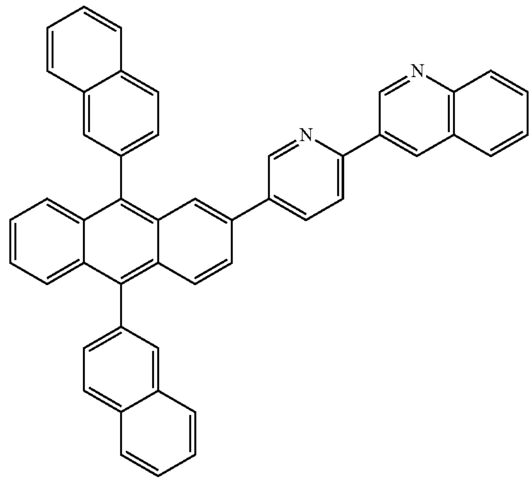
ET12
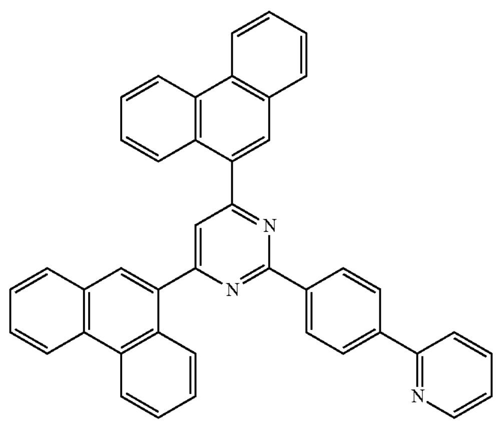
ET13
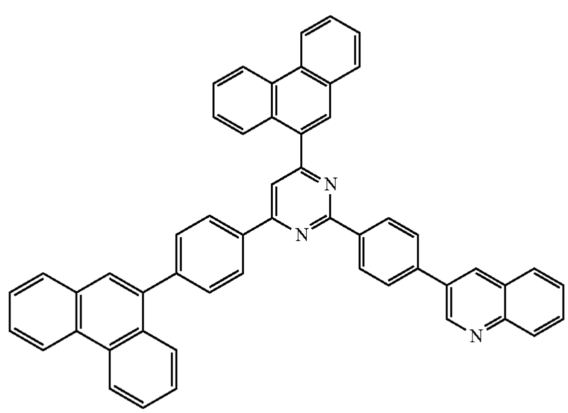

ET14

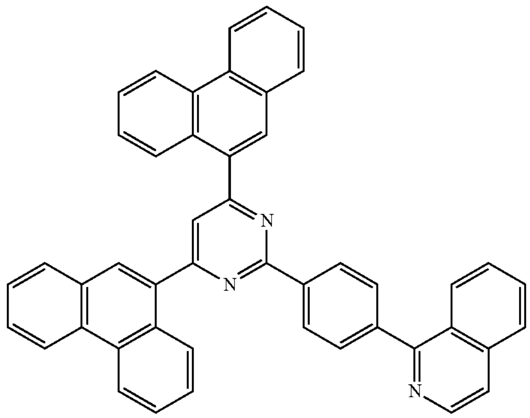

ET15

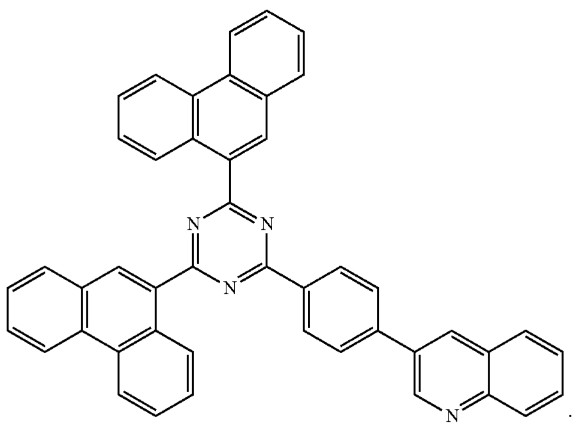

A thickness of the electron transport layer may be in a range of about 100 Å to about 1,000 Å, for example, about 150 Å to about 500 Å. When the thickness of the electron transport layer is within any of the ranges described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

ET-D1

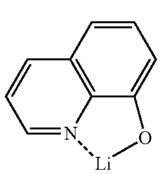

ET-D2

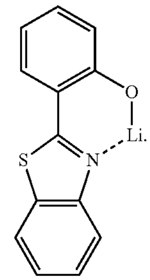

The electron transport region may include an electron injection layer that facilitates the injection of electrons from the second electrode 190.

The electron injection layer may be formed on the electron transport layer by one or more of various suitable methods, such as vacuum deposition, spin coating casting, a LB method, ink-jet printing, laser-printing, and/or laser-induced thermal imaging. When the electron injection layer is formed by vacuum deposition and/or spin coating, deposition and/or coating conditions for forming the electron injection layer may be the same as (or similar to) those for the formation of the hole injection layer.

The electron injection layer may include at least one selected from LiF, NaCl, CsF, $Li_2O$, BaO, and LiQ.

A thickness of the electron injection layer may be in a range of about 1 Å to about 100 Å, for example, about 3 Å to about 90 Å. When the thickness of the electron injection layer is within any of the ranges described above, the electron injection layer may have satisfactory electron injection characteristics without a substantial increase in driving voltage.

The second electrode 190 may be positioned on the electron transport region described above. The second electrode 190 may be a cathode that is an electron injection electrode. When the second electrode 190 is a cathode, a metal for forming the second electrode may be a material having a low work function, such as a metal, an alloy, an electrically conductive compound, or a mixture thereof. Non-limiting examples of the second electrode 190 include lithium (Li), magnesium (Mg), aluminum (Al), aluminum-lithium (Al—Li), calcium (Ca), magnesium-indium (Mg—In), and magnesium-silver (Mg—Ag). In some embodiments, the material for forming the second electrode 190 may be ITO or IZO. The second electrode 190 may be a reflective electrode or a transmissive electrode.

The organic light-emitting device according to one or more embodiments of the present invention may be included in a flat panel display device including a thin film transistor. The thin film transistor may include a gate electrode, source and drain electrodes, a gate insulating film, and an active layer, and one of the source and drain electrodes may electrically contact a first electrode of the organic light-emitting device. The active layer may include crystalline silicon, amorphous silicon, organic semiconductor, oxide semiconductor, and/or the like, but embodiments of the present invention are not limited thereto.

A $C_1$-$C_{60}$ alkyl group as used herein refers to a linear or branched aliphatic hydrocarbon monovalent group having 1 to 60 carbon atoms in the main carbon chain, and non-limiting examples thereof include a methyl group, an ethyl group, a propyl group, an isobutyl group, a sec-butyl group, a ter-butyl group, a pentyl group, an iso-amyl group, and a hexyl group. A $C_1$-$C_{60}$ alkylene group as used herein refers to a divalent group having the same structure as the $C_1$-$C_{60}$ alkyl group.

A $C_1$-$C_{60}$ alkoxy group as used herein refers to a monovalent group represented by —$OA_{101}$ (where $A_{101}$ is the $C_1$-$C_{60}$ alkyl group), and non-limiting examples thereof include a methoxy group, an ethoxy group, and an isopropyloxy group.

A $C_2$-$C_{60}$ alkenyl group as used herein refers to a hydrocarbon group having at least one carbon-carbon double bond at one or more positions along a carbon chain (e.g., in the middle or at either of the terminal ends) of the $C_2$-$C_{60}$ alkyl group, and non-limiting examples thereof include an ethenyl group, a propenyl group, and a butenyl group. A $C_2$-$C_{60}$ alkenylene group as used herein refers to a divalent group having the same structure as the $C_2$-$C_{60}$ alkenyl group.

A $C_2$-$C_{60}$ alkynyl group as used herein refers to a hydrocarbon group having at least one carbon-carbon triple bond at one or more positions along a carbon chain (e.g., in the middle or at either of the terminal ends) of the $C_2$-$C_{60}$ alkyl group, and non-limiting examples thereof include an ethynyl group and a propynyl group. A $C_2$-$C_{60}$ alkynylene group as used herein refers to a divalent group having the same structure as the $C_2$-$C_{60}$ alkynyl group.

A $C_3$-$C_{10}$ cycloalkyl group as used herein refers to a monovalent hydrocarbon monocyclic group having 3 to 10 carbon atoms as ring-forming atoms, and non-limiting examples thereof include a cyclopropyl group, a cyclobutyl group, a cyclopentyl group, a cyclohexyl group, and a cycloheptyl group. A $C_3$-$C_{10}$ cycloalkylene group as used herein refers to a divalent group having the same structure as the $C_3$-$C_{10}$ cycloalkyl group.

A $C_1$-$C_{10}$ heterocycloalkyl group as used herein refers to a monovalent monocyclic group having at least one hetero atom selected from N, O, P, and S as a ring-forming atom and 1 to 10 carbon atoms as the remaining ring-forming atoms, and non-limiting examples thereof include a tetrahydrofuranyl group and a tetrahydrothiophenyl group. A $C_1$-$C_{10}$ heterocycloalkylene group as used herein refers to a divalent group having the same structure as the $C_1$-$C_{10}$ heterocycloalkyl group.

A $C_3$-$C_{10}$ cycloalkenyl group as used herein refers to a monovalent monocyclic group that has 3 to 10 carbon atoms as ring-forming atoms and at least one carbon-carbon double bond in the ring thereof, and does not have overall aromaticity. Non-limiting examples of the $C_3$-$C_{10}$ cycloalkenyl group include a cyclopentenyl group, a cyclohexenyl group, and a cycloheptenyl group. A $C_3$-$C_{10}$ cycloalkenylene group as used herein refers to a divalent group having the same structure as the $C_3$-$C_{10}$ cycloalkenyl group.

A $C_1$-$C_{10}$ heterocycloalkenyl group as used herein refers to a monovalent monocyclic group that has at least one hetero atom selected from N, O, P, and S as a ring-forming atom, 1 to 10 carbon atoms as the remaining ring-forming atoms, and at least one double bond in its ring. Non-limiting examples of the $C_1$-$C_{10}$ heterocycloalkenyl group include a 2,3-hydrofuranyl group and a 2,3-hydrothiophenyl group. A $C_1$-$C_{10}$ heterocycloalkenylene group as used herein refers to a divalent group having the same structure as the $C_1$-$C_{10}$ heterocycloalkenyl group.

A $C_6$-$C_{60}$ aryl group as used herein refers to a monovalent group having a carbocyclic aromatic system including 6 to 60 carbon atoms, and a $C_6$-$C_{60}$ arylene group as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and/or the $C_6$-$C_{60}$ arylene group include two or more rings, the rings may be fused to each other.

A $C_1$-$C_{60}$ heteroaryl group as used herein refers to a monovalent group having a carbocyclic aromatic system that has at least one hetero atom selected from N, O, P, and S as a ring-forming atom, and 1 to 60 carbon atoms. A $C_1$-$C_{60}$ heteroarylene group as used herein refers to a divalent group having a carbocyclic aromatic system that has at least one hetero atom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and/or the $C_1$-$C_{60}$ heteroarylene group include two or more rings, the rings may be fused to each other.

A $C_6$-$C_{60}$ aryloxy group as used herein refers to a group represented by —$OA_{102}$ (where $A_{102}$ is the $C_6$-$C_{60}$ aryl group), and a $C_6$-$C_{60}$ arylthio group refers to a group represented by —$SA_{103}$ (where $A_{103}$ is the $C_6$-$C_{60}$ aryl group).

A monovalent non-aromatic condensed polycyclic group as used herein refers to a cyclic monovalent group (for example, having 8 to 60 carbon atoms) that includes two or more rings condensed to each other, only carbon atoms as ring forming atoms, and the entire molecular structure does not have overall aromaticity. Non-limiting example of the monovalent non-aromatic condensed polycyclic group is a fluorenyl group. A divalent non-aromatic condensed polycyclic group as used herein refers to a divalent group having the same structure as the monovalent non-aromatic condensed polycyclic group.

A monovalent non-aromatic condensed heteropolycyclic group as used herein refers to a cyclic monovalent group (for example, having 2 to 60 carbon atoms) that includes two or more rings condensed to each other, has at least one heteroatom selected from N, O, P, and S as a ring forming atom, and carbon atoms as the remaining ring-forming atoms, and the entire molecular structure does not have overall aromaticity. Non-limiting example of the monovalent non-aromatic condensed heteropolycyclic group is a carbazolyl group. A divalent non-aromatic condensed heteropolycyclic group as used herein refers to a divalent group having the same structure as the monovalent non-aromatic condensed heteropolycyclic group.

Hereinafter, an organic light-emitting device according to one or more embodiments is described in more detail with reference to Examples. However, these Examples are for illustrative purposes only and are not intended to limit the scope of the present disclosure.

EXAMPLE

Example R1

A glass substrate with ITO anode thereon was cut to a size of 50 mm×50 mm×0.5 mm and then, sonicated in acetone, in isopropyl alcohol, and in pure water, for 15 minutes in each, and then, washed by exposure to UV ozone for 30 minutes.

Compound HT3 was deposited on the ITO anode to form a hole transport layer having a thickness of 1200 Å, thereby completing the formation of a hole transport region.

Compound PH1-1 and Compound PH2-1 (a weight ratio of Compound PH1-1 to Compound PH2-1 was 5:5), which acted as a host, and $Ir(pq)_2acac$ (Compound PD17, an amount of the dopant was 5 wt %), which acted as a dopant, were co-deposited on the hole transport region to form an emission layer having a thickness of 300 Å.

Compound ET1 was deposited on the emission layer to form an electron transport layer having a thickness of 400 Å, and LiF was vacuum deposited on the electron transport layer to form an electron injection layer having a thickness of 10 Å, thereby completing the formation of an electron transport region. On the electron transport region, Al cathode having a thickness of 2000 Å was formed, thereby completing the manufacture of an organic light-emitting device.

PH1-1

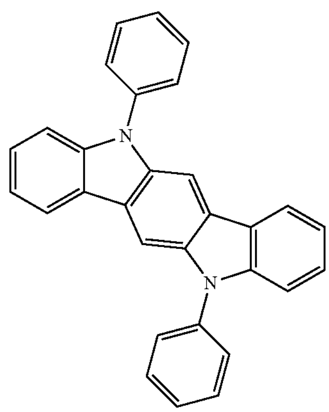

PH2-1

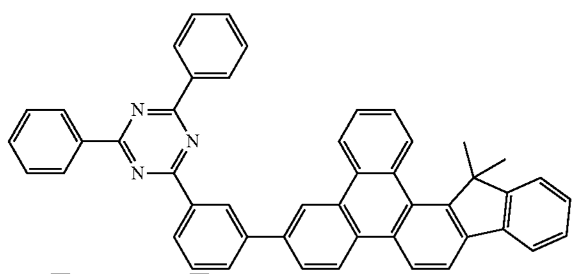

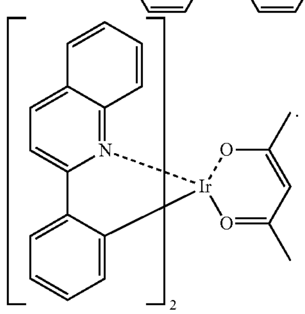

$Ir(pq)_2acac$

Example R2

An organic light-emitting device was manufactured in the same (or substantially the same) manner as in Example R1, except that in forming an emission layer, Compound PH2-2 was used instead of Compound PH2-1.

PH1-1

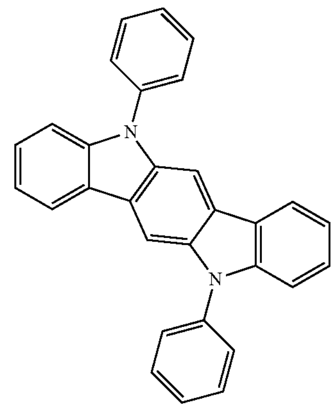

PH2-2

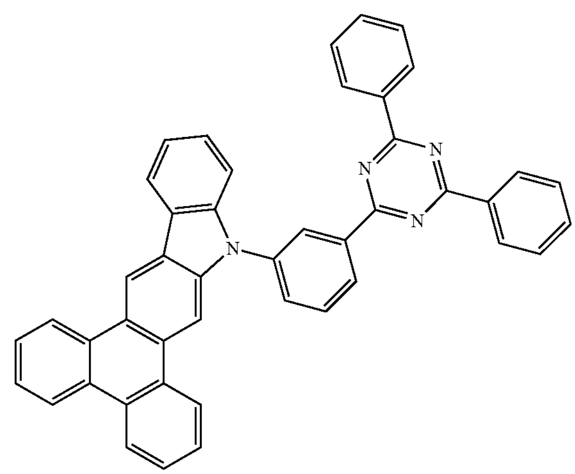

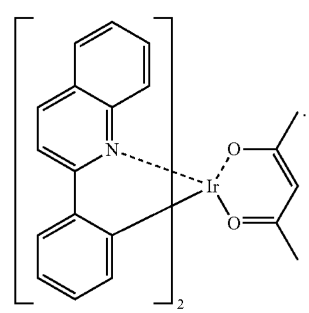

$Ir(pq)_2acac$

Example R3

An organic light-emitting device was manufactured in the same (or substantially the same) manner as in Example R1, except that in forming an emission layer, Compound PH1-3 was used instead of Compound PH1-1, and Compound PH2-2 was used instead of Compound PH2-1.

PH1-3

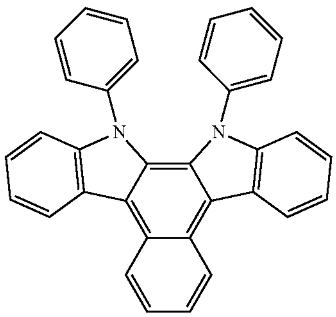

PH2-2

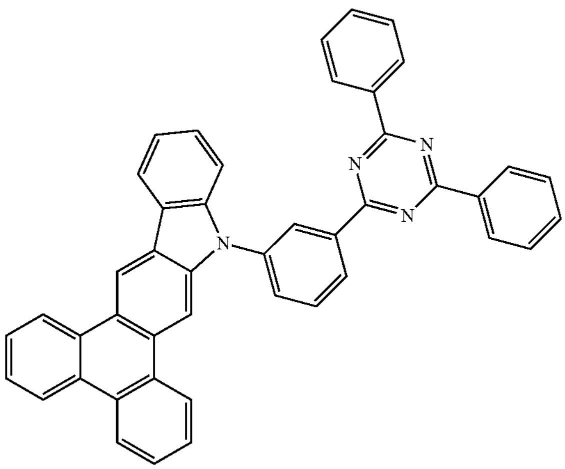

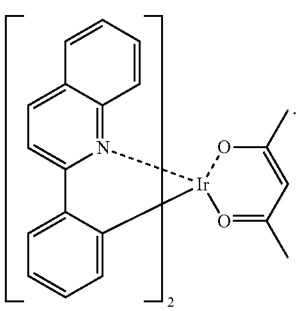

$Ir(pq)_2acac$

Example R4

An organic light-emitting device was manufactured in the same (or substantially the same) manner as in Example R1, except that in forming an emission layer, Compound PH1-3 was used instead of Compound PH1-1, and Compound PH2-4 was used instead of Compound PH2-1.

PH1-3

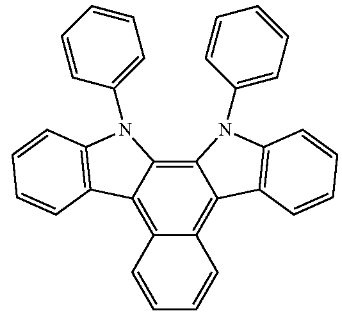

PH2-4

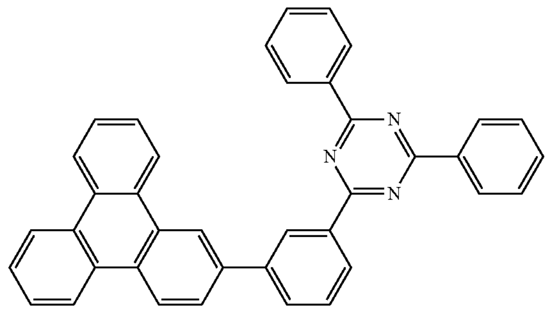

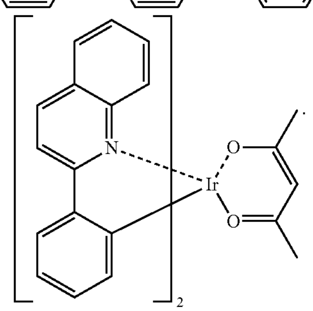

$Ir(pq)_2acac$

Comparative Example R1

An organic light-emitting device was manufactured in the same (or substantially the same) manner as in Example R1, except that in forming an emission layer, CBP was used instead of Compound PH1-1 and Compound PH2-1.

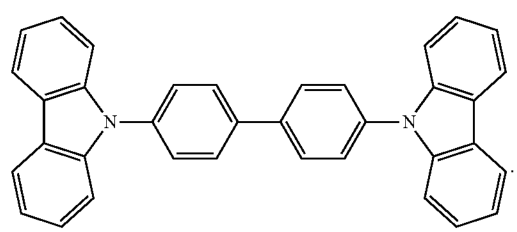

CBP

Comparative Example R2

An organic light-emitting device was manufactured in the same (or substantially the same) manner as in Example R1, except that in forming an emission layer, Compound PH1-2 was used instead of Compound PH1-1, and Compound PH1-3 was used instead of Compound PH2-1.

PH1-2

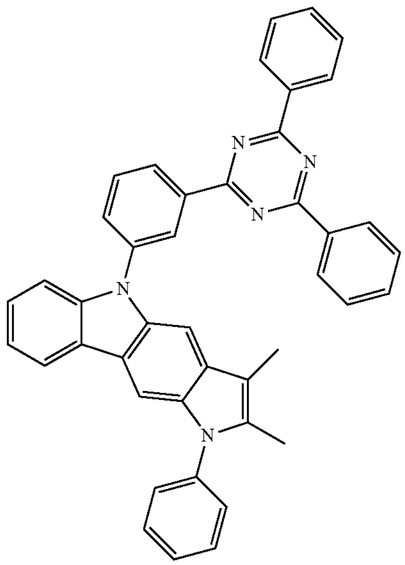

PH1-3

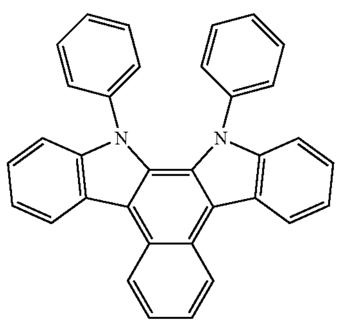

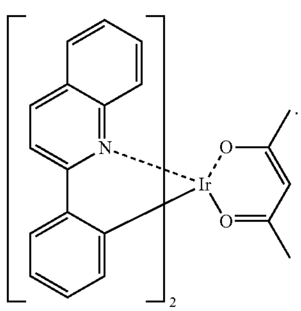

$Ir(pq)_2acac$

Comparative Example R3

An organic light-emitting device was manufactured in the same (or substantially the same) manner as in Example R1, except that in forming an emission layer, Compound A was used instead of Compound PH1-1, and Compound B was used instead of Compound PH2-1.

Compound A

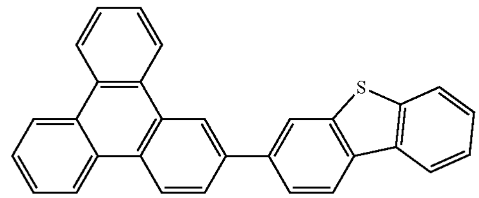

Compound B

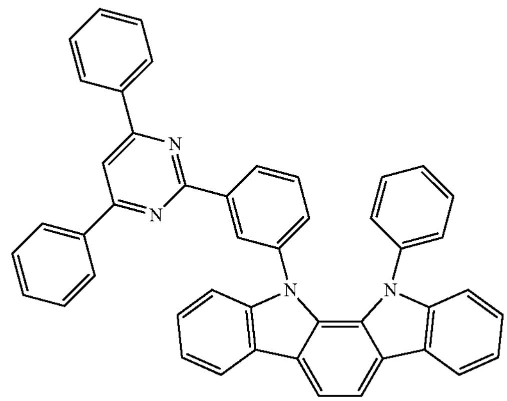

Comparative Example R4

An organic light-emitting device was manufactured in the same (or substantially the same) manner as in Example R1, except that in forming an emission layer, Compound C was used instead of Compound PH1-1, and Compound D was used instead of Compound PH2-1.

Compound C

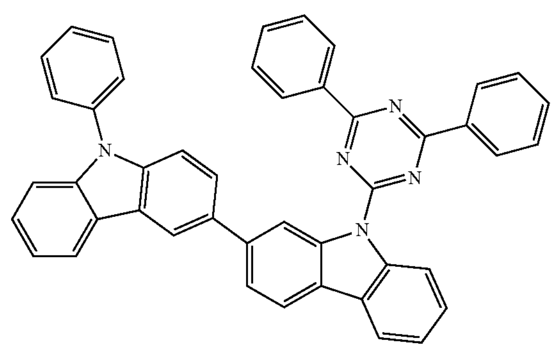

Compound D

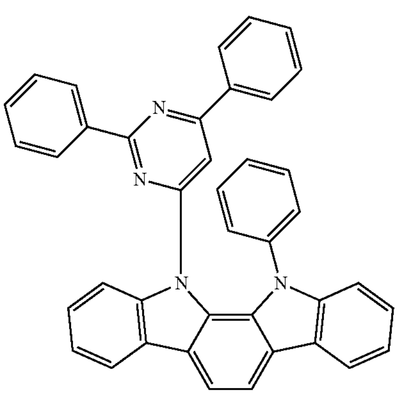

Comparative Example R5

An organic light-emitting device was manufactured in the same (or substantially the same) manner as in Example R1, except that in forming an emission layer, Compound E was used instead of Compound PH1-1, and Compound F was used instead of Compound PH2-1.

Compound E

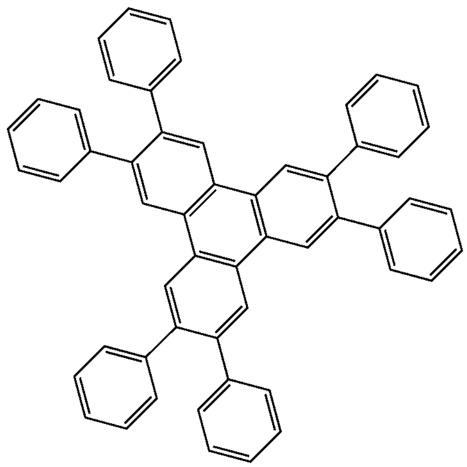

Compound F

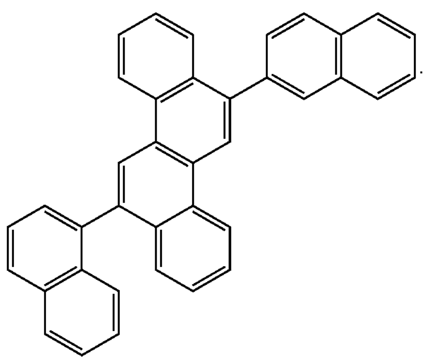

Comparative Example R6

An organic light-emitting device was manufactured in the same (or substantially the same) manner as in Example R1, except that in forming an emission layer, Compound G was used instead of Compounds PH1-1 and PH2-1.

Compound G

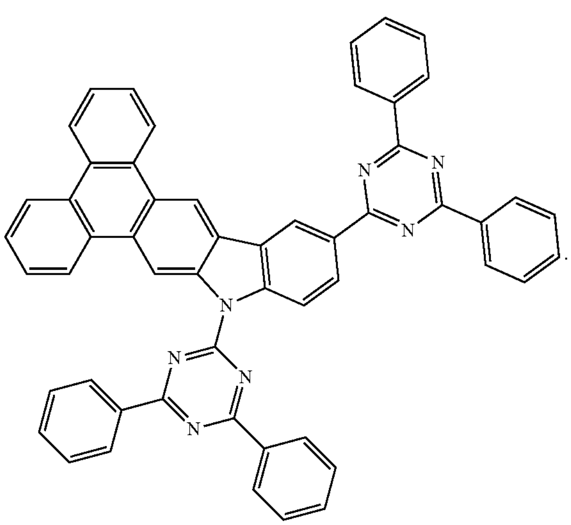

Comparative Example R7

An organic light-emitting device was manufactured in the same (or substantially the same) manner as in Example R1, except that in forming an emission layer, Compound PH1-1 alone was used instead of both Compounds PH1-1 and PH2-1.

Example G1

A glass substrate with ITO anode thereon was cut to a size of 50 mm×50 mm×0.5 mm and then, sonicated in acetone, in isopropyl alcohol, and in pure water, for 15 minutes in each, and then, washed by exposure to UV ozone for 30 minutes.

Compound HT3 was deposited on the ITO anode to form a hole transport layer having a thickness of 1200 Å, thereby completing the formation of a hole transport region.

On the hole transport region, Compound PH1-1 and Compound PH2-2 (a weight ratio of Compound PH1-1 and Compound PH2-2 was 5:5), which acted as a host, and $Ir(ppy)_3$ (Compound PD1, an amount of the dopant was 5 wt %), which acted as a dopant, were co-deposited to form an emission layer having a thickness of 300 Å.

Compound ET1 was deposited on the emission layer to form an electron transport layer having a thickness of 400 Å, and LiF was vacuum deposited on the electron transport layer to form an electron injection layer having a thickness of 10 Å, thereby completing the formation of an electron transport region. On the electron transport region, Al cathode having a thickness of 2000 Å was formed to complete the manufacture of an organic light-emitting device.

PH1-1

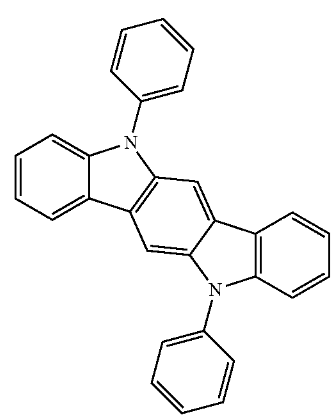

-continued

PH2-2

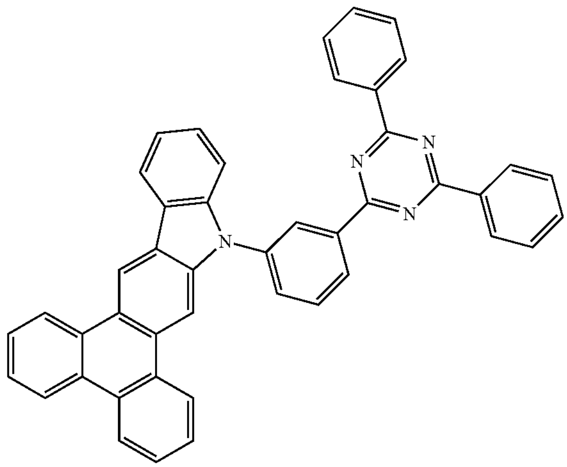

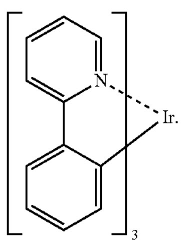

Ir(ppy)$_3$

Example G2

An organic light-emitting device was manufactured in the same (or substantially the same) manner as in Example G1, except that in forming an emission layer, Compound PH2-4 was used instead of Compound PH2-2.

PH1-1

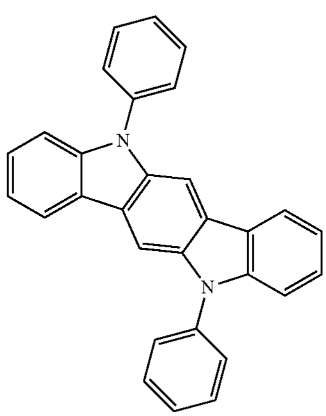

-continued

PH2-4

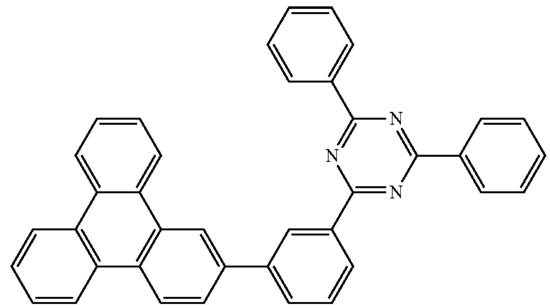

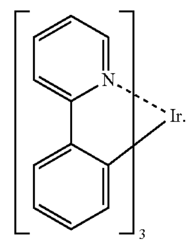

Ir(ppy)$_3$

Example G3

An organic light-emitting device was manufactured in the same (or substantially the same) manner as in Example G1, except that in forming an emission layer, Compound PH1-3 was used instead of Compound PH1-1, and Compound PH2-1 was used instead of Compound PH2-2.

PH1-3

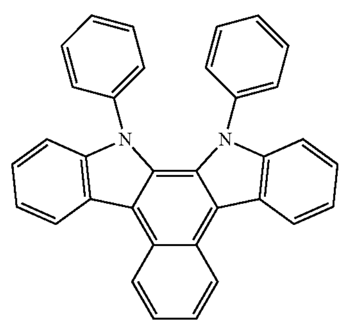

PH2-1

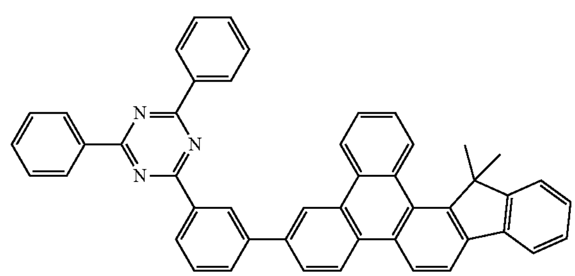

-continued

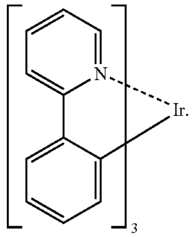

Ir(ppy)3

Example G4

An organic light-emitting device was manufactured in the same (or substantially the same) manner as in Example G1, except that in forming an emission layer, Compound PH1-3 was used instead of Compound PH1-1, and Compound PH2-4 Was used instead of Compound PH2-2.

PH1-3

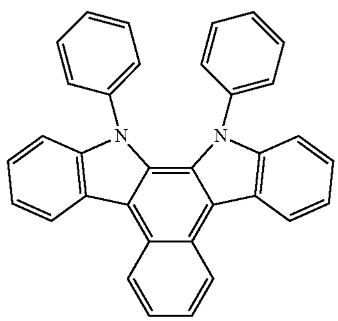

PH2-4

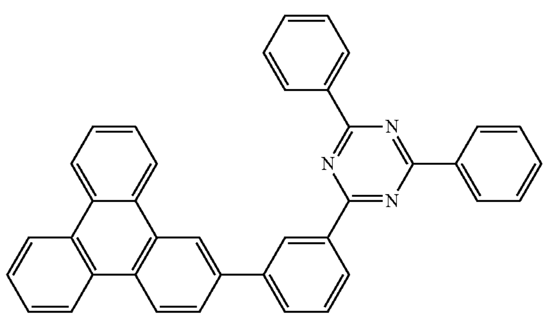

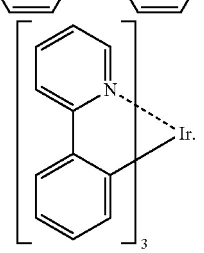

Ir(ppy)3

Comparative Example G1

An organic light-emitting device was manufactured in the same (or substantially the same) manner as in Example G1, except that in forming an emission layer, CBP was used instead of Compound PH1-1 and Compound PH2-2.

Comparative Example G2

An organic light-emitting device was manufactured in the same (or substantially the same) manner as in Example G1, except that in forming an emission layer, Compound PH1-2 was used instead of Compound PH1-1, and Compound PH1-3 was used instead of Compound PH2-2.

PH1-2

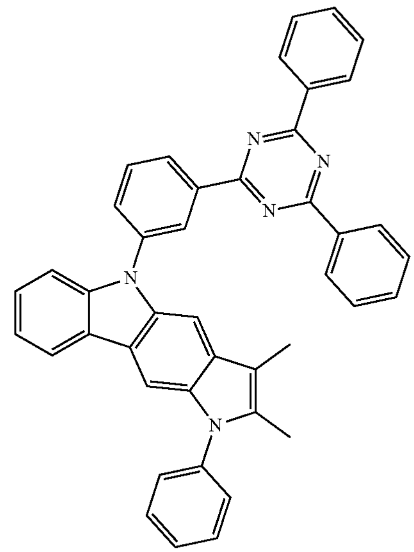

PH1-3

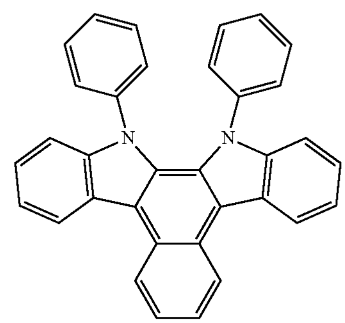

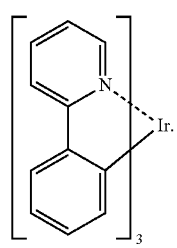

Ir(ppy)3

Comparative Example G3

An organic light-emitting device was manufactured in the same (or substantially the same) manner as in Example G1, except that in forming an emission layer, Compound A was used instead of Compound PH1-1, and Compound B was used instead of Compound PH2-2.

Compound A

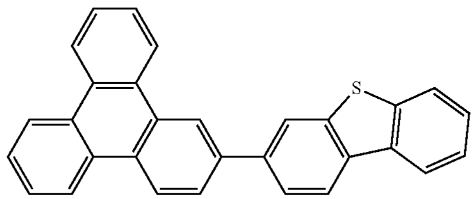

Compound B

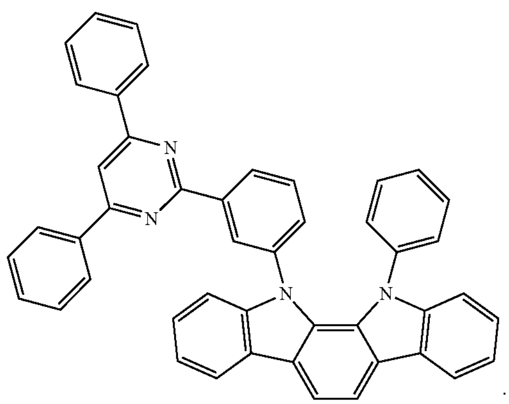

Comparative Example G4

An organic light-emitting device was manufactured in the same (or substantially the same) manner as in Example G1, except that in forming an emission layer, Compound C was used instead of Compound PH1-1, and Compound D was used instead of Compound PH2-2.

Compound C

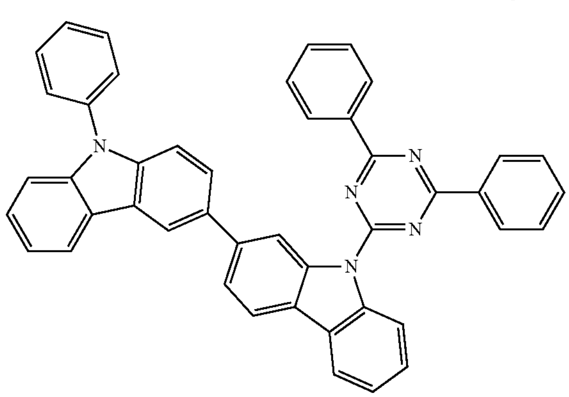

-continued

Compound D

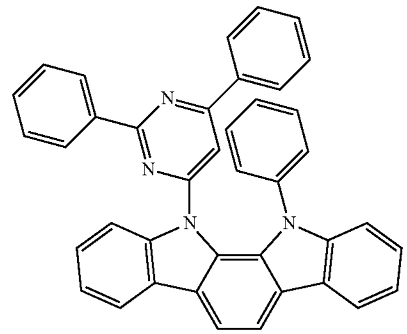

Comparative Example G5

An organic light-emitting device was manufactured in the same (or substantially the same) manner as in Example G1, except that in forming an emission layer, Compound E was used instead of Compound PH1-1, and Compound F was used instead of Compound PH2-2.

Compound E

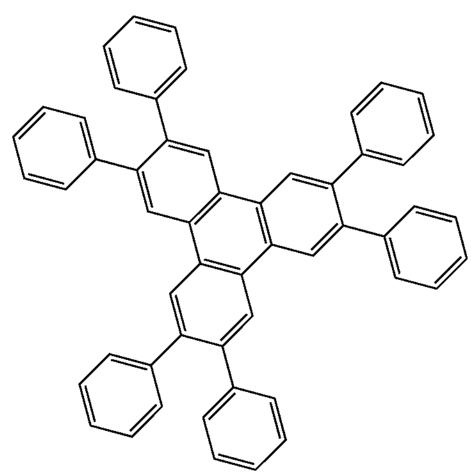

Compound F

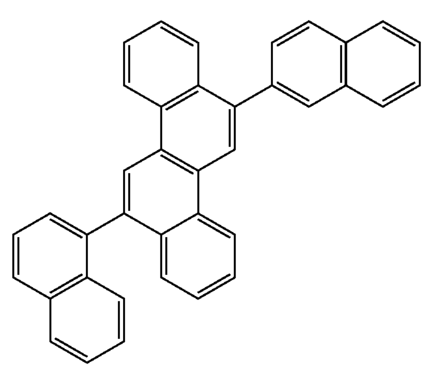

Comparative Example G6

An organic light-emitting device was manufactured in the same (or substantially the same) manner as in Example G1, except that in forming an emission layer, Compound G was used instead of Compounds PH1-1 and PH2-2.

Compound G

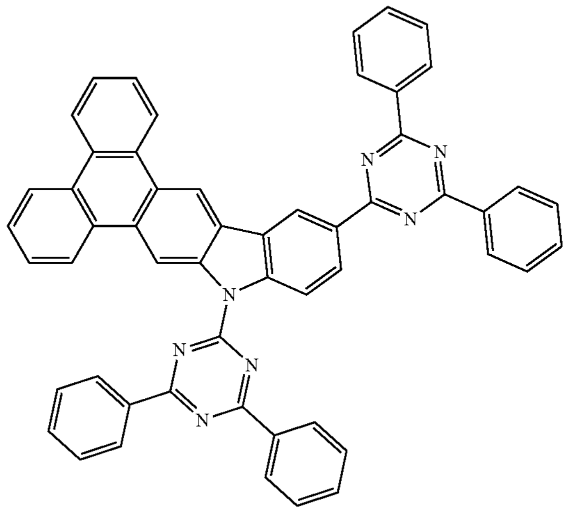

Comparative Example G7

An organic light-emitting device was manufactured in the same (or substantially the same) manner as in Example G1, except that in forming an emission layer, Compound PH1-1 alone was used instead of both Compounds PH1-1 and PH2-2.

Example B1

A glass substrate with ITO anode thereon was cut to a size of 50 mm×50 mm×0.5 mm and then, sonicated in acetone, in isopropyl alcohol, and in pure water, for 15 minutes in each, and then, washed by exposure to UV ozone for 30 minutes.

Compound HT3 was deposited on the ITO anode to form a hole transport layer having a thickness of 1000 Å, and mCP was deposited on the hole transport layer to form an electron blocking layer having a thickness of 200 Å, thereby completing the formation of a hole transport region.

On the hole transport region, Compound PH1-2 and Compound PH2-1 (a weight ratio of Compound PH1-2 to Compound PH2-1 was 5:5), which acted as a host, and Flrpic (Compound PD2, an amount of the dopant was 5 wt %), which acted as a dopant, were co-deposited to form an emission layer having a thickness of 300 Å.

TmPyPB was deposited on the emission layer to form a hole blocking layer having a thickness of 100 Å, and Compound ET1 was deposited on the hole blocking layer to form an electron transport layer having a thickness of 300 Å, and LiF was vacuum deposited on the electron transport layer to form an electron injection layer having a thickness of 10 Å, thereby completing the formation of an electron transport region. Then, an Al cathode having a thickness of 2000 Å was formed on the electron transport region, thereby completing the manufacture of an organic light-emitting device.

PH1-2

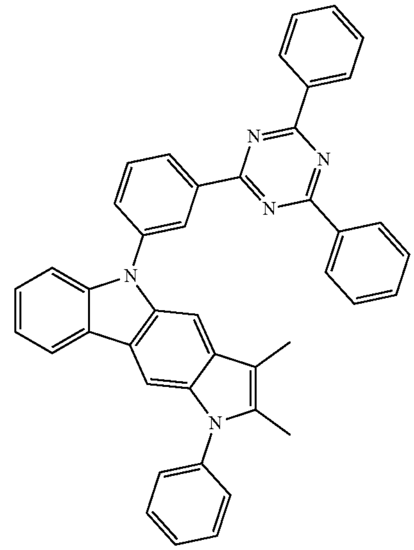

PH2-1

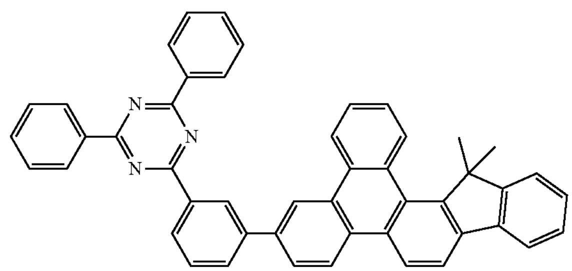

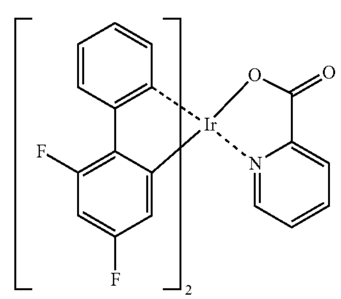

Flrpic

Example B2

An organic light-emitting device was manufactured in the same (or substantially the same) manner as in Example B1, except that in forming an emission layer, Compound PH2-3 was used instead of Compound PH2-1.

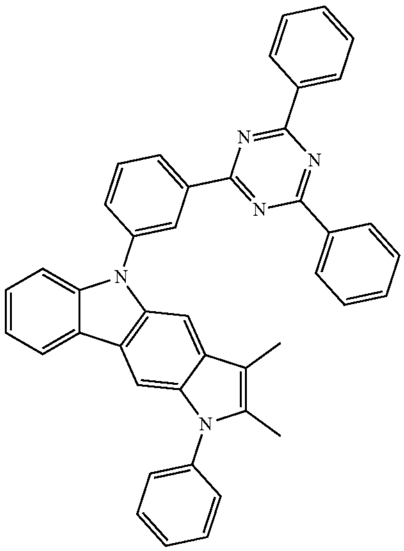
PH1-2

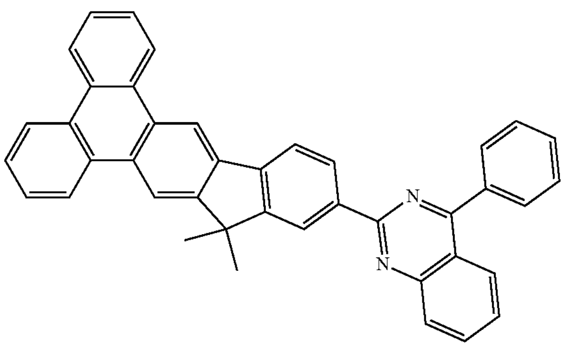
PH2-3

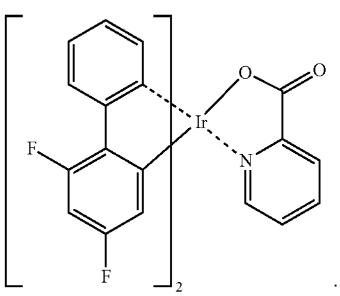
FIrpic

Example B3

An organic light-emitting device was manufactured in the same (or substantially the same) manner as in Example B1, except that in forming an emission layer, Compound PH1-4 was used instead of Compound PH1-2, and Compound PH2-2 was used instead of Compound PH2-1.

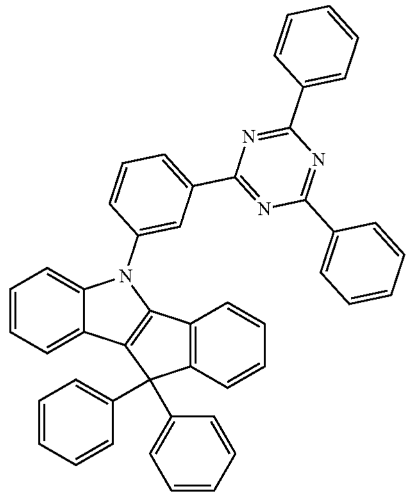
PH1-4

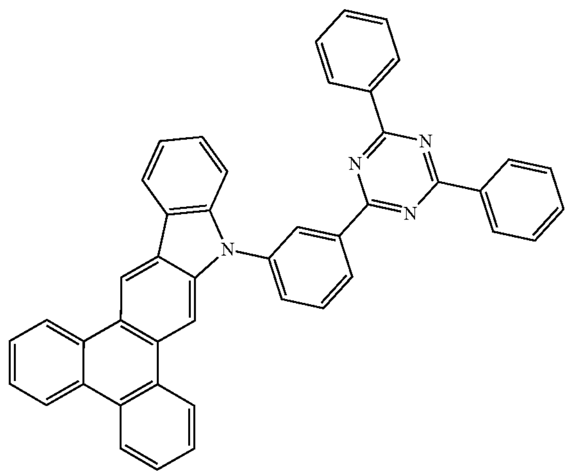
PH2-2

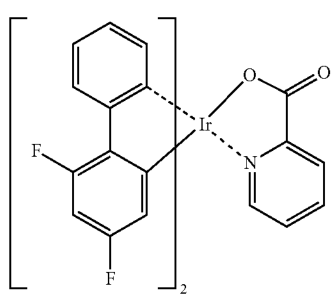
FIrpic

Example B4

An organic light-emitting device was manufactured in the same (or substantially the same) manner as in Example B1, except that in forming an emission layer, Compound PH1-4 was used instead of Compound PH1-2, and Compound PH2-4 was used instead of Compound PH2-1.

PH1-4

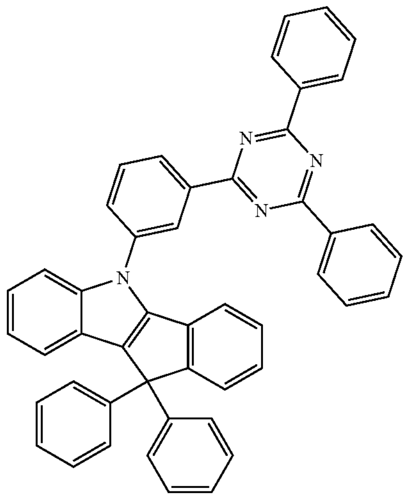

PH2-4

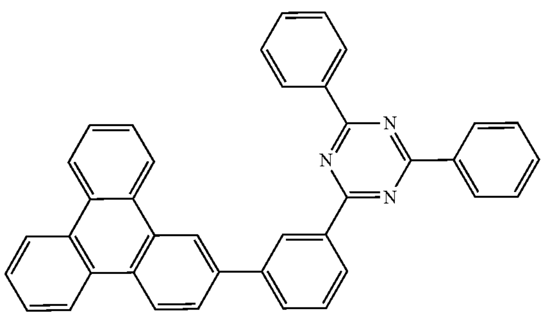

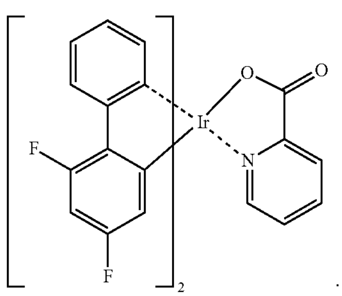

FIrpic

Comparative Example B1

An organic light-emitting device was manufactured in the same (or substantially the same) manner as in Example B1, except that in forming an emission layer, CBP was used instead of Compound PH1-2 and Compound PH2-1.

Comparative Example B2

An organic light-emitting device was manufactured in the same (or substantially the same) manner as in Example B1, except that in forming an emission layer, Compound PH1-3 was used instead of Compound PH2-1.

PH1-2

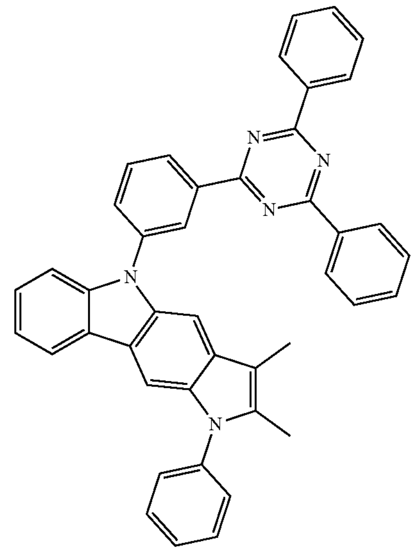

PH1-3

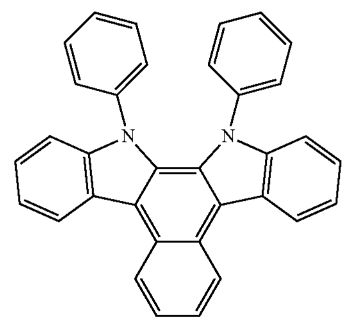

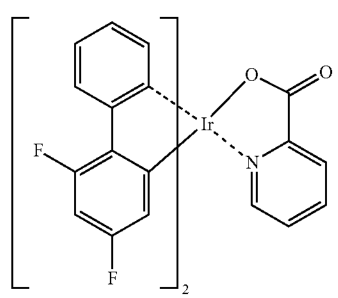

FIrpic

Comparative Example B3

An organic light-emitting device was manufactured in the same (or substantially the same) manner as in Example B, except that in forming an emission layer, Compound A was used instead of Compound PH1-2, and Compound B was used instead of Compound PH2-1.

-continued

Compound A

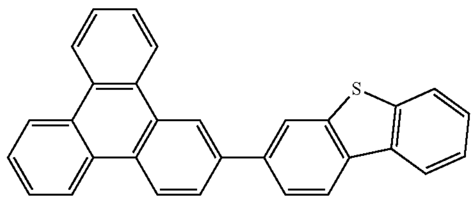

Compound B

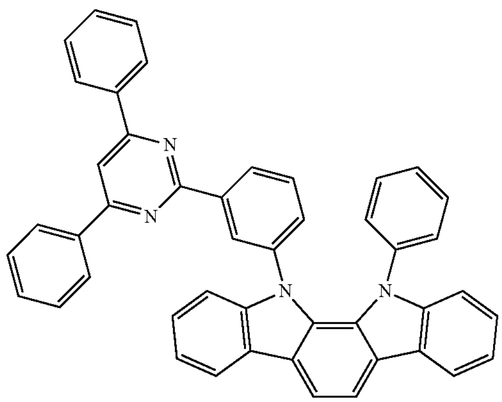

Compound C

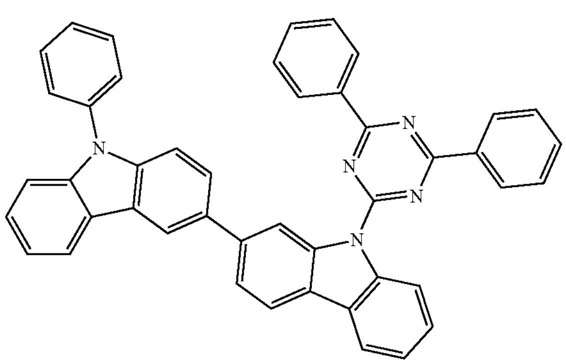

Compound D

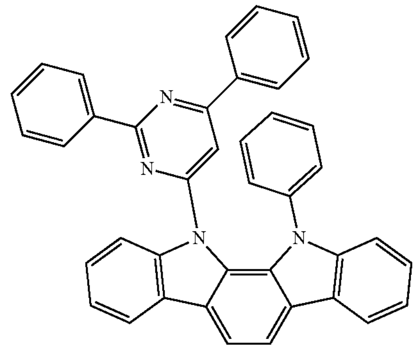

Comparative Example B4

An organic light-emitting device was manufactured in the same (or substantially the same) manner as in Example B1, except that in forming an emission layer, Compound C was used instead of Compound PH1-2, and Compound D was used instead of Compound PH2-1.

Comparative Example B5

An organic light-emitting device was manufactured in the same (or substantially the same) manner as in Example B1, except that in forming an emission layer, Compound E was used instead of Compound PH1-2, and Compound F was used instead of Compound PH2-1.

Compound E

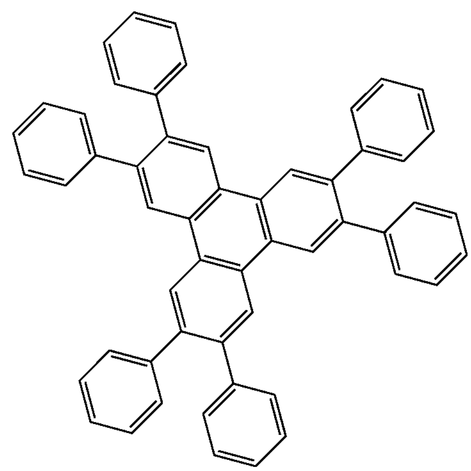

Compound F

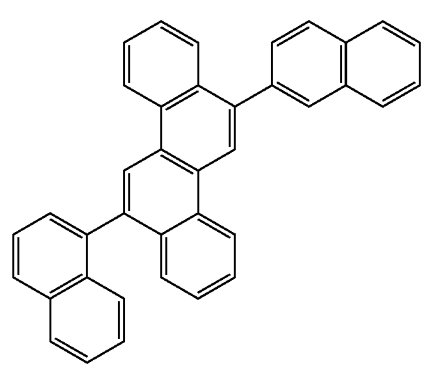

Comparative Example B6

An organic light-emitting device was manufactured in the same (or substantially the same) manner as in Example B1, except that in forming an emission layer, Compound G was used instead of Compounds PH1-2 and PH2-1.

Compound G

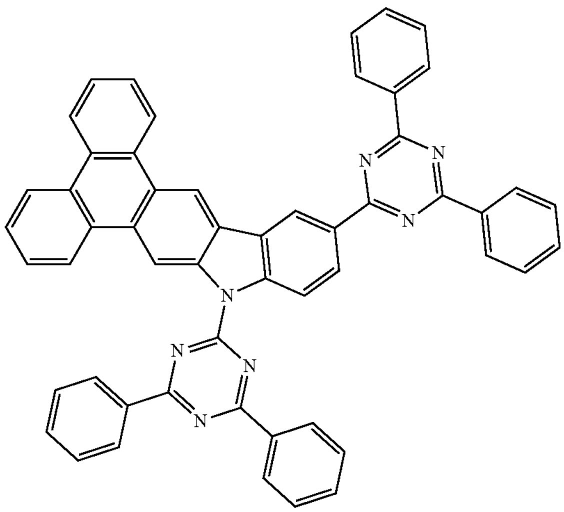

.

Comparative Example B7

An organic light-emitting device was manufactured in the same (or substantially the same) manner as in Example B1, except that in forming an emission layer, Compound PH1-1 was used instead of Compounds PH1-2 and PH2-1.

Evaluation Example 1

The efficiency and lifespan ($T_{90}$) data of the organic light-emitting devices manufactured according to Examples R1 to R4, Comparative Examples R1 to R7, Examples G1 to G4, Comparative Examples G1 to G7, Examples B1 to B4, and Comparative Examples B1 to B7 were evaluated by using an IVL (current-voltage-luminance) meter (PhotoResearch PR650, Keithley 238), and the results are shown in Tables 1 to 3. $T_{90}$ data (@(RG 500/B 150) nit) indicates the amount of time that elapsed until brightness was reduced to 95% of the initial brightness of 100%.

TABLE 1

| | Host | | Dopant | Efficiency (cd/A) | $T_{90}$ (hr) |
|---|---|---|---|---|---|
| Example R1 | Compound PH1-1 | Compound PH2-1 | $Ir(pq)_2acac$ | 24.8 | 234 |
| Example R2 | Compound PH1-1 | Compound PH2-2 | $Ir(pq)_2acac$ | 23.5 | 199 |
| Example R3 | Compound PH1-3 | Compound PH2-2 | $Ir(pq)_2acac$ | 24.0 | 180 |
| Example R4 | Compound PH1-3 | Compound PH2-4 | $Ir(pq)_2acac$ | 22.9 | 205 |
| Comparative Example R1 | CBP | | $Ir(pq)_2acac$ | 13.2 | 13.2 |
| Comparative Example R2 | Compound PH1-2 | Compound PH1-3 | $Ir(pq)_2acac$ | 14.9 | 103 |
| Comparative Example R3 | Compound A | Compound B | $Ir(pq)_2acac$ | 20.1 | 139 |
| Comparative Example R4 | Compound C | Compound D | $Ir(pq)_2acac$ | 21.4 | 87 |
| Comparative Example R5 | Compound E | Compound F | $Ir(pq)_2acac$ | 15.1 | 51 |
| Comparative Example R6 | Compound G | | $Ir(pq)_2acac$ | 18.5 | 18.5 |
| Comparative Example R7 | Compound PH1-1 | | $Ir(pq)_2acac$ | 14.6 | 14.6 |

TABLE 2

| | Host | | Dopant | Efficiency (cd/A) | $T_{90}$ (hr) |
|---|---|---|---|---|---|
| Example G1 | Compound PH1-1 | Compound PH2-2 | $Ir(ppy)_3$ | 62 | 168 |
| Example G2 | Compound PH1-1 | Compound PH2-4 | $Ir(ppy)_3$ | 59 | 150 |
| Example G3 | Compound PH1-3 | Compound PH2-1 | $Ir(ppy)_3$ | 64 | 139 |
| Example G4 | Compound PH1-3 | Compound PH2-4 | $Ir(ppy)_3$ | 65 | 171 |
| Comparative Example G1 | CBP | | $Ir(ppy)_3$ | 43 | 43 |
| Comparative Example G2 | Compound PH1-2 | Compound PH1-3 | $Ir(ppy)_3$ | 47 | 65 |
| Comparative Example G3 | Compound A | Compound B | $Ir(ppy)_3$ | 51 | 117 |
| Comparative Example G4 | Compound C | Compound D | $Ir(ppy)_3$ | 50 | 102 |
| Comparative Example G5 | Compound E | Compound F | $Ir(ppy)_3$ | 45 | 40 |
| Comparative Example G6 | Compound G | | $Ir(ppy)_3$ | 54 | 54 |
| Comparative Example G7 | Compound PH1-1 | | $Ir(ppy)_3$ | 43 | 43 |

TABLE 3

| | Host | | Dopant | Efficiency (cd/A) | $T_{90}$ (hr) |
|---|---|---|---|---|---|
| Example B1 | Compound PH1-2 | Compound PH2-1 | Flrpic | 22.8 | 49 |
| Example B2 | Compound PH1-2 | Compound PH2-3 | Flrpic | 26.5 | 61 |
| Example B3 | Compound PH1-4 | Compound PH2-2 | Flrpic | 25.8 | 77 |
| Example B4 | Compound PH1-4 | Compound PH2-4 | Flrpic | 27.1 | 63 |
| Comparative Example B1 | CBP | | Flrpic | 15.3 | 15.3 |
| Comparative Example B2 | Compound PH1-2 | Compound PH1-3 | Flrpic | 19.0 | 44 |
| Comparative Example B3 | Compound A | Compound B | Flrpic | 21.4 | 37 |
| Comparative Example B4 | Compound C | Compound D | Flrpic | 19.3 | 39 |
| Comparative Example B5 | Compound E | Compound F | Flrpic | 15.8 | 31 |
| Comparative Example B6 | Compound G | | Flrpic | 18.7 | 18.7 |
| Comparative Example B7 | Compound PH1-1 | | Flrpic | 14.9 | 14.9 |

Referring to Table 1, the organic light-emitting devices of Examples R1 to R4 had significantly better efficiency and lifespan characteristics as compared to the organic light-emitting devices of Comparative Examples R1 to R7. Referring to Table 2, the organic light-emitting devices of Examples G1 to G4 had significantly better efficiency and lifespan characteristics as compared to the organic light-emitting devices of Comparative Examples G1 to G7, and referring to Table 3, the organic light-emitting devices of Examples B1 to B4 had significantly better efficiency and lifespan characteristics as compared to the organic light-emitting devices of Comparative Examples B1 to B7.

Organic light-emitting devices according to embodiments of the present invention have high efficiency and long lifespan characteristics.

It should be understood that the embodiments described therein should be considered in a descriptive sense only and not for purposes of limitation. Descriptions of features or aspects within each embodiment should typically be considered as available for other similar features or aspects in other embodiments. Accordingly, it is to be understood that the disclosure is not limited to the disclosed embodiments, but, on the contrary, is intended to cover various modifications and equivalent arrangements included within the spirit and scope of the appended claims and equivalents thereof.

What is claimed is:

1. An organic light-emitting device comprising:

a first electrode;

a second electrode; and an organic layer between the first electrode and the second electrode and comprising an emission layer, wherein the organic layer comprises a first material represented by Formula 1 and a second material represented by any one of Formulae 2-7 to 2-18:

Formula 1

$$Ar_{11} \!-\!\!\left[(L_{11})_{a11} - (R_{11})_{b11}\right]_{c11}$$

2-7

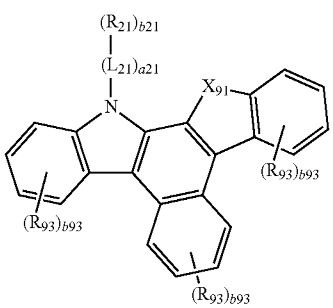

2-8

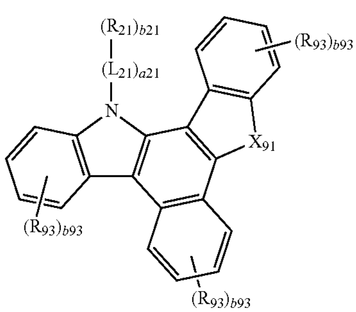

-continued 2-9

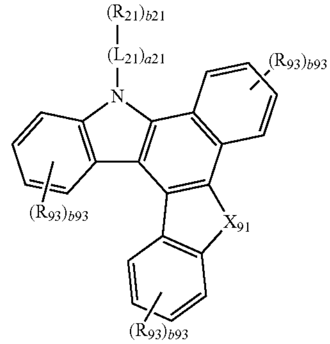

2-10

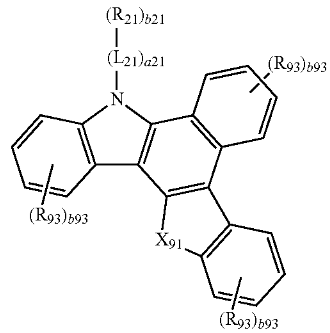

2-11

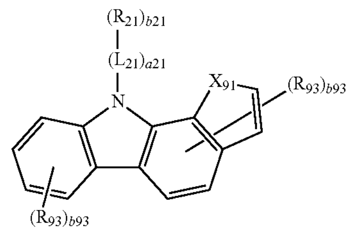

2-12

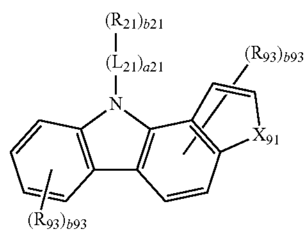

2-13

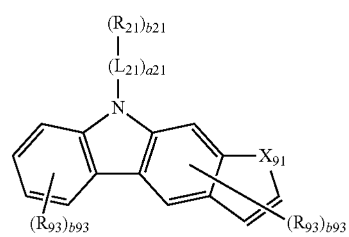

2-14

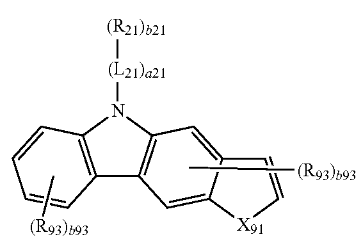

-continued
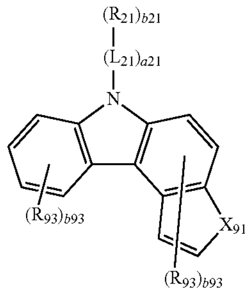
2-15
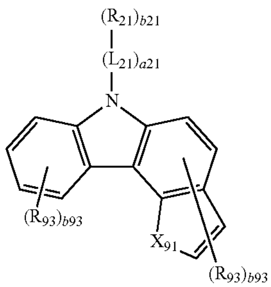
2-16
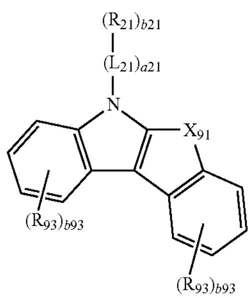
2-17
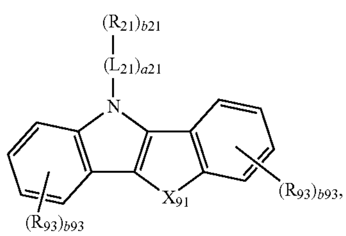
2-18
wherein in Formulae 1 and 2-7 to 2-18, $Ar_{11}$ is selected from Formulae 8-1 to 8-7
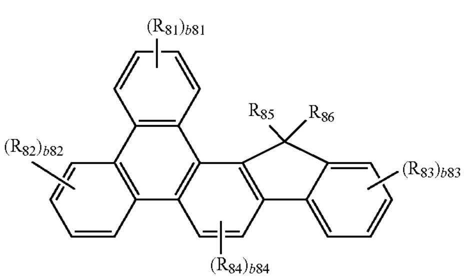
8-1
-continued
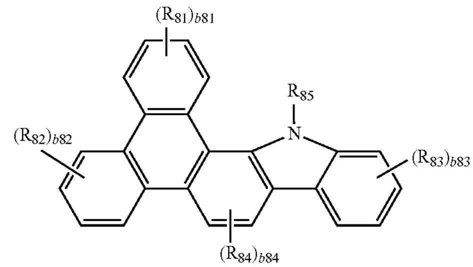
8-2
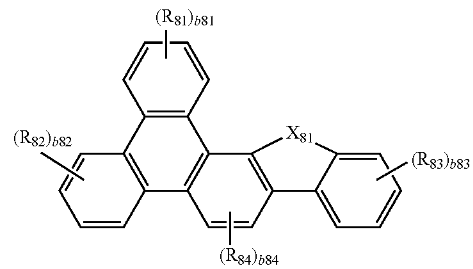
8-3
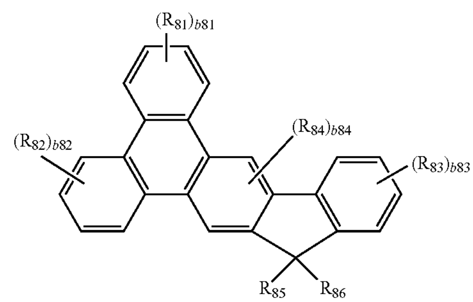
8-4
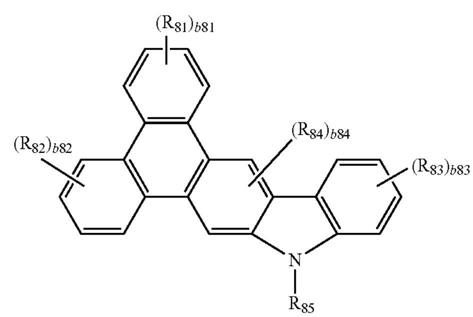
8-5
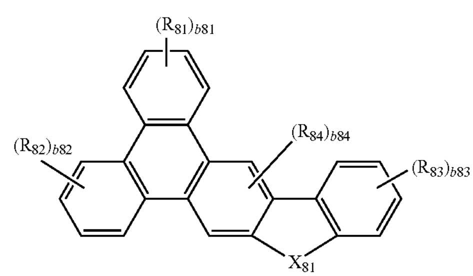
8-6

8-7
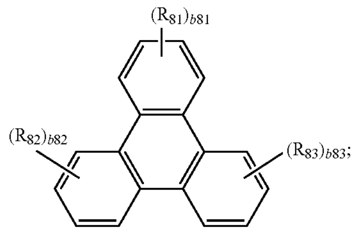
wherein
$X_{81}$ is selected from *—O—* and *—S—*;
$X_{91}$ is selected from
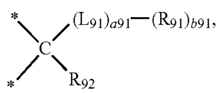
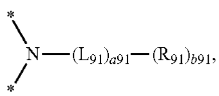
*—O—*, and *—S—*;
$L_{11}$ is a group selected from groups represented by Formulae 3-1 to 3-35:
3-1
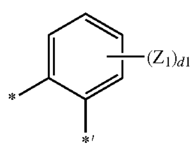
3-2
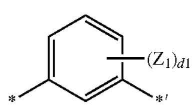
3-3
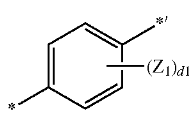
3-4
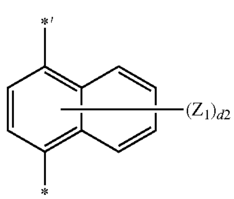
3-5
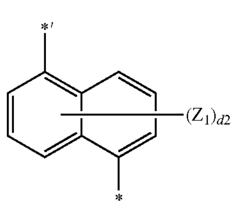
3-6
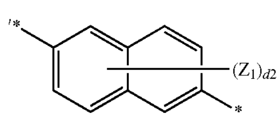
3-7
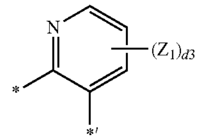
3-8
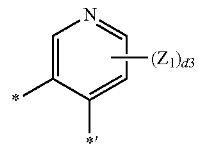
3-9
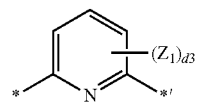
3-10
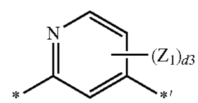
3-11
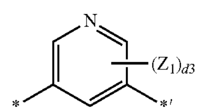
3-12
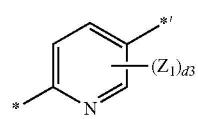
3-13
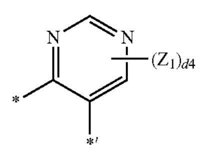
3-14
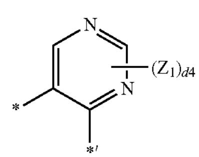
3-15
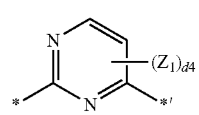
3-16
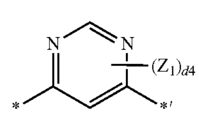
3-17
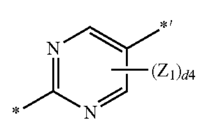
3-18
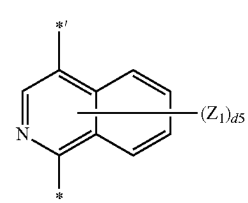

-continued
3-19
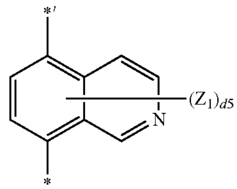
3-20
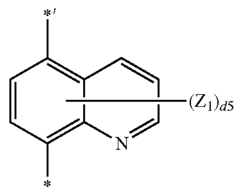
3-21
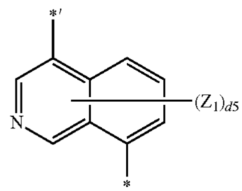
3-22
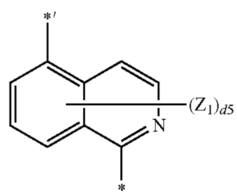
3-23
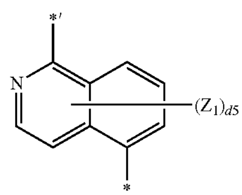
3-24
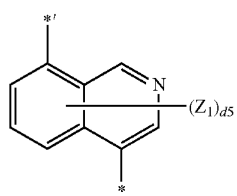
3-25
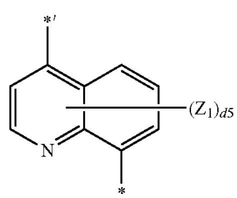
3-26
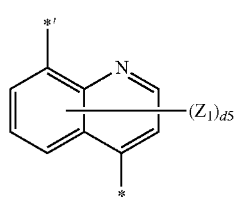
-continued
3-27
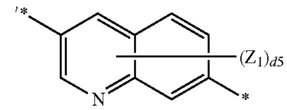
3-28
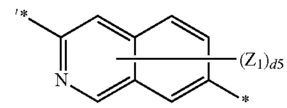
3-29
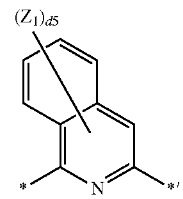
3-30
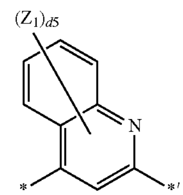
3-31
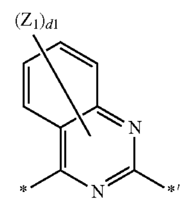
3-32
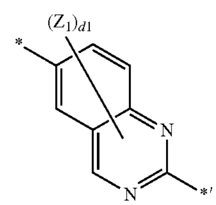
3-33
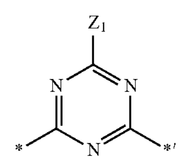
3-34
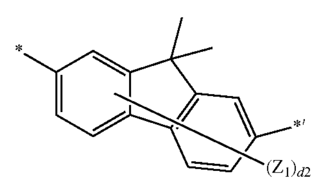
3-35
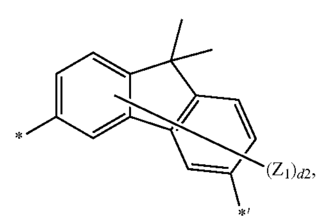

wherein in Formulae 3-1 to 3-35, $Z_1$ is a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a naphthyl group, a pyridinyl group, and a pyrimidinyl group;

d1 is selected from 1, 2, 3, and 4;

d2 is selected from 1, 2, 3, 4, 5, and 6;

d3 is selected from 1, 2, and 3;

d4 is selected from 1 and 2;

d5 is selected from 1, 2, 3, 4, and 5; and

* and *' each indicate a binding site to a neighboring atom;

$L_{21}$ and $L_{91}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11, a21, and a91 are each independently selected from 0, 1, 2, and 3;

$R_{11}$ is selected from Formulae 4-1 to 4-47:

4-1

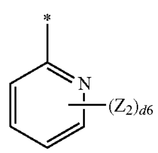

4-2

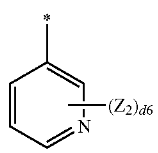

4-3

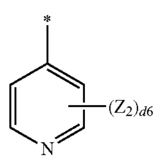

4-4

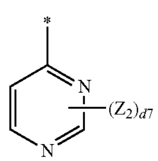

4-5

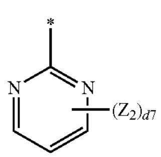

-continued 4-6

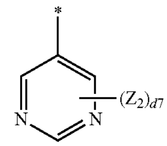

4-7

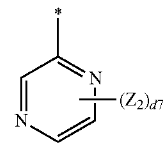

4-8

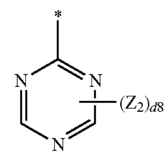

4-9

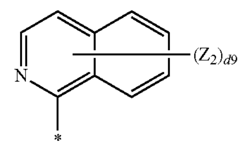

4-10

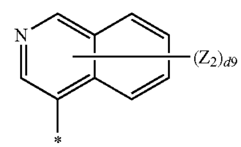

4-11

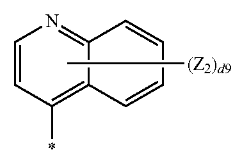

4-12

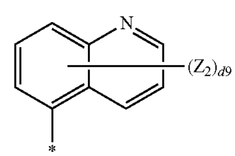

4-13

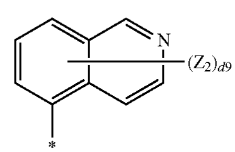

4-14

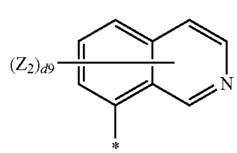

4-15

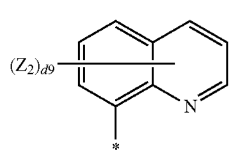

-continued
4-16
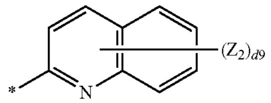
4-17
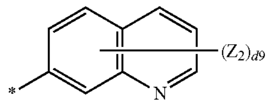
4-18
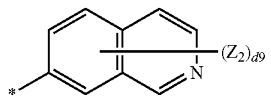
4-19
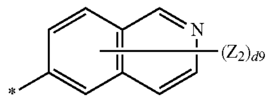
4-20
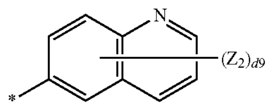
4-21
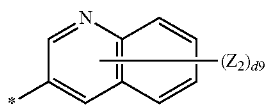
4-22
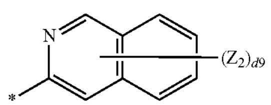
4-23
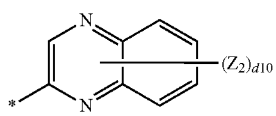
4-24
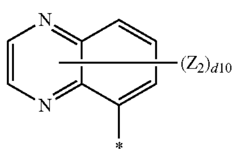
4-25
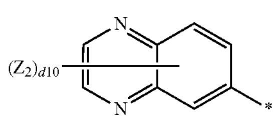
4-26
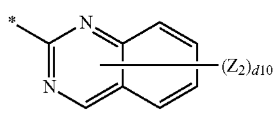
4-27
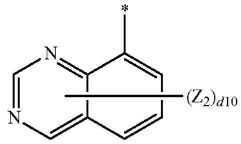
4-28
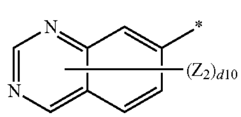
-continued
4-29
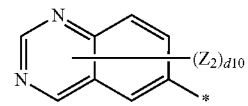
4-30
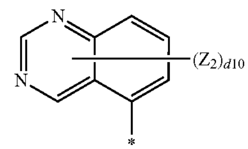
4-31
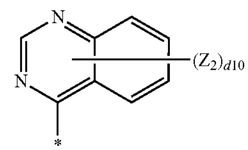
4-32
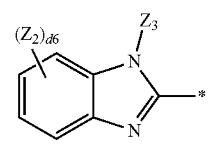
4-33
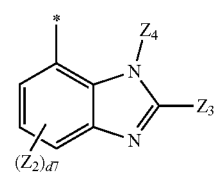
4-34
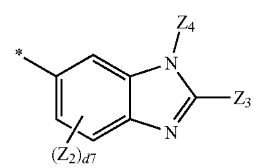
4-35
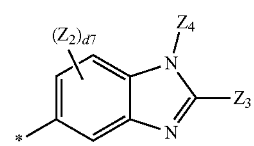
4-36
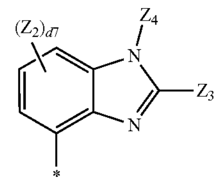
4-37
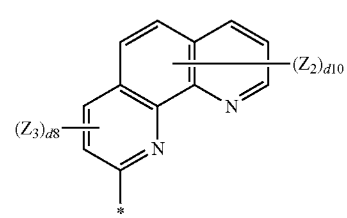

-continued 4-38

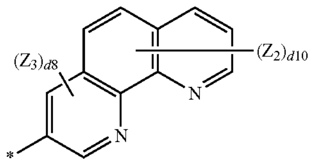

4-39

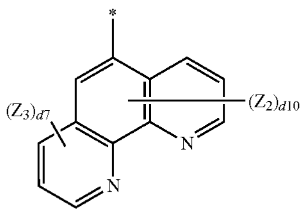

4-40

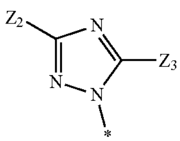

4-41

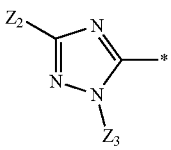

4-42

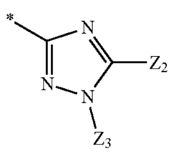

4-43

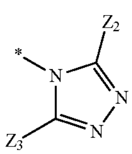

4-44

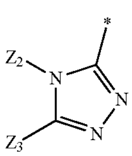

4-45

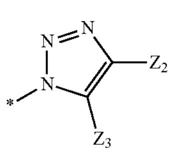

4-46

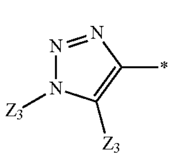

4-47

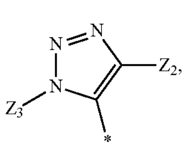

wherein in Formulae 4-1 to 4-47, $Z_2$ to $Z_4$ are each independently selected from a hydrogen, a deuterium, a phenyl group, a biphenyl group, a naphthyl group, a pyridinyl group, a pyrimidinyl group, and a triazinyl group;

d6 is selected from 1, 2, 3, and 4; and d7 is selected from 1, 2, and 3;

d8 is selected from 1 and 2;

d9 is selected from 1, 2, 3, 4, 5, and 6;

d10 is selected from 1, 2, 3, 4, and 5; and

* indicates a binding site to a neighboring atom;

wherein when $Ar_{11}$ is Formula 8-7, $R_{11}$ is selected from:

a pyridinyl group, a pyrimidinyl group, a pyridazinyl group, a triazinyl group, a quinolinyl group, an isoquinolinyl group, a quinazolinyl group, a quinoxalinyl group, a phenanthrolinyl group, a benzimidazolyl group, and a triazolyl group; and a pyridinyl group, a pyrimidinyl group, a pyridazinyl group, a triazinyl group, a quinolinyl group, an isoquinolinyl group, a quinazolinyl group, a quinoxalinyl group, a phenanthrolinyl group, a benzimidazolyl group, and a triazolyl group, each substituted with at least one selected from a deuterium, —F, —Cl, —Br, —I, a $C_1$-$C_{20}$ alkyl group, a phosphoric acid group or a salt thereof, a phenyl group, a biphenyl group, a naphthyl group, a pyridinyl group, a pyrimidinyl group, and a triazinyl group;

b11 is selected from 1, 2, 3, and 4;

c11 is selected from 1, 2, and 3, and when c11 is two or more, a plurality of $*\text{-}[(L_{11})_{a11}\text{-}(R_{11})_{b11}]$ are identical to or different from each other;

$R_{81}$ to $R_{86}$ are each independently selected from $*\text{-}[(L_{11})_{a11}\text{-}(R_{11})_{b11}]$, a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group;

b81 to b83 are each independently selected from 1, 2, 3, and 4;

b84 is selected from 1 and 2;

$R_{21}$ and $R_{91}$ to $R_{94}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b21, b91, b93, and b95 are each independently selected from 0, 1, 2, 3, and 4;

b94 is selected from 1, 2, 3, 4, 5, and 6;

b96 is selected from 1 and 2; and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_{11}$ to $Q_{17}$, $Q_{21}$ to $Q_{27}$, and $Q_{31}$ to $Q_{37}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

2. The organic light-emitting device of claim 1, wherein $L_{11}$, $L_{21}$, and $L_{91}$ are each independently selected from a phenylene group, a naphthylene group, a fluorenylene group, a pyridinylene group, a pyrimidinylene group, a quinolinylene group, an isoquinolinylene group, a quinazolinylene group, a carbazolylene group, and a triazinylene group; and a phenylene group, a naphthylene group, a fluorenylene group, a pyridinylene group, a pyrimidinylene group, a quinolinylene group, an isoquinolinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, and a naphthyl group.

3. The organic light-emitting device of claim 1, wherein $L_{21}$ and $L_{91}$ are each independently a group selected from groups represented by Formulae 3-1 to 3-35:

3-1

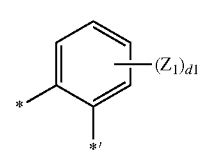

3-2

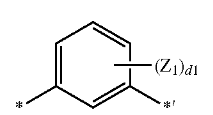

3-3

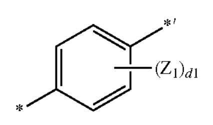

-continued
3-4
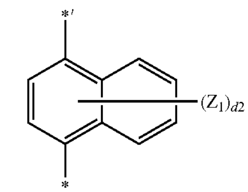
3-5
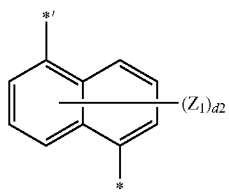
3-6
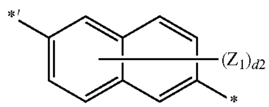
3-7
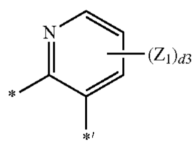
3-8
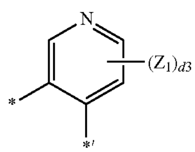
3-9
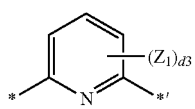
3-10
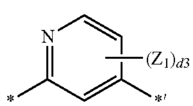
3-11
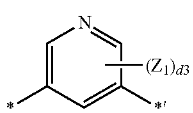
3-12
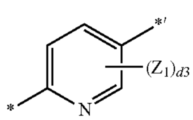
3-13
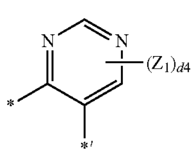
3-14
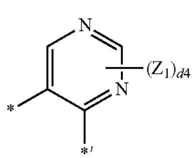
-continued
3-15
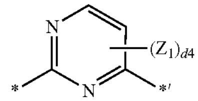
3-16
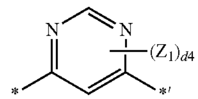
3-17
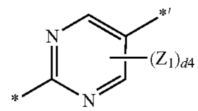
3-18
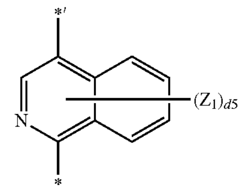
3-19
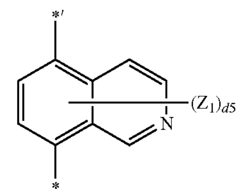
3-20
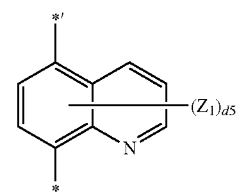
3-21
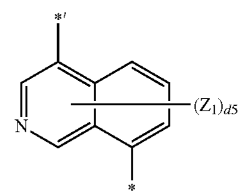
3-22
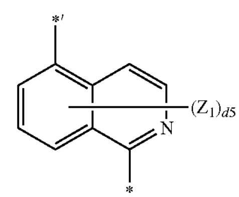
3-23
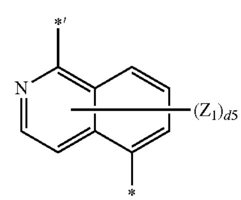

-continued 3-24

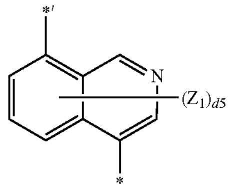

3-25

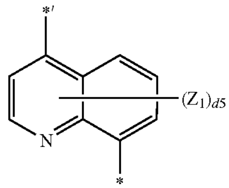

3-26

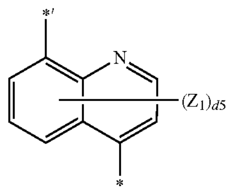

3-27

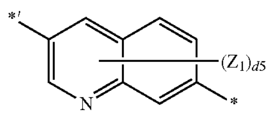

3-28

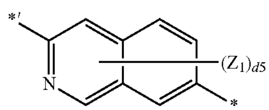

3-29

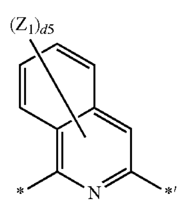

3-30

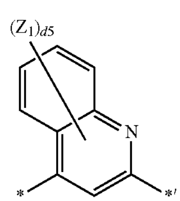

3-31

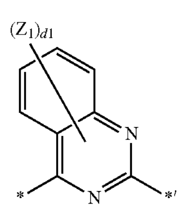

3-32

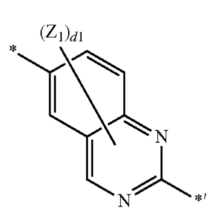

-continued 3-33

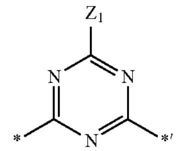

3-34

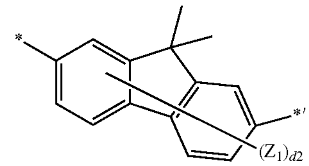

3-35

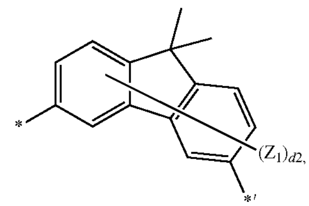

wherein in Formulae 3-1 to 3-35, $Z_1$ is a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a naphthyl group, a pyridinyl group, and a pyrimidinyl group;

d1 is selected from 1, 2, 3, and 4;

d2 is selected from 1, 2, 3, 4, 5, and 6;

d3 is selected from 1, 2, and 3;

d4 is selected from 1 and 2;

d5 is selected from 1, 2, 3, 4, and 5; and

* and *' each indicate a binding site to a neighboring atom.

4. The organic light-emitting device of claim 1, wherein $R_{11}$ is a substituted or unsubstituted $C_1$-$C_{60}$ heteroaryl group including at least one nitrogen atom (N).

5. The organic light-emitting device of claim 1, wherein $R_{11}$ is selected from Formulae 5-1 to 5-143:

5-1

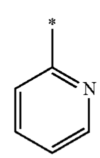

5-2

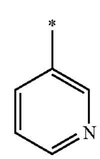

5-3

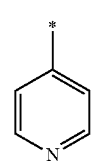

-continued
5-4
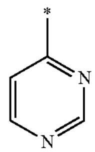
5-5
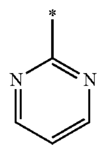
5-6
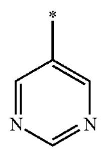
5-7
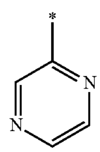
5-8
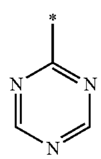
5-9
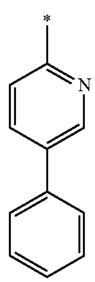
5-10
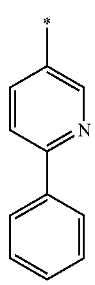
5-11
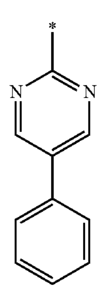
-continued
5-12
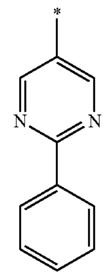
5-13
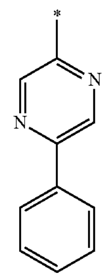
5-14
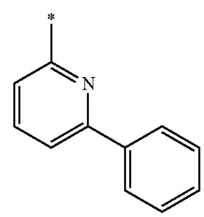
5-15
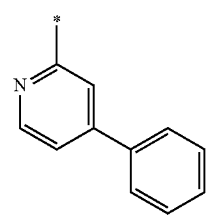
5-16
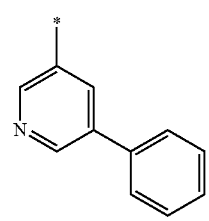
5-17
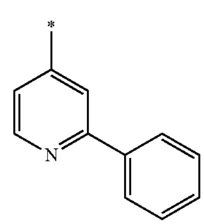

-continued
5-18
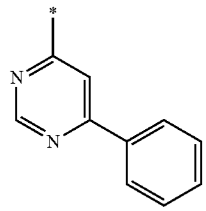
5-19
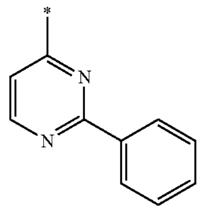
5-20
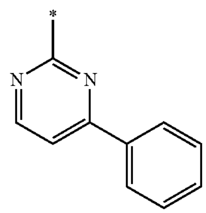
5-21
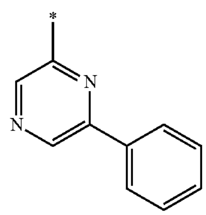
5-22
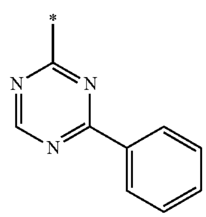
5-23
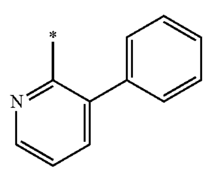
5-24
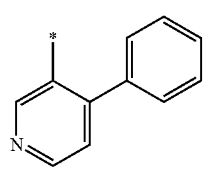
5-25
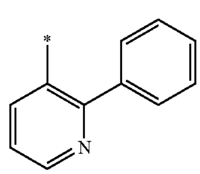
-continued
5-26
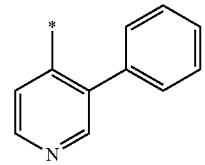
5-27
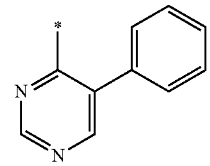
5-28
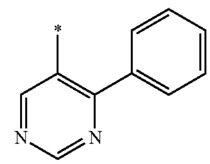
5-29
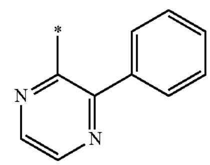
5-30
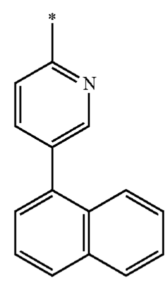
5-31
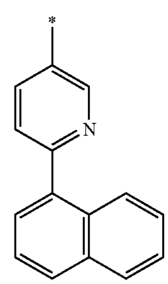
5-32
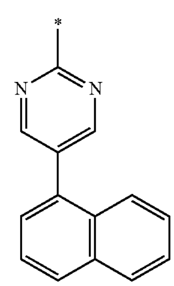

5-33
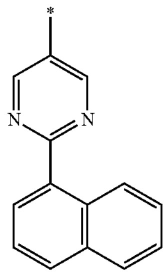
5-34
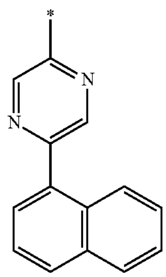
5-35
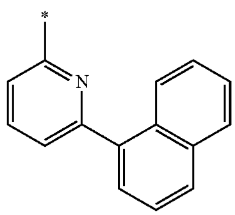
5-36
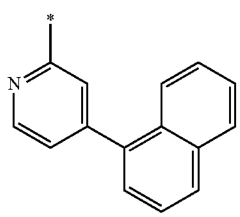
5-37
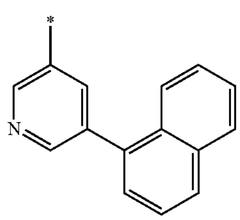
5-38
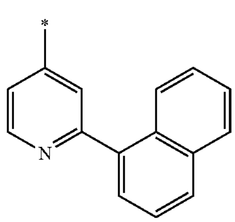
5-39
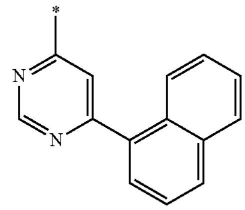
5-40
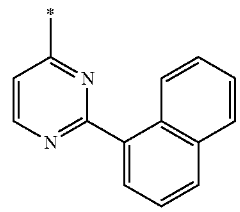
5-41
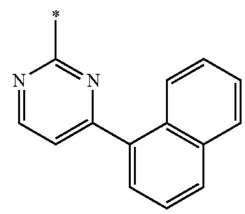
5-42
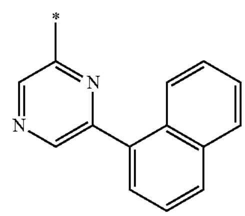
5-43
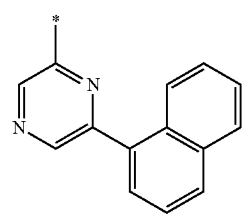
5-44
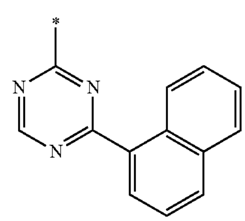
5-45
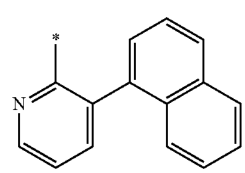

-continued
5-46
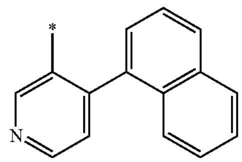
5-47
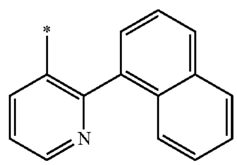
5-48
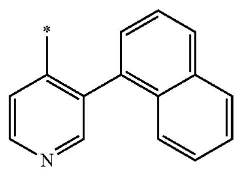
5-49
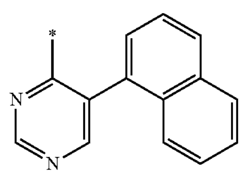
5-50
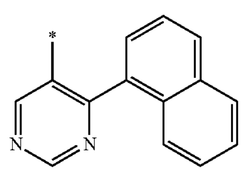
5-51
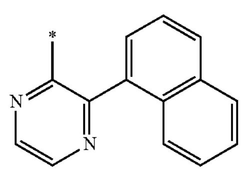
5-52
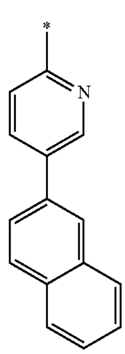
-continued
5-53
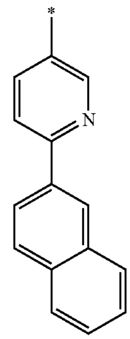
5-54
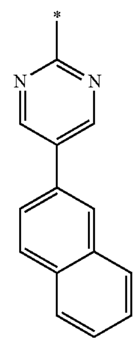
5-55
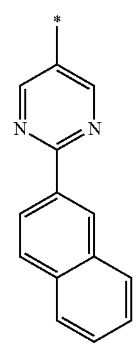
5-56
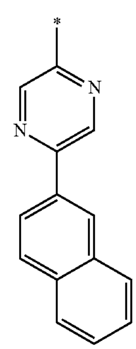
5-57
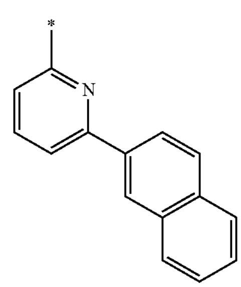

-continued
5-58
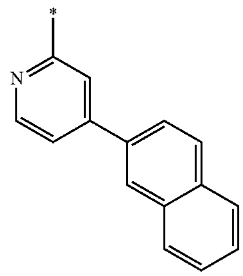
5-59
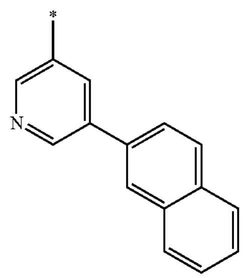
5-60
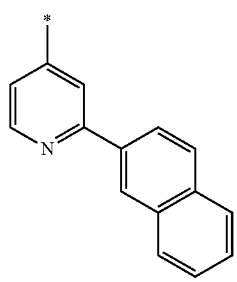
5-61
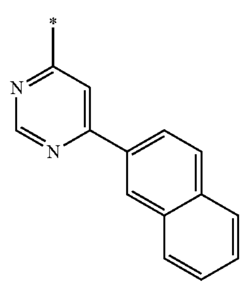
5-62
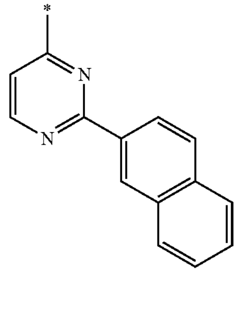
-continued
5-63
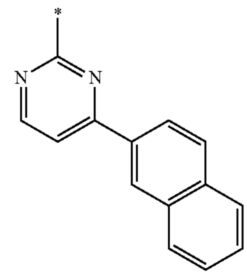
5-64
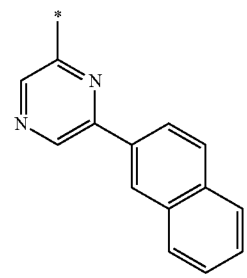
5-65
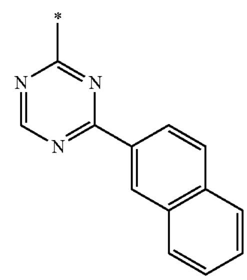
5-66
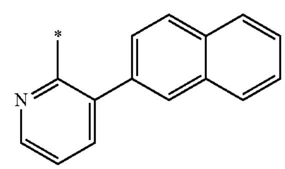
5-67
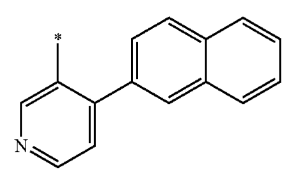
5-68
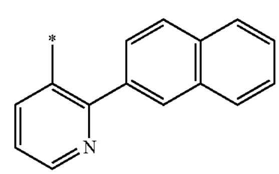
5-69
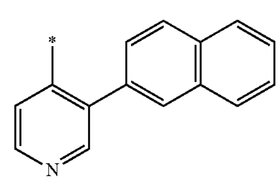

-continued
5-70
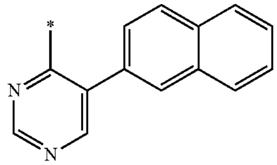
5-71
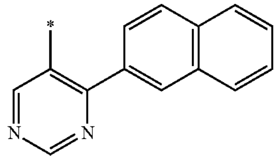
5-72
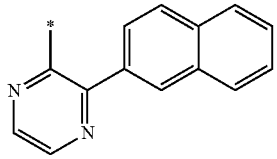
5-73
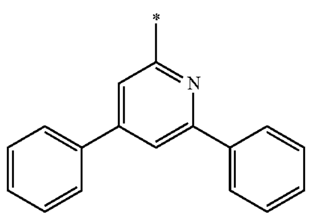
5-74
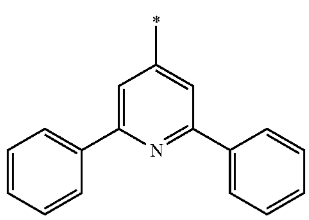
5-75
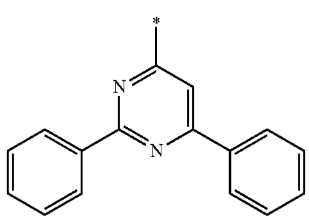
5-76
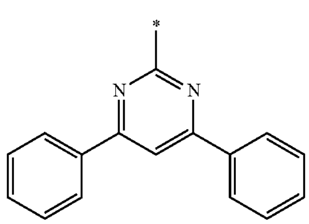
5-77
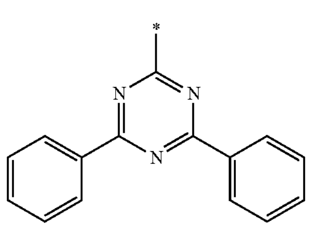
-continued
5-78
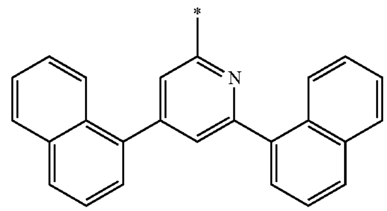
5-79
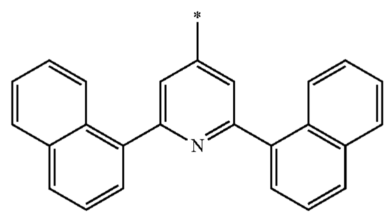
5-80
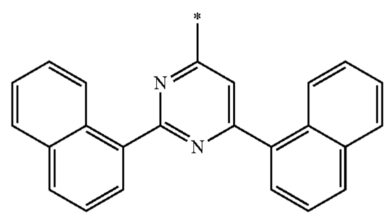
5-81
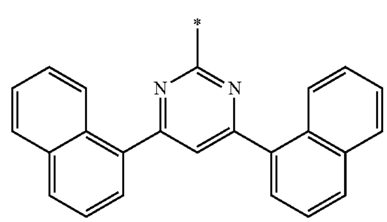
5-82
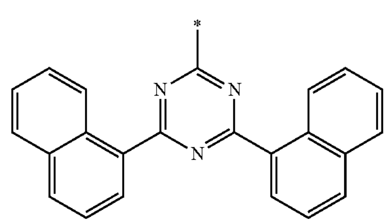
5-83
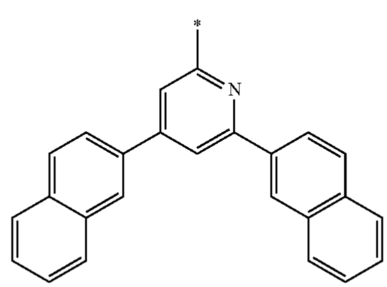

-continued
5-84
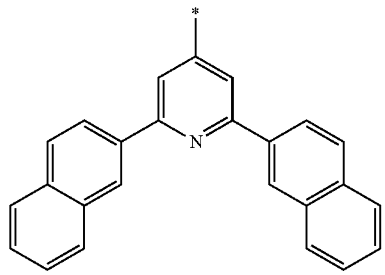
5-85
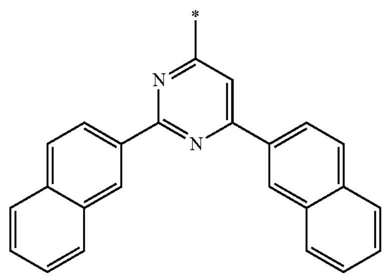
5-86
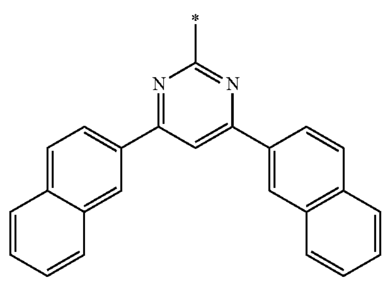
5-87
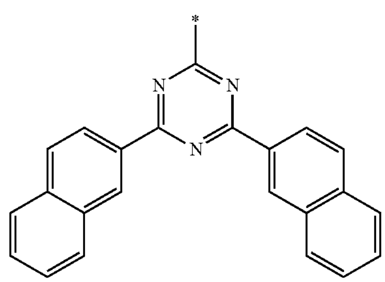
5-88
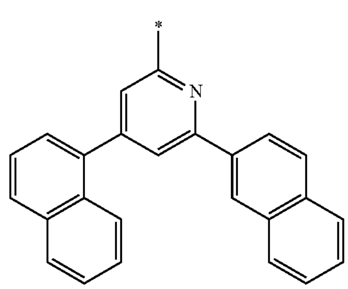
-continued
5-89
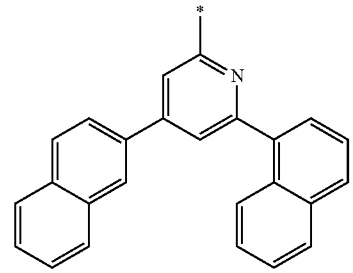
5-90
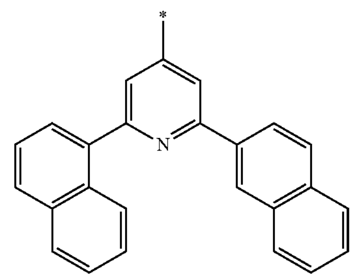
5-91
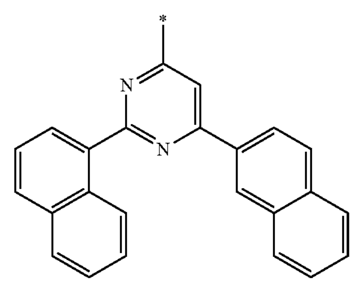
5-92
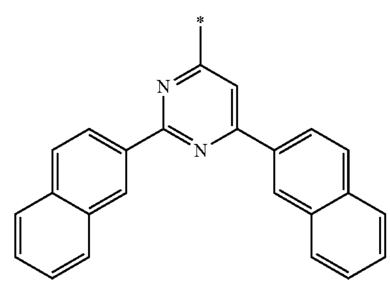
5-93
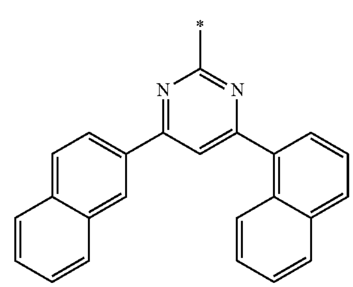

-continued
5-94
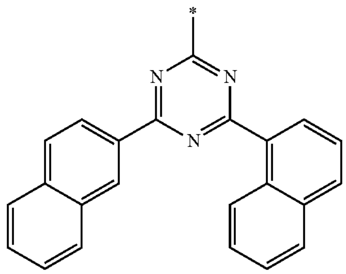
5-95
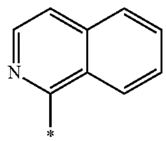
5-96
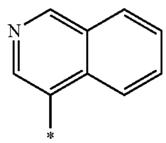
5-97
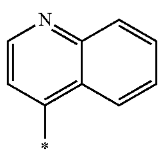
5-98
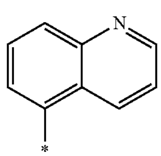
5-99
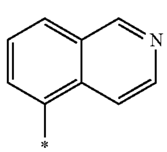
5-100
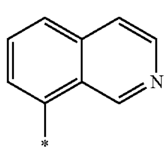
5-101
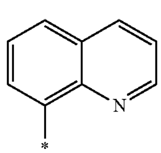
5-102
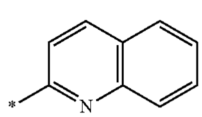
5-103
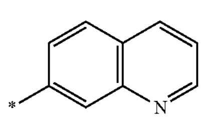
-continued
5-104
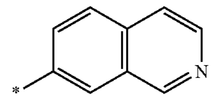
5-105
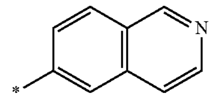
5-106
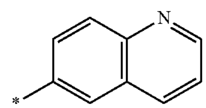
5-107
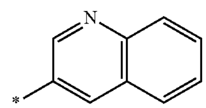
5-108
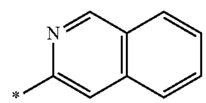
5-109
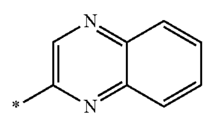
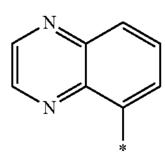
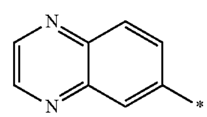
5-112
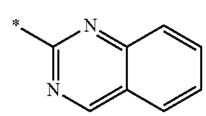
5-113
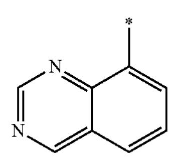
5-114
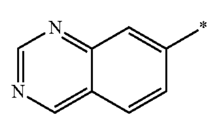
5-115
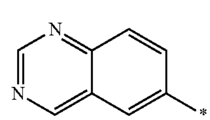
5-116
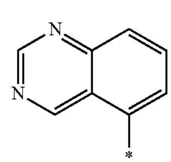

-continued
5-117
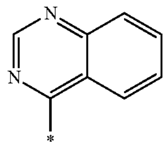
5-118
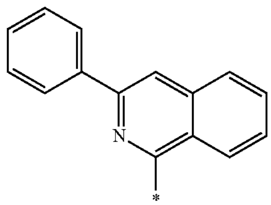
5-119
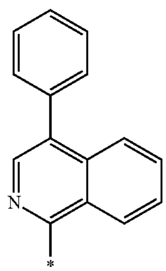
5-120
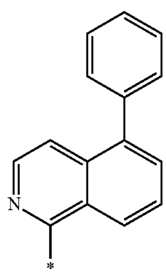
5-121
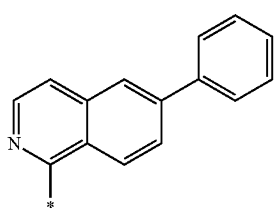
5-122
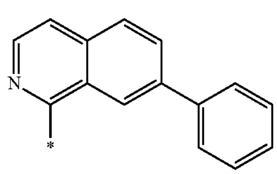
5-123
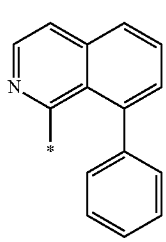
-continued
5-124
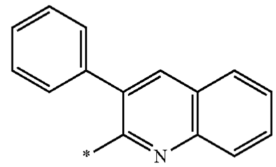
5-125
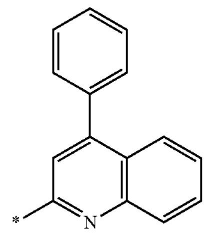
5-126
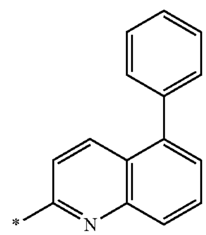
5-127
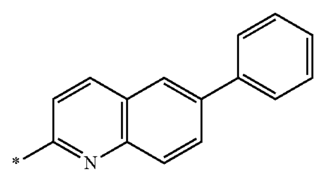
5-128
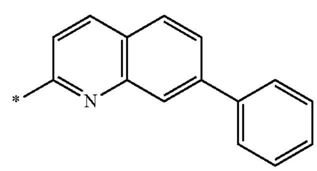
5-129
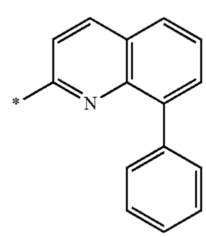
5-130
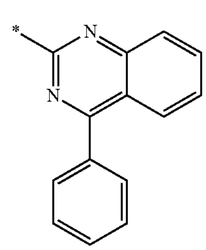

-continued 5-131

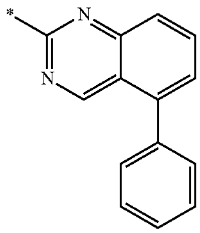

5-132

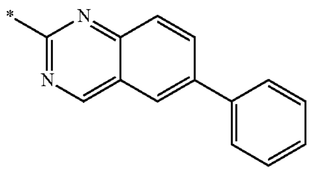

5-133

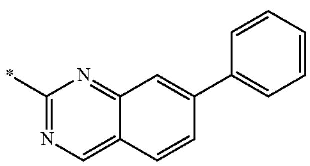

5-134

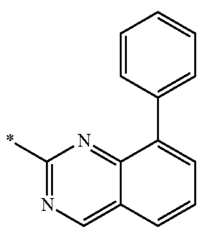

5-135

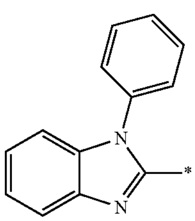

5-136

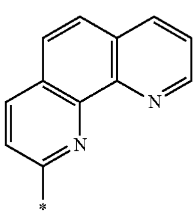

5-137

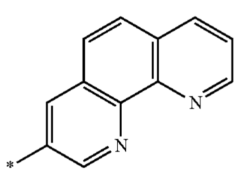

5-138

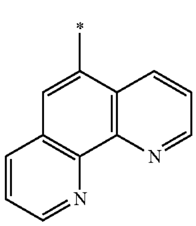

-continued 5-139

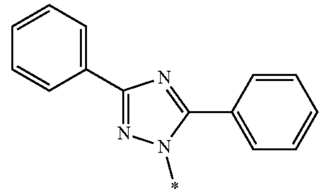

5-140

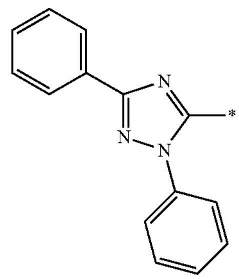

5-141

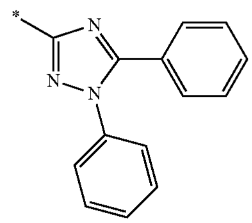

5-142

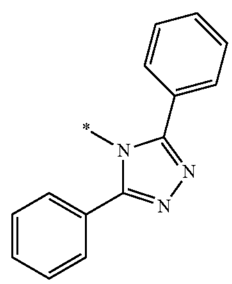

5-143

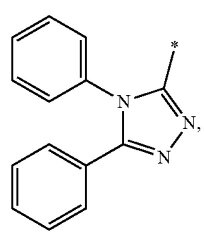

wherein in Formulae 5-1 to 5-143,

* indicates a binding site to a neighboring atom.

6. The organic light-emitting device of claim 1, wherein c11 is 1.

7. The organic light-emitting device of claim 1, wherein $R_{81}$ to $R_{56}$ are each independently selected from

*—$[(L_{11})_{a11}$-$(R_{11})_{b11}]$, a hydrogen, a deuterium, —F, —Cl, —Br, —I, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, a phenyl group, a naphthyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, a pyridinyl group, a pyrazinyl group, a pyrimidinyl group, a pyridazinyl group, an indolyl group, a quinolinyl group, an isoquinolinyl group, a benzoquinolinyl group, a quinoxalinyl group, a quinazolinyl group, a cinnolinyl group, a phenanthridinyl group, an acridinyl group, a phenanthrolinyl group, a phenazinyl group, a benzimidazolyl group, a triazolyl group, and a triazinyl group; and a phenyl group, a naphthyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, a pyridinyl group, a pyrazinyl group, a pyrimidinyl group, a pyridazinyl group, an indolyl group, a quinolinyl group, an isoquinolinyl group, a benzoquinolinyl group, a quinoxalinyl group, a quinazolinyl group, a cinnolinyl group, a phenanthridinyl group, an acridinyl group, a phenanthrolinyl group, a phenazinyl group, a benzimidazolyl group, a triazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group.

8. The organic light-emitting device of claim 1, wherein $R_{81}$ to $R_{86}$ are each independently selected from *-[$(L_{11})_{a11}$-$(R_{11})_{b11}$], a hydrogen, a deuterium, —F, —Cl, —Br, —I, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, a phenyl group, a naphthyl group, a pyridinyl group, a pyrimidinyl group, a pyridazinyl group, and a triazinyl group; and a phenyl group, a naphthyl group, a pyridinyl group, a pyrimidinyl group, a pyridazinyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pyridinyl group, a pyrimidinyl group, and a triazinyl group.

9. The organic light-emitting device of claim 1, wherein $R_{21}$ and $R_{91}$ to $R_{94}$ are each independently selected from a hydrogen, a deuterium, —F, —Cl, —Br, —I, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoa quinoxalinyl group, a quinazolinyl group, a benzoa quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazolyl group, an imidazopyridinyl group, and an imidazopyrimidinyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group.

10. The organic light-emitting device of claim 1, wherein $R_{21}$ and $R_{91}$ to $R_{94}$ are each independently selected from a hydrogen, a deuterium, —F, —Cl, —Br, —I, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, a phenyl group, a naphthyl group, a fluorenyl group, a benzofluorenyl group, a phenanthrenyl group, an anthracenyl group, a triphenylenyl group, a pyridinyl group, a pyrimidinyl group, a pyridazinyl group, a triazinyl group, a dibenzofuranyl group, a dibenzothiophenyl group, a quinolinyl group, an isoquinolinyl group, a carbazolyl group, a quinazolinyl group, a quinoxalinyl group, a phenanthrolinyl group, a benzimidazolyl group, and a triazolyl group; and a phenyl group, a naphthyl group, a fluorenyl group, a benzofluorenyl group, a phenanthrenyl group, an anthracenyl group, a triphenylenyl group, a pyridinyl group, a pyrimidinyl group, a pyridazinyl group, a triazinyl group, a dibenzofuranyl group, a dibenzothiophenyl group, a quinolinyl group, an isoquinolinyl group, a carbazolyl group, a quinazolinyl group, a quinoxalinyl group, a phenanthrolinyl group, a benzimidazolyl group, and a triazolyl group, each substituted with at least one selected from a deuterium, —F, —Br, —I, a $C_1$-$C_{20}$ alkyl group, a phosphoric acid group or a salt thereof, a phenyl group, a biphenyl group, a naphthyl group, a pyridinyl group, a pyrimidinyl group, and a triazinyl group.

11. The organic light-emitting device of claim 1, wherein $R_{21}$ and $R_{91}$ to $R_{94}$ are each independently selected from Formulae 4-1 to 4-47 and 6-1 to 6-15:

4-1

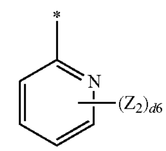

4-2

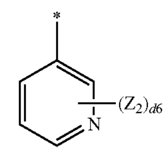

4-3

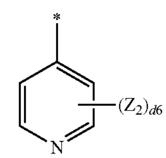

4-4

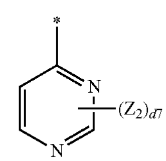

4-5

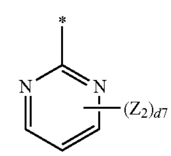

4-6

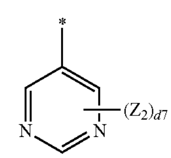

4-7

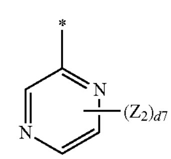

4-8

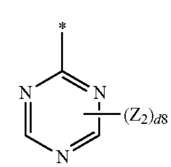

-continued
R-9
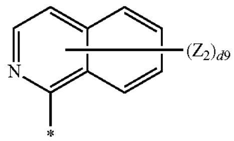
4-10
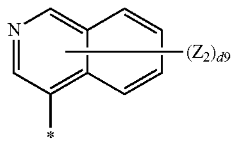
4-11
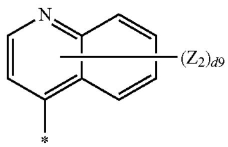
4-12
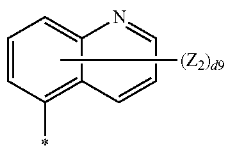
4-13
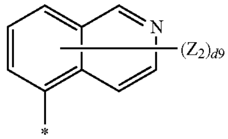
4-14
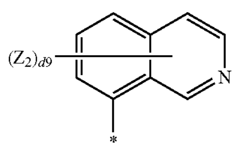
4-15
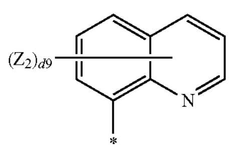
4-16
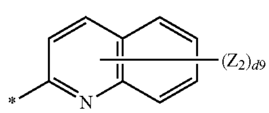
4-17
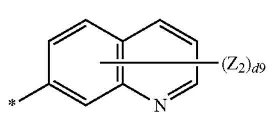
4-18
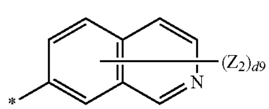
4-19
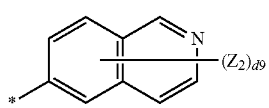
-continued
4-20
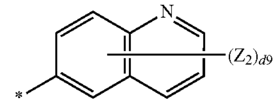
4-21
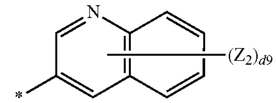
4-22
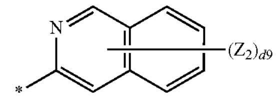
4-23
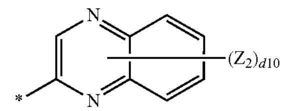
4-24
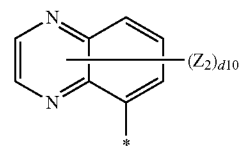
4-25
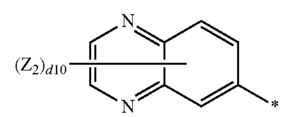
4-26
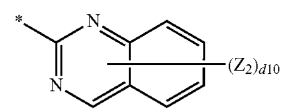
4-27
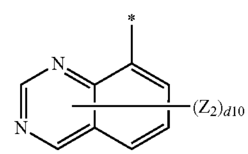
4-28
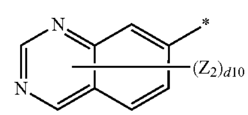
4-29
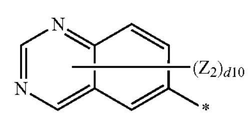
4-30
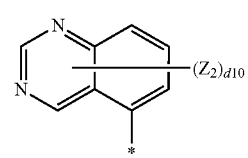
4-31
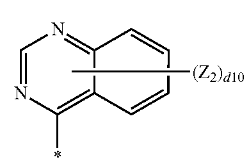

-continued
4-32
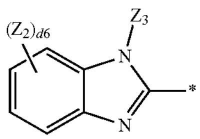
4-33
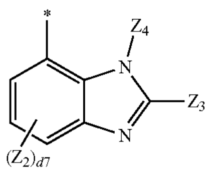
4-34
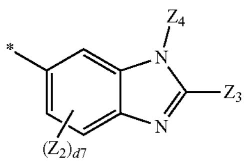
4-35
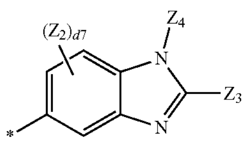
4-36
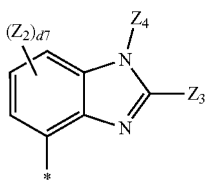
4-37
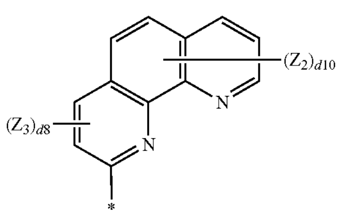
4-38
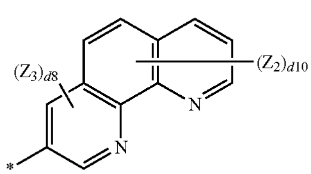
4-39
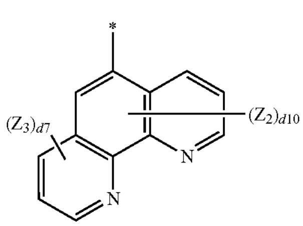
4-40
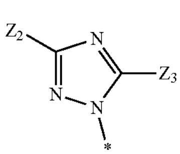
-continued
4-41
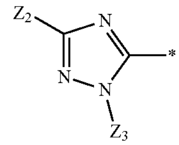
4-42
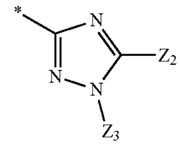
4-43
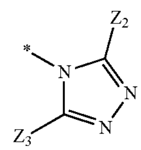
4-44
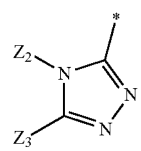
4-45
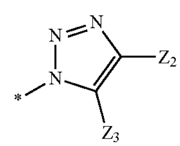
4-46
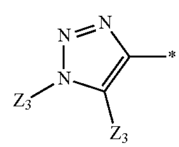
4-47
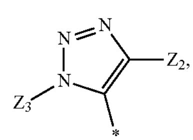
6-1
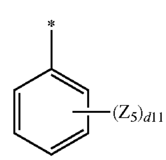
6-2
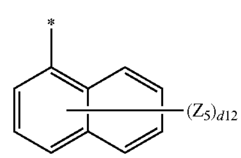
6-3
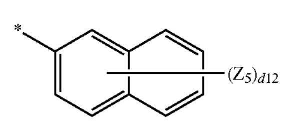

-continued 6-4

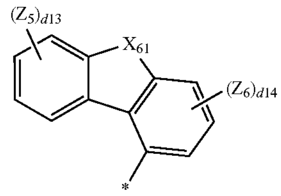

6-5

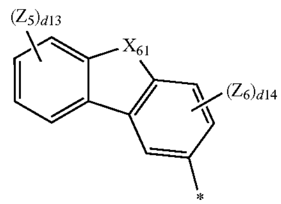

6-6

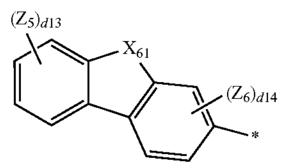

6-7

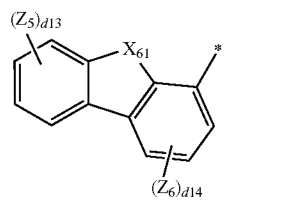

6-8

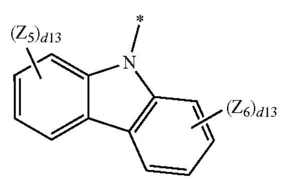

6-9

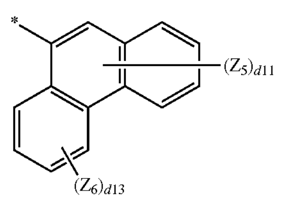

6-10

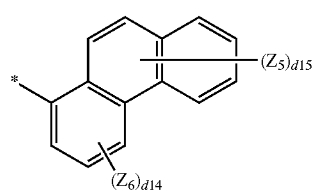

6-11

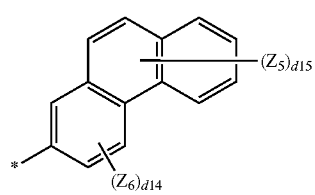

-continued 6-12

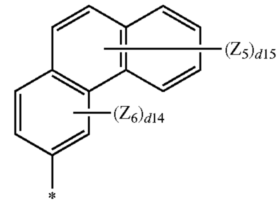

6-13

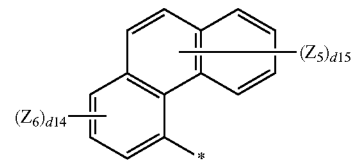

6-14

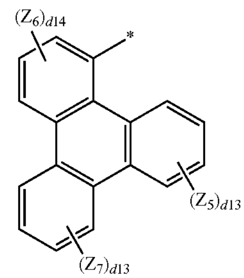

6-15

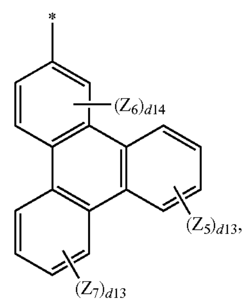

wherein in Formulae 4-1 to 4-47 and Formulae 6-1 to 6-15, $X_{61}$ is selected from $C(Q_1)(Q_2)$, $N(Q_1)$, an oxygen atom (O), and a sulfur atom (S);

$Q_1$ and $Q_2$ are each independently selected from a hydrogen, a methyl group, and a phenyl group;

$Z_2$ to $Z_7$ are each independently selected from a hydrogen, a deuterium, a phenyl group, a biphenyl group, a naphthyl group, a pyridinyl group, a pyrimidinyl group, and a triazinyl group;

d6 and d13 are each independently selected from 1, 2, 3, and 4;

d7 and d14 are each independently selected from 1, 2, and 3;

d8 is selected from 1 and 2;

d9 and d15 are each independently selected from 1, 2, 3, 4, 5 and 6;

d10 and d11 are each independently selected from 1, 2, 3, 4, and 5;

d12 is selected from 1, 2, 3, 4, 5, 6, and 7; and

* indicates a binding site to a neighboring atom.

12. The organic light-emitting device of claim 1, wherein $R_{21}$ and $R_{91}$ to $R_{94}$ are each independently selected from Formulae 5-1 to 5-143 and 7-1 to 7-35:

5-1
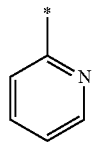
5-2
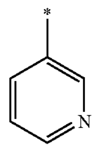
5-3
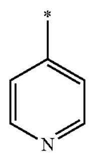
5-4
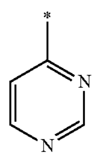
5-5
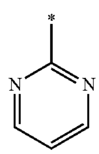
5-6
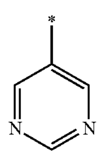
5-7
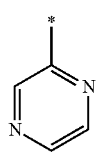
5-8
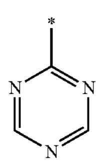
5-9
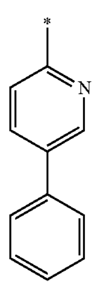
-continued
5-10
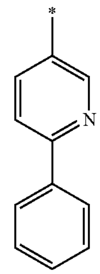
5-11
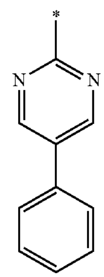
5-12
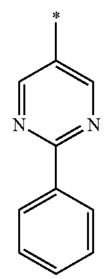
5-13
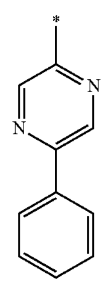
5-14
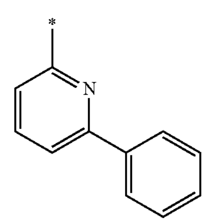
5-15
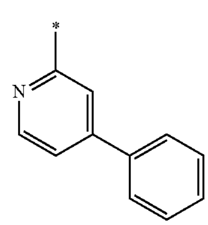

-continued
5-16
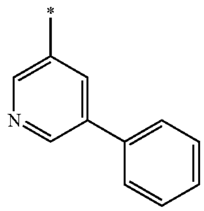
5-17
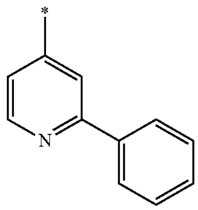
5-18
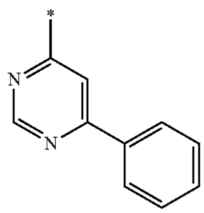
5-19
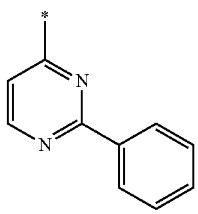
5-20
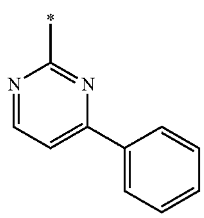
5-21
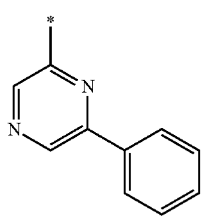
5-22
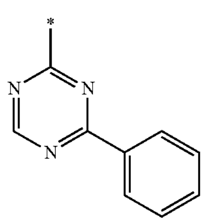
-continued
5-23
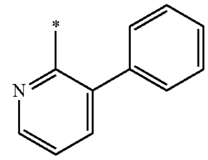
5-24
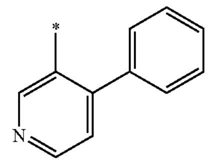
5-25
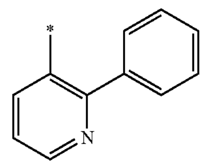
5-26
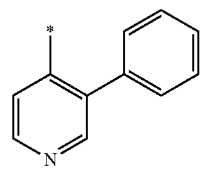
5-27
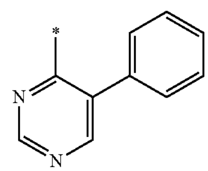
5-28
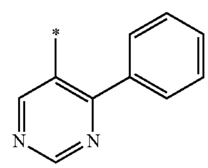
5-29
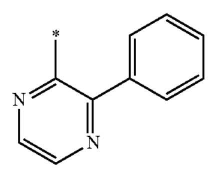
5-30
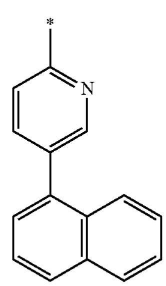

-continued
5-31
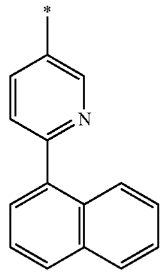
5-32
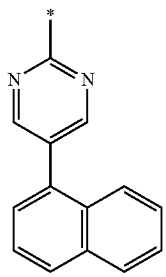
5-33
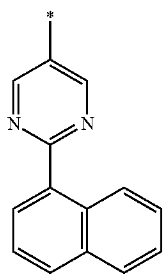
5-34
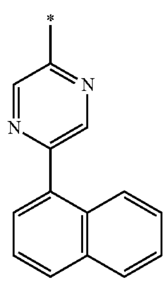
5-35
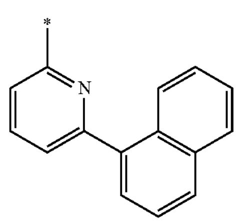
5-36
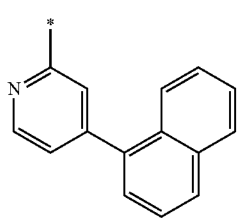
-continued
5-37
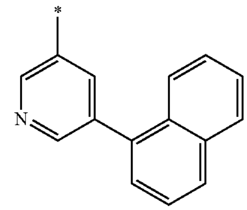
5-38
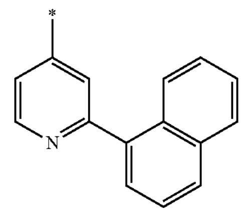
5-39
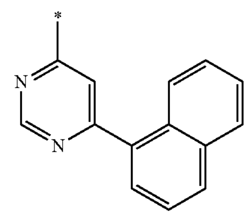
5-40
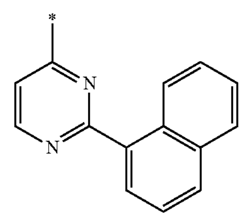
5-41
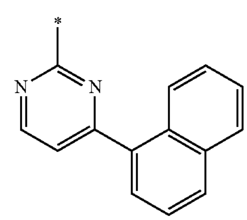
5-42
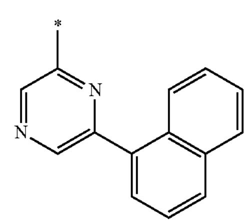

-continued
5-43
5-44
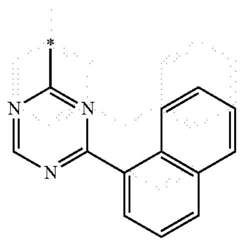
5-45
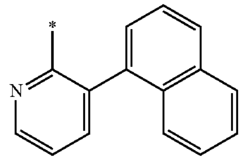
5-46
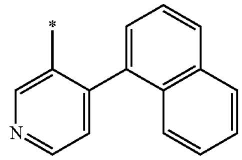
5-47
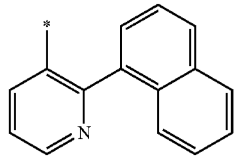
5-48
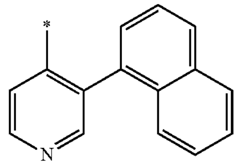
5-49
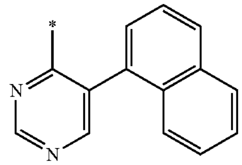
5-50
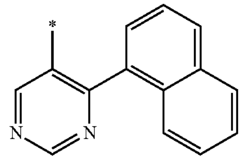
5-51
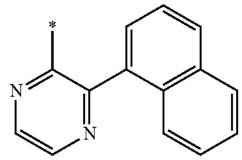
-continued
5-52
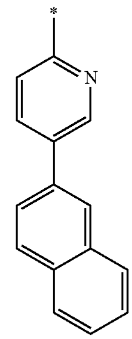
5-53
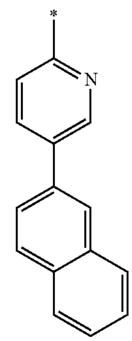
5-54
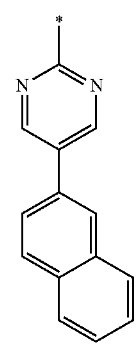
5-55
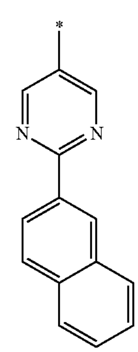

-continued
5-56
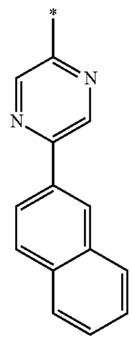
5-57
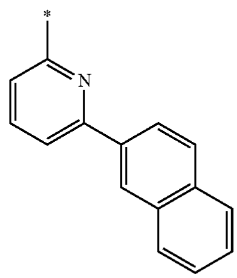
5-58
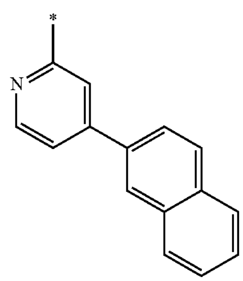
5-59
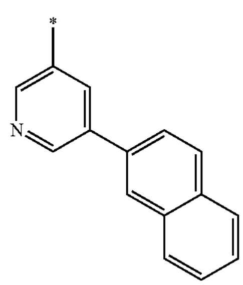
5-60
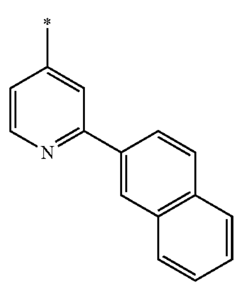
-continued
5-61
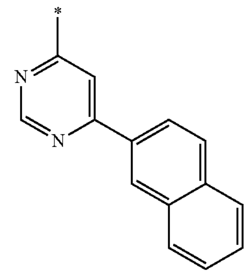
5-62
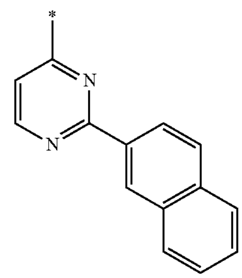
5-63
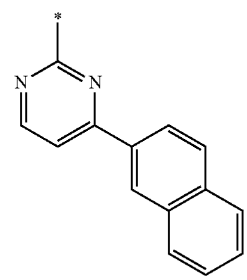
5-64
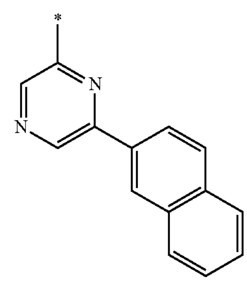
5-65
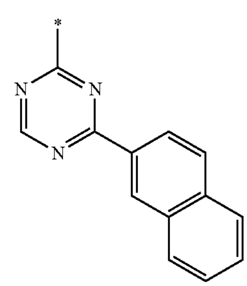
5-66
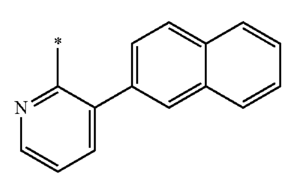

-continued
5-67
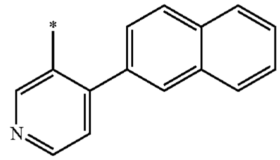
5-68
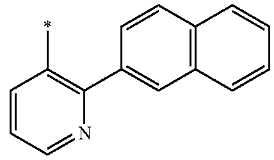
5-69
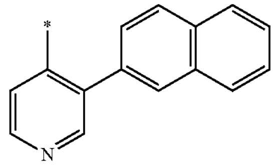
5-70
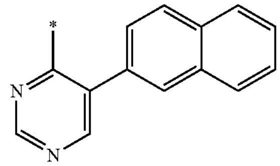
5-71
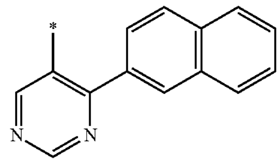
5-72
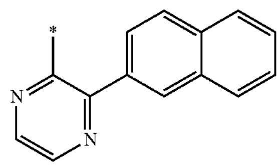
5-73
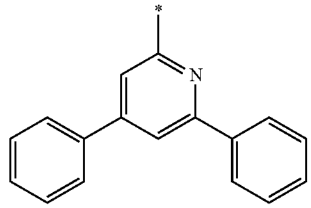
5-74
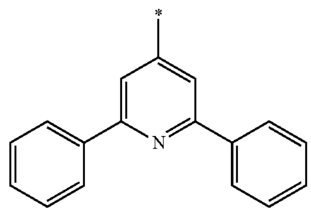
-continued
5-75
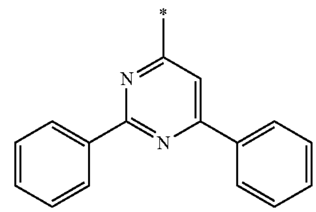
5-76
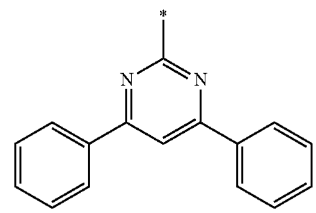
5-77
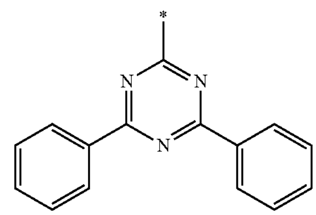
5-78
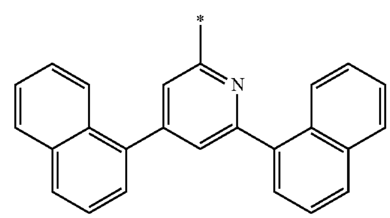
5-79
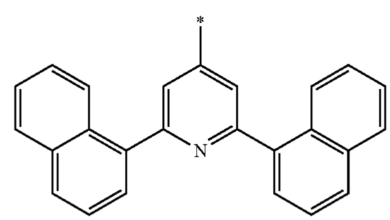
5-80
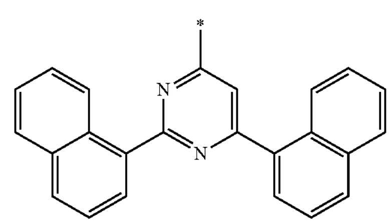
5-81
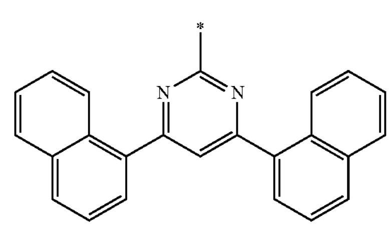

-continued
5-82
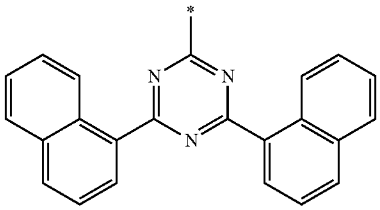
5-83
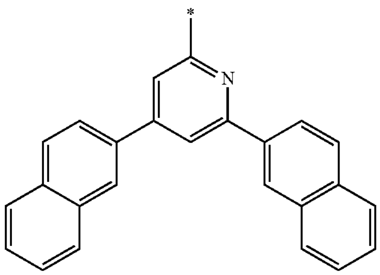
5-84
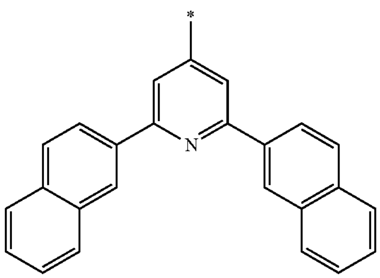
5-85
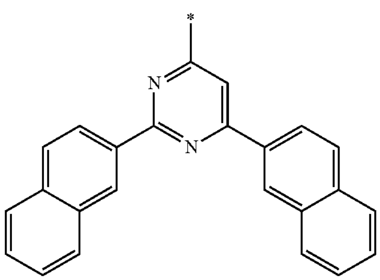
5-86
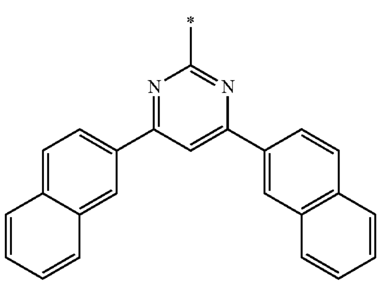
5-87
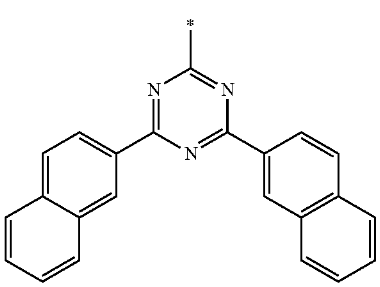
-continued
5-88
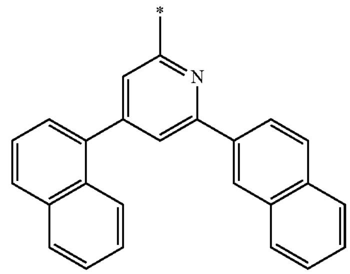
5-89
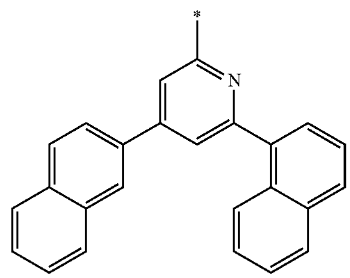
5-90
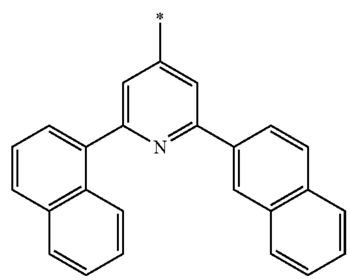
5-91
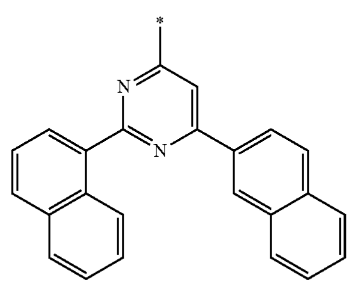
5-92
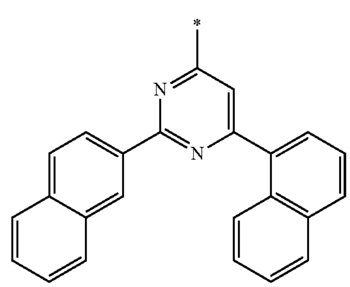

-continued
5-93
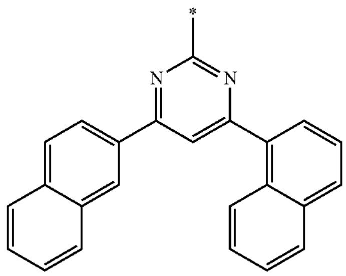
5-94
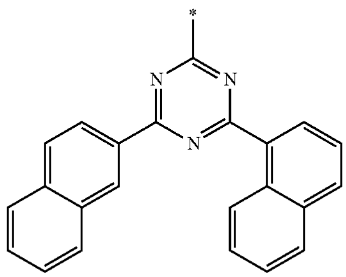
5-95
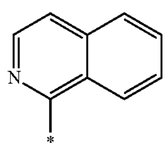
5-96
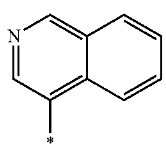
5-97
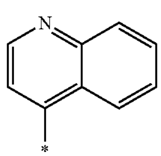
5-98
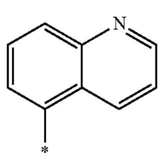
5-99
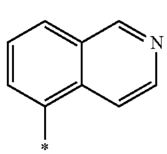
5-100
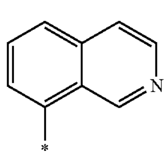
5-101
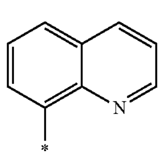
-continued
5-102
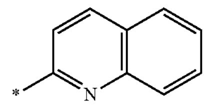
5-103
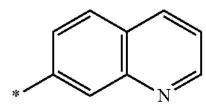
5-104
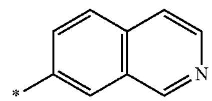
5-105
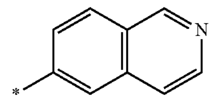
5-106
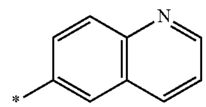
5-107
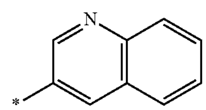
5-108
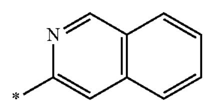
5-109
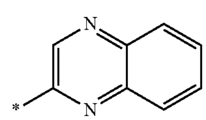
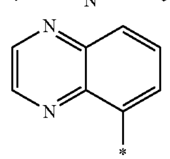
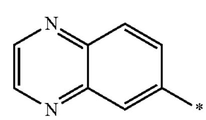
5-112
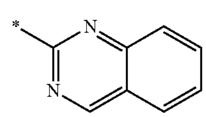
5-113
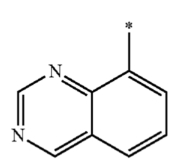
5-114
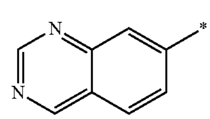
5-115
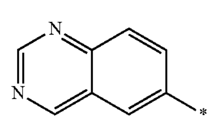

-continued
5-116
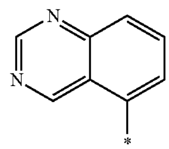
5-117
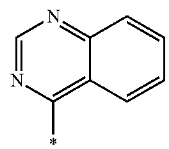
5-118
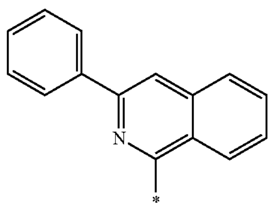
5-119
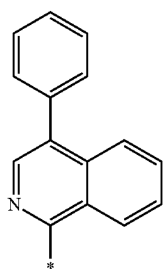
5-120
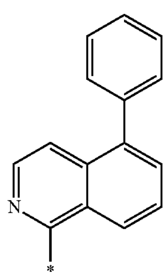
5-121
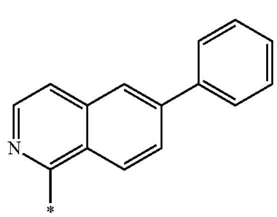
5-122
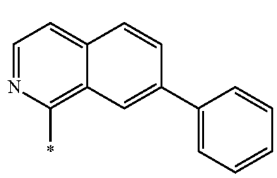
-continued
5-123
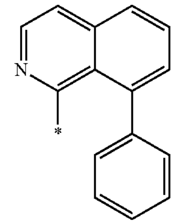
5-124
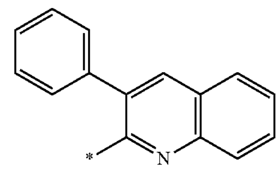
5-125
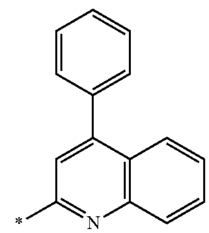
5-126
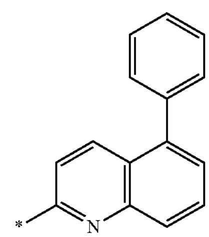
5-127
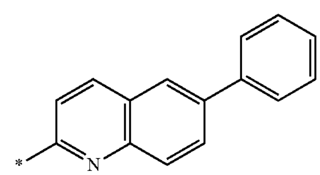
5-128
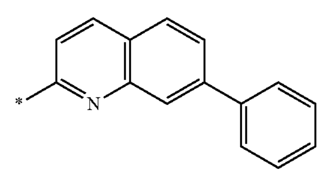
5-129
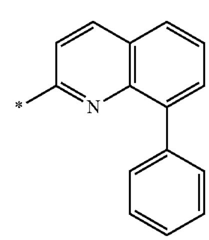

5-130
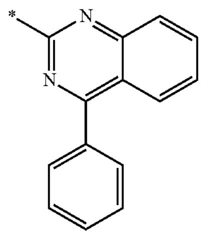
5-131
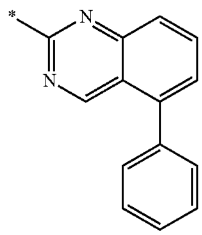
5-132
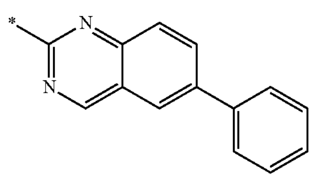
5-133
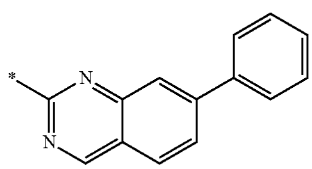
5-134
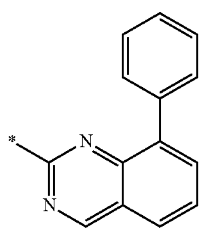
5-135
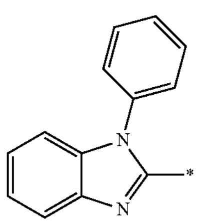
5-136
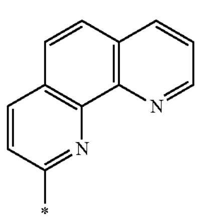
5-137
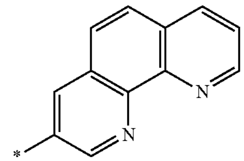
5-138
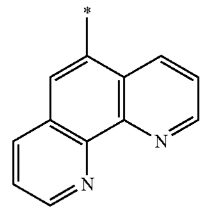
5-139
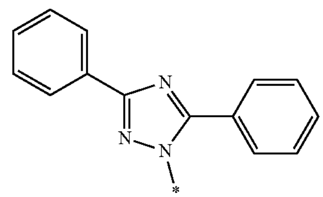
5-140
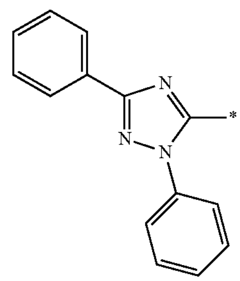
5-141
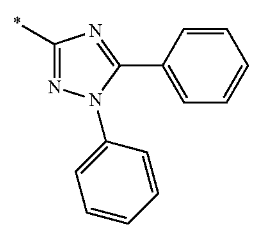
5-142
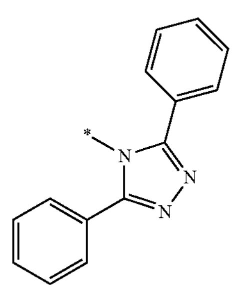
5-143
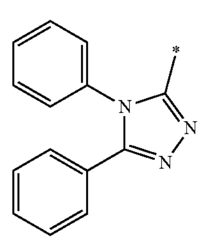

-continued
7-1
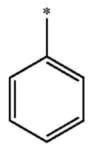
7-2
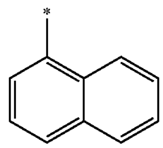
7-3
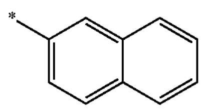
7-4
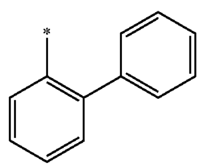
7-5
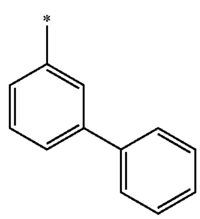
7-6
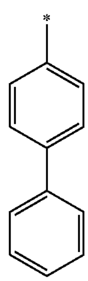
7-7
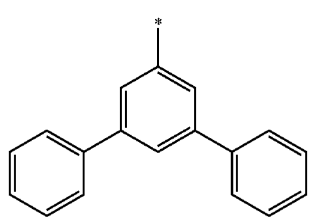
7-8
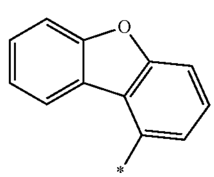
-continued
7-9
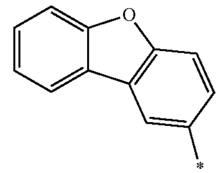
7-10
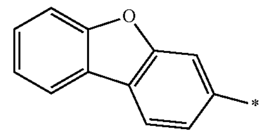
7-11
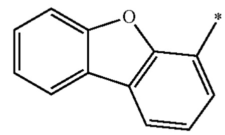
7-12
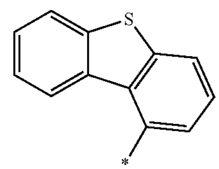
7-13
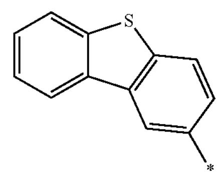
7-14
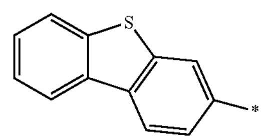
7-15
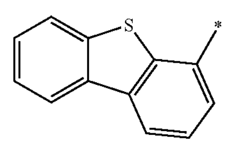
7-16
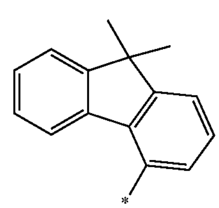
7-17
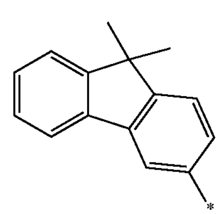

-continued
7-18
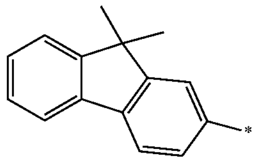
7-19
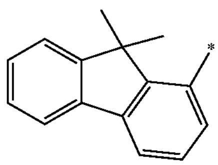
7-20
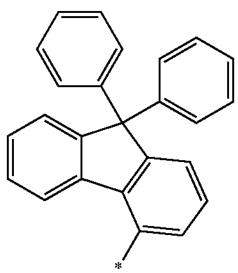
7-21
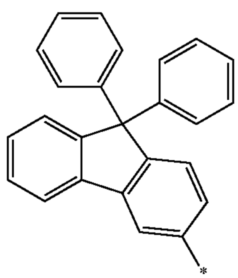
7-22
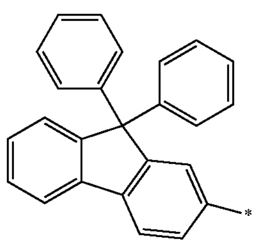
7-23
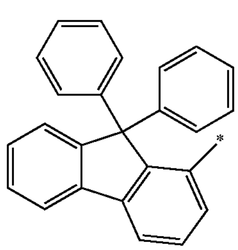
-continued
7-24
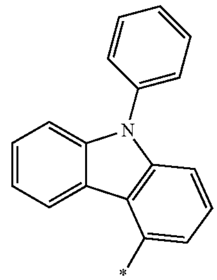
7-25
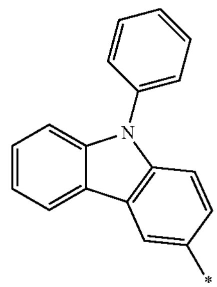
7-26
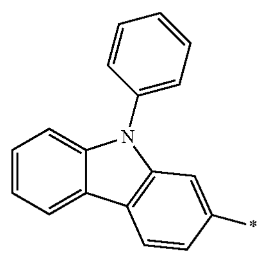
7-27
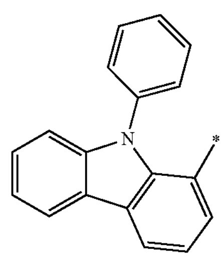
7-28
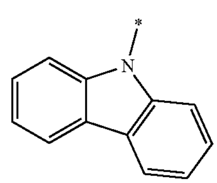
7-29
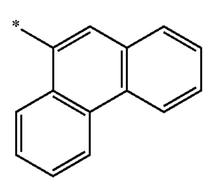
7-30
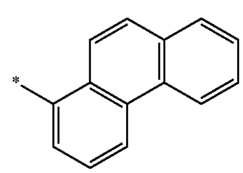

-continued
7-31
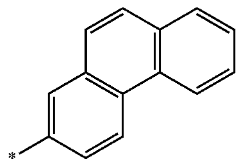
7-32
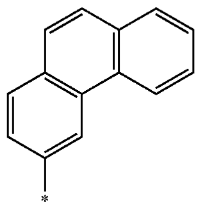
7-33
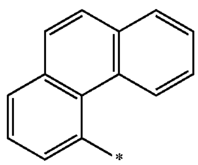
7-34
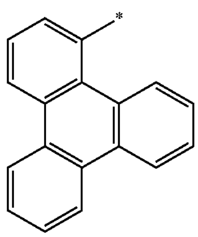
7-35
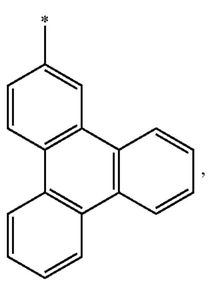
wherein in Formulae 5-1 to 5-143 and 7-1 to 7-35, indicates a binding site to a neighboring atom.
13. The organic light-emitting device of claim 1, wherein the first material is represented by any one of Formulae 1-1 to 1-12:
1-1
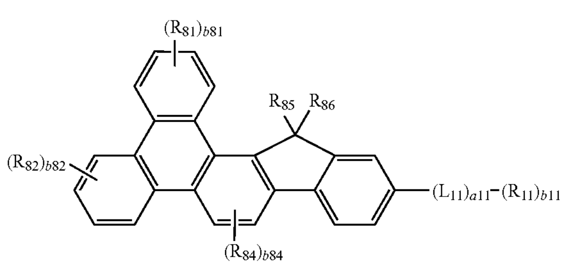
-continued
1-2
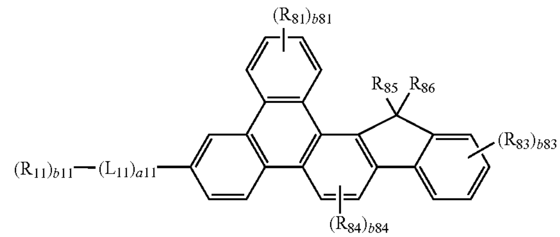
1-3
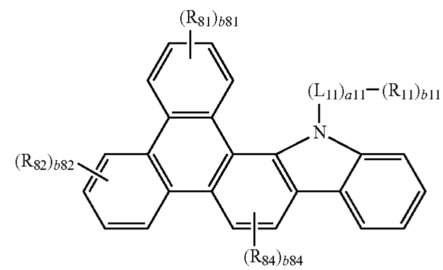
1-4
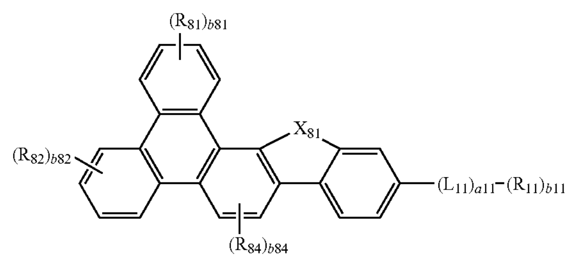
1-5
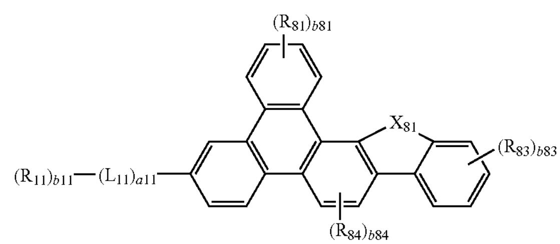
1-6
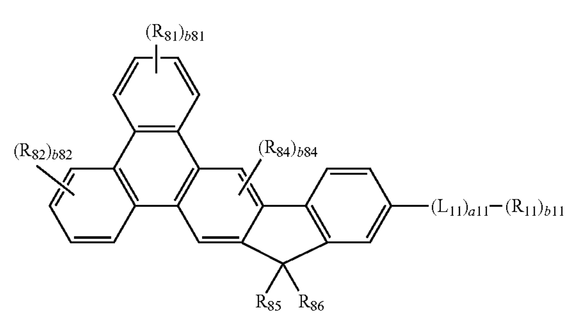

-continued
1-7
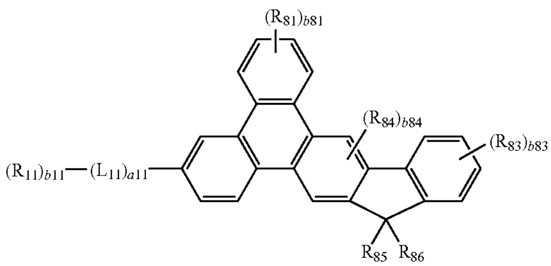
1-8
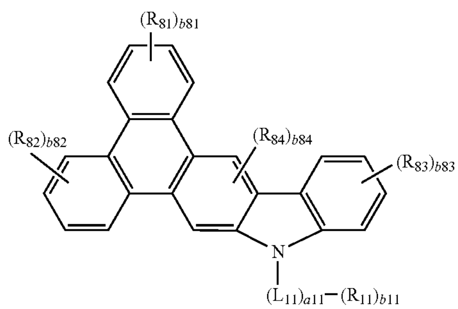
1-9
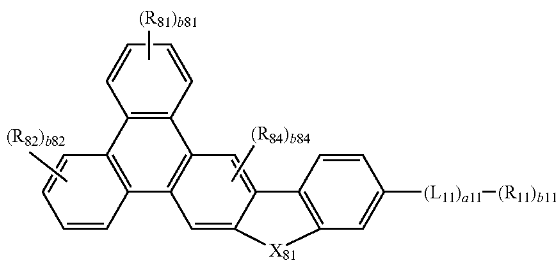
1-10
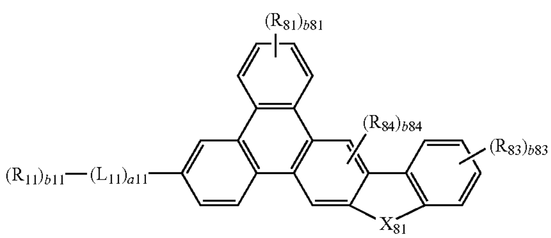
1-11
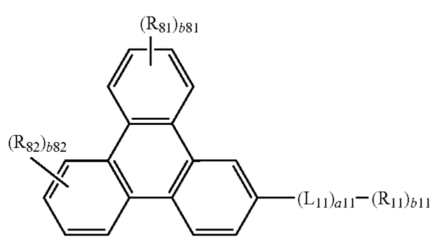
1-12
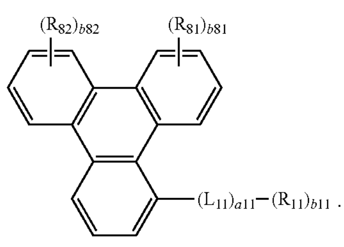
14. An organic light-emitting device comprising:
a first electrode;
a second electrode; and
an organic layer between the first electrode and the second electrode and comprising an emission layer,
wherein the organic layer comprises a first material selected from Compounds 1 to 140; and
a second material selected from Compounds 200 to 371:
1
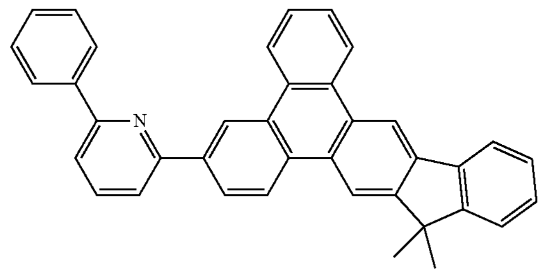
2
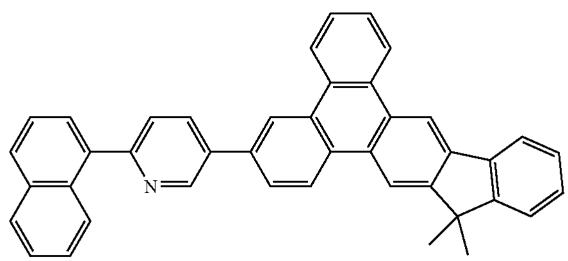
3
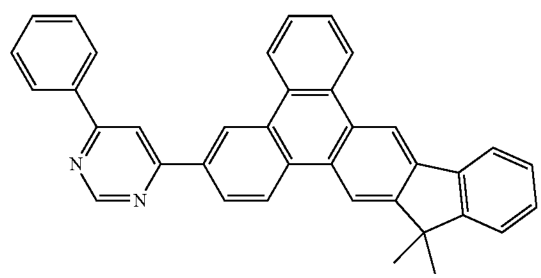
4
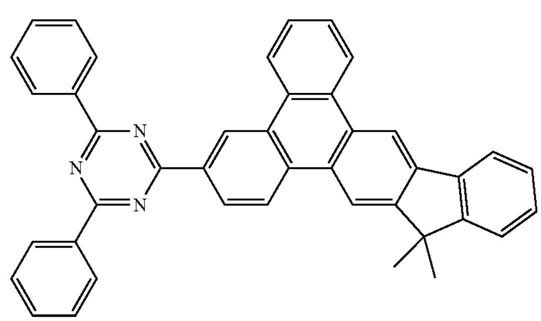

5
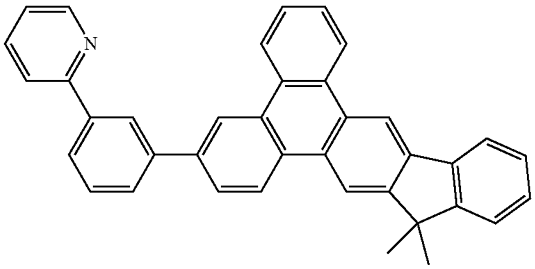
6
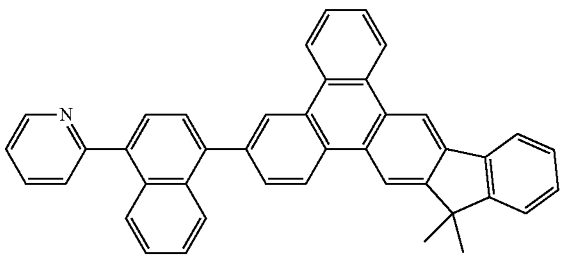
7
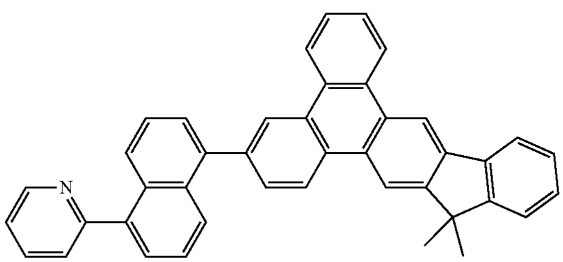
8
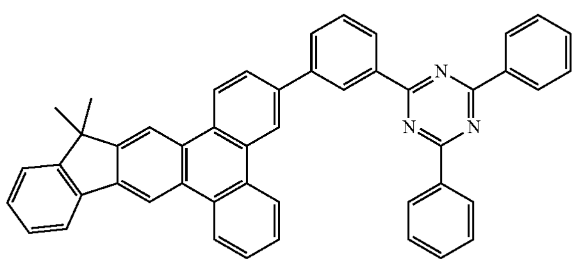
9
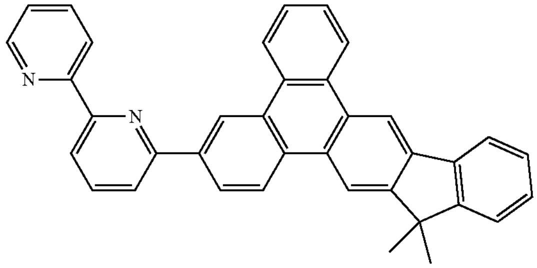
10
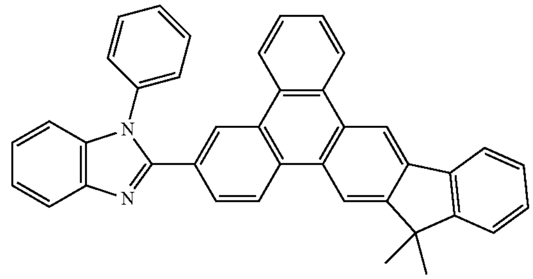
11
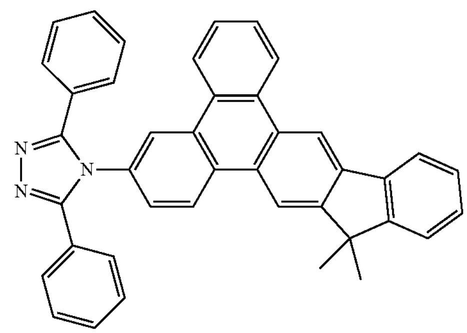
12
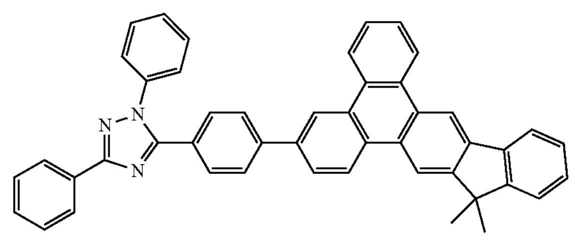
13
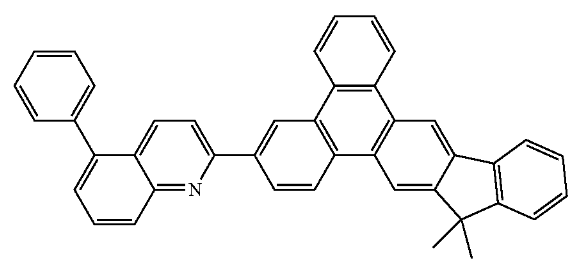
14
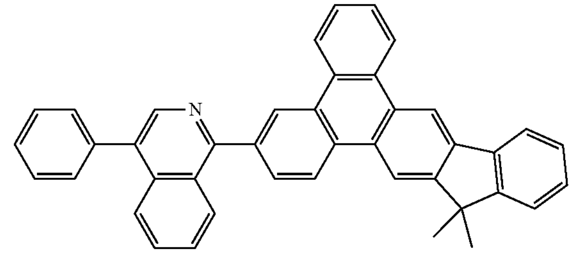

-continued
15
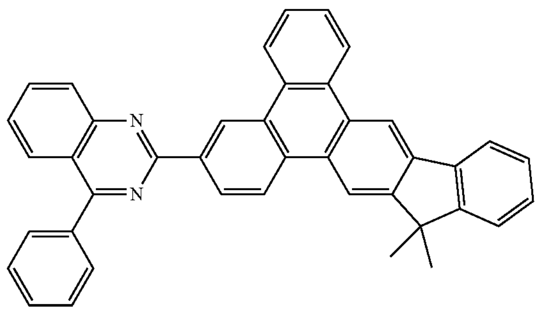
16
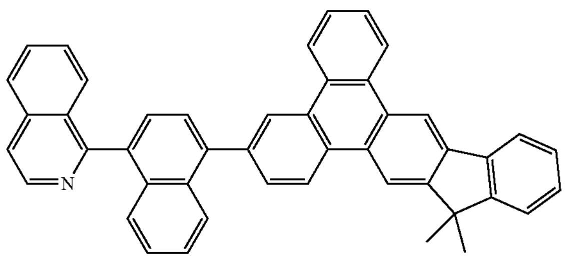
17
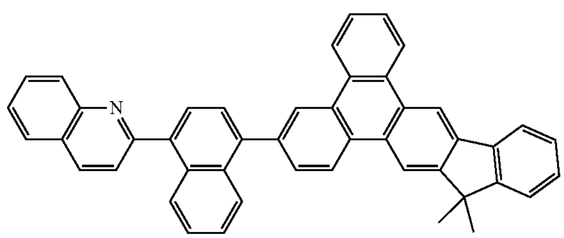
18
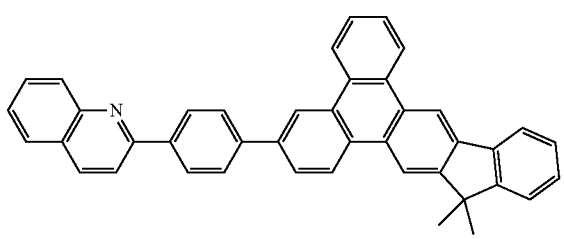
19
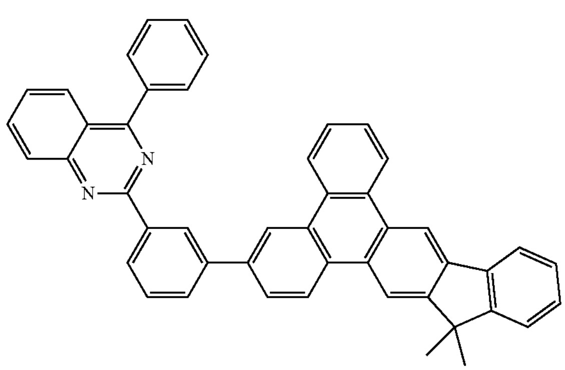
-continued
20
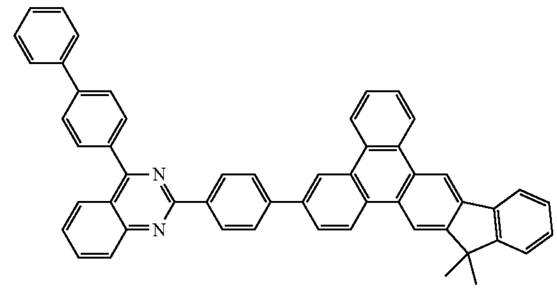
21
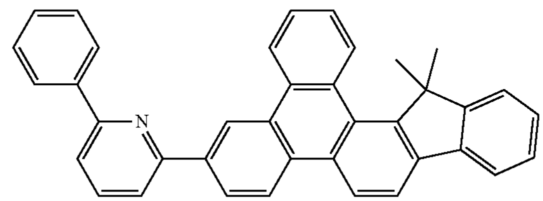
22
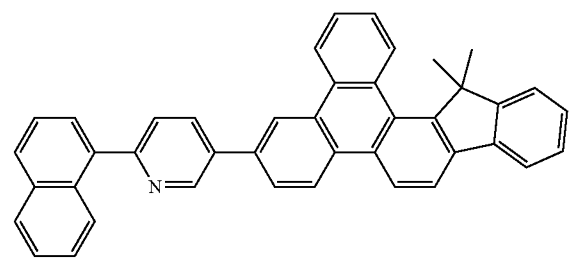
23
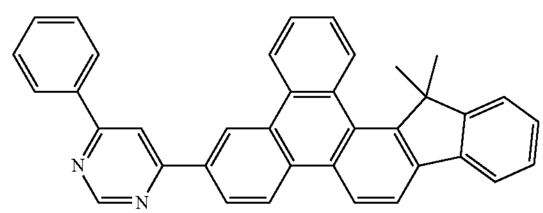
24
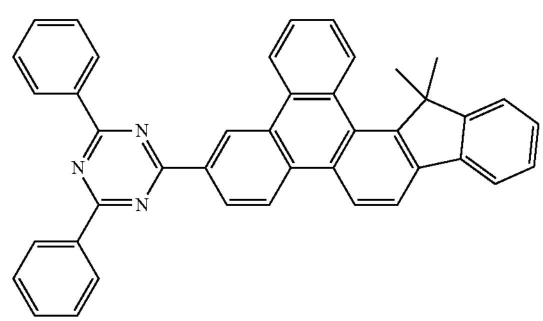
25
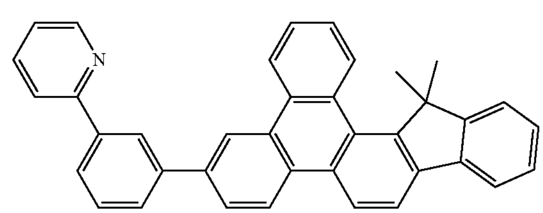

-continued
26
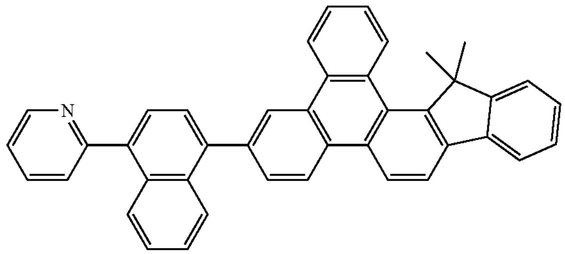
27
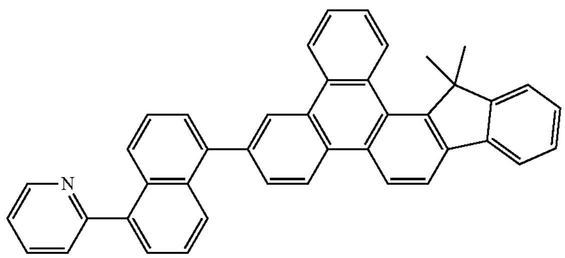
28
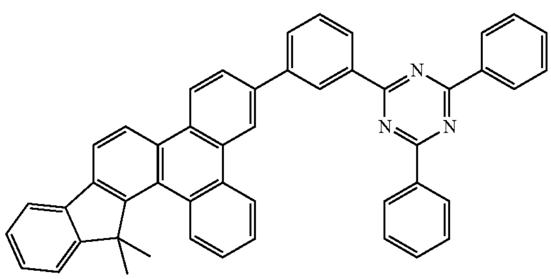
29
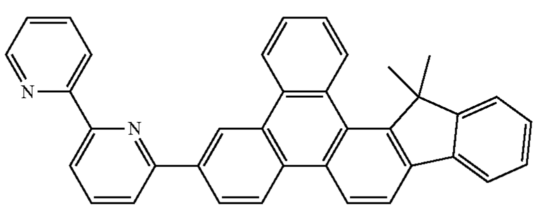
30
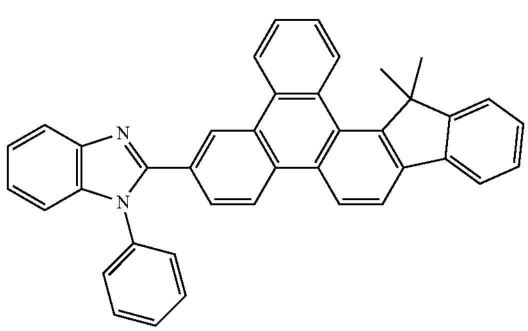
-continued
31
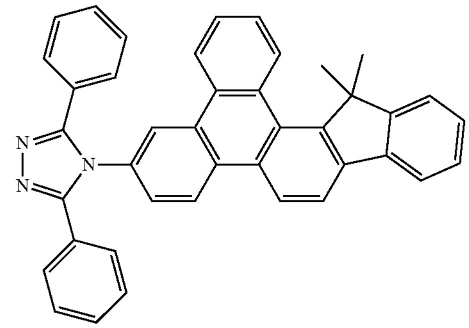
32
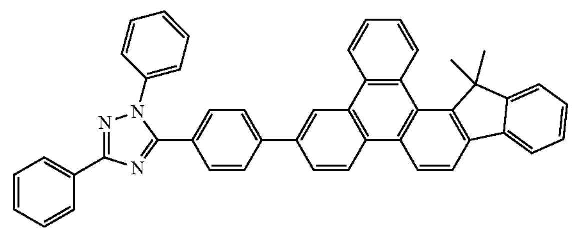
33
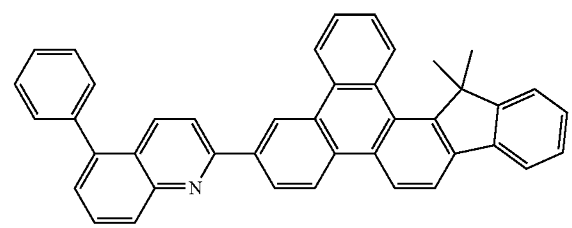
34
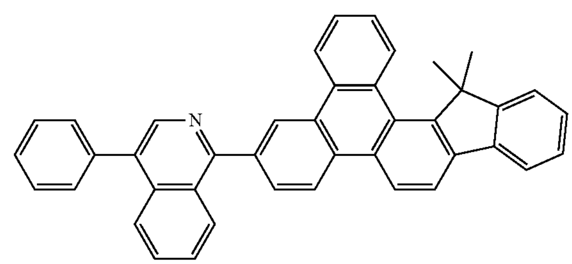
35
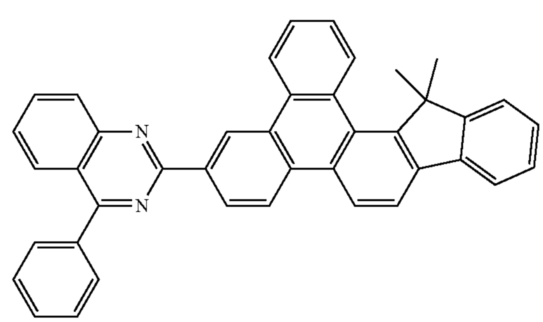

36
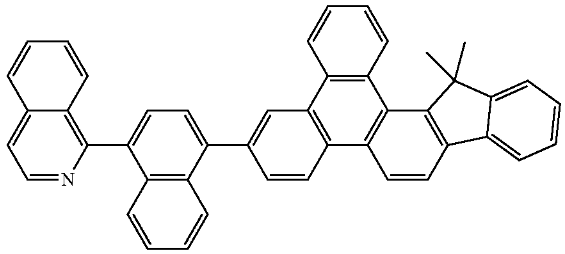
37
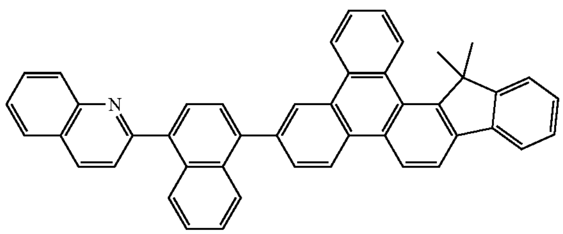
38
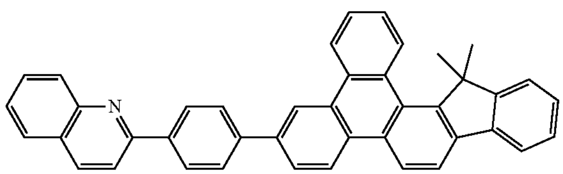
39
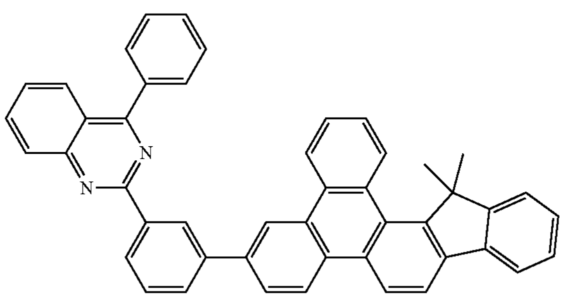
40
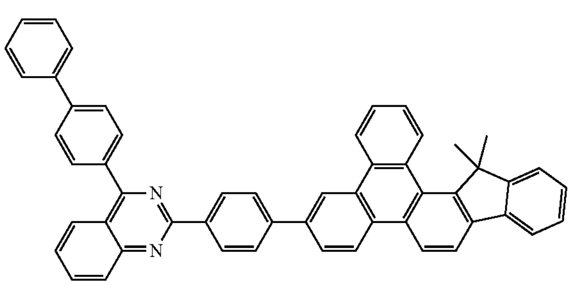
41
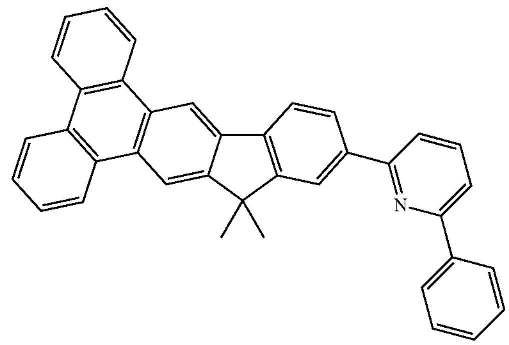
42
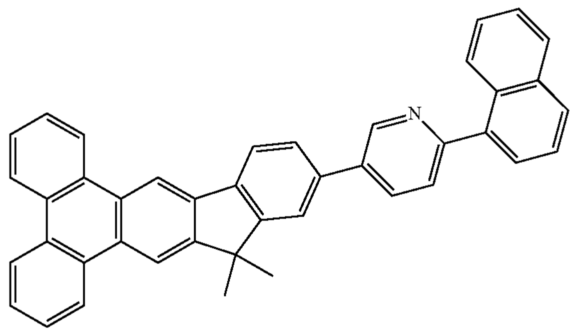
43
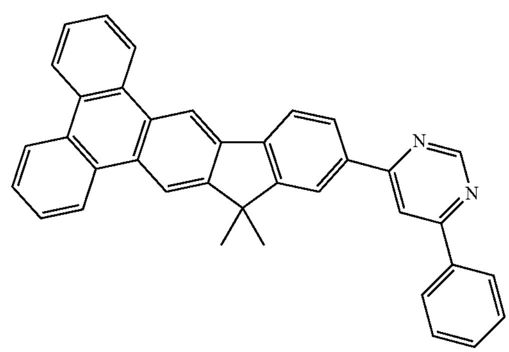
44
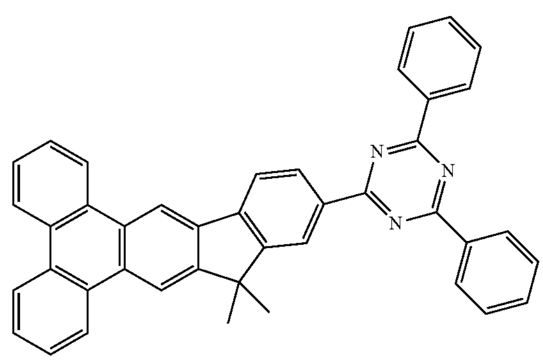

-continued
45
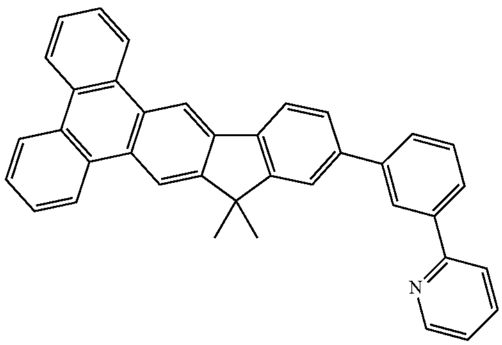
46
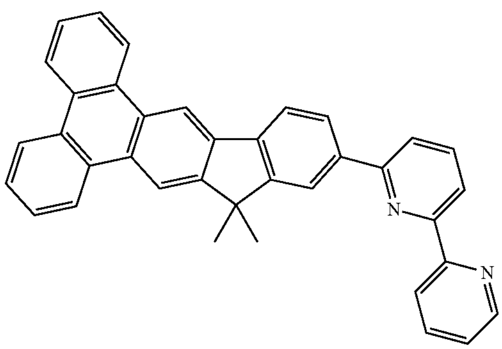
47
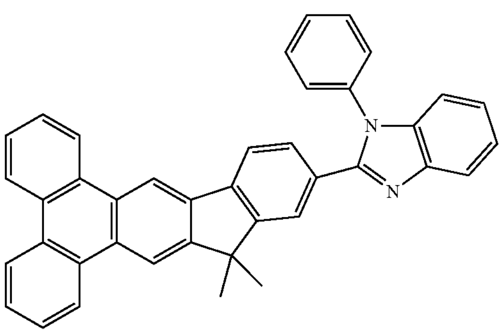
48
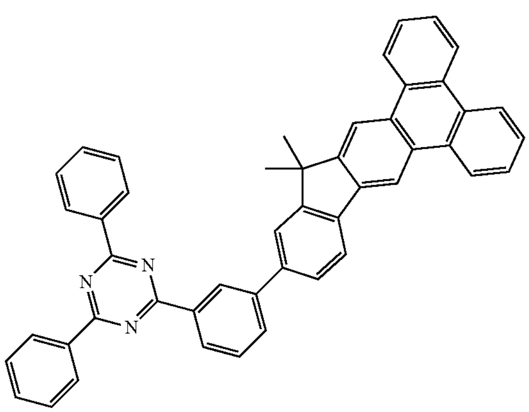
-continued
49
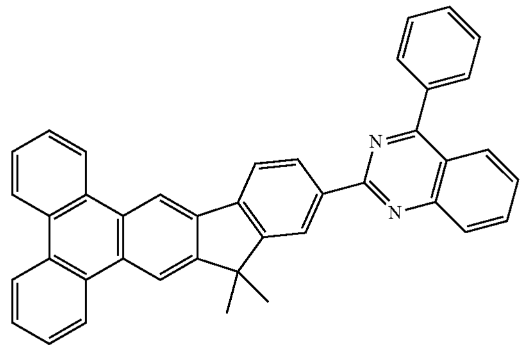
50
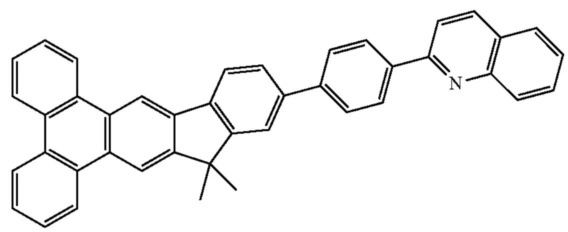
51
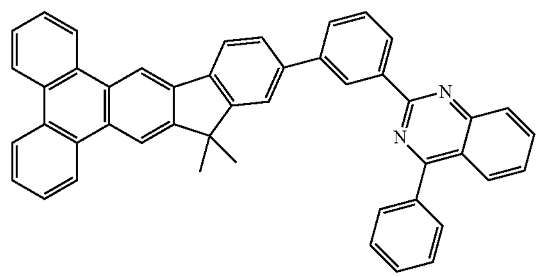
52
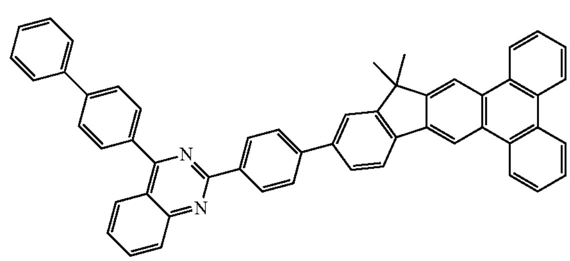
53
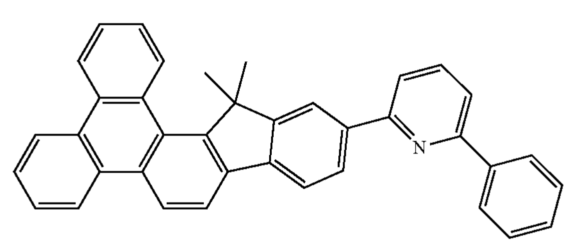

-continued
54
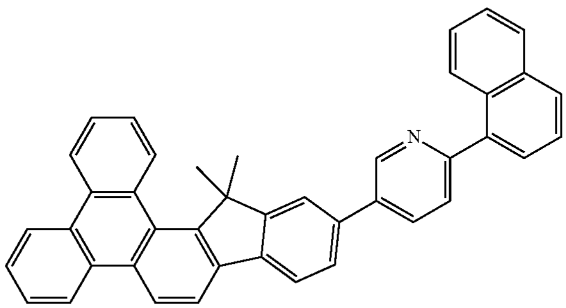
55
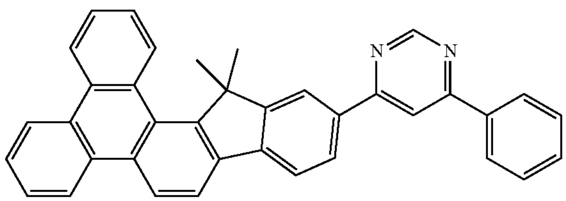
56
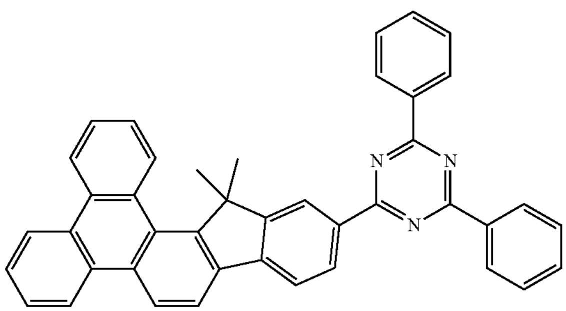
57
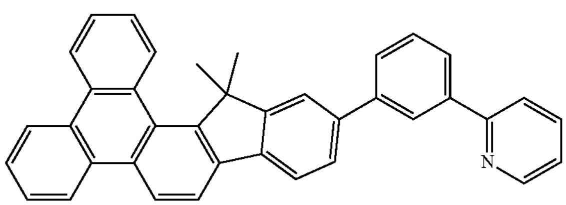
58
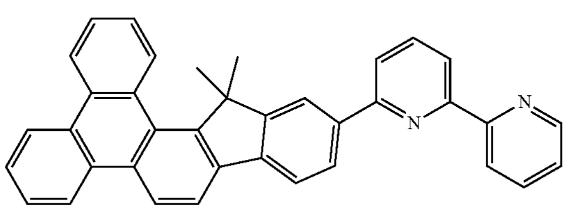
59
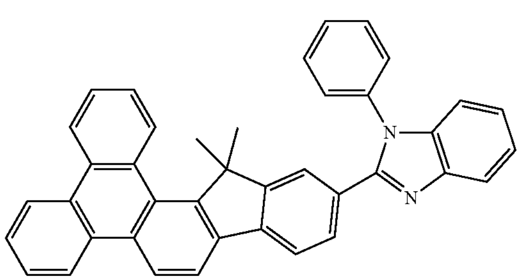
-continued
60
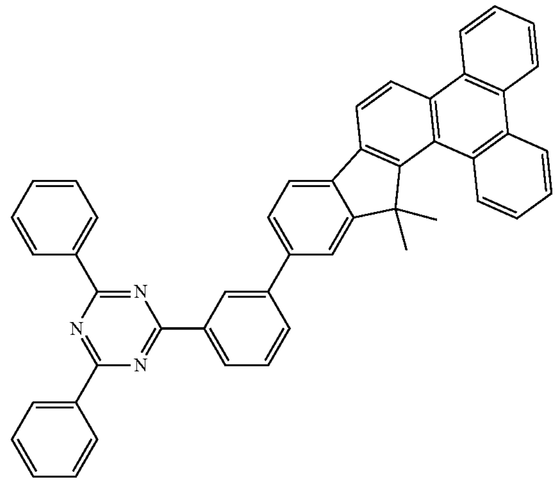
61
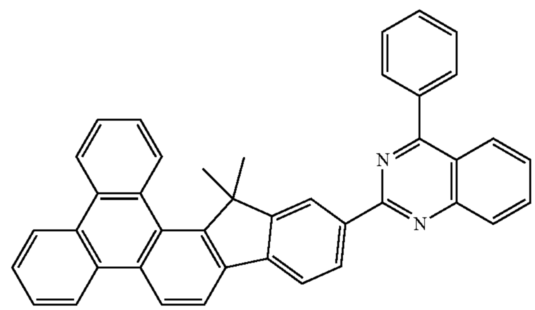
62
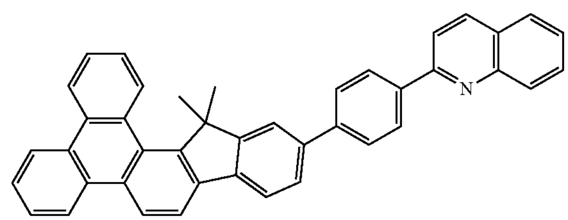
63
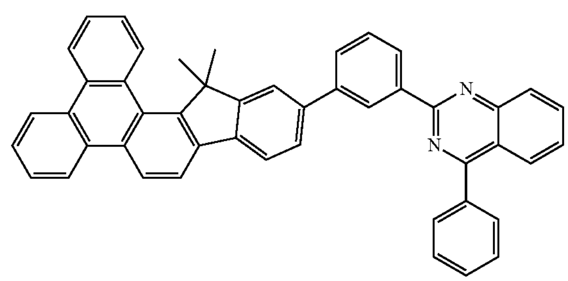

64
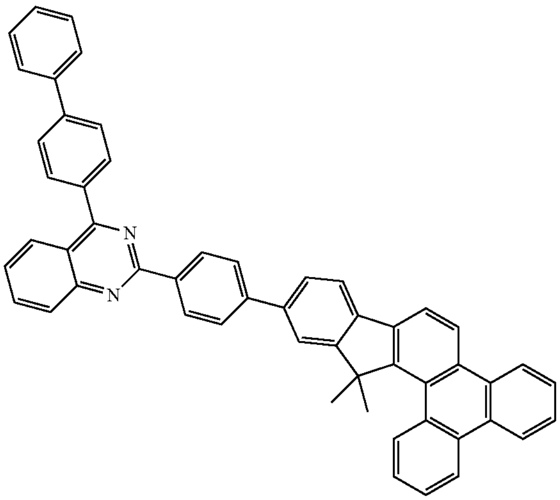
65
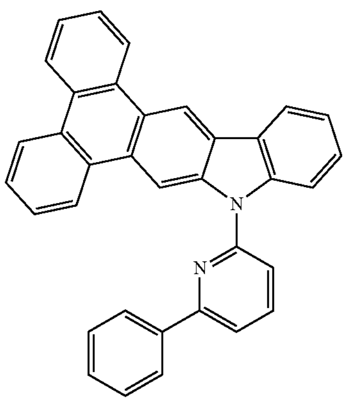
66
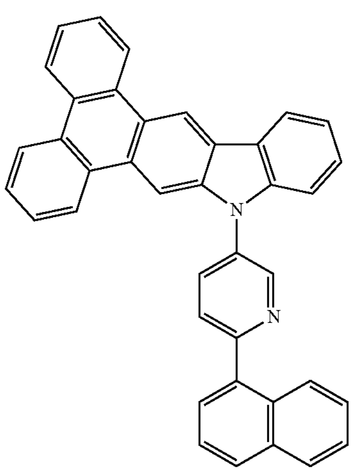
67
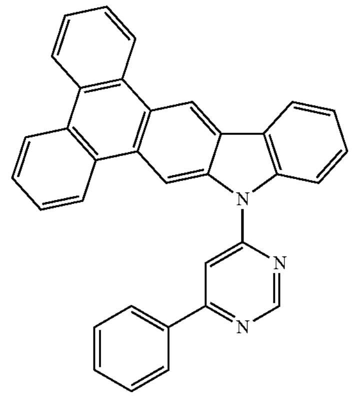
68
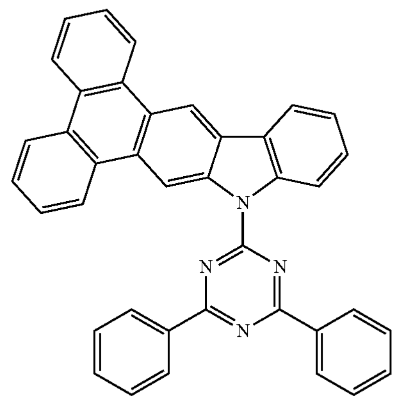
69
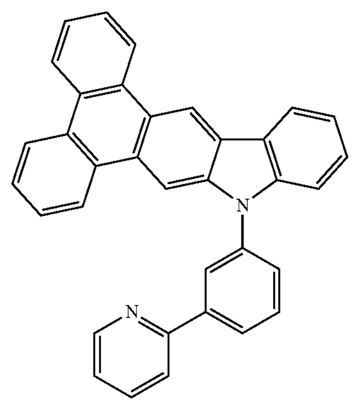
70
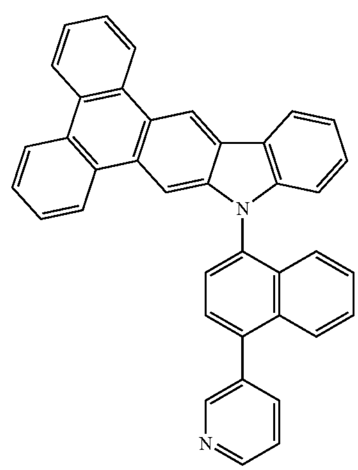

-continued
71
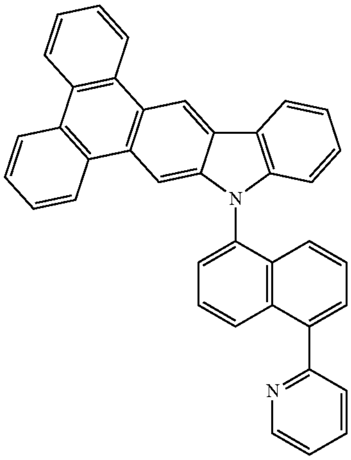
72
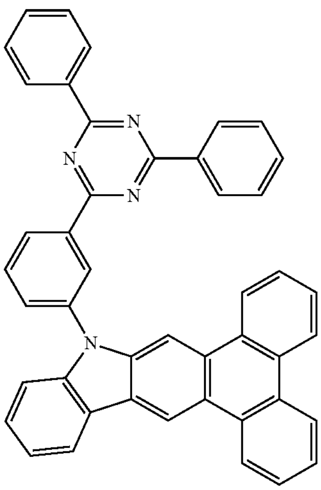
73
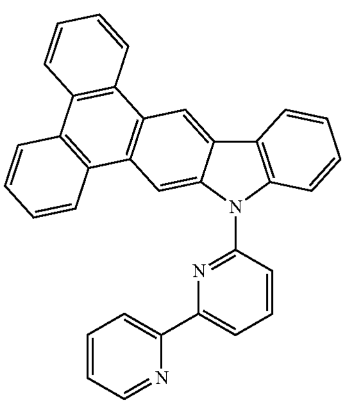
-continued
74
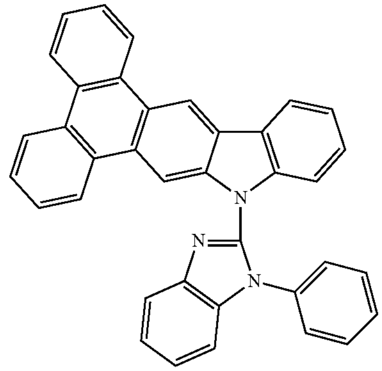
75
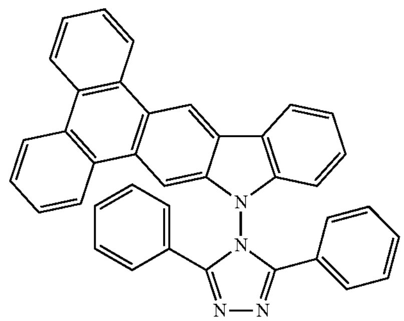
76
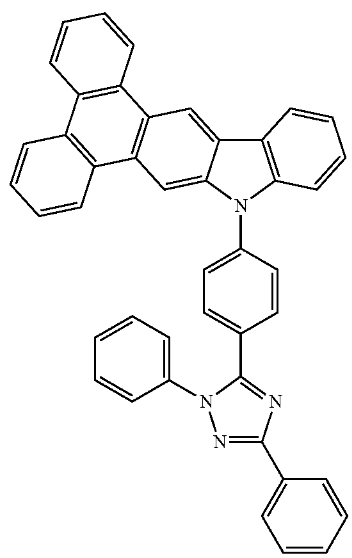

-continued
77
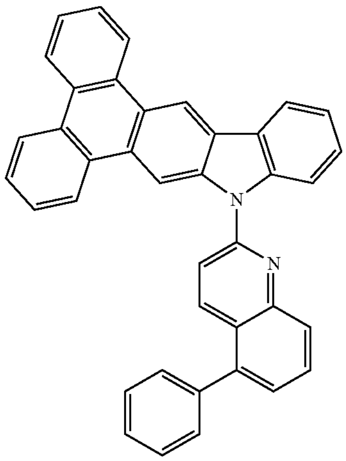
78
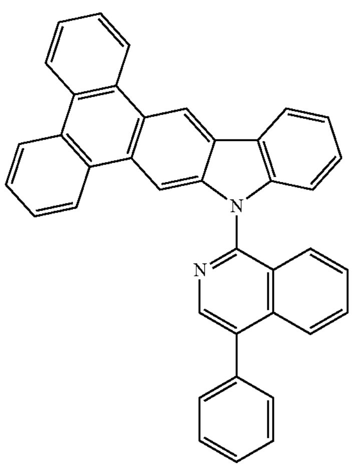
79
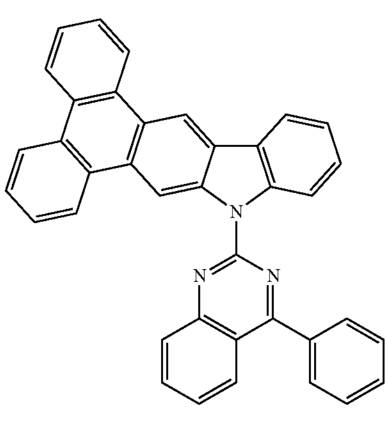
-continued
80
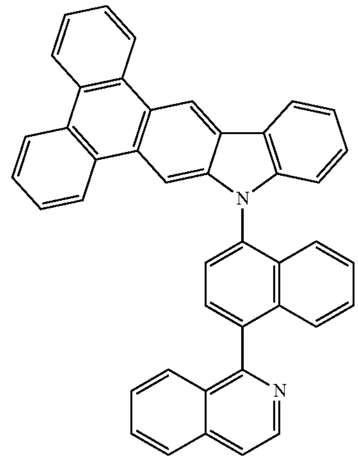
81
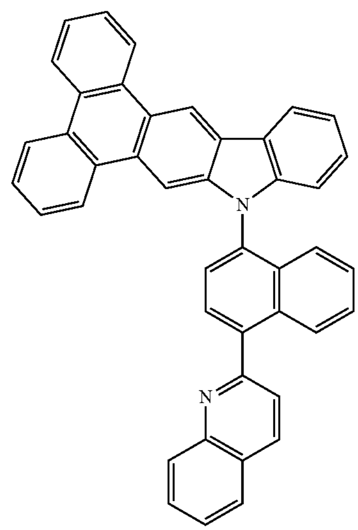
82
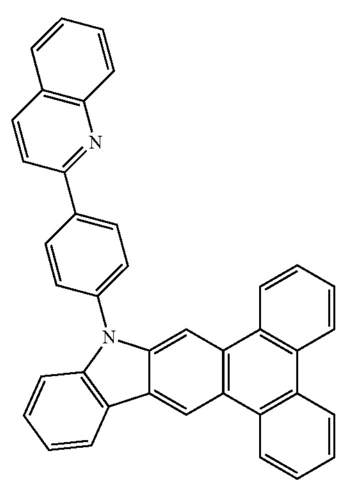

83
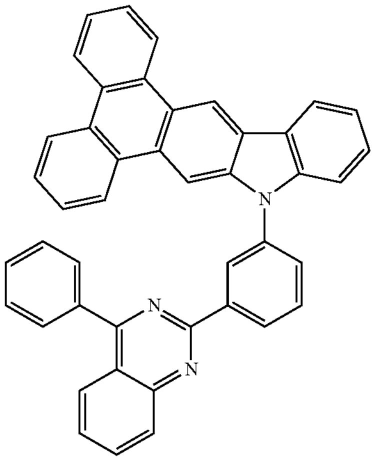
84
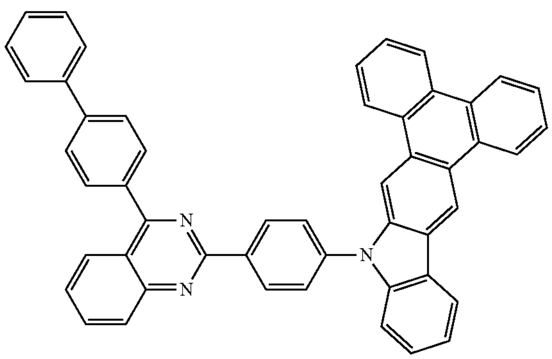
85
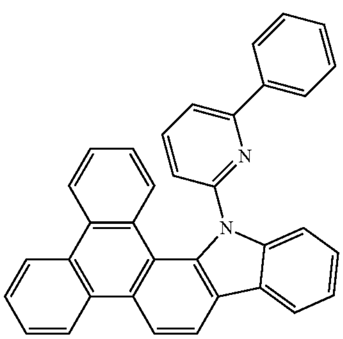
86
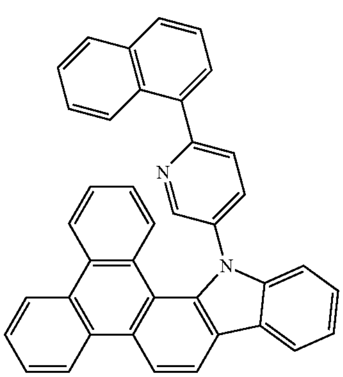
87
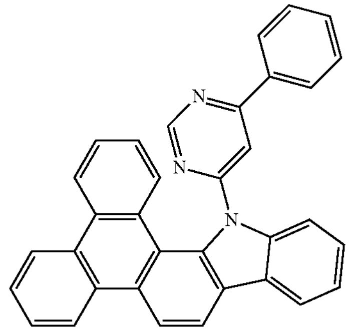
88
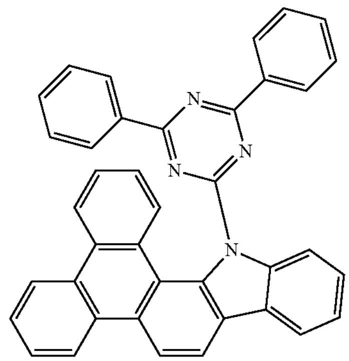
89
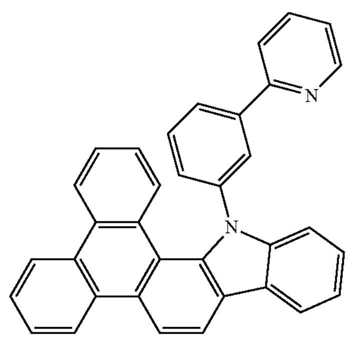
90
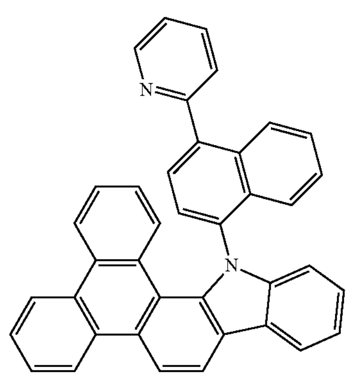

-continued
91
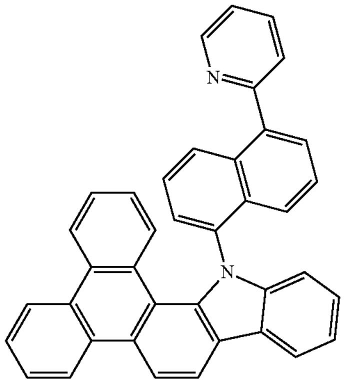
92
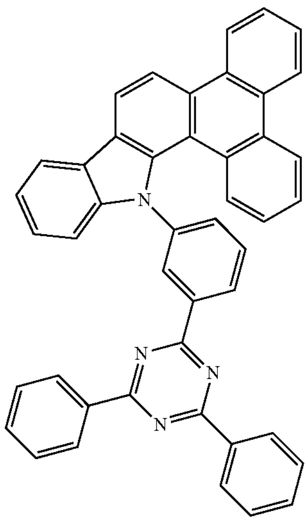
93
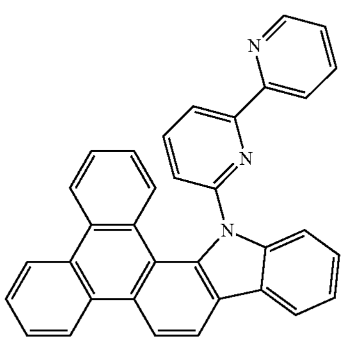
94
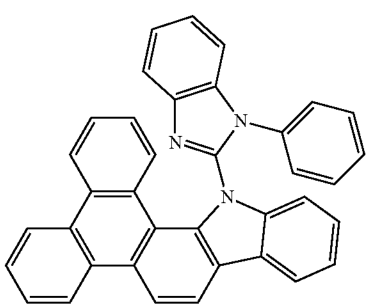
-continued
95
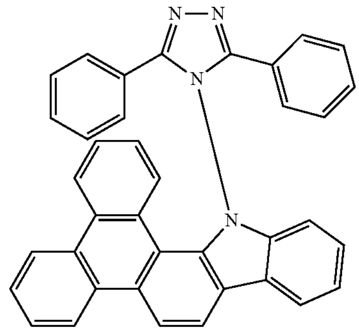
96
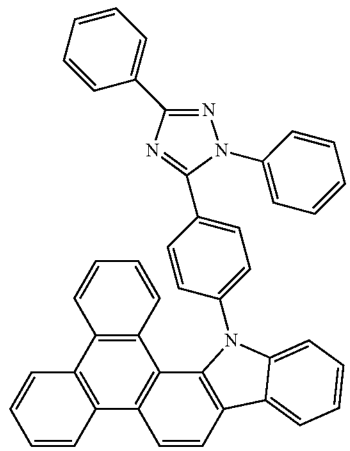
97
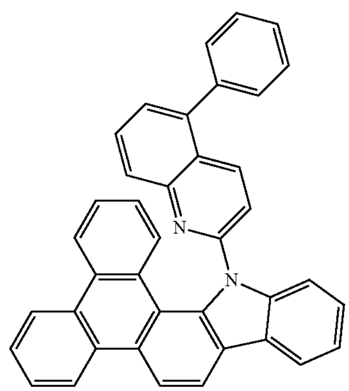
98
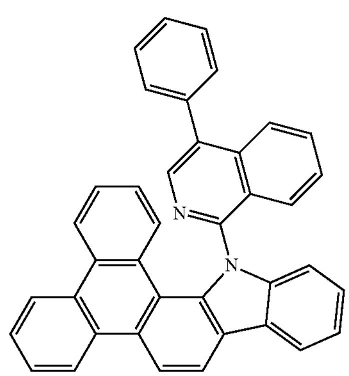

-continued
99
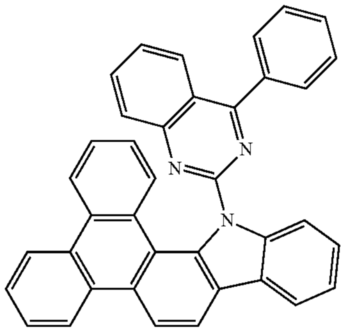
100
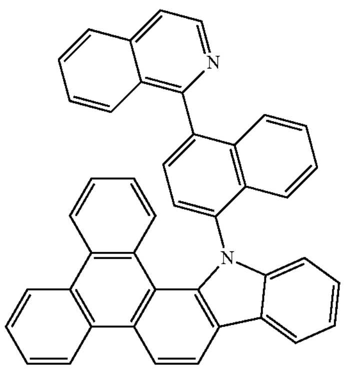
101
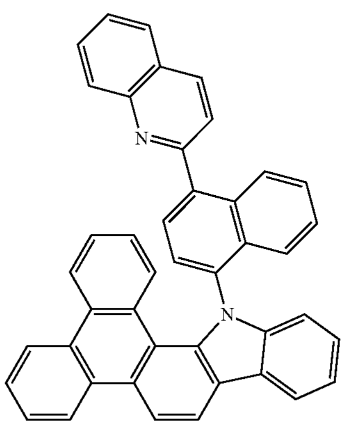
102
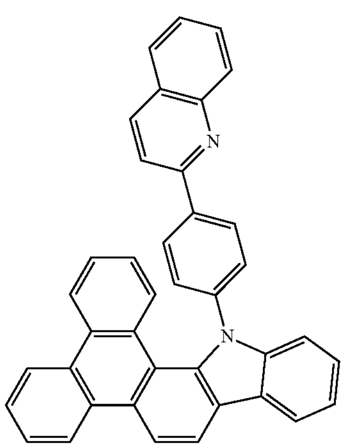
-continued
103
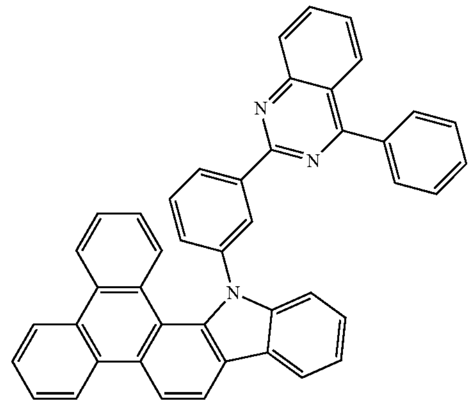
104
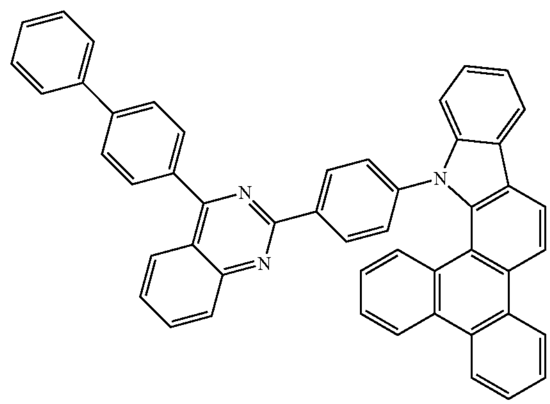
105
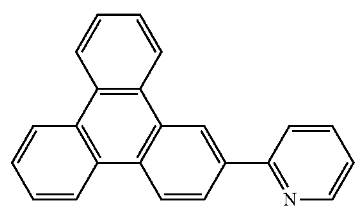
106
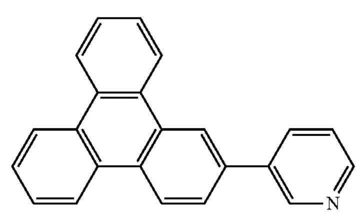
107
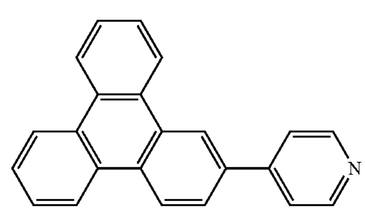

-continued
108
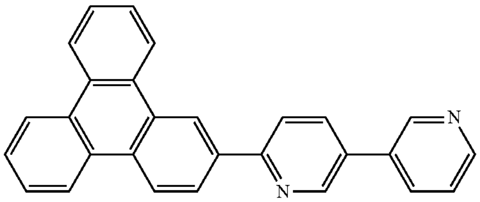
109
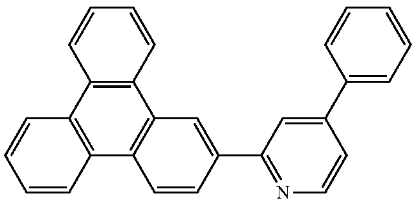
110
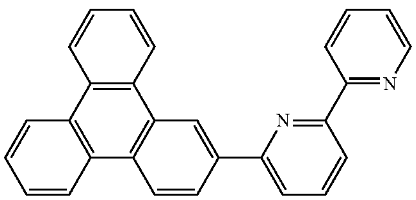
111
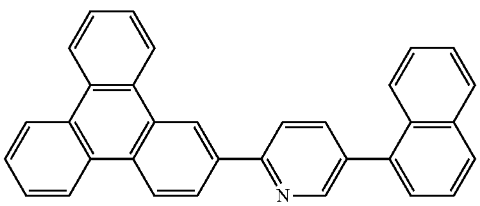
112
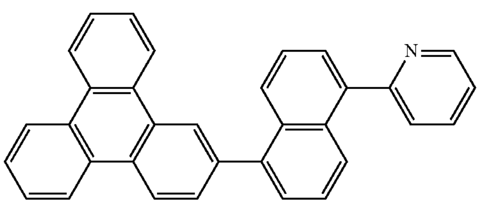
113
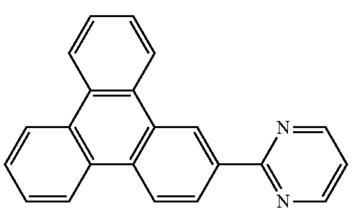
114
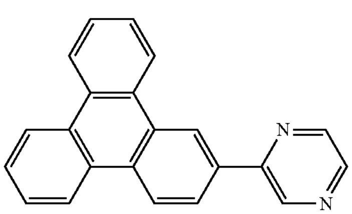
-continued
115
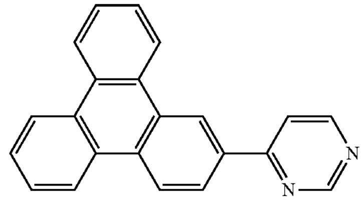
116
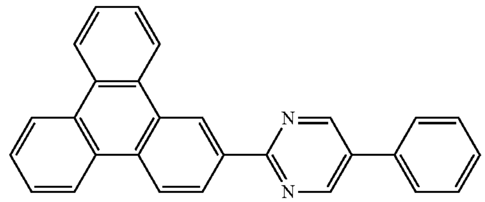
117
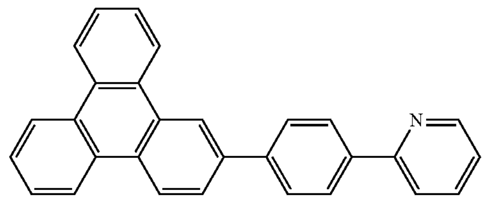
118
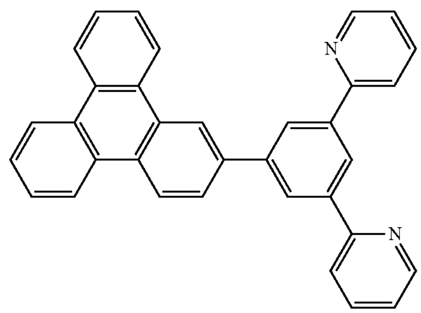
119
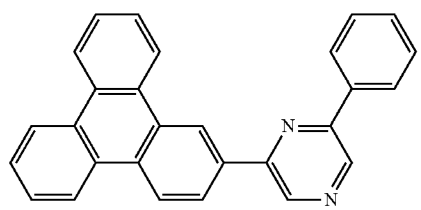
120
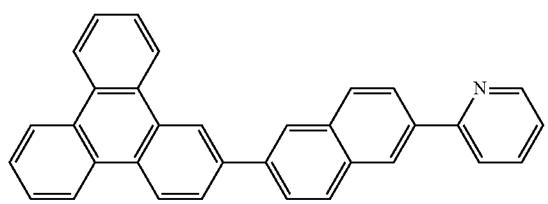
121
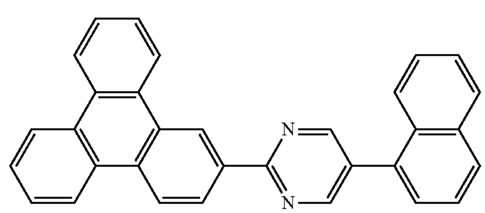

-continued
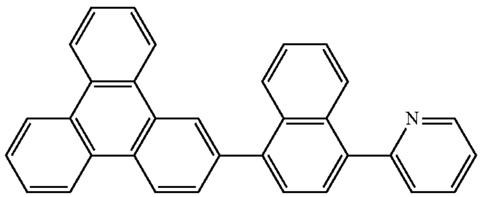
122
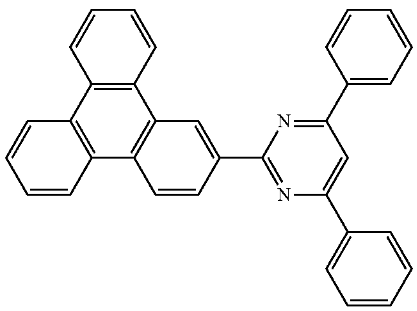
123
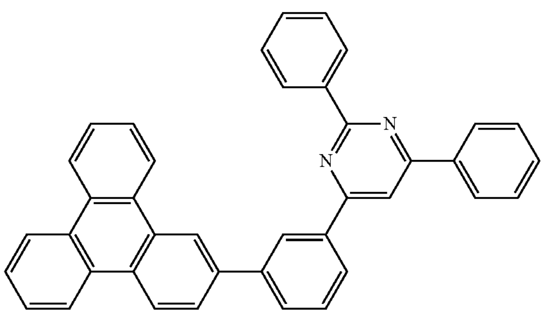
124
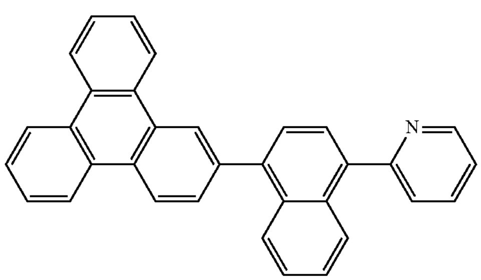
125
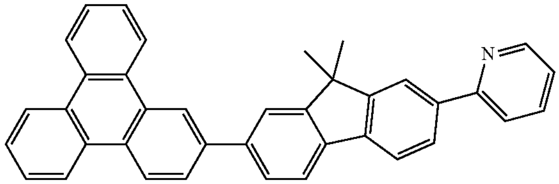
126
-continued
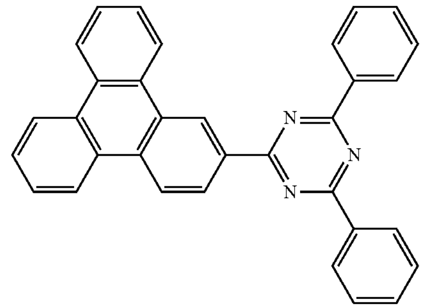
127
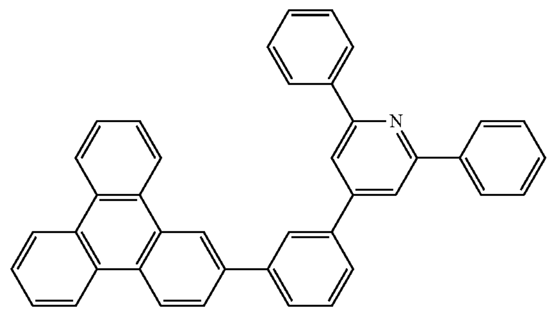
128
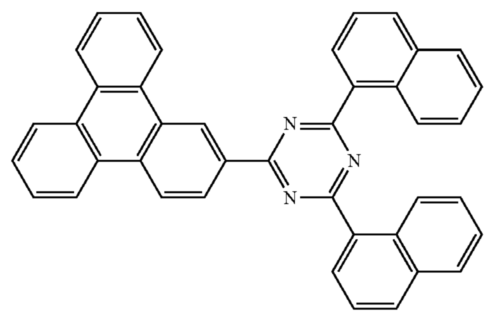
129
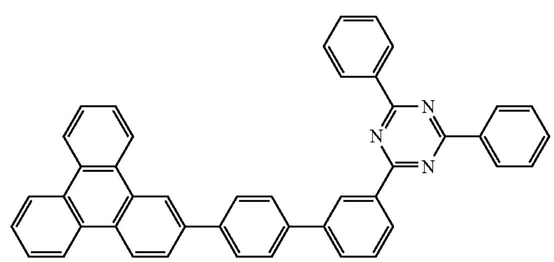
130
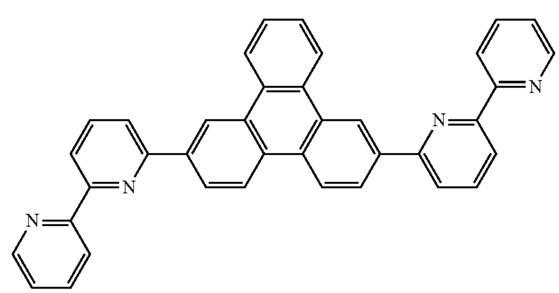
131

-continued
132
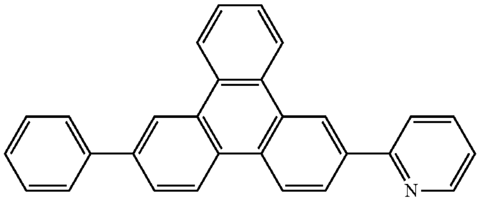
133
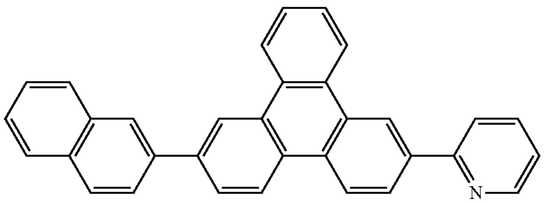
134
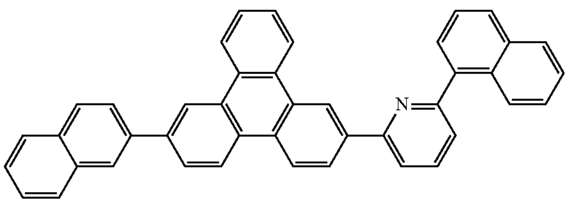
135
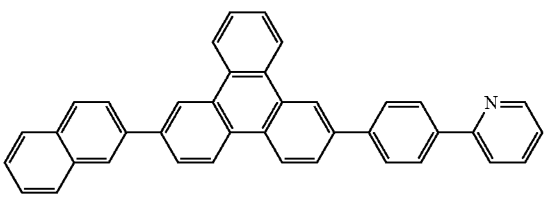
136
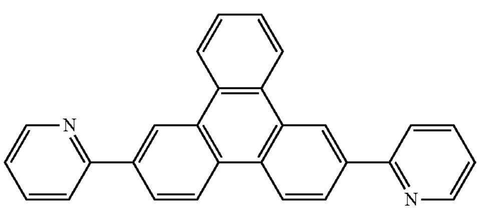
137
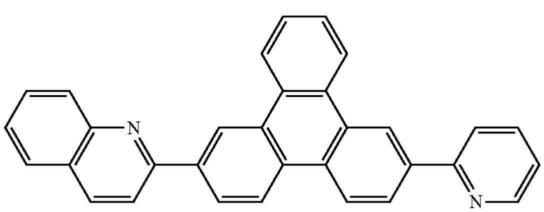
138
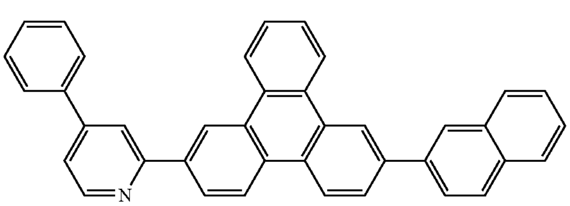
-continued
139
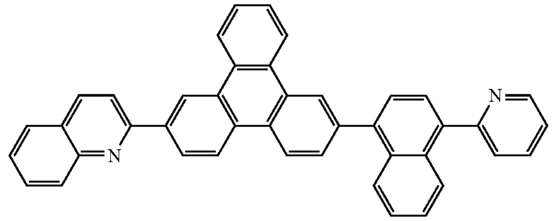
140
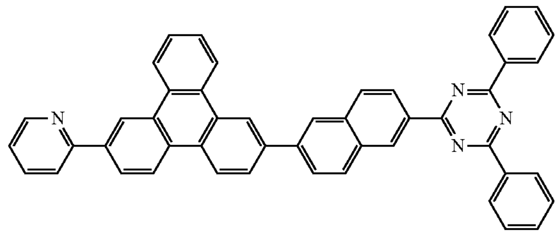
200
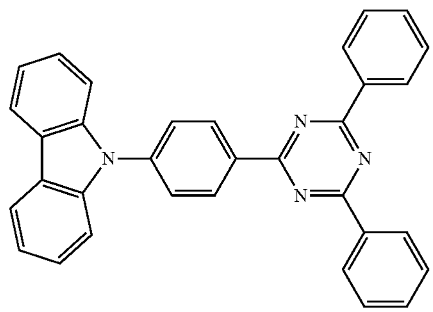
201
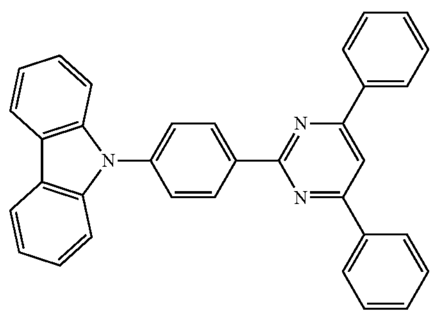
202
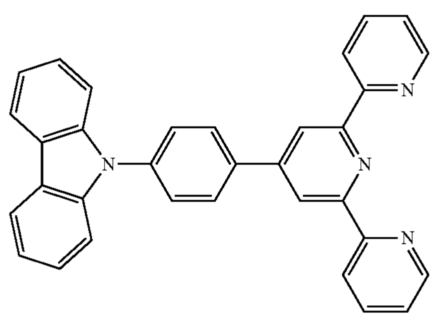

-continued
203
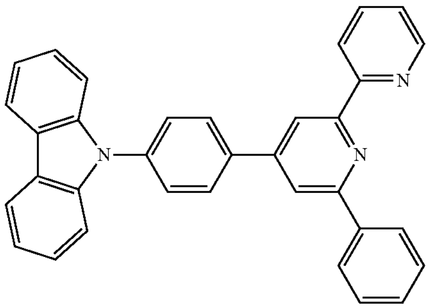
204
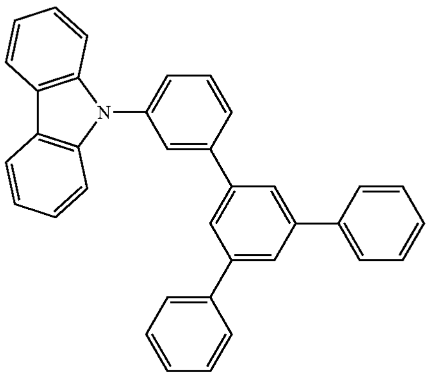
205
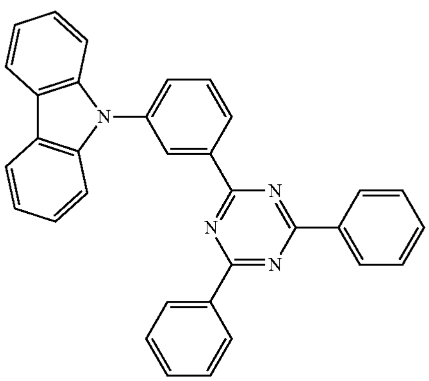
206
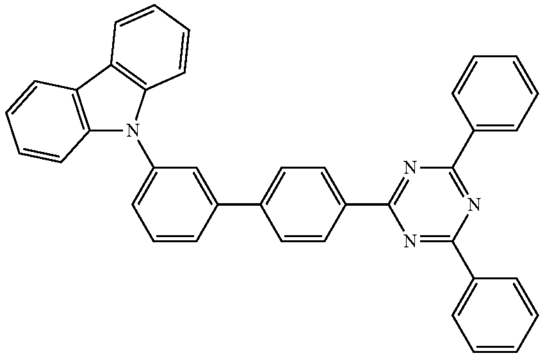
-continued
207
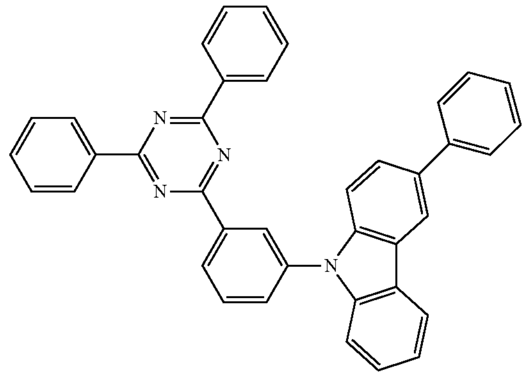
208
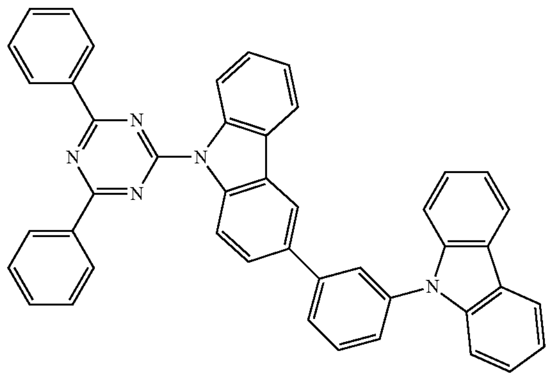
209
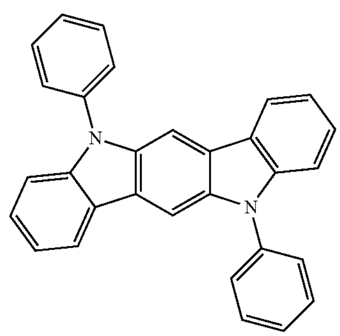
210
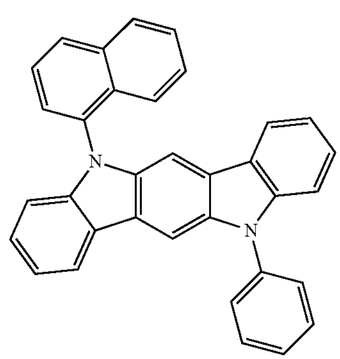

-continued
211
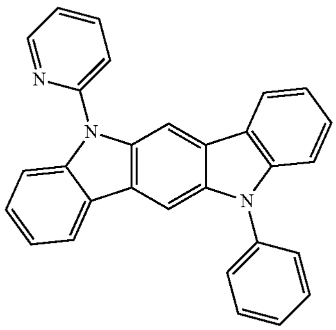
212
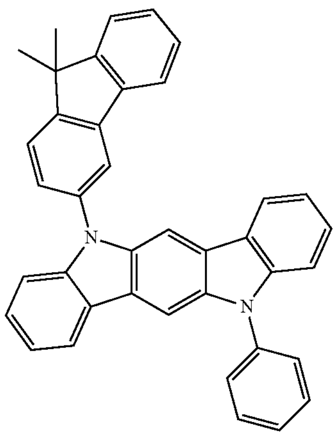
213
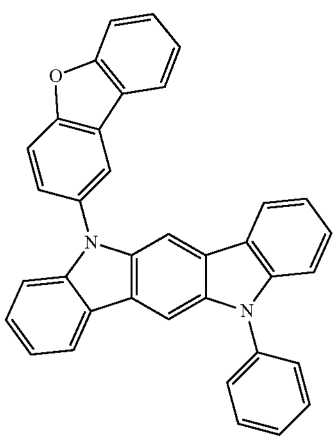
214
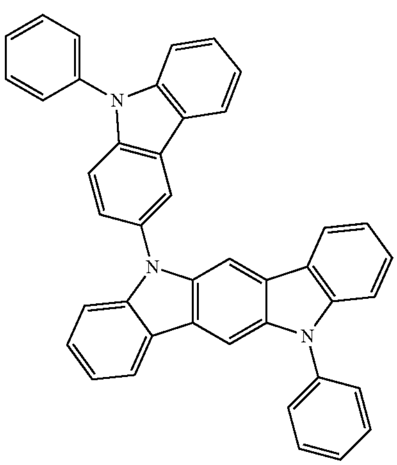
-continued
215
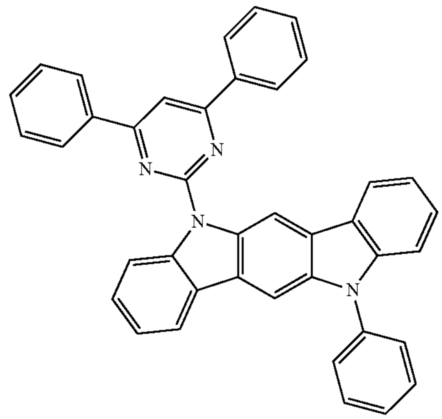
216
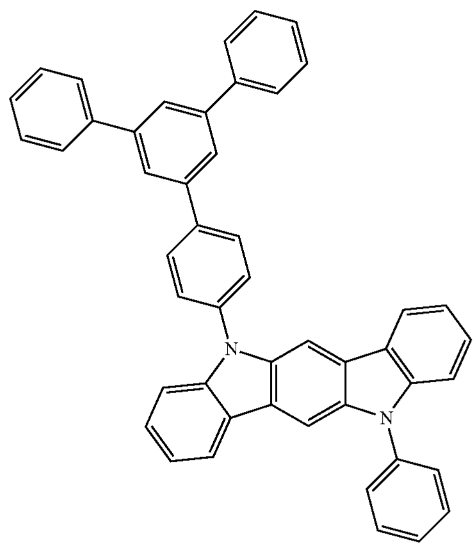
217
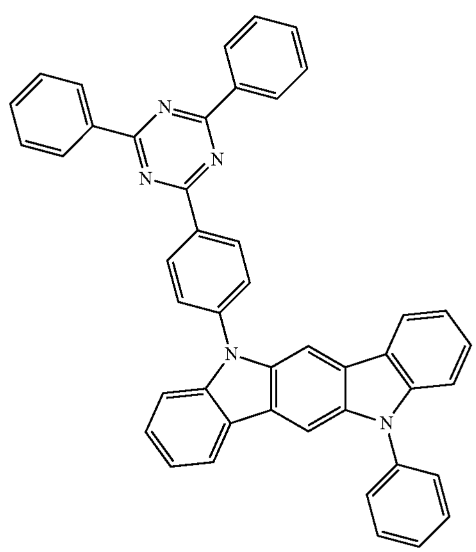

-continued
218
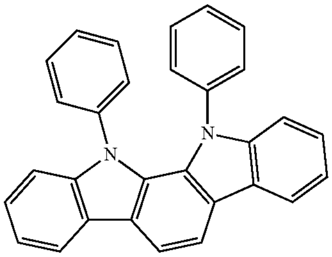
219
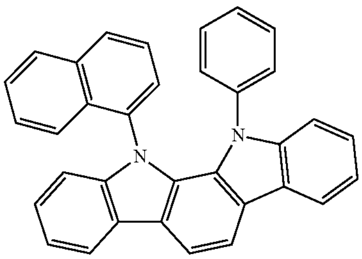
220
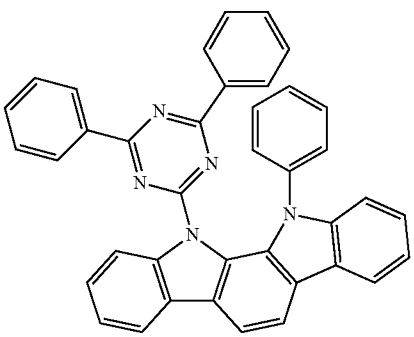
221
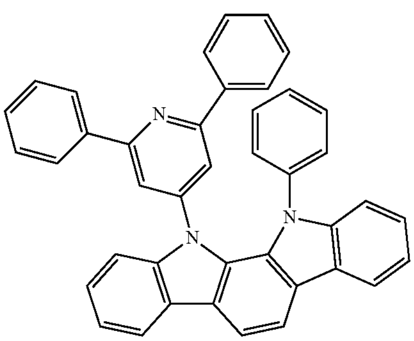
222
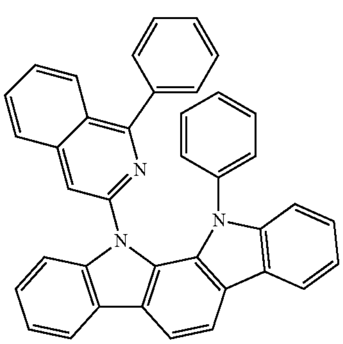
223
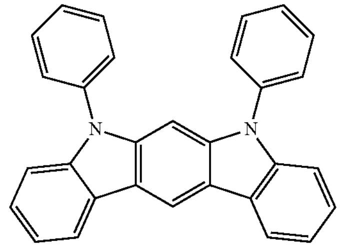
224
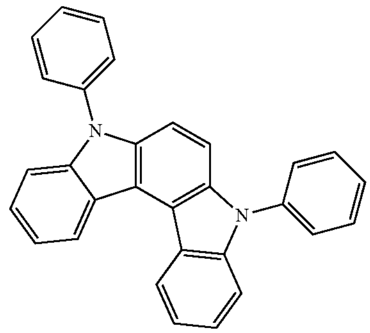
225
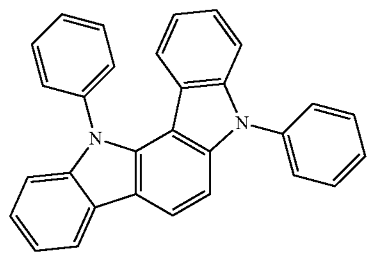
226
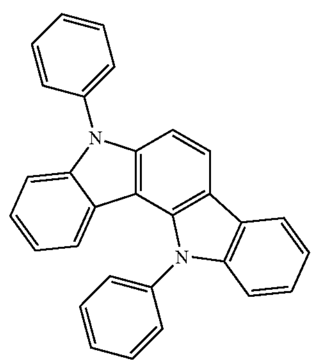
227
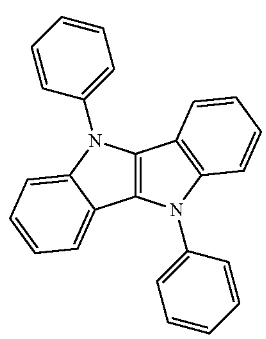

-continued
228
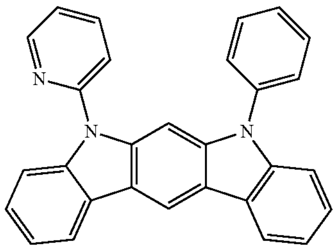
229
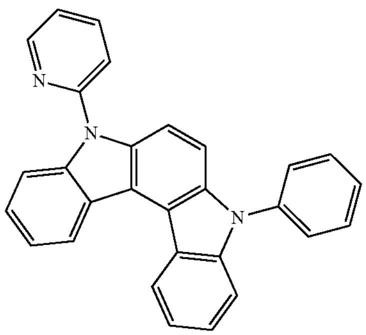
230
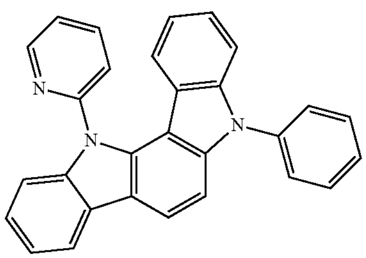
231
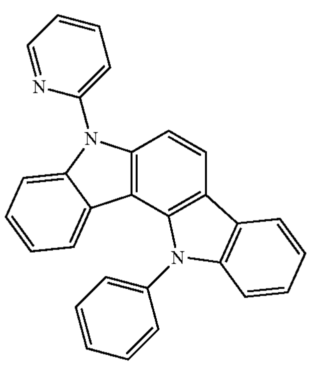
232
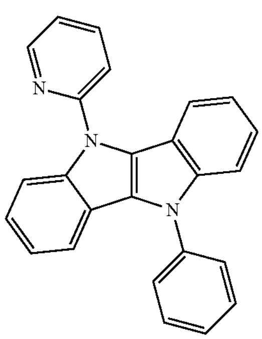
-continued
233
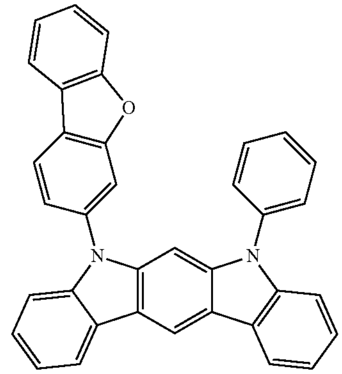
234
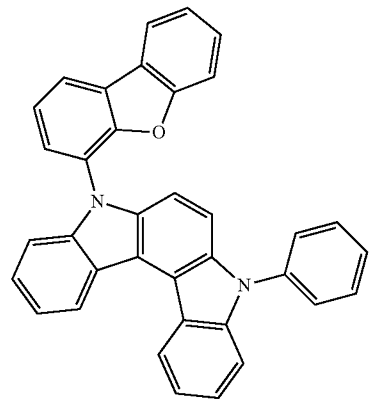
235
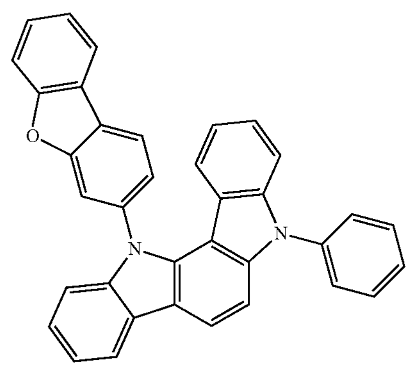
236
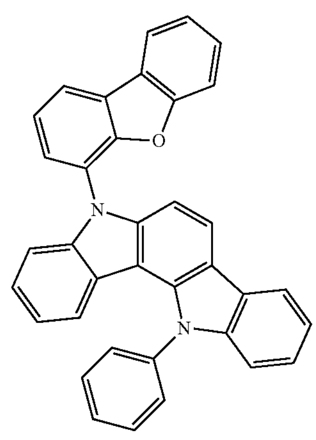

-continued
237
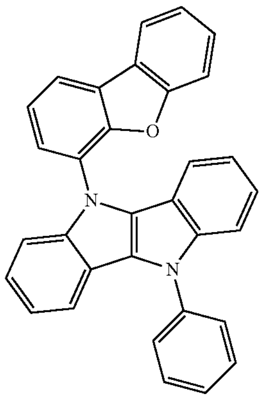
238
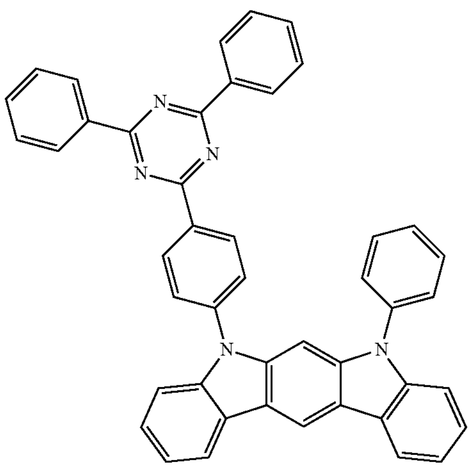
239
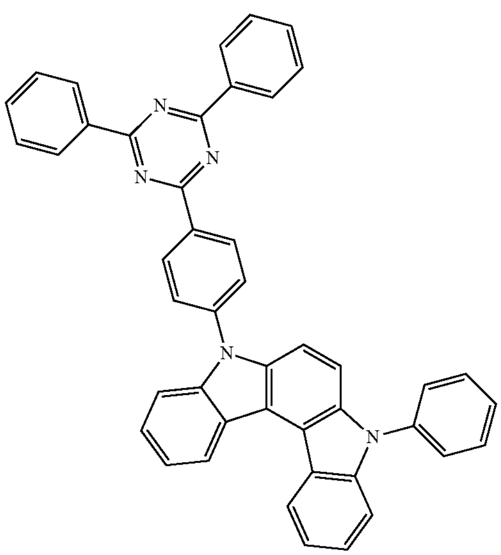
-continued
240
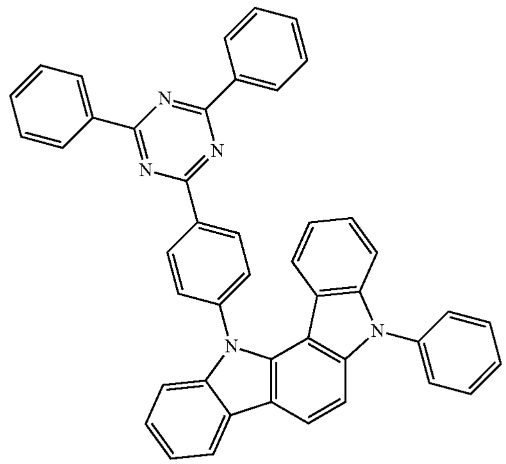
241
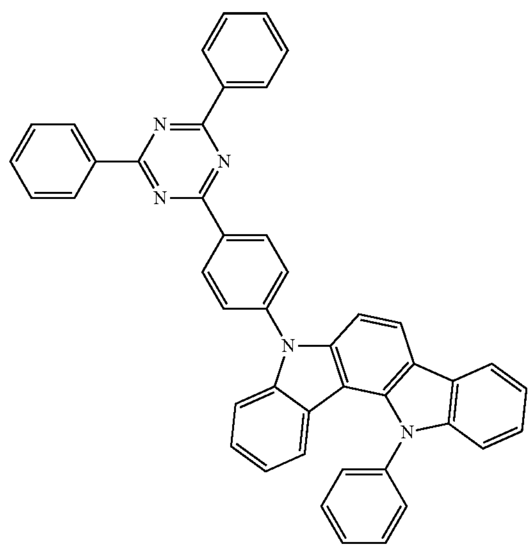
242
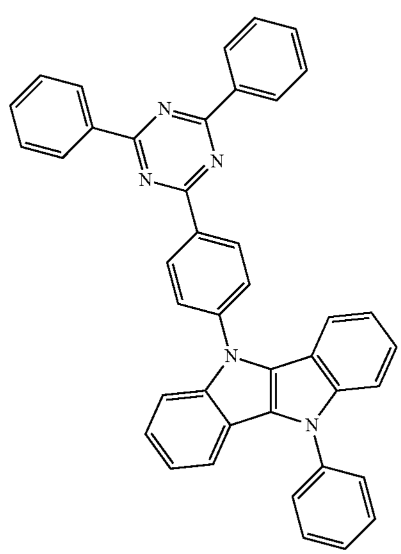

-continued
243
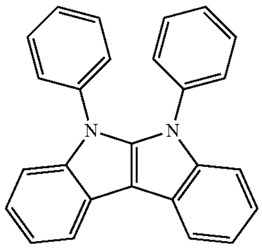
244
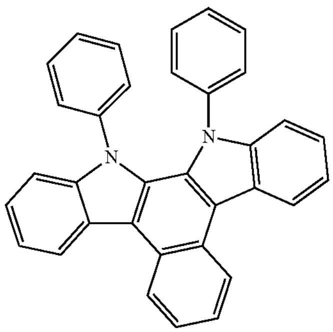
245
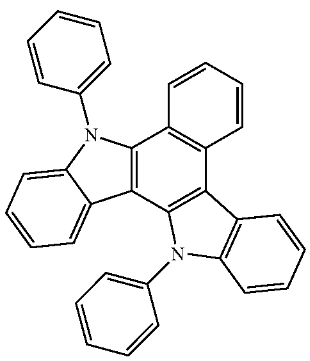
246
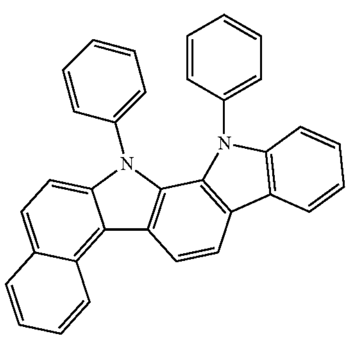
247
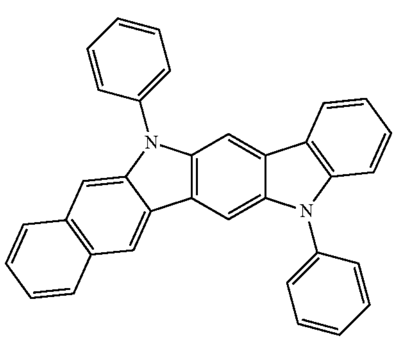
-continued
248
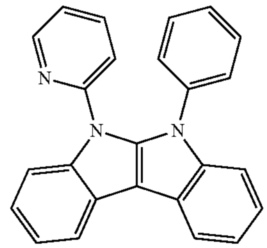
249
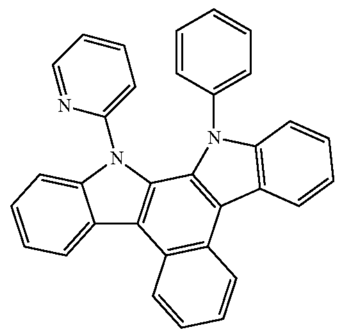
250
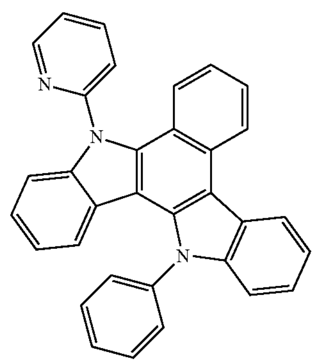
251
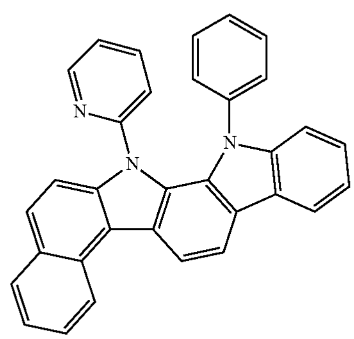
252
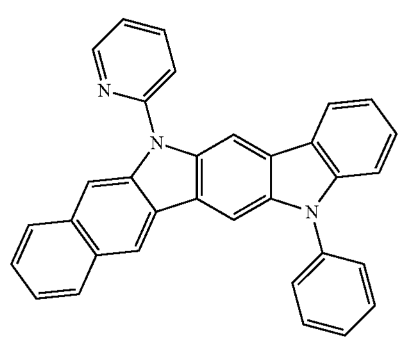

-continued
253
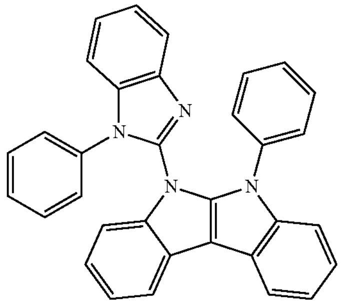
254
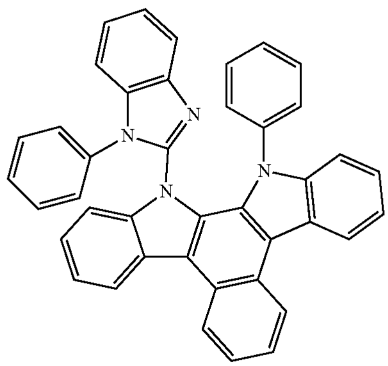
255
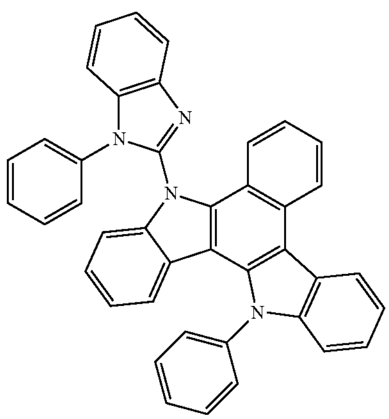
256
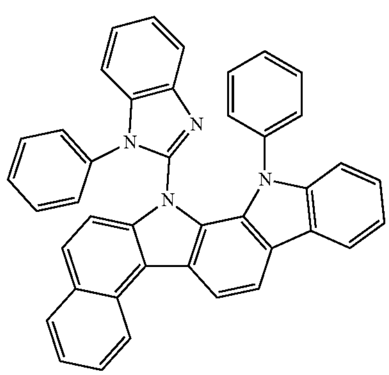
-continued
257
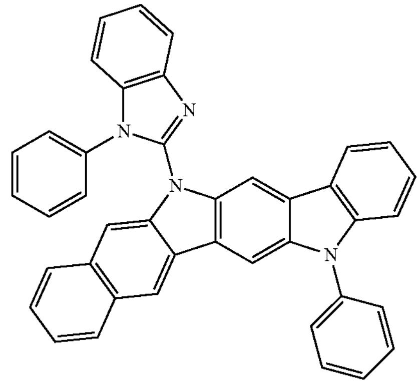
258
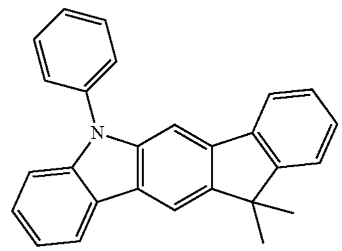
259
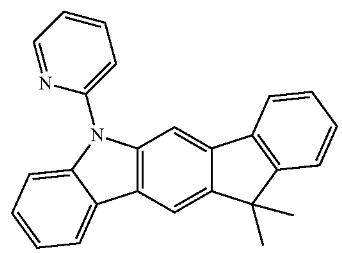
260
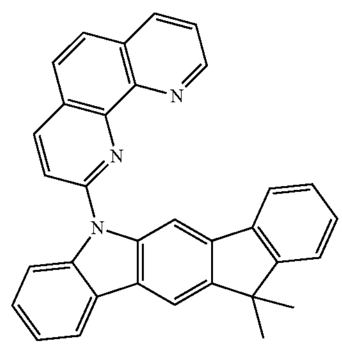
261
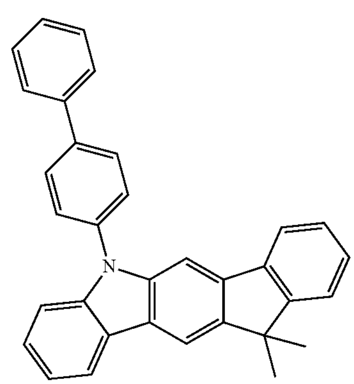

-continued
262
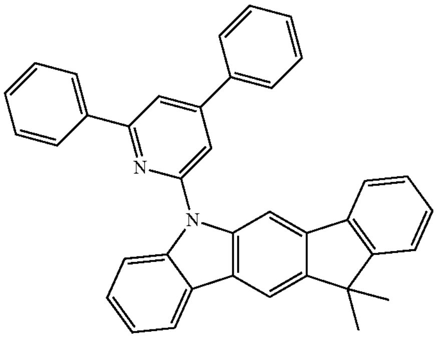
263
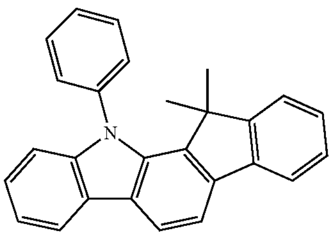
264
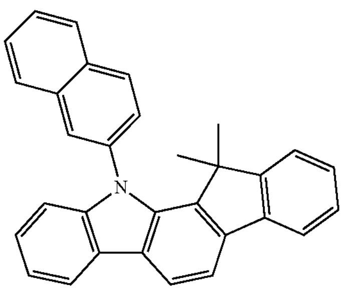
265
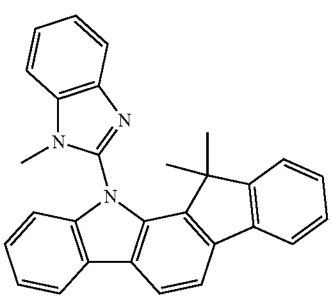
266
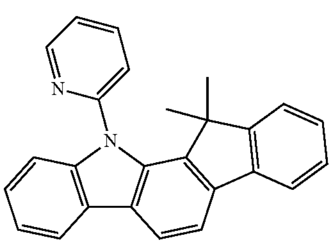
-continued
267
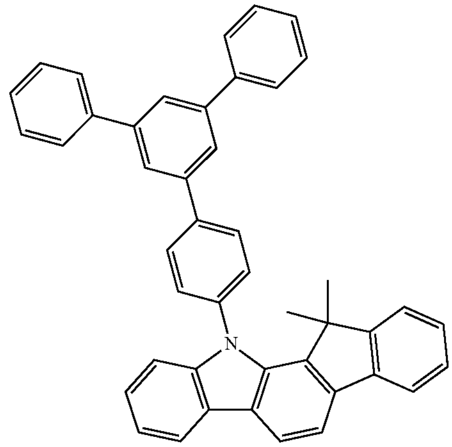
268
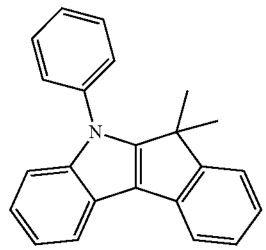
269
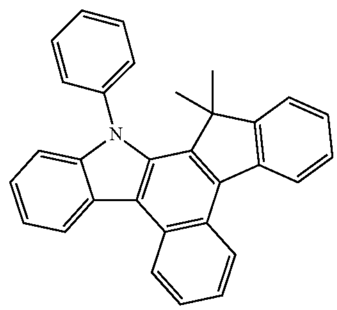
270
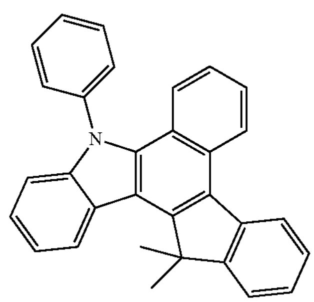
271
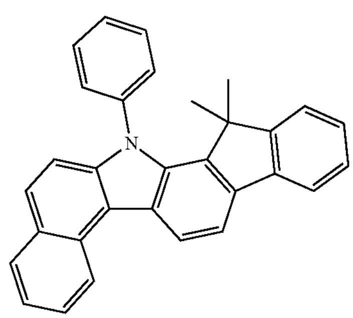

272
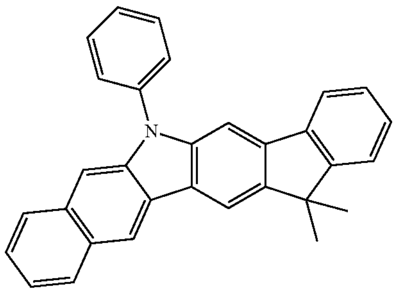
273
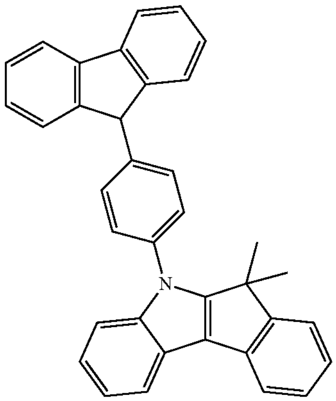
274
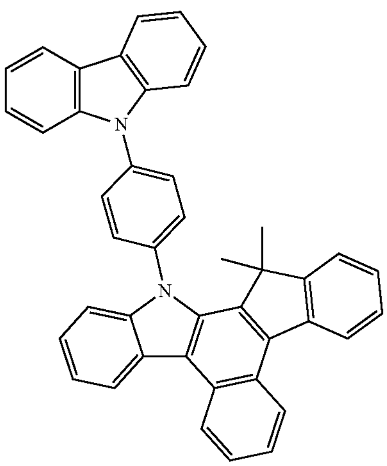
275
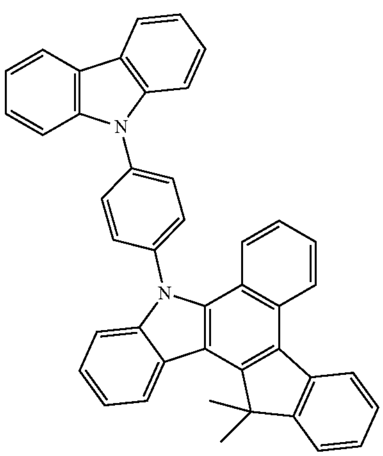
276
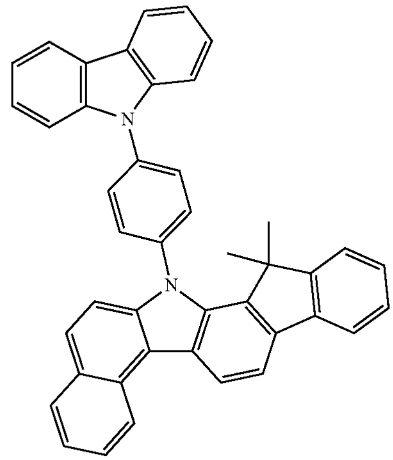
277
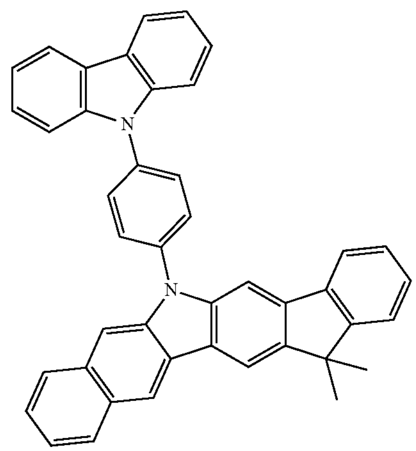
278
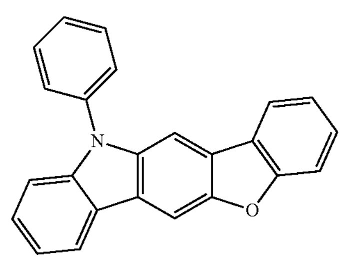
279
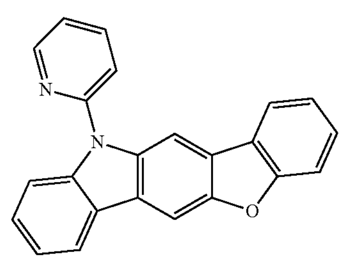

-continued
280
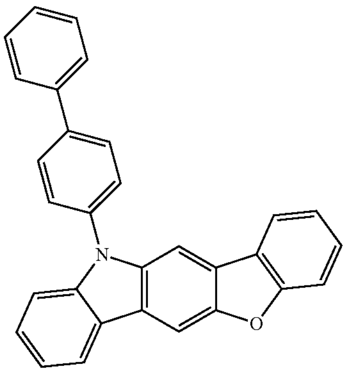
281
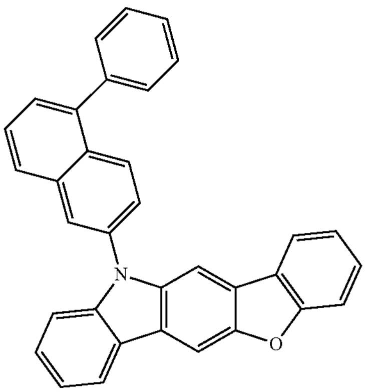
282
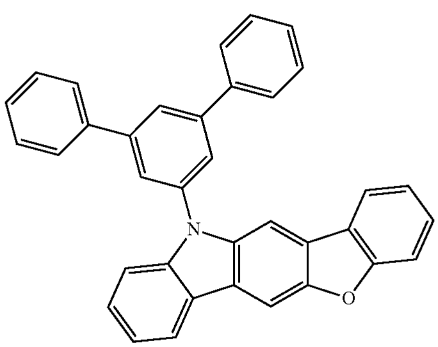
283
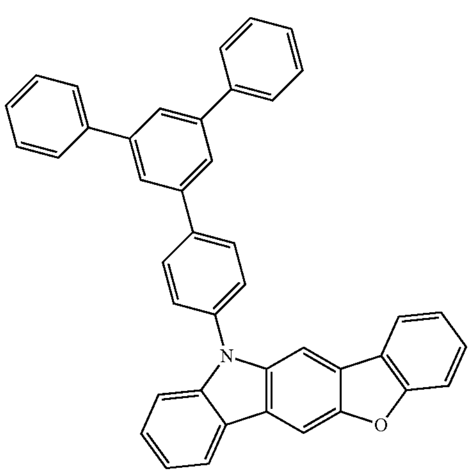
-continued
284
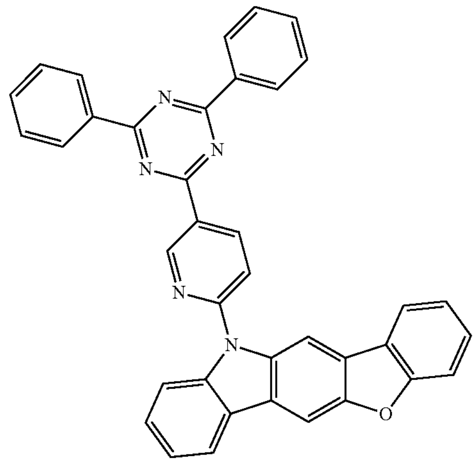
285
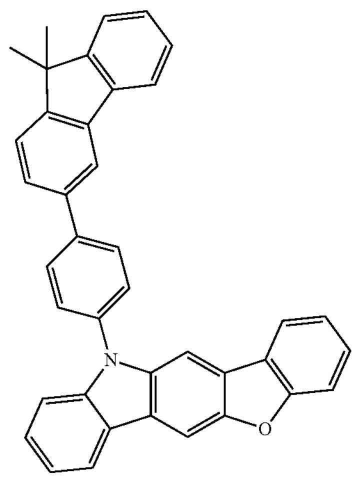
286
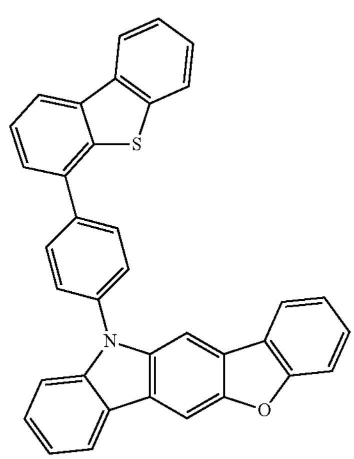

287
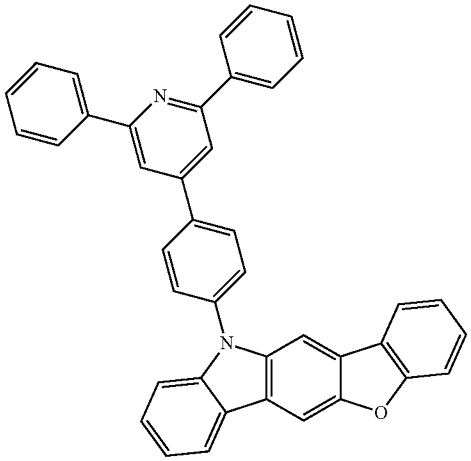
288
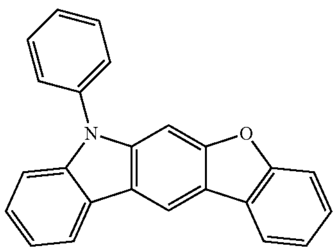
289
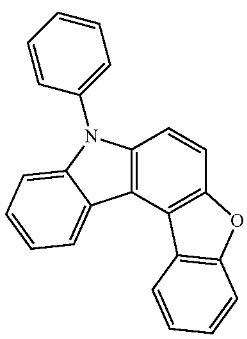
290
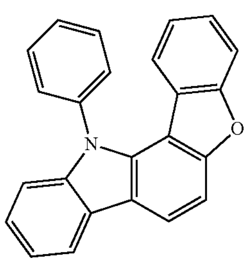
291
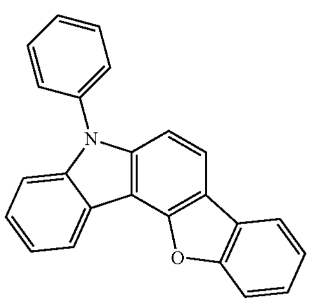
292
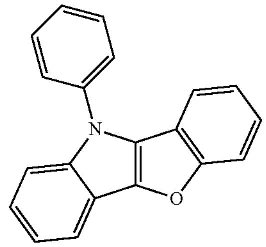
293
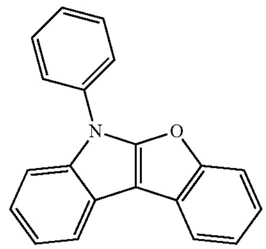
294
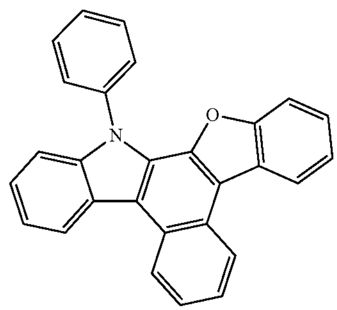
295
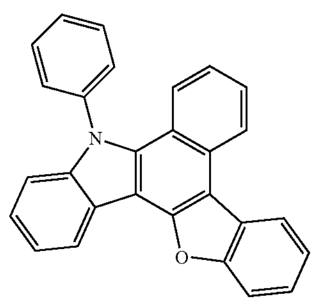
296
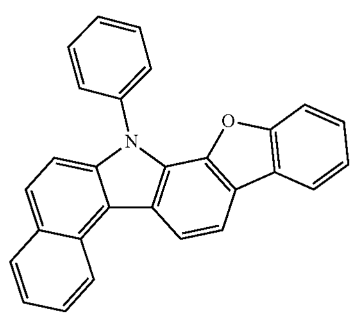

-continued
297
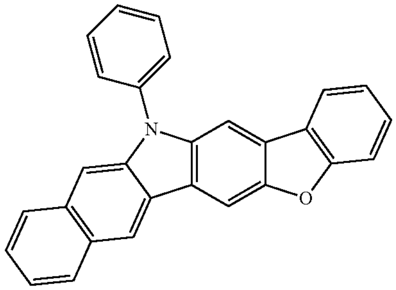
298
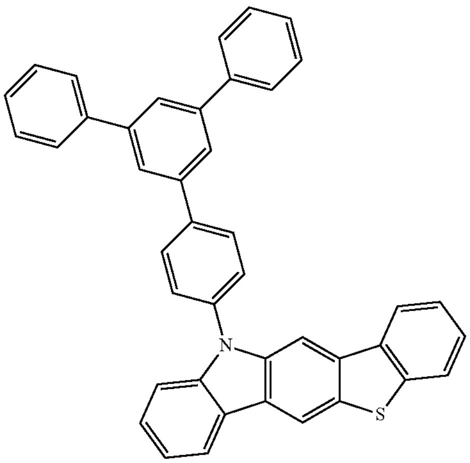
299
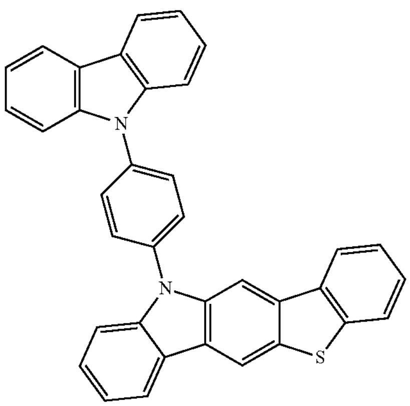
300
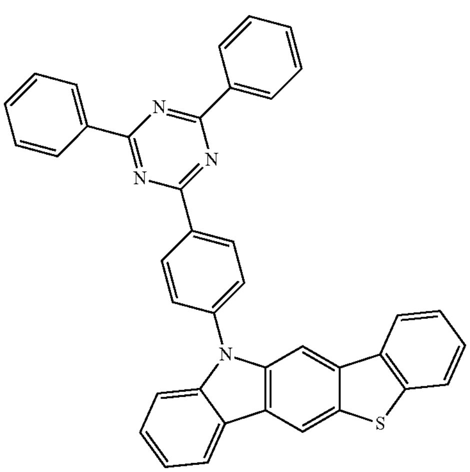
-continued
301
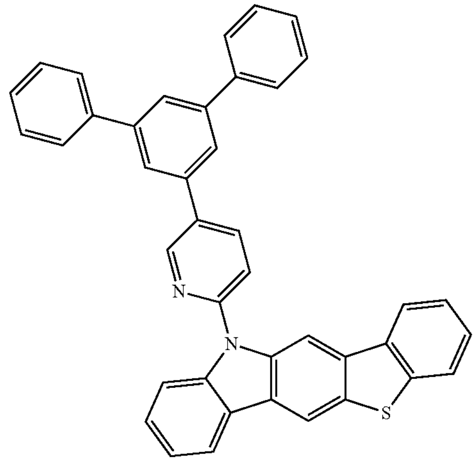
302
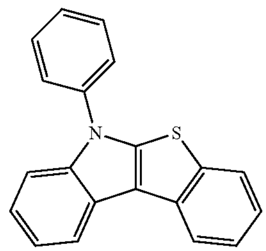
303
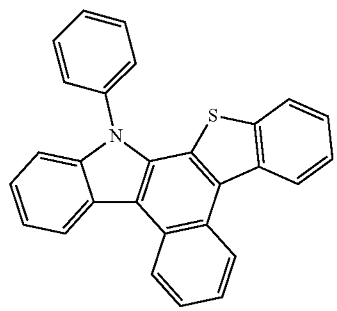
304
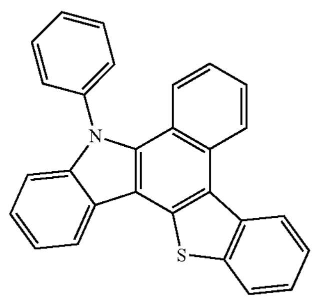
305
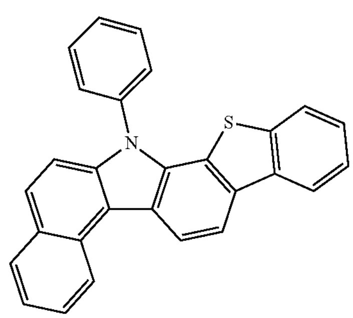

-continued
306
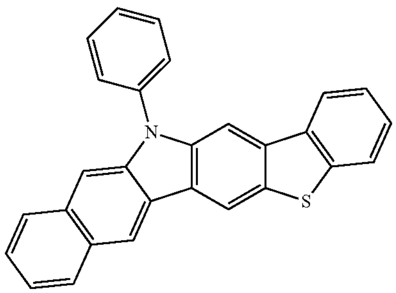
307
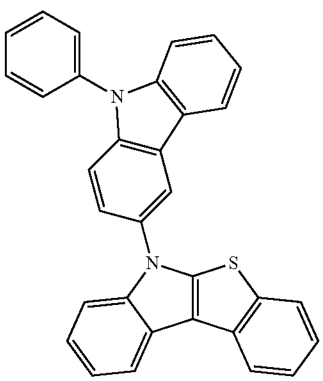
308
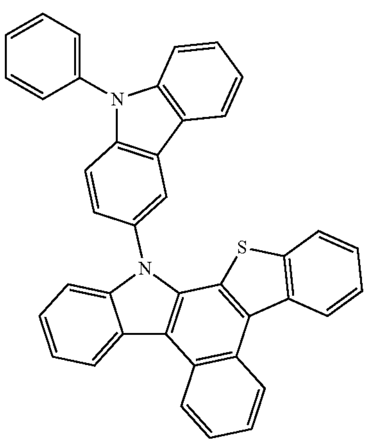
309
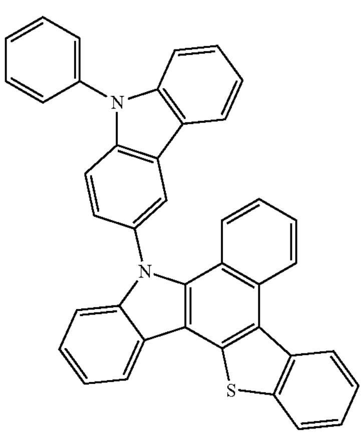
-continued
310
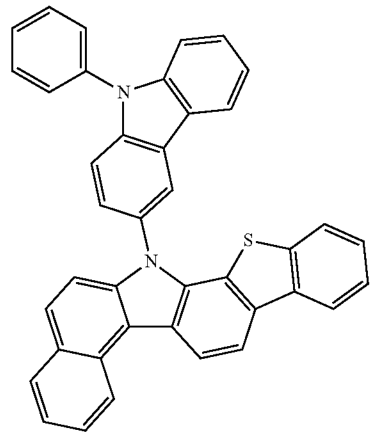
311
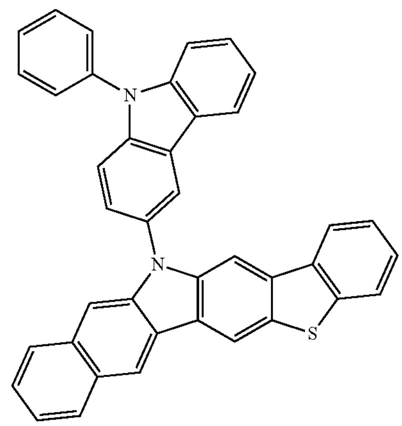
312
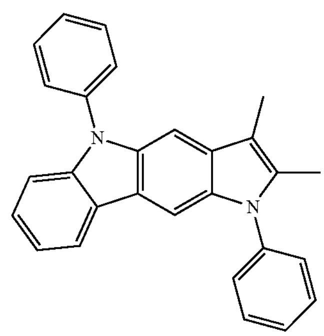
313
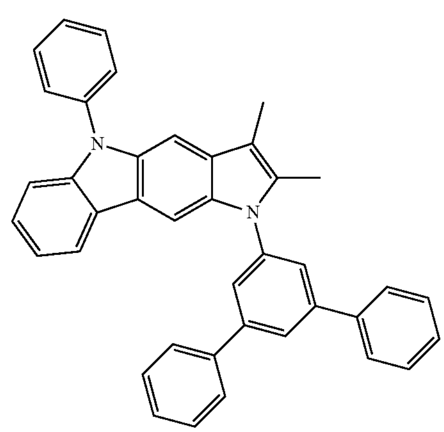

-continued
314
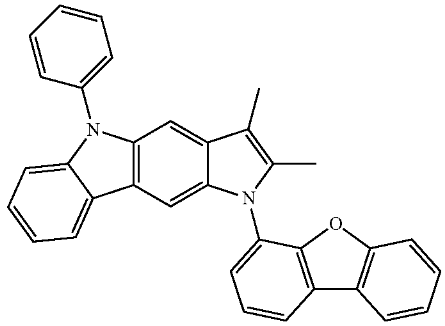
315
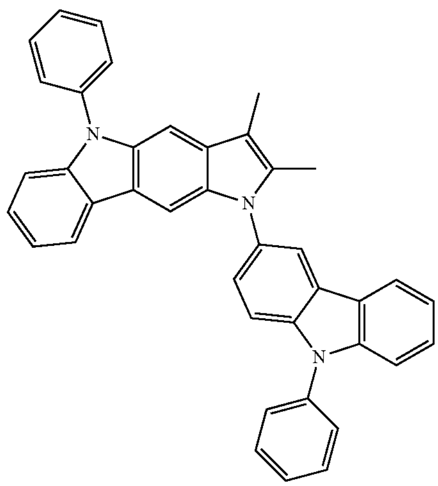
316
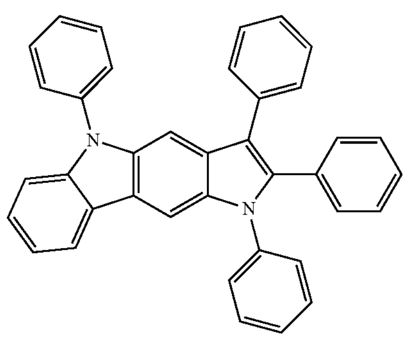
317
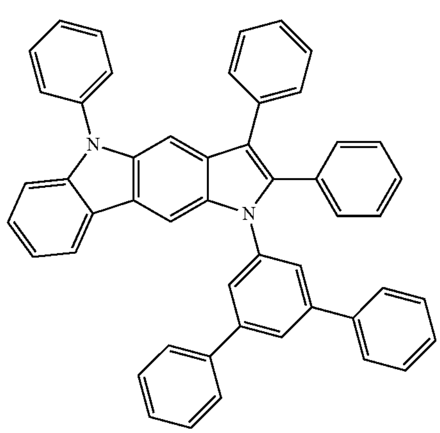
-continued
318
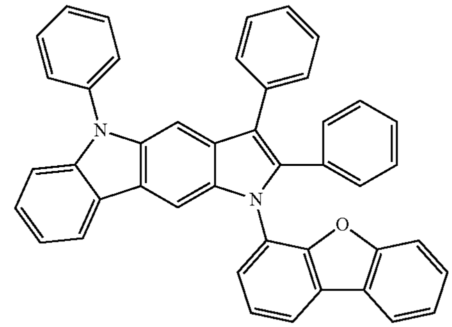
319
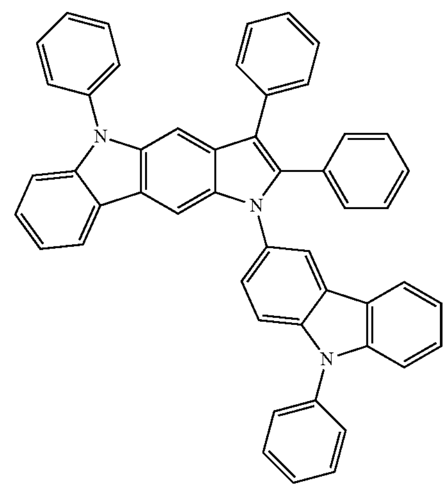
320
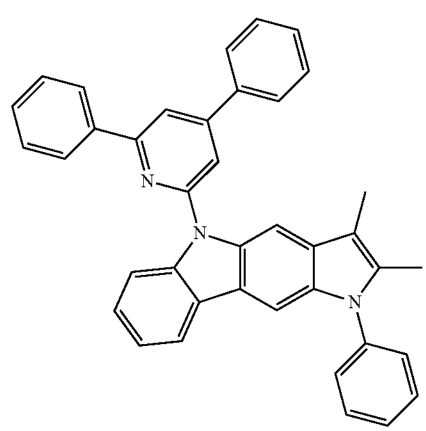

-continued
321
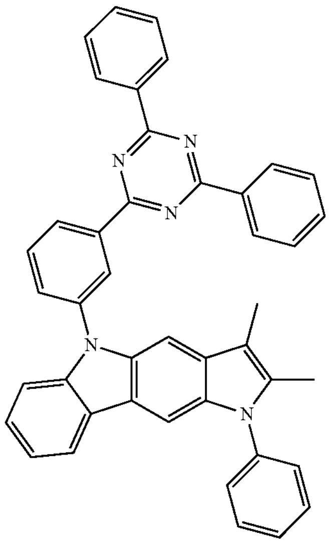
322
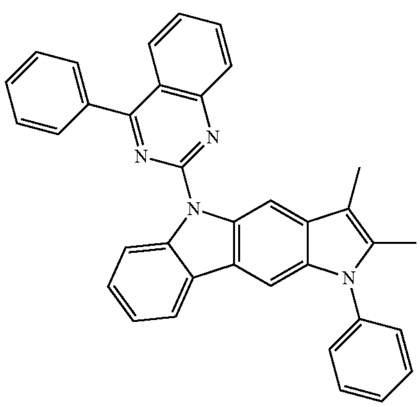
323
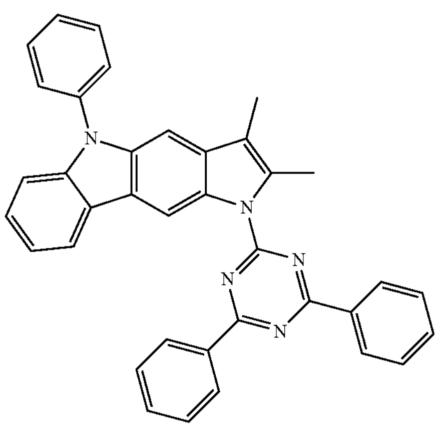
324
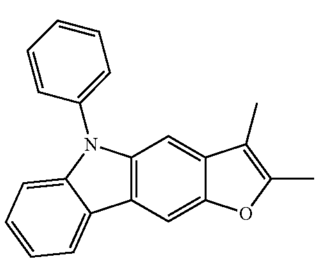
325
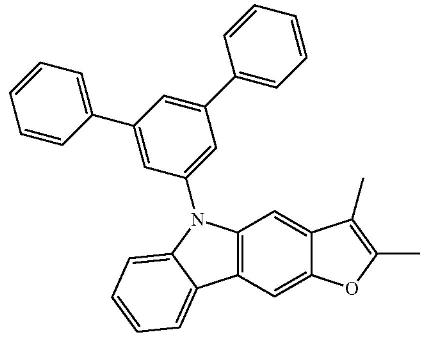
326
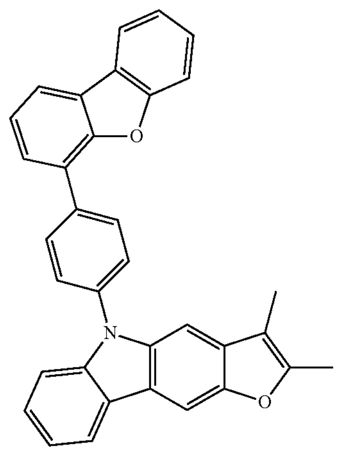
327
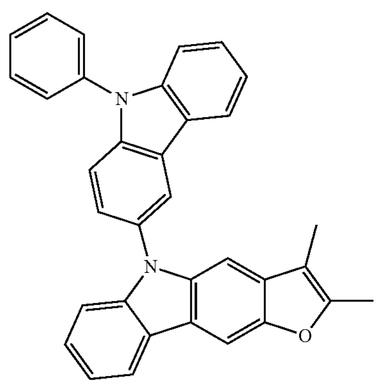
328
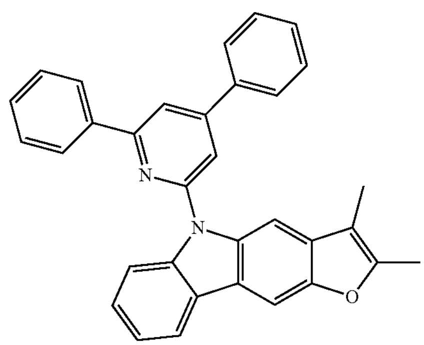

-continued
329
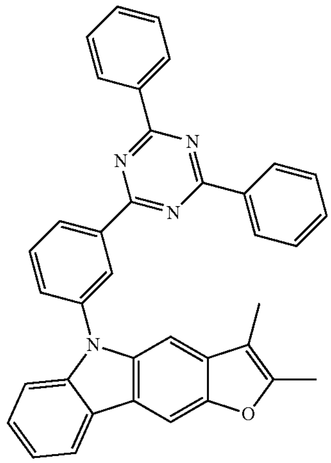
330
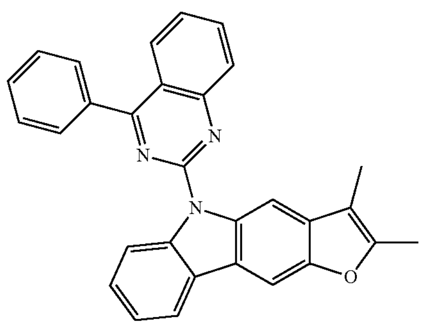
331
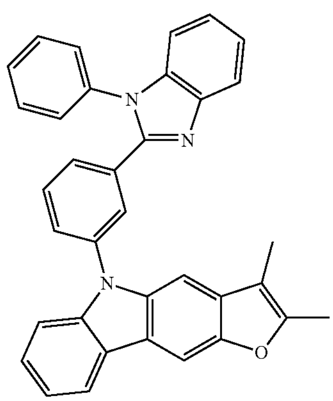
332
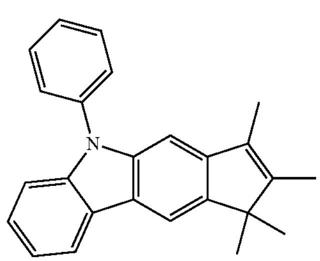
-continued
333
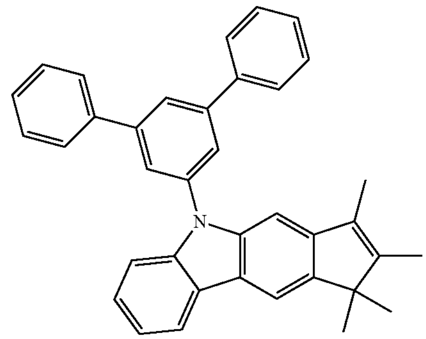
334
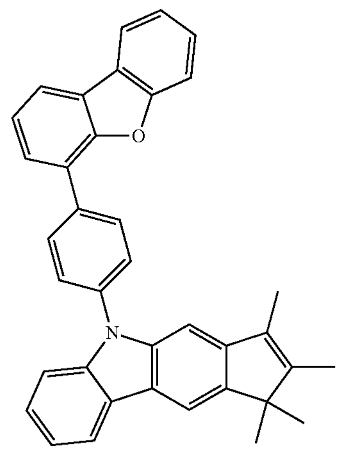
335
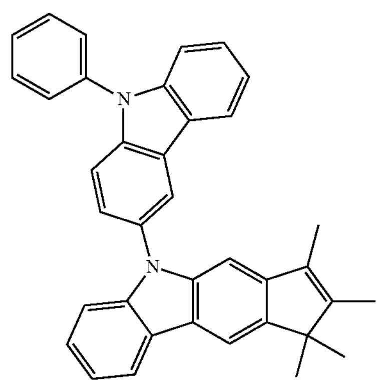
336
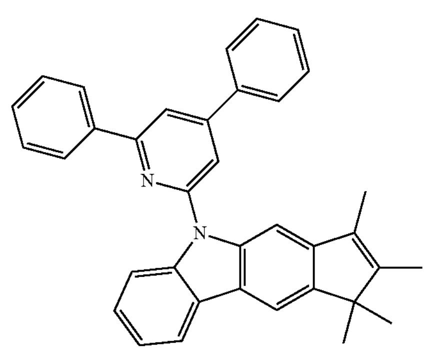

337
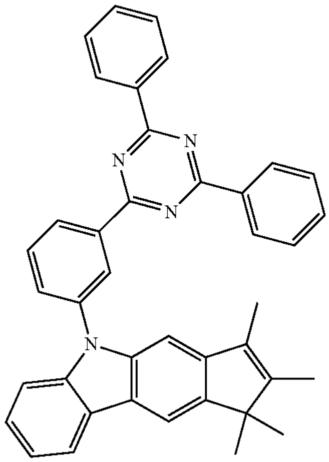
338
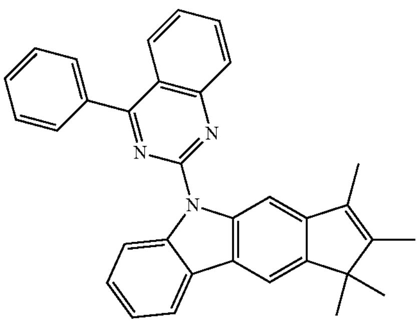
339
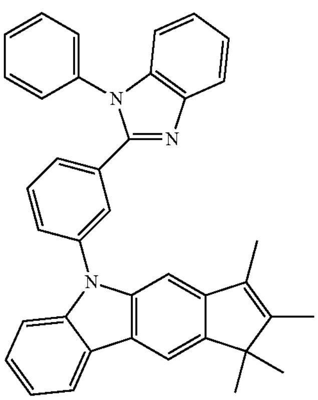
340
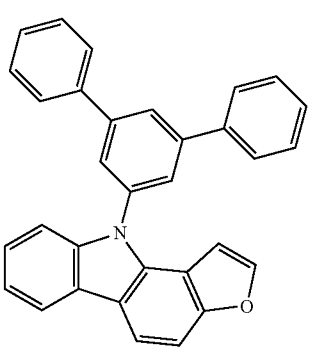
341
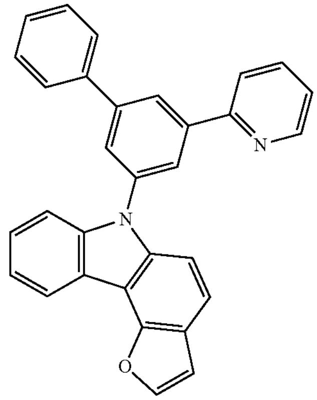
342
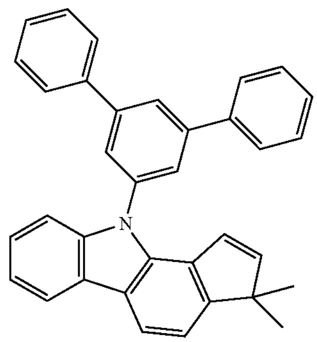
343
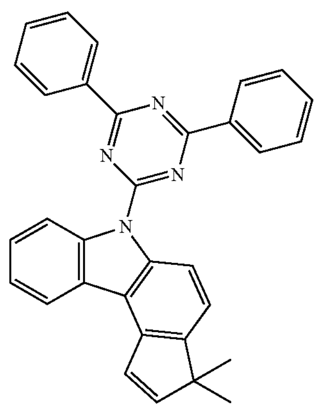
344
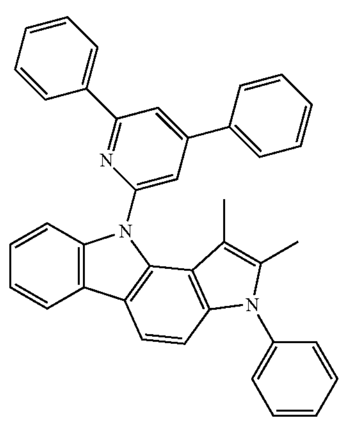

-continued
345
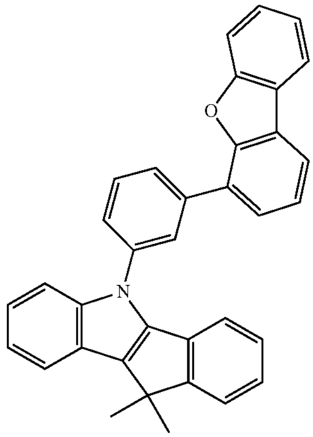
346
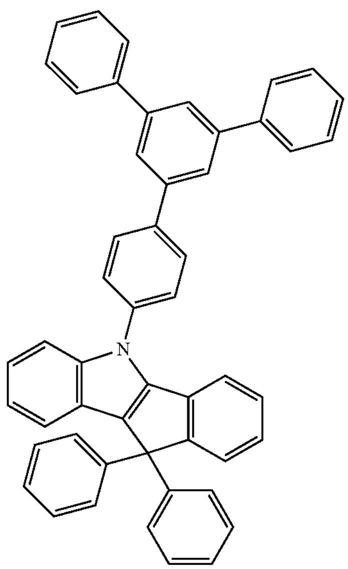
347
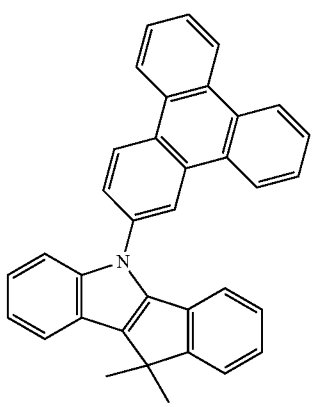
-continued
348
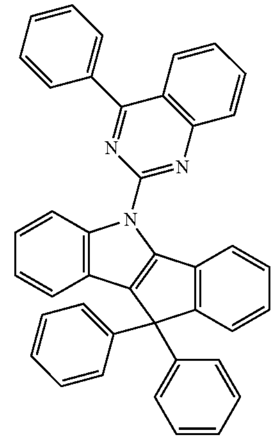
349
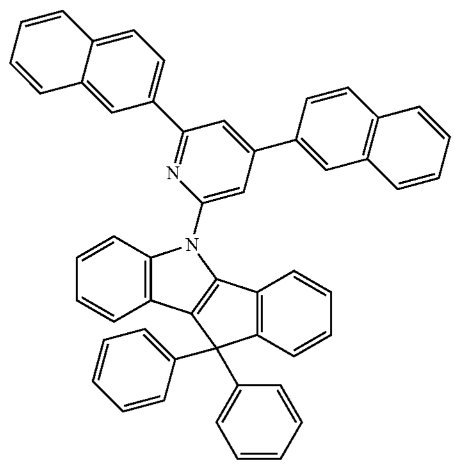
350
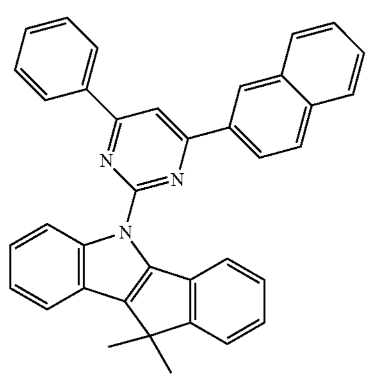

351
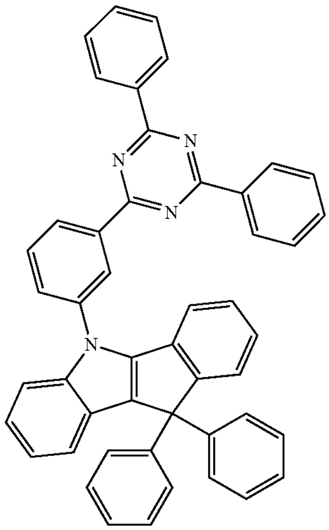
352
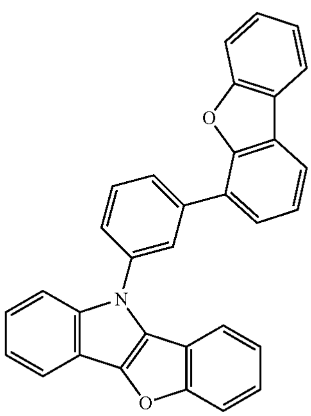
353
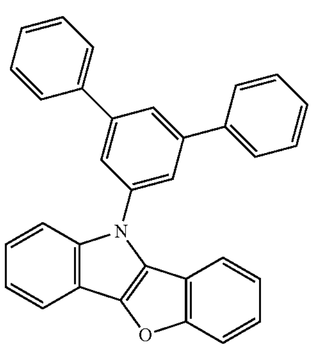
354
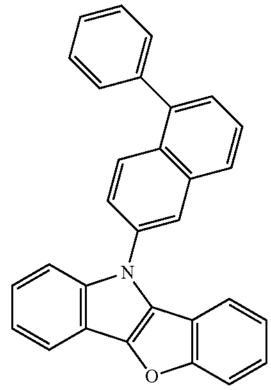
355
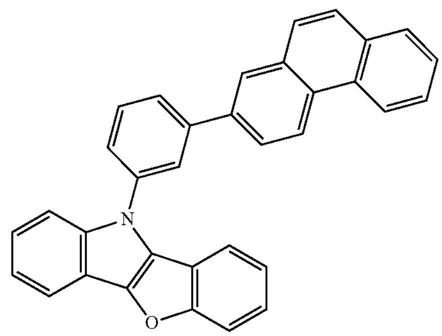
356
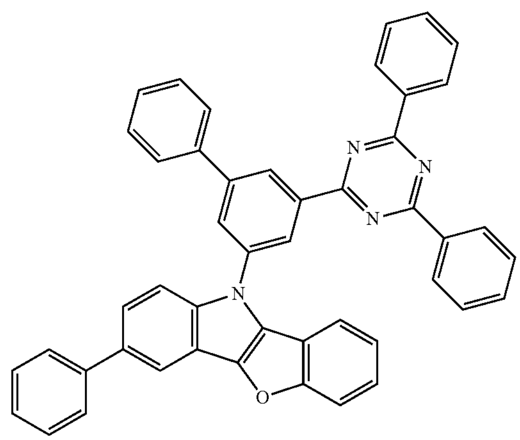
357
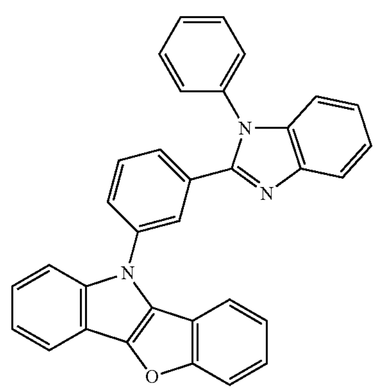

-continued
358
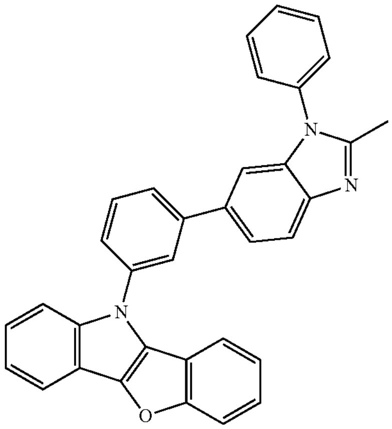
359
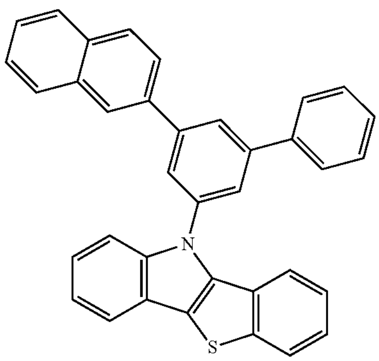
360
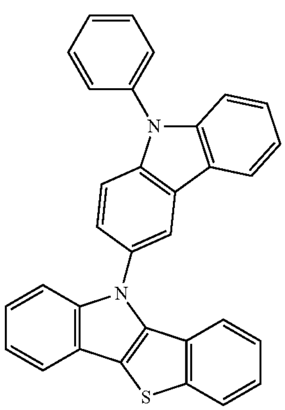
361
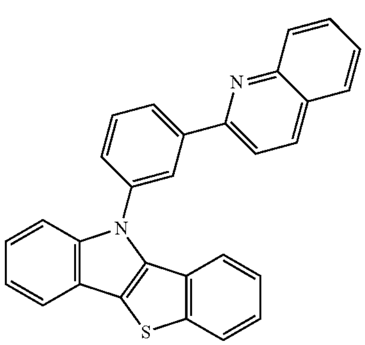
-continued
362
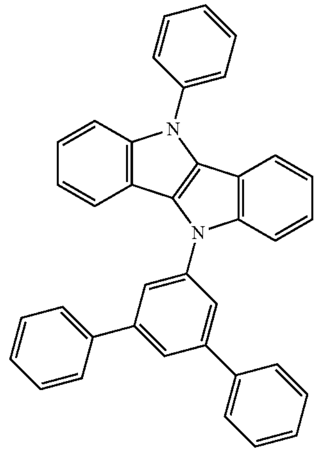
363
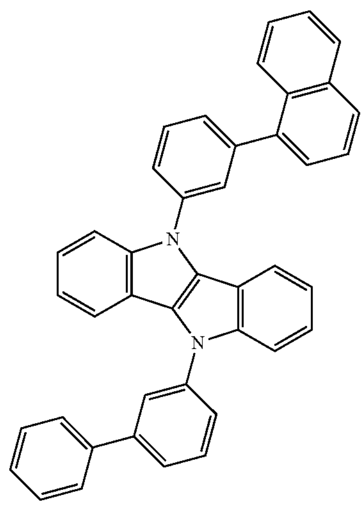
364
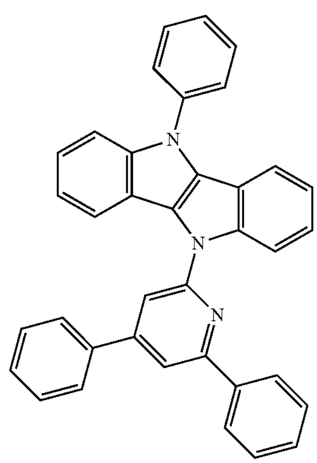

-continued
365
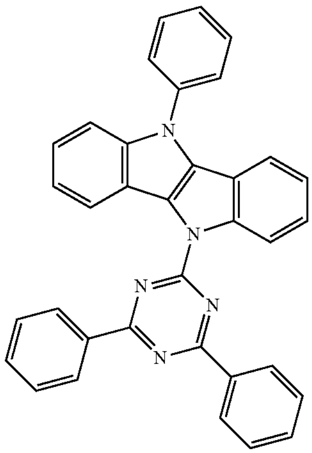
366
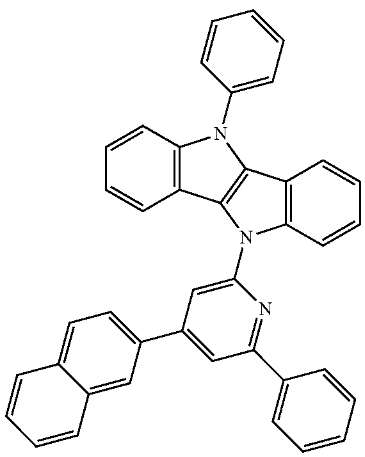
367
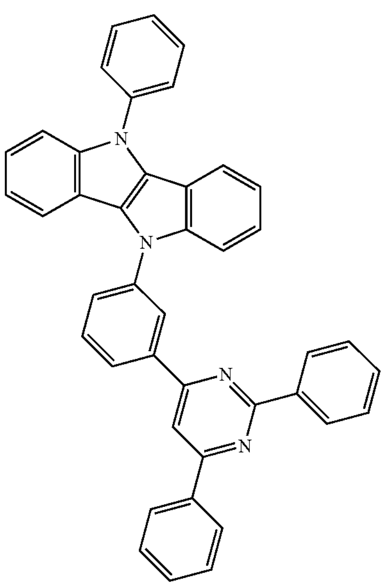
-continued
368
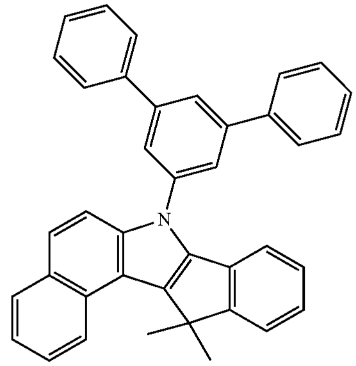
369
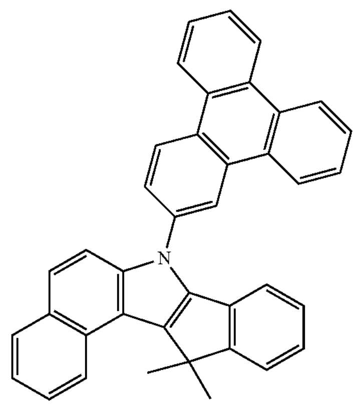
370
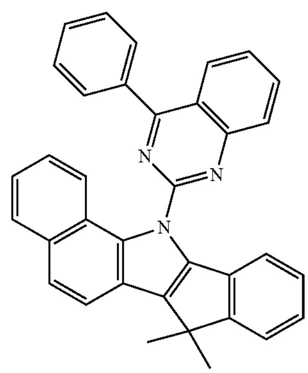
371
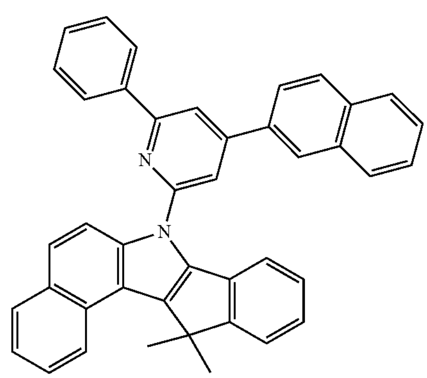
15. The organic light-emitting device of claim 1, wherein the first material and the second material are in the emission layer.

16. The organic light-emitting device of claim 15, wherein the emission layer further comprises a dopant comprising one selected from iridium (Ir), platinum (Pt), osmium (Os), titanium (Ti), zirconium (Zr), hafnium (Hf), europium (Eu), terbium (Tb), thulium (Tm), rhodium (Rh), and copper (Cu).

17. The organic light-emitting device of claim 16, wherein the dopant is an organometallic compound represented by Formula 401:

Formula 401

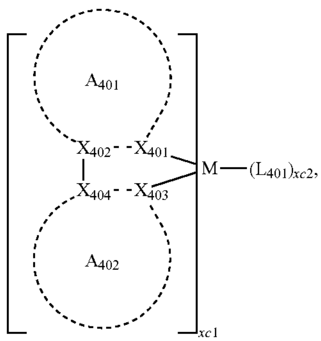

wherein in Formula 401,

M is selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ are each independently nitrogen or carbon;

$A_{401}$ and $A_{402}$ rings are each independently selected from a substituted or unsubstituted benzene group, a substituted or unsubstituted naphthalene group, a substituted or unsubstituted fluorene group, a substituted or unsubstituted spiro-fluorene group, a substituted or unsubstituted indene group, a substituted or unsubstituted pyrrole group, a substituted or unsubstituted thiophene group, a substituted or unsubstituted furan group, a substituted or unsubstituted imidazole group, a substituted or unsubstituted pyrazole group, a substituted or unsubstituted thiazole group, a substituted or unsubstituted isothiazole group, a substituted or unsubstituted oxazole group, a substituted or unsubstituted isoxazole group, a substituted or unsubstituted pyridine group, a substituted or unsubstituted pyrazine group, a substituted or unsubstituted pyrimidine group, a substituted or unsubstituted pyridazine group, a substituted or unsubstituted quinoline group, a substituted or unsubstituted isoquinoline group, a substituted or unsubstituted benzoquinoline group, a substituted or unsubstituted quinoxaline group, a substituted or unsubstituted quinazoline group, a substituted or unsubstituted carbazole group, a substituted or unsubstituted benzimidazole group, a substituted or unsubstituted benzofuran group, a substituted or unsubstituted benzothiophene group, a substituted or unsubstituted isobenzothiophene group, a substituted or unsubstituted benzoxazole group, a substituted or unsubstituted isobenzoxazole group, a substituted or unsubstituted triazole group, a substituted or unsubstituted oxadiazole group, a substituted or unsubstituted triazine group, a substituted or unsubstituted dibenzofuran group, and a substituted or unsubstituted dibenzothiophene group; and at least one substituent of the substituted benzene group, substituted naphthalene group, substituted fluorene group, substituted spiro-fluorene group, substituted indene group, substituted pyrrole group, substituted thiophene group, substituted furan group, substituted imidazole group, substituted pyrazole group, substituted thiazole group, substituted isothiazole group, substituted oxazole group, substituted isoxazole group, substituted pyridine group, substituted pyrazine group, substituted pyrimidine group, substituted pyridazine group, substituted quinoline group, substituted isoquinoline group, substituted benzoquinoline group, substituted quinoxaline group, substituted quinazoline group, substituted carbazole group, substituted benzimidazole group, substituted benzofuran group, substituted benzothiophene group, substituted isobenzothiophene group, substituted benzoxazole group, substituted isobenzoxazole group, substituted triazole group, substituted oxadiazole group, substituted triazine group, substituted dibenzofuran group, and substituted dibenzothiophene group is selected from:

a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a non-aromatic condensed polycyclic group, —$N(Q_{401})(Q_{402})$, —$Si(Q_{403})(Q_{404})(Q_{405})$) and —$B(Q_{406})(Q_{407})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$), wherein $Q_{401}$ to $Q_{407}$, $Q_{411}$ to $Q_{417}$, and $Q_{421}$ to $Q_{427}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group;

$L_{401}$ is an organic ligand;

xc1 is 1, 2, or 3; and xc2 is 0, 1, 2, or 3.

18. An organic light-emitting device comprising:

a first electrode;

a second electrode; and an organic layer between the first electrode and the second electrode and comprising an emission layer, wherein the organic layer comprises a first material represented by Formula 1 and a second material represented by Formula 2:

Formula 1

$$Ar_{11}-\left[(L_{11})_{a11}-(R_{11})_{b11}\right]_{c11}$$

Formula 2

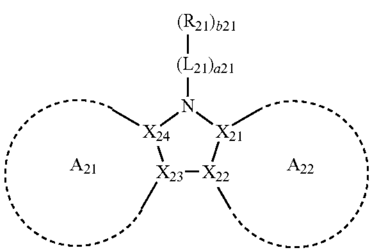

, wherein in Formulae 1 and 2, $Ar_{11}$ is selected from Formulae 8-1, 8-3 to 8-4, and 8-6 to 8-7

8-1

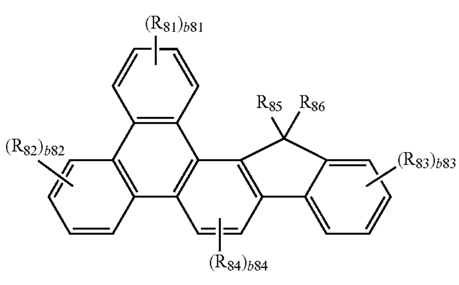

8-3

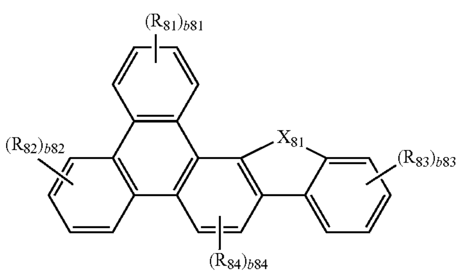

-continued 8-4

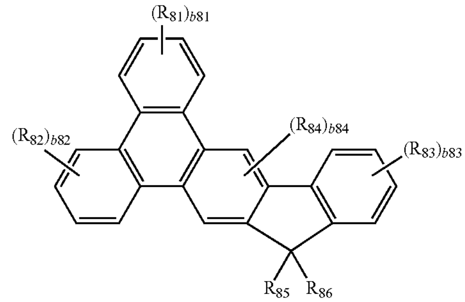

8-6

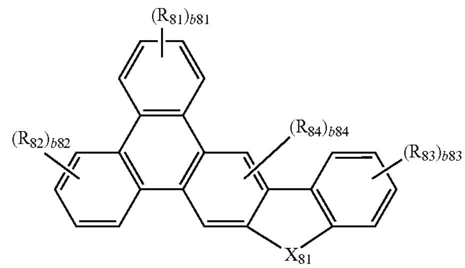

8-7

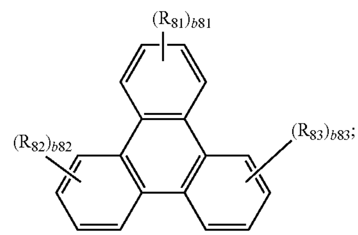

$A_{21}$ and $A_{22}$ are each independently selected from Formulae 9-1 to 9-12, and any two adjacent groups selected from $X_{21}$ to $X_{24}$ are each independently carbon atoms corresponding to * in Formulae 9-1 to 9-12

9-1

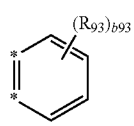

9-2

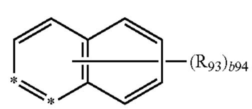

9-3

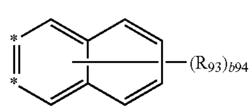

9-4

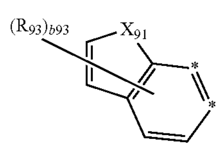

9-5

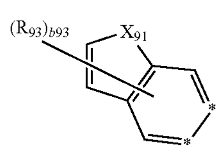

-continued 9-6

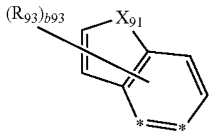

9-7

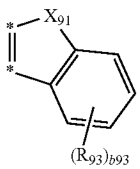

9-8

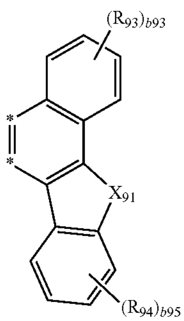

9-9

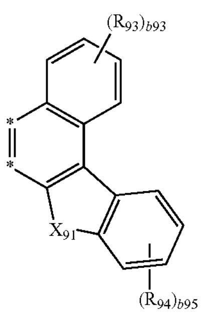

9-10

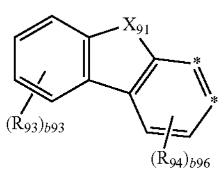

9-11

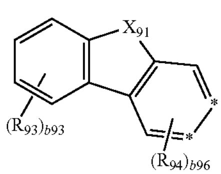

9-12

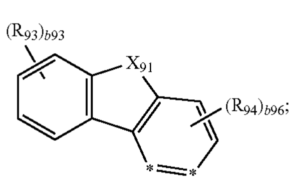

wherein $X_{81}$ is selected from *—O—* and *—S—*;

$X_{91}$ is selected from

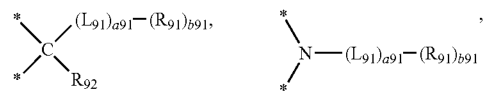

*—O—*, and *—S—*;

$L_{11}$, $L_{21}$, and $L_{91}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11, a21, and a91 are each independently selected from 0, 1, 2, and 3;

$R_{11}$ is an electron transport group;

wherein when $Ar_{11}$ is Formula 8-7, $L_{11}$ is selected from:

a phenylene group, a naphthylene group, a fluorenylene group, a pyridinylene group, a pyrimidinylene group, a quinolinylene group, an isoquinolinylene group, a quinazolinylene group, a carbazolylene group, and a triazinylene group; and a phenylene group, a naphthylene group, a fluorenylene group, a pyridinylene group, a pyrimidinylene group, a quinolinylene group, an isoquinolinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, and a naphthyl group, and $R_{11}$ is selected from:

a pyridinyl group, a pyrimidinyl group, a pyridazinyl group, a triazinyl group, a quinolinyl group, an isoquinolinyl group, a quinazolinyl group, a quinoxalinyl group, a phenanthrolinyl group, a benzimidazolyl group, and a triazolyl group; and a pyridinyl group, a pyrimidinyl group, a pyridazinyl group, a triazinyl group, a quinolinyl group, an isoquinolinyl group, a quinazolinyl group, a quinoxalinyl group, a phenanthrolinyl group, a benzimidazolyl group, and a triazolyl group, each substituted with at least one selected from a deuterium, —F, —Cl, —Br, —I, a $C_1$-$C_{20}$ alkyl group, a phosphoric acid group or a salt thereof, a phenyl group, a biphenyl group, a naphthyl group, a pyridinyl group, a pyrimidinyl group, and a triazinyl group;

b11 is selected from 1, 2, 3, and 4;

c11 is selected from 1, 2, and 3, and when c11 is two or more, a plurality of *-$[(L_{11})_{a11}$-$(R_{11})_{b11}]$ are identical to or different from each other;

$R_{81}$ to $R_{86}$ are each independently selected from *-$[(L_{11})_{a11}$-$(R_{11})_{b11}]$, a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group;

b81 to b83 are each independently selected from 1, 2, 3, and 4;

b84 is selected from 1 and 2;

$R_{21}$ and $R_{91}$ to $R_{94}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b21, b91, b93, and b95 are each independently selected from 0, 1, 2, 3, and 4;

b94 is selected from 1, 2, 3, 4, 5, and 6;

b96 is selected from 1 and 2; and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_{11}$ to $Q_{17}$, $Q_{21}$ to $Q_{27}$, and $Q_{31}$ to $Q_{37}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

* * * * *